US010988686B2

(12) United States Patent
D'amico et al.

(10) Patent No.: US 10,988,686 B2
(45) Date of Patent: Apr. 27, 2021

(54) LUMINESCENT PARTICLES COMPRISING ENCAPSULATED NANOPARTICLES AND USES THEREOF

(71) Applicant: NEXDOT, Romainville (FR)

(72) Inventors: Michele D'amico, Romainville (FR); Alexis Kuntzmann, Paris (FR); Robin Faideau, Houilles (FR)

(73) Assignee: NEXDOT, Romainville (FR)

( * ) Notice: Subject to any disclaimer, the term of this patent is extended or adjusted under 35 U.S.C. 154(b) by 322 days.

(21) Appl. No.: 15/996,007

(22) Filed: Jun. 1, 2018

(65) Prior Publication Data

US 2019/0002759 A1 Jan. 3, 2019

Related U.S. Application Data

(60) Provisional application No. 62/514,601, filed on Jun. 2, 2017, provisional application No. 62/514,422, filed (Continued)

(30) Foreign Application Priority Data

Sep. 22, 2017 (EP) .................................... 17306241
Sep. 22, 2017 (EP) .................................... 17306246

(Continued)

(51) Int. Cl.

*C09K 11/02* (2006.01)
*C09K 11/88* (2006.01)

(Continued)

(52) U.S. Cl.

CPC ............ *C09K 11/025* (2013.01); *C09K 11/02* (2013.01); *C09K 11/06* (2013.01);

(Continued)

(58) Field of Classification Search

CPC .............................. C09K 11/02; C09K 11/025
See application file for complete search history.

(56) References Cited

U.S. PATENT DOCUMENTS

| | | | | |
|---|---|---|---|---|
| 8,957,401 B2 * | 2/2015 | Pickett | H01L 33/505 | |
| | | | 257/13 | |
| 9,368,693 B2 * | 6/2016 | Kurtin | H01L 29/127 | |

(Continued)

FOREIGN PATENT DOCUMENTS

KR 20130043442 A 4/2013

OTHER PUBLICATIONS

Gui et al., "Facile synthesis of quantum dots/mesoporous silica/quantum dots core/shell/shell hybrid microspheres for ratiometric fluorescence detection of 5-fluorouracil in human serum", Analyst, Jul. 22, 2013, 138, 5956-5964.

(Continued)

*Primary Examiner* — C Melissa Koslow
(74) *Attorney, Agent, or Firm* — Nixon & Vanderhye

(57) ABSTRACT

Disclosed is a luminescent particle including a first material, wherein the luminescent particle includes at least one particle including a second material and at least one nanoparticle dispersed in the second material; wherein the first material and the second material have a bandgap superior or equal to 3 eV; and wherein the luminescent particle is a colloidal particle. Also disclosed is a light emitting material, a support and an optoelectronic device.

18 Claims, 30 Drawing Sheets

Related U.S. Application Data on Jun. 2, 2017, provisional application No. 62/514,297, filed on Jun. 2, 2017, provisional application No. 62/609,932, filed on Dec. 22, 2017, provisional application No. 62/710,298, filed on Feb. 16, 2018, provisional application No. 62/642,370, filed on Mar. 13, 2018.

(30) Foreign Application Priority Data

| | | |
|---|---|---|
| Sep. 22, 2017 | (EP) | 17306247 |
| Sep. 22, 2017 | (EP) | 17306248 |
| Sep. 22, 2017 | (EP) | 17306249 |
| Dec. 11, 2017 | (EP) | 17206479 |

(51) Int. Cl.

| | |
|---|---|
| ***C09K 11/70*** | (2006.01) |
| ***H01L 33/50*** | (2010.01) |
| ***C09K 11/06*** | (2006.01) |
| ***C09K 11/08*** | (2006.01) |
| ***C09K 11/56*** | (2006.01) |
| ***B82Y 20/00*** | (2011.01) |

(52) U.S. Cl.

CPC ........ *C09K 11/0883* (2013.01); *C09K 11/565* (2013.01); *C09K 11/70* (2013.01); *C09K 11/703* (2013.01); *C09K 11/883* (2013.01); *H01L 33/502* (2013.01); *B82Y 20/00* (2013.01); *C09K 2211/10* (2013.01)

(56) References Cited

U.S. PATENT DOCUMENTS

| | | | |
|---|---|---|---|
| 9,425,365 | B2 | 8/2016 | Kurtin |
| 2010/0224831 | A1 | 9/2010 | Woo et al. |
| 2011/0068321 | A1 | 3/2011 | Pickett et al. |
| 2013/0075692 | A1 | 3/2013 | Naasani et al. |
| 2016/0139137 | A1 | 5/2016 | Palomares et al. |
| 2017/0096599 | A1 | 4/2017 | Han et al. |

OTHER PUBLICATIONS

International Search Report for International Application No. PCT/EP2018/064440, dated Aug. 22, 2018.

* cited by examiner

LUMINESCENT PARTICLES COMPRISING ENCAPSULATED NANOPARTICLES AND USES THEREOF

FIELD OF INVENTION

The present invention pertains to the field of luminescent particles. In particular, the invention relates to luminescent particles comprising particles encapsulating nanoparticles in an inorganic material.

BACKGROUND OF INVENTION

To represent the colors in all their variety, one proceeds typically by additive synthesis of at least three complementary colors, especially red, green and blue. In a chromaticity diagram, the subset of available colors obtained by mixing different proportions of these three colors is formed by the triangle formed by the three coordinates associated with the three colors red, green and blue. This subset constitutes what is called a gamut. The majority of color display devices operate on this three-color principle: each pixel consists of three sub-pixels, one red, one green and one blue, whose mixture with different intensities can reproduce a colorful impression.

A luminescent or backlit display such as a computer LCD screen has to present the widest possible gamut for an accurate color reproduction. For this, the composing sub-pixels must be of the most saturated colors possible in order to describe the widest possible gamut. A sub-pixel has a saturated color if it is close to a monochromatic color. From a spectral point of view, this means that the light emitted by the source is comprised of a single narrow fluorescence band of wavelengths. A highly saturated shade has a vivid, intense color while a less saturated shade appears rather bland and gray.

It is therefore important to have sub-pixels whose emission spectra are narrow and with saturated colors.

Luminescent inorganic nanoparticles, especially semiconductor nanoparticles, commonly called "quantum dots", are known as emissive material. Semiconductor nanoparticles have a narrow fluorescence spectrum, approximately 30 nm full width at half maximum, and offer the possibility to emit in the entire visible spectrum as well as in the infrared with a single excitation source in the ultraviolet. Luminescent inorganic nanoparticles, especially semiconductor nanoparticles, are currently used in display devices as phosphors.

However, there is a real need for materials to be used in display devices and lighting devices, these materials having a high stability in time and in temperature, under a high photon flux. In addition, there is a need for materials having a high stability for long term use when deposited on diodes, or Light Emitting Diodes (LED).

To ensure a high long term stability, further chemical reaction between the surface of nanoparticles and environmental deteriorating species such as water, oxygen or other harmful compounds, must be prevented during their use. However, the ligands commonly used to functionalize the surface of quantum dots do not protect efficiently said surface against reactions with deteriorating species or harmful compounds and thus do not enable the long-term performance required for display or lighting devices.

It is known to coat nanoparticles with a protective shell, i.e. to encapsulate nanoparticles in another material, to prevent deteriorating species or harmful compounds from reaching said nanoparticles surface. Silica is known to be an insulating protective material for nanoparticles. Furthermore, particles encapsulating nanoparticles in an insulating protective material can act as scatterers in the sub-pixels. This results in the scattering of the light emitted by the light source in all parts of the sub-pixels and then the scattering of the light emitted by sub-pixels so that said light can be emitted in all directions.

For example, U.S. Pat. No. 9,425,365 discloses the encapsulation of quantum dots, including a nanocrystalline core and a nanocrystalline shell, in mesoporous silica using a reverse micellar method. The obtained particles are mesoporous silica nanoparticles, each comprising only one quantum dot. However, said particles are mesoporous which means that they comprise a porous network of silica that allows access to the quantum dots surface for deteriorating species, like water and oxygen, or other harmful compounds. The protection of said surface is thus ineffective and does not enable a long-term stability in time and temperature.

Gui et al. discloses the encapsulation of multiple PbSe quantum dots in silica particles using a base-catalyzed sol-gel method (Analyst, 2013, 138, 5956). However, said PbSe quantum dots are aggregated in the silica particles, resulting in a decrease of the photoluminescence quantum yield. The silica particles are porous, allowing access to the quantum dots surface for deteriorating species, like water, oxygen or other harmful compounds. Patent application KR20130043442 discloses quantum dots encapsulated in silica using aerosol. However, the resulting particles are not well defined and are aggregated, resulting in a silica matrix-like material comprising quantum dots. Said material will not allow for a good dispersion in a host material in view of an application as a sub-pixel.

The protection of nanoparticles from deteriorating species or harmful compounds will be more effective if said nanoparticles are protected by more than one inorganic material. Indeed, a double encapsulation, i.e. encapsulating nanoparticles in an inorganic material and dispersing the resulting particle in another inorganic material, will better prevent the diffusion of deteriorating species or harmful compounds to the surface of the nanoparticles as each inorganic material can act as a barrier against said deteriorating species or harmful compounds.

It is therefore an object of the present invention to provide luminescent particles comprising first material and at least one particle comprising a second material and at least one nanoparticle dispersed in said second material.

The encapsulated particles that may not be spherical, which is a drawback for many applications, can be rendered spherical by their encapsulation in a bigger particle.

Said luminescent particles having one or more of the following advantages: coupling the properties of different particles encapsulated in the same luminescent particle; preventing a decrease of the properties of encapsulated nanoparticles; enhanced stability over temperature, environment variations and deteriorating species like water and oxygen, or other harmful compounds attacks; capable of scattering the light emitted by a light source and the light resulting from the excitation of said luminescent particles, enhanced photoluminescence quantum yield, enhanced resistance to photobleaching and enhanced resistance to photon flux.

Said luminescent particles can also easily comply with ROHS requirements depending on the first and second materials selected. It is a great advantage to have ROHS compliant particles while preserving the properties of encapsulated nanoparticles. that may not be ROHS compliant themselves.

Furthermore, said luminescent particles are tailored to be air processable allowing an easy manipulation, transport and use of said luminescent particle in a device such as an optoelectronic device.

SUMMARY

The present invention relates to a luminescent particle comprising a first material, wherein the luminescent particle comprises at least one particle comprising a second material and at least one nanoparticle dispersed in said second material; wherein the first material and the second material have a bandgap superior or equal to 3 eV.

In one embodiment, the first material and the second material are selected from the group consisting of silicon oxide, aluminium oxide, titanium oxide, iron oxide, calcium oxide, magnesium oxide, zinc oxide, tin oxide, beryllium oxide, zirconium oxide, niobium oxide, cerium oxide, iridium oxide, scandium oxide, sodium oxide, barium oxide, potassium oxide, tellurium oxide, manganese oxide, boron oxide, germanium oxide, osmium oxide, rhenium oxide, arsenic oxide, tantalum oxide, lithium oxide, strontium oxide, yttrium oxide, hafnium oxide, molybdenum oxide, technetium oxide, rhodium oxide, cobalt oxide, gallium oxide, indium oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, silicon carbide SiC, aluminium nitride AlN, gallium nitride GaN, boron nitride BN, mixed oxides, mixed oxides thereof, or a mixture thereof.

In one embodiment, the first material limits or prevents the diffusion of outer molecular species or fluids (liquid or gas) into said first material.

In one embodiment, the first material has a density ranging from 1 to 10.

In one embodiment, the first material has a density superior or equal to the density of the second material.

In one embodiment, the first material has a thermal conductivity at standard conditions of at least 0.1 W/(m.K).

In one embodiment, the at least one nanoparticle is a luminescent nanoparticle.

In one embodiment, the at least one nanoparticle is a semiconductor nanocrystal.

In one embodiment, the semiconductor nanocrystal comprises a core comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

In one embodiment, the semiconductor nanocrystal comprises at least one shell comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

In one embodiment, the semiconductor nanocrystal comprises at least one crown comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

In one embodiment, the semiconductor nanocrystal is a semiconductor nanoplatelet. The present invention also relates to a light emitting material comprising at least one host material and at least one luminescent particle, wherein said at least one luminescent particle is dispersed in the at least one host material.

In one embodiment, the host material comprises an inorganic material, a polymer such as a co-polymer, a block co-polymer, or a silicone-based polymer, a resin such as an epoxy resin or a mixture thereof.

In one embodiment, the host material has a thermal conductivity at standard conditions of at least 0.1 W/(m.K).

The present invention also relates to a support supporting at least one luminescent particle or a light emitting material.

In one embodiment, the support is a LED chip or microsized LED.

The present invention also relates to an optoelectronic device comprising at least one luminescent particle or a light emitting material.

Definitions

In the present invention, the following terms have the following meanings:

- "Array" refers to a series, a matrix, an assemblage, an organization, a succession, a collection or an arrangement of elements or items, wherein said elements or items are arranged in a particular way.
- "Backlight unit" refers to a unit comprising at least one light source configured to emit primary light and a polarizer configured to polarize said primary light. Said "backlight unit" is configured to provide said polarized light to the liquid crystal layer, the color filter layer and the second polarizer. As said polarized light pass through the liquid crystal layer and the color filter layer, only the selected portion of the primary light will be transmitted through the second polarizer, such that an image can be viewed by the viewer. Said "backlight unit" is preferably located to the back of a LCD Panel, before the liquid crystal layer.

"Core" refers to the innermost space within a particle.

"Shell" refers to at least one monolayer of material coating partially or totally a core.

"Encapsulate" refers to a material that coats, surrounds, embeds, contains, comprises, wraps, packs, or encloses a plurality of particles.

"Uniformly dispersed" refers to particles that are not aggregated, do not touch, are not in contact, and are separated by an inorganic material. Each particle is spaced from their adjacent particles by an average minimal distance.

"Colloidal" refers to a substance in which particles are dispersed, suspended and do not settle or would take a very long time to settle appreciably, but are not soluble in said substance.

"Colloidal particles" refers to particles that may be dispersed, suspended and which would not settle or would take a very long time to settle appreciably in another substance, typically in an aqueous or organic solvent, and which are not soluble in said substance. "Colloidal particles" does not refer to particles grown on substrate.

"Impermeable" refers to a material that limits or prevents the diffusion of outer molecular species or fluids (liquid or gas) into said material.

"Permeable" refers to a material that allows the diffusion of outer molecular species or fluids (liquid or gas) into said material.

"Outer molecular species or fluids (liquid or gas)" refers to molecular species or fluids (liquid or gas) coming from outside a material or a particle.

"Adjacent particle" refers to neighbouring particles in a space or a volume, without any other particle between said adjacent particles.

"Packing fraction" refers to the volume ratio between the volume filled by an ensemble of objects into a space and the volume of said space. The terms packing fraction, packing density and packing factor are interchangeable in the present invention.

"Loading charge" refers to the mass ratio between the mass of an ensemble of objects comprised in a space and the mass of said space.

"Population of particles" refers to a statistical set of particles having the same maximum emission wavelength.

"Statistical set" refers to a collection of at least 2, 3, 4, 5, 6, 7, 8, 9, 10, 11, 12, 13, 14, 15, 16, 17, 18, 19, 20, 30, 40, 50, 60, 70, 80, 90, 100, 150, 200, 250, 300, 350, 400, 450, 500, 550, 600, 650, 700, 750, 800, 850, 900, 950, or 1000 objects obtained by the strict same process. Such statistical set of objects allows determining average characteristics of said objects, for example their average size, their average size distribution or the average distance between them.

"Surfactant-free" refers to a particle that does not comprise any surfactant and was not synthesized by a method comprising the use of surfactants.

"Optically transparent" refers to a material that absorbs less than 10%, 5%, 2.5%, 1%, 0.99%, 0.98%, 0.97%, 0.96%, 0.95%, 0.94%, 0.93%, 0.92%, 0.91%, 0.9%, 0.89%, 0.88%, 0.87%, 0.86%, 0.85%, 0.84%, 0.83%, 0.82%, 0.81%, 0.8%, 0.79%, 0.78%, 0.77%, 0.76%, 0.75%, 0.74%, 0.73%, 0.72%, 0.71%, 0.7%, 0.69%, 0.68%, 0.67%, 0.66%, 0.65%, 0.64%, 0.63%, 0.62%, 0.61%, 0.6%, 0.59%, 0.58%, 0.57%, 0.56%, 0.55%, 0.54%, 0.53%, 0.52%, 0.51%, 0.5%, 0.49%, 0.48%, 0.47%, 0.46%, 0.45%, 0.44%, 0.43%, 0.42%, 0.41%, 0.4%, 0.39%, 0.38%, 0.37%, 0.36%, 0.35%, 0.34%, 0.33%, 0.32%, 0.31%, 0.3%, 0.29%, 0.28%, 0.27%, 0.26%, 0.25%, 0.24%, 0.23%, 0.22%, 0.21%, 0.2%, 0.19%, 0.18%, 0.17%, 0.16%, 0.15%, 0.14%, 0.13%, 0.12%, 0.11%, 0.1%, 0.09%, 0.08%, 0.07%, 0.06%, 0.05%, 0.04%, 0.03%, 0.02%, 0.01%, 0.009%, 0.008%, 0.007%, 0.006%, 0.005%, 0.004%, 0.003%, 0.002%, 0.001%, 0.0009%, 0.0008%, 0.0007%, 0.0006%, 0.0005%, 0.0004%, 0.0003%, 0.0002%, 0.0001%, or 0% of light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

"Roughness" refers to a surface state of a particle. Surface irregularities can be present at the surface of particles and are defined as peaks or cavities depending on their relative position respect to the average particle surface. All said irregularities constitute the particle roughness. Said roughness is defined as the height difference between the highest peak and the deepest cavity on the surface. The surface of a particle is smooth if they are no irregularities on said surface, i.e. the roughness is equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said particle.

"Polydisperse" refers to particles or droplets of varied sizes, wherein the size difference is superior or equal to 20%.

"Monodisperse" refers to particles or droplets, wherein the size difference is inferior than 20%, 15%, 10%, preferably 5%.

"Narrow size distribution" refers to a size distribution of a statistical set of particles less than 1%, 2%, 3%, 4%, 5%, 6%, 7%, 8%, 9%, 10%, 15%, 20%, 25%, 30%, 35%, or 40% of the average size.

"Partially" means incomplete. In the case of a ligand exchange, partially means that 5%, 10%, 15%, 20%, 25%, 30%, 35%, 40%, 45%, 50%, 55%, 60%, 65%, 70%, 75%, 80%, 85%, 90%, 95% of the ligands at the surface of a particle have been successfully exchanged.

The terms "Film", "Layer" or "Sheet" are interchangeable in the present invention.

"Nanoplatelet" refers to a 2D shaped nanoparticle, wherein the smallest dimension of said nanoplatelet is smaller than the largest dimension of said nanoplatelet by a factor (aspect ratio) of at least 1.5, at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5 or at least 10.

"Free of oxygen" refers to a formulation, a solution, a film, or a composition that is free of molecular oxygen, $O_2$, i.e. wherein molecular oxygen may be present in said formulation, solution, film, or composition in an amount of less than about 10 ppm, 5 ppm, 4 ppm, 3 ppm, 2 ppm, 1 ppm, 500 ppb, 300 ppb or in an amount of less than about 100 ppb in weight.

"Free of water" refers to a formulation, a solution, a film, or a composition that is free of molecular water, $H_2O$, i.e. wherein molecular water may be present in said formulation, solution, film, or composition in an amount of less than about 100 ppm, 50 ppm, 10 ppm, 5 ppm, 4 ppm, 3 ppm, 2 ppm, 1 ppm, 500 ppb, 300 ppb or in an amount of less than about 100 ppb in weight.

"Pixel pitch" refers to the distance from the center of a pixel to the center of the next pixel.

"Curvature" refers to the reciprocal of the radius.

"ROHS compliant" refers to a material compliant with Directive 2011/65/EU of the European Parliament and of the Council of 8 Jun. 2011 on the restriction of the use of certain hazardous substances in electrical and electronic equipment.

"Standard conditions" refers to the standard conditions of temperature and pressure, i.e. 273.15 K and $10^5$ Pa respectively.

"Display apparatus" refers to an apparatus or a device that displays an image signal. Display devices or display apparatus include all devices that display an image, a succession of pictures or a video such as, non-limitatively, a LCD display, a television, a projector, a computer monitor, a personal digital assistant, a mobile phone, a laptop computer, a tablet PC, an MP3 player, a CD player, a DVD player, a Blu-Ray player, a head mounted display, glasses, a helmet, a headgear, a headwear, a smart watch, a watch phone or a smart device.

"Primary light" refers to the light supplied by a light source. For example, primary light refers to the light supplied to the light emitting material by the light source.

"Secondary light" refers to the light emitted by a material in response to an excitation. Said excitation is generally provided by the light source, i.e. the excitation is the incident light. For example, secondary light refers to the light emitted by the luminescent particles, the light emitting material or the color conversion layer in response to an excitation of the particles comprised in said luminescent particles.

"Resulting light" refers to the light supplied by a material after excitation by an incident light and emission of a secondary light. For example, resulting light refers to the light supplied by the luminescent particles, the light emitting material or the color conversion layer and is a combination of a part of the incident light and the secondary light.

"Surrounding medium" refers to the medium in which the luminescent particles of the present invention are dispersed, or the medium which surrounds partially or totally said luminescent particles. It may be a fluid (liquid, gas) or a solid host material.

DETAILED DESCRIPTION

The following detailed description will be better understood when read in conjunction with the drawings. For the purpose of illustrating, the particle is shown in the preferred embodiments. It should be understood, however that the application is not limited to the precise arrangements, structures, features, embodiments, and aspect shown. The drawings are not drawn to scale and are not intended to limit the scope of the claims to the embodiments depicted. Accordingly it should be understood that where features mentioned in the appended claims are followed by reference signs, such signs are included solely for the purpose of enhancing the intelligibility of the claims and are in no way limiting on the scope of the claims.

This invention relates to a particle 1, as illustrated in FIG. 1, comprising a first material 11, wherein the particle 1 comprises at least one particle 2 comprising a second material 21 and at least one nanoparticle 3 dispersed in said second material 21.

This invention relates to a particle 1, as illustrated in FIG. 1, comprising a first material 11, wherein the particle 1 comprises at least one particle 2 comprising a second material 21 and at least one nanoparticle 3 dispersed in said second material 21; wherein the first material 11 and the second material 21 have a bandgap superior or equal to 3 eV.

This invention relates to a particle 1, as illustrated in FIG. 1, comprising a first material 11, wherein the particle 1 comprises at least one particle 2 comprising a second material 21 and at least one nanoparticle 3 dispersed in said second material 21; wherein the first material 11 and the second material 21 have a bandgap superior or equal to 3 eV; and wherein the luminescent particle 1 is a colloidal particle.

This invention relates to a luminescent particle 1, as illustrated in FIG. 1, comprising a first material 11, wherein the luminescent particle 1 comprises at least one particle 2 comprising a second material 21 and at least one nanoparticle 3 dispersed in said second material 21.

This invention relates to a luminescent particle 1, as illustrated in FIG. 1, comprising a first material 11, wherein the luminescent particle 1 comprises at least one particle 2 comprising a second material 21 and at least one nanoparticle 3 dispersed in said second material 21; wherein the first material 11 and the second material 21 have a bandgap superior or equal to 3 eV.

This invention relates to a luminescent particle 1, as illustrated in FIG. 1, comprising a first material 11, wherein the luminescent particle 1 comprises at least one particle 2 comprising a second material 21 and at least one nanoparticle 3 dispersed in said second material 21; wherein the first material 11 and the second material 21 have a bandgap superior or equal to 3 eV; and wherein the luminescent particle 1 is a colloidal particle.

The encapsulation of the at least one particle 2 in the first material 11 allows for an increased protection of the at least one nanoparticle 3 regarding the diffusion of outer molecular species or fluids (liquid or gas), especially deteriorating species like $O_2$ and $H_2O$ to the surface of said nanoparticle 3. The first material 11 acts as a supplementary barrier against outer molecular species or fluids that could impair the properties of the at least one nanoparticle 3.

Having a bandgap superior or equal to 3 eV, the first material 11 and the second material 21 are optically transparent to UV and blue light.

The "double encapsulation" of nanoparticles 3 have several advantages: i) it allows a passivation of nanoparticles 3 surface, thus a better protection of said nanoparticles 3 from temperature, environment variations and deteriorating species like water and oxygen therefore preventing the degradation of said nanoparticles 3; ii) in the case of luminescent nanoparticles 3 it helps preventing photoluminescence quantum yield decrease and photoluminescence decrease due to interaction with the environment; iii) it allows the scattering of the light emitted by a light source and the light resulting from the excitation of said nanoparticles 3.

Luminescent particles 1 of the invention are also particularly interesting as they can easily comply with ROHS requirements depending on the first and second materials (11, 21) selected. It is then possible to have ROHS compliant particles while preserving the properties of nanoparticles 3. that may not be ROHS compliant themselves.

According to one embodiment, the luminescent particle 1 is air processable. This embodiment is particularly advantageous for the manipulation or the transport of said luminescent particle 1 and for the use of said luminescent particle 1 in a device such as an optoelectronic device.

According to one embodiment, the luminescent particle 1 is compatible with standard lithography processes. This embodiment is particularly advantageous for the use of said luminescent particle 1 in a device such as an optoelectronic device.

According to one embodiment, the luminescent particle 1 is a colloidal particle.

According to one embodiment, the luminescent particle 1 does not comprise a spherical porous bead, preferably the luminescent particle 1 does not comprise a central spherical porous bead.

According to one embodiment, the luminescent particle 1 does not comprise a spherical porous bead, wherein nanoparticles 3 are linked to the surface of said spherical porous bead.

According to one embodiment, the luminescent particle 1 does not comprise a bead and nanoparticles 3 having opposite electronic charges.

According to one embodiment, the luminescent particle 1 is dispersible in aqueous solvents, organic solvents and/or mixture thereof.

According to one embodiment, the luminescent particle 1 does not comprise organic molecules or polymer chains.

According to one embodiment, the luminescent particle 1 is fluorescent.

According to one embodiment, the luminescent particle 1 is phosphorescent.

According to one embodiment, the luminescent particle 1 is electroluminescent.

According to one embodiment, the luminescent particle 1 is chemiluminescent.

According to one embodiment, the luminescent particle 1 is triboluminescent.

According to one embodiment, the features of the light emission of luminescent particle 1 are sensible to external pressure variations. In this embodiment, "sensible" means that the features of the light emission can be modified by external pressure variations.

According to one embodiment, the wavelength emission peak of luminescent particle 1 is sensible to external pressure variations. In this embodiment, "sensible" means that the wavelength emission peak can be modified by external pressure variations, i.e. external pressure variations can induce a wavelength shift.

According to one embodiment, the FWHM of luminescent particle 1 is sensible to external pressure variations. In this embodiment, "sensible" means that the FWHM can be modified by external pressure variations, i.e. FWHM can be reduced or increased.

According to one embodiment, the PLQY of luminescent particle 1 is sensible to external pressure variations. In this embodiment, "sensible" means that the PLQY can be modified by external pressure variations, i.e. PLQY can be reduced or increased.

According to one embodiment, the features of the light emission of luminescent particle 1 are sensible to external temperature variations.

According to one embodiment, the wavelength emission peak of luminescent particle 1 is sensible to external temperature variations. In this embodiment, "sensible" means that the wavelength emission peak can be modified by external temperature variations, i.e. external temperature variations can induce a wavelength shift.

According to one embodiment, the FWHM of luminescent particle 1 is sensible to external temperature variations. In this embodiment, "sensible" means that the FWHM can be modified by external temperature variations, i.e. FWHM can be reduced or increased.

According to one embodiment, the PLQY of luminescent particle 1 is sensible to external temperature variations. In this embodiment, "sensible" means that the PLQY can be modified by external temperature variations, i.e. PLQY can be reduced or increased.

According to one embodiment, the features of the light emission of luminescent particle 1 are sensible to external variations of pH.

According to one embodiment, the wavelength emission peak of luminescent particle 1 is sensible to external variations of pH. In this embodiment, "sensible" means that the wavelength emission peak can be modified by external variations of pH, i.e. external variations of pH can induce a wavelength shift.

According to one embodiment, the FWHM of luminescent particle 1 is sensible to e external variations of pH. In this embodiment, "sensible" means that the FWHM can be modified by external variations of pH, i.e. FWHM can be reduced or increased.

According to one embodiment, the PLQY of luminescent particle 1 is sensible to external variations of pH. In this embodiment, "sensible" means that the PLQY can be modified by external variations of pH, i.e. PLQY can be reduced or increased.

According to one embodiment, the luminescent particle 1 comprise at least one particle 2 wherein the wavelength emission peak is sensible to external temperature variations; and at least one particle 2 wherein the wavelength emission peak is not or less sensible to external temperature variations. In this embodiment, "sensible" means that the wavelength emission peak can be modified by external temperature variations, i.e. wavelength emission peak can be reduced or increased. This embodiment is particularly advantageous for temperature sensor applications.

According to one embodiment, the luminescent particle 1 exhibits an emission spectrum with at least one emission peak, wherein said emission peak has a maximum emission wavelength ranging from 400 nm to 50 μm.

According to one embodiment, the luminescent particle 1 exhibits an emission spectrum with at least one emission peak, wherein said emission peak has a maximum emission wavelength ranging from 400 nm to 500 nm. In this embodiment, the luminescent particle 1 emits blue light.

According to one embodiment, the luminescent particle 1 exhibits an emission spectrum with at least one emission peak, wherein said emission peak has a maximum emission wavelength ranging from 500 nm to 560 nm, more preferably ranging from 515 nm to 545 nm. In this embodiment, the luminescent particle 1 emits green light.

According to one embodiment, the luminescent particle 1 exhibits an emission spectrum with at least one emission peak, wherein said emission peak has a maximum emission wavelength ranging from 560 nm to 590 nm. In this embodiment, the luminescent particle 1 emits yellow light.

According to one embodiment, the luminescent particle 1 exhibits an emission spectrum with at least one emission peak, wherein said emission peak has a maximum emission wavelength ranging from 590 nm to 750 nm, more preferably ranging from 610 nm to 650 nm. In this embodiment, the luminescent particle 1 emits red light.

According to one embodiment, the luminescent particle 1 exhibits an emission spectrum with at least one emission peak, wherein said emission peak has a maximum emission wavelength ranging from 750 nm to 50 μm. In this embodiment, the luminescent particle 1 emits near infra-red, mid-infra-red, or infra-red light.

According to one embodiment, the luminescent particle 1 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the luminescent particle 1 exhibits emission spectra with at least one emission peak having a full width half maximum strictly lower than 40 nm, 30 nm, 25 nm, 20 nm, 15 nm, or 10 nm.

According to one embodiment, the luminescent particle 1 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the luminescent particle 1 exhibits emission spectra with at least one emission peak having a full width at quarter maximum strictly lower than 90 nm, 80 nm, 70 nm, 60 nm, 50 nm, 40 nm, 30 nm, 25 nm, 20 nm, 15 nm, or 10 nm.

According to one embodiment, the luminescent particle 1 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the luminescent particle 1 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the luminescent particle 1 has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the luminescent particle 1 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one preferred embodiment, the luminescent particle 1 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{2}$, 70 $W.cm^{2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the luminescent particle 1 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW.cm^{-2}$, 50 $mW.cm^{-2}$, 100 $mW.cm^{-2}$, 500 $mW.cm^{2}$, 1 $W.cm^{-2}$, 5 $W.cm^{-2}$, 10 $W.cm^{2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one preferred embodiment, the luminescent particle 1 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 mW.cm$^{-2}$, 50 mW.cm$^{-2}$, 100 mW.cm$^{-2}$, 500 mW.cm$^{-2}$, 1 W.cm$^{2}$, 5 W.cm$^{-2}$, 10 W.cm$^{2}$, 20 W.cm$^{-2}$, 30 W.cm$^{-2}$, 40 W.cm$^{-2}$, 50 W.cm$^{2}$, 60 W.cm$^{-2}$, 70 W.cm$^{-2}$, 80 W.cm$^{2}$, 90 W.cm$^{-2}$, 100 W.cm$^{-2}$, 110 W.cm$^{-2}$, 120 W.cm$^{-2}$, 130 W.cm$^{-2}$, 140 W.cm$^{2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{2}$, 500 W.cm$^{-2}$, 600 W.cm$^{2}$, 700 W.cm$^{-2}$, 800 W.cm$^{2}$, 900 W.cm$^{-2}$, 1 kW.cm$^{-2}$, 50 kW.cm$^{-2}$, or 100 kW.cm$^{-2}$.

According to one embodiment, the luminescent particle 1 has a size above 50 nm.

According to one embodiment, the luminescent particle 1 has a size of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 or 1 mm.

According to one embodiment, a statistical set of luminescent particles 1 has an average size of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the luminescent particle 1 has a largest dimension of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the luminescent particle 1 has a smallest dimension of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the luminescent particle 1 is smaller than the largest dimension of said luminescent particle 1 by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the luminescent particles 1 have an average size of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the luminescent particle 1 has a smallest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 m$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the luminescent particle 1 has a largest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, in a statistical set of luminescent particles 1, said luminescent particles 1 are polydisperse.

According to one embodiment, in a statistical set of luminescent particles 1, said luminescent particles 1 are monodisperse.

According to one embodiment, in a statistical set of luminescent particles 1, said luminescent particles 1 have a narrow size distribution.

According to one embodiment, in a statistical set of luminescent particles 1, said luminescent particles 1 are not aggregated.

According to one embodiment, the surface roughness of the luminescent particle 1 is less or equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said luminescent particle 1, meaning that the surface of said luminescent particle 1 is completely smooth.

According to one embodiment, the surface roughness of the luminescent particle 1 is less or equal to 0.5% of the largest dimension of said luminescent particle 1, meaning that the surface of said luminescent particle 1 is completely smooth.

According to one embodiment, the luminescent particle 1 has a spherical shape, an ovoid shape, a discoidal shape, a cylindrical shape, a faceted shape, a hexagonal shape, a triangular shape, a cubic shape, or a platelet shape.

According to one embodiment, the luminescent particle 1 has a raspberry shape, a prism shape, a polyhedron shape, a snowflake shape, a flower shape, a thorn shape, a hemi-sphere shape, a cone shape, a urchin shape, a filamentous shape, a biconcave discoid shape, a worm shape, a tree shape, a dendrite shape, a necklace shape, a chain shape, or a bush shape.

According to one embodiment, the luminescent particle 1 has a spherical shape, or the luminescent particle 1 is a bead.

According to one embodiment, the luminescent particle 1 is hollow, i.e. the luminescent particle 1 is a hollow bead.

According to one embodiment, the luminescent particle 1 does not have a core/shell structure.

According to one embodiment, the luminescent particle 1 has a core/shell structure as described hereafter.

According to one embodiment, the luminescent particle 1 is not a fiber.

According to one embodiment, the luminescent particle 1 is not a matrix with undefined shape.

According to one embodiment, the luminescent particle 1 is not macroscopical piece of glass. In this embodiment, a piece of glass refers to glass obtained from a bigger glass entity for example by cutting it, or to glass obtained by using a mold. In one embodiment, a piece of glass has at least one dimension exceeding 1 mm.

According to one embodiment, the luminescent particle 1 is not obtained by reducing the size of the first material 11. For example, luminescent particle 1 is not obtained by milling a piece of first material 11, nor by cutting it, nor by firing it with projectiles like particles, atoms or electrons, or by any other method.

According to one embodiment, the luminescent particle 1 is not obtained by milling bigger particles or by spraying a powder.

According to one embodiment, the luminescent particle 1 is not a piece of nanometer pore glass doped with nanoparticle 3.

According to one embodiment, the luminescent particle 1 is not a glass monolith.

According to one embodiment, the spherical luminescent particle 1 has a diameter of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 or 1 mm.

According to one embodiment, a statistical set of spherical luminescent particles 1 has an average diameter of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical luminescent particles 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical luminescent particle 1 has a unique curvature of at least 200 $\mu m^{-1}$, 100 $\mu m^{-1}$, 66.6 $\mu m^{-1}$, 50 $\mu m^{-1}$, 33.3 $\mu m^{-1}$, 28.6 $\mu m^{-1}$, 25 $\mu m^{-1}$, 20 $\mu m^{-1}$, 18.2 $\mu m^{-1}$, 16.7 $\mu m^{-1}$, 15.4 $\mu m^{-1}$, 14.3 $\mu m^{-1}$, 13.3 $\mu m^{-1}$, 12.5 $\mu m^{-1}$, 11.8 $\mu m^{-1}$, 11.1 $\mu m^{-1}$, 10.5 $\mu m^{-1}$, 10 $\mu m^{-1}$, 9.5 $\mu m^{-1}$, 9.1 $\mu m^{-1}$, 8.7 $\mu m^{-1}$, 8.3 $\mu m^{-1}$, 8 $\mu m^{-1}$, 7.7 $\mu m^{-1}$, 7.4 $\mu m^{-1}$, 7.1 $\mu m^{-1}$, 6.9 $\mu m^{-1}$, 6.7 $\mu m^{-1}$, 5.7 $\mu m^{-1}$, 5 $\mu m^{-1}$, 4.4 $\mu m^{-1}$, 4 $\mu m^{-1}$, 3.6 $\mu m^{-1}$, 3.3 $\mu m^{-1}$, 3.1 $\mu m^{-1}$, 2.9 $\mu m^{-1}$, 2.7 $\mu m^{-1}$, 2.5 $\mu m^{-1}$, 2.4 $\mu m^{-1}$, 2.2 $\mu m^{-1}$, 2.1 $\mu m^{-1}$, 2 $\mu m^{-1}$, 1.3333 $\mu m^{-1}$, 0.8 $\mu m^{-1}$, 0.6666 $\mu m^{-1}$, 0.5714 $\mu m^{-1}$, 0.5 $\mu m^{-1}$, 0.4444 $\mu m^{-1}$, 0.4 $\mu m^{-1}$, 0.3636 $\mu m^{-1}$, 0.3333 $\mu m^{-1}$, 0.3080 $\mu m^{-1}$, 0.2857 $\mu m^{-1}$, 0.2667 $\mu m^{-1}$, 0.25 $\mu m^{-1}$, 0.2353 $\mu m^{-1}$, 0.2222 $\mu m^{-1}$, 0.2105 $\mu m^{-1}$, 0.2 $\mu m^{-1}$, 0.1905 $\mu m^{-1}$, 0.1818 $\mu m^{-1}$, 0.1739 $\mu m^{-1}$, 0.1667 $\mu m^{-1}$, 0.16 $\mu m^{-1}$, 0.1538 $\mu m^{-1}$, 0.1481 $\mu m^{-1}$, 0.1429 $\mu m^{-1}$, 0.1379 $\mu m^{-1}$, 0.1333 $\mu m^{-1}$, 0.1290 $\mu m^{-1}$, 0.125 $\mu m^{-1}$, 0.1212 $\mu m^{-1}$, 0.1176 $\mu m^{-1}$, 0.1176 $\mu m^{-1}$, 0.1143 $\mu m^{-1}$, 0.1111 $\mu m^{-1}$, 0.1881 $\mu m^{-1}$, 0.1053 $\mu m^{-1}$, 0.1026 $\mu m^{-1}$, 0.1 $\mu m^{-1}$, 0.0976 $\mu m^{-1}$, 0.9524 $\mu m^{-1}$, 0.0930 $\mu m^{-1}$, 0.0909 $\mu m^{-1}$, 0.0889 $\mu m^{-1}$, 0.870 $\mu m^{-1}$, 0.0851 $\mu m^{-1}$, 0.0833 $\mu m^{-1}$, 0.0816 $\mu m^{-1}$, 0.08 $\mu m^{-1}$, 0.0784 $\mu m^{-1}$, 0.0769 $\mu m^{-1}$, 0.0755 $\mu m^{-1}$, 0.0741 $\mu m^{-1}$, 0.0727 $\mu m^{-1}$, 0.0714 $\mu m^{-1}$, 0.0702 $\mu m^{-1}$, 0.0690 $\mu m^{-1}$, 0.0678

μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$, 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, a statistical set of the spherical luminescent particles 1 has an average unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the curvature of the spherical luminescent particle 1 has no deviation, meaning that said luminescent particle 1 has a perfect spherical shape. A perfect spherical shape prevents fluctuations of the intensity of the scattered light.

According to one embodiment, the unique curvature of the spherical luminescent particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said luminescent particle 1.

Luminescent particle 1 with an average size less than 1 μm have several advantages compared to bigger particles comprising the same number of particles 2: i) increasing the light scattering compared to bigger particles; ii) obtaining more stable colloidal suspensions compared to bigger particles, when they are dispersed in a solvent; iii) having a size compatible with pixels of at least 100 nm. Luminescent particle 1 with an average size larger than 1 μm have several advantages compared to smaller particles comprising the same number of particles 2: i) reducing light scattering compared to smaller particles; ii) having whispering-gallery wave modes; iii) having a size compatible with pixels larger than or equal to 1 μm; iv) increasing the average distance between nanoparticles 3 comprised in the at least one particle 2 comprised in the luminescent particle 1, resulting in a better heat draining; v) increasing the average distance between nanoparticles 3 comprised in the at least one particle 2 comprised in the luminescent particle 1 and the surface of said luminescent particles 1, thus better protecting the nanoparticles 3 against oxidation, or delaying oxidation resulting from a chemical reaction with chemical species coming from the outer space of said luminescent particles 1; vi) increasing the mass ratio between the luminescent particle 1 and nanoparticle 3 comprised in said at least one particle 2 comprised in the luminescent particle 1 compared to smaller luminescent particles 1, thus reducing the mass concentration of chemical elements subject to ROHS standards, making it easier to comply with ROHS requirements.

According to one embodiment, the luminescent particle 1 is ROHS compliant.

According to one embodiment, the luminescent particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the luminescent particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the luminescent particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the luminescent particle 1 comprises heavier chemical elements than the main chemical element present in the first and/or second materials (1, 2). In this embodiment, said heavy chemical elements in the luminescent particle 1 will lower the mass concentration of chemical elements subject to ROHS standards, allowing said luminescent particle 1 to be ROHS compliant.

According to one embodiment, examples of heavy chemical elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the luminescent particle 1 exhibits at least one other property so that the luminescent particle 1 is also: magnetic; ferromagnetic; paramagnetic; superparamagnetic; diamagnetic; plasmonic; piezo-electric; pyro-electric; ferro-electric; drug delivery featured; a light scatterer; an electrical insulator; an electrical conductor; a thermal insulator; a thermal conductor; and/or a local high temperature heating system.

According to one embodiment, the luminescent particle 1 exhibits at least one other property comprising one or more of the following: capacity of increasing local electromagnetic field, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the luminescent particle 1 is an electrical insulator. In this embodiment, the quenching of fluorescent properties for fluorescent nanoparticles 3 encapsulated in the second material 21 is prevented when it is due to electron transport. In this embodiment, the luminescent particle 1 may be used as an electrical insulator material exhibiting the same properties as the nanoparticles 3 encapsulated in the second material 21.

According to one embodiment, the luminescent particle 1 is an electrical conductor. This embodiment is particularly advantageous for an application of the luminescent particle 1 in photovoltaics or LEDs.

According to one embodiment, the luminescent particle 1 has an electrical conductivity at standard conditions ranging from $1\times10^{20}$ to $10^{7}$ S/m, preferably from $1\times10^{-15}$ to 5 S/m, more preferably from $1\times10^{-7}$ to 1 S/m.

According to one embodiment, the luminescent particle 1 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, 0.5×10 S/m, 1×10 S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^{2}$ S/m, $5\times10^{2}$ S/m, $10^{3}$ S/m, $5\times10^{3}$ S/m, $10^{4}$ S/m, $5\times10^{4}$ S/m, $10^{5}$ S/m, $5\times10^{5}$ S/m, $10^{6}$ S/m, $5\times10^{6}$ S/m, or $10^{7}$ S/m.

According to one embodiment, the electrical conductivity of the luminescent particle 1 may be measured for example with an impedance spectrometer.

According to one embodiment, the luminescent particle 1 is a thermal insulator.

According to one embodiment, the luminescent particle 1 is a thermal conductor. In this embodiment, the luminescent particle 1 is capable of draining away the heat originating from the nanoparticles 3 encapsulated in the second material 21, or from the environment.

According to one embodiment, the luminescent particle 1 has a thermal conductivity at standard conditions ranging from 0.1 to 450 W/(m.K), preferably from 1 to 200 W/(m.K), more preferably from 10 to 150 W/(m.K).

According to one embodiment, the luminescent particle 1 has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9

W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

According to one embodiment, the thermal conductivity of the luminescent particle 1 may be measured for example by steady-state methods or transient methods.

According to one embodiment, the luminescent particle 1 is hydrophobic.

According to one embodiment, the luminescent particle 1 is hydrophilic.

According to one embodiment, the luminescent particle 1 is surfactant-free. In this embodiment, the surface of the luminescent particle 1 will be easy to functionalize as said surface will not be blocked by any surfactant molecule.

According to one embodiment, the luminescent particle 1 is not surfactant-free. According to one embodiment, the luminescent particle 1 is amorphous. According to one embodiment, the luminescent particle 1 is crystalline.

According to one embodiment, the luminescent particle 1 is totally crystalline.

According to one embodiment, the luminescent particle 1 is partially crystalline.

According to one embodiment, the luminescent particle 1 is monocrystalline.

According to one embodiment, the luminescent particle 1 is polycrystalline. In this embodiment, the luminescent particle 1 comprises at least one grain boundary.

According to one embodiment, the luminescent particle 1 is porous.

According to one embodiment, the luminescent particle 1 is considered porous when the quantity adsorbed by the luminescent particle 1 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the luminescent particle 1 can be hexagonal, vermicular or cubic.

According to one embodiment, the organized porosity of the luminescent particle 1 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the luminescent particle 1 is not porous.

According to one embodiment, the luminescent particle 1 does not comprise pores or cavities.

According to one embodiment, the luminescent particle 1 is considered non-porous when the quantity adsorbed by the said luminescent particle 1 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the luminescent particle 1 is permeable.

According to one embodiment, the permeable luminescent particle 1 has an intrinsic permeability to fluids higher or equal to $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the luminescent particle 1 is impermeable to outer molecular species, gas or liquid. In this embodiment, outer molecular species, gas or liquid refers to molecular species, gas or liquid external to said luminescent particle 1.

According to one embodiment, the impermeable luminescent particle 1 has an intrinsic permeability to fluids less or equal to $10^{-11}$ cm$^2$, $10^{-12}$ cm$^2$, $10^{-13}$ cm$^2$, $10^{-14}$ cm$^2$, or $10^{-15}$ cm$^2$.

According to one embodiment, the luminescent particle 1 has an oxygen transmission rate ranging from $10^{-7}$ to 10 cm$^3$.m$^{-2}$.day$^{-1}$, preferably from $10^{-7}$ to 1 cm$^3$.m$^{-2}$.day$^{-1}$, more preferably from $10^{-7}$ to $10^{-1}$ cm$^3$.m$^{-2}$.day$^{-1}$, even more preferably from $10^{-7}$ to $10^{-4}$ cm$^3$.m$^{-2}$.day$^{-1}$ at room temperature.

According to one embodiment, the luminescent particle 1 has a water vapor transmission rate ranging from $10^{-7}$ to 10 g.m$^{-2}$.day$^{-1}$, preferably from $10^{-7}$ to 1 g.m$^{-2}$.day$^{-1}$, more preferably from $10^{-6}$ to $10^{-1}$ g.m$^{-2}$.day$^{-1}$, even more preferably from $10^{-7}$ to $10^{-4}$ g.m$^{-2}$.day$^{-1}$ at room temperature. A water vapor transmission rate of $10^{-6}$ g.m$^{-2}$.day$^{-1}$ is particularly adequate for a use on LED.

According to one embodiment, the luminescent particle 1 is optically transparent, i.e. the luminescent particle 1 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the luminescent particle 1 is a homostructure.

According to one embodiment, the luminescent particle 1 is not a core/shell structure wherein the core does not comprise particles 2 and the shell comprises particles 2.

According to one embodiment as illustrated in FIG. 6A-D, the luminescent particle 1 is a heterostructure, comprising a core 12 and at least one shell 13.

According to one embodiment, the shell 13 of the core/shell luminescent particle 1 comprises an inorganic material. In this embodiment, said inorganic material is the same or different than the first material 11 comprised in the core 12 of the core/shell luminescent particle 1.

According to one embodiment, the shell 13 of the core/shell luminescent particle 1 consists of an inorganic material. In this embodiment, said inorganic material is the same or different than the first material 11 comprised in the core 12 of the core/shell luminescent particle 1.

According to one embodiment illustrated in FIG. 6A, the core 12 of the core/shell luminescent particle 1 comprises at least one particle 2 as described herein and the shell 13 of the core/shell luminescent particle 1 does not comprise particles 2.

According to one embodiment illustrated in FIG. 6C, the core 12 of the core/shell luminescent particle 1 comprises at least one particle 2 as described herein and the shell 13 of the core/shell luminescent particle 1 comprises at least one particle 2.

According to one embodiment illustrated in FIG. 6D, the core 12 of the core/shell luminescent particle 1 comprises at least one particle 2 as described herein and the shell 13 of the core/shell luminescent particle 1 comprises at least one nanoparticle 3. In this embodiment, said at least one nanoparticle 3 comprised in the shell 13 may be different or identical to the at least one nanoparticle 3 dispersed in the second material 21 of the at least one particle 2 comprised in the core 12.

According to one embodiment, the at least one particle 2 comprised in the core 12 of the core/shell luminescent particle 1 is identical to the at least one particle 2 comprised in the shell 13 of the core/shell luminescent particle 1.

According to one embodiment, the at least one particle 2 comprised in the core 12 of the core/shell luminescent particle 1 is different to the at least one particle 2 comprised in the shell 13 of the core/shell luminescent particle 1. In this embodiment, the resulting core/shell luminescent particle 1 will exhibit different properties.

According to one embodiment, the core 12 of the core/shell luminescent particle 1 comprises at least one luminescent particle 2 and the shell 13 of the core/shell luminescent particle 1 comprises at least one particle 2 selected in the group of magnetic particle, plasmonic particle, dielectric particle, piezoelectric particle, pyro-electric particle, ferro-electric particle, light scattering particle, electrically insulating particle, thermally insulating particle, or catalytic particle.

According to one embodiment, the shell 13 of the core/shell luminescent particle 1 comprises at least one luminescent particle 2 and the core 12 of the core/shell luminescent particle 1 comprises at least one particle 2 selected in the group of magnetic particle, plasmonic particle, dielectric particle, piezoelectric particle, pyro-electric particle, ferro-electric particle, light scattering particle, electrically insulating particle, thermally insulating particle, or catalytic particle.

In a preferred embodiment, the core 12 of the core/shell luminescent particle 1 and the shell 13 of the core/shell luminescent particle 1 comprise at least two different luminescent particles 2, wherein said luminescent particles 2 emit at different emission wavelengths. This means that the core 12 comprises at least one luminescent nanoparticle and the shell 13 comprises at least one luminescent nanoparticle, said luminescent nanoparticles having different emission wavelengths.

In a preferred embodiment, the core 12 of the core/shell luminescent particle 1 and the shell 13 of the core/shell luminescent particle 1 comprise at least two different luminescent particles 2, wherein at least one luminescent particle 2 emits at a wavelength in the range from 500 to 560 nm, and at least one luminescent particle 2 emits at a wavelength in the range from 600 to 2500 nm. In this embodiment, the core 12 of the core/shell luminescent particle 1 and the shell 13 of the core/shell luminescent particle 1 comprise at least one luminescent particle 2 emitting in the green region of the visible spectrum and at least one luminescent particle 2 emitting in the red region of the visible spectrum, thus the luminescent particle 1 paired with a blue LED will be a white light emitter.

In a preferred embodiment, the core 12 of the core/shell luminescent particle 1 and the shell 13 of the core/shell luminescent particle 1 comprise at least two different luminescent particles 2, wherein at least one luminescent particle 2 emits at a wavelength in the range from 400 to 490 nm, and at least one luminescent particle 2 emits at a wavelength in the range from 600 to 2500 nm. In this embodiment, the core 12 of the core/shell luminescent particle 1 and the shell 13 of the core/shell luminescent particle 1 comprise at least one luminescent particle 2 emitting in the blue region of the visible spectrum and at least one luminescent particle 2 emitting in the red region of the visible spectrum, thus the luminescent particle 1 will be a white light emitter.

In a preferred embodiment, the core 12 of the core/shell luminescent particle 1 and the shell 13 of the core/shell luminescent particle 1 comprise comprises at least two different luminescent particles 2, wherein at least one luminescent particle 2 emits at a wavelength in the range from 400 to 490 nm, and at least one luminescent particle 2 emits at a wavelength in the range from 500 to 560 nm. In this embodiment, the core 12 of the core/shell luminescent particle 1 and the shell 13 of the core/shell luminescent particle 1 comprise at least one luminescent particle 2 emitting in the blue region of the visible spectrum and at least one luminescent particle 2 emitting in the green region of the visible spectrum.

According to one embodiment, the shell 13 of the luminescent particle 1 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the shell 13 of the luminescent particle 1 has a thickness homogeneous all along the core 12, i.e. the shell 13 of the luminescent particle 1 has a same thickness all along the core 12.

According to one embodiment, the shell 13 of the luminescent particle 1 has a thickness heterogeneous along the core 12, i.e. said thickness varies along the core 12.

According to one embodiment, the luminescent particle 1 is not a core/shell particle wherein the core is an aggregate of metallic particles and the shell comprises the first material 11. According to one embodiment, the luminescent particle 1 is a core/shell particle wherein the core is filled with solvent and the shell comprises at least one particle 2 dispersed in a first material 11, i.e. said luminescent particle 1 is a hollow bead with a solvent filled core.

According to one embodiment, the luminescent particle 1 comprises one particle 2 dispersed in the first material 11.

According to one embodiment, the luminescent particle 1 is not a core/shell particle wherein the core is an aggregate of particles and the shell comprises the first material 11.

According to one embodiment, the luminescent particle 1 is not a core/shell particle wherein the core is an aggregate of metallic particles and the shell comprises the first material 11.

According to one embodiment, the luminescent particle 1 does not comprise only one particle 2 dispersed in the first material 11. In this embodiment, the luminescent particle 1 is not a core/shell particle wherein the at least one particle 2 is the core with a shell of the first material 11.

According to one embodiment, the luminescent particle 1 does not comprise only one core/shell particle 2 dispersed in the first material 11, i.e. the luminescent particle 1 is not a core/shell/shell particle, wherein the at least one core/shell particle 2 is the core with a first shell, and the second shell is made of the first material 11.

According to one embodiment, the luminescent particle 1 comprises at least two particles 2 dispersed in the first material 11.

According to one embodiment, the luminescent particle 1 comprises a plurality of particles 2 dispersed in the first material 11.

According to one embodiment, the luminescent particle 1 comprises at least 1, at least 2, at least 3, at least 4, at least 5, at least 6, at least 7, at least 8, at least 9, at least 10, at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 particles 2 dispersed in the first material 11.

According to one embodiment, the luminescent particle 1 comprises a combination of at least two different particles 2. In this embodiment, the resulting luminescent particle 1 will exhibit different properties.

In a preferred embodiment illustrated in FIG. 5, the luminescent particle 1 comprises at least two different particles 2, wherein at least one particle 2 emits at a wavelength in the range from 500 to 560 nm, and at least one particle 2 emits at a wavelength in the range from 600 to 2500 nm. In this embodiment, the luminescent particle 1 comprises at least one particle 2 emitting in the green region of the visible spectrum and at least one particle 2 emitting in the red region of the visible spectrum, thus the luminescent particle 1 paired with a blue LED will be a white light emitter.

In a preferred embodiment, the luminescent particle 1 comprises at least two different particles 2, wherein at least one particle 2 emits at a wavelength in the range from 400 to 490 nm, and at least one particle 2 emits at a wavelength in the range from 600 to 2500 nm. In this embodiment, the luminescent particle 1 comprises at least one particle 2 emitting in the blue region of the visible spectrum and at least one particle 2 emitting in the red region of the visible spectrum, thus the luminescent particle 1 will be a white light emitter.

In a preferred embodiment, the luminescent particle 1 comprises at least two different particles 2, wherein at least one particle 2 emits at a wavelength in the range from 400 to 490 nm, and at least one particle 2 emits at a wavelength in the range from 500 to 560 nm. In this embodiment, the luminescent particle 1 comprises at least one particle 2 emitting in the blue region of the visible spectrum and at least one particle 2 emitting in the green region of the visible spectrum.

In a preferred embodiment, the luminescent particle 1 comprises three different particles 2, wherein said particles 2 emit different emission wavelengths or color.

In a preferred embodiment, the luminescent particle 1 comprises at least three different particles 2, wherein at least one particle 2 emits at a wavelength in the range from 400 to 490 nm, at least one particle 2 emits at a wavelength in the range from 500 to 560 nm and at least one particle 2 emits at a wavelength in the range from 600 to 2500 nm. In this embodiment, the luminescent particle 1 comprises at least one particle 2 emitting in the blue region of the visible spectrum, at least one particle 2 emitting in the green region of the visible spectrum and at least one particle 2 emitting in the red region of the visible spectrum.

According to one embodiment, each particle 2 is totally surrounded by or encapsulated in the first material 11.

According to one embodiment, each particle 2 is partially surrounded by or encapsulated in the first material 11.

In a preferred embodiment, the luminescent particle 1 does not comprise any particle 2 on its surface. In this embodiment, the at least particle 2 is completely surrounded by the first material 11.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of particles 2 are comprised in the first material 11. In this embodiment, each of said particles 2 is completely surrounded by the first material 11.

According to one embodiment, the luminescent particle 1 comprises at least 100%, 95%, 90%, 85%, 80%, 75%, 70%, 65%, 60%, 55%, 50%, 45%, 40%, 35%, 30%, 25%, 20%, 15%, 10%, 5%, 1% or 0% of particles 2 on its surface.

According to one embodiment illustrated in FIG. 7A-B, the luminescent particle 1 comprises at least one particle 2 located on the surface of said luminescent particle 1.

According to one embodiment illustrated in FIG. 8A-B, the luminescent particle 1 comprises at least one particle 2 dispersed in the first material 11, i.e. totally surrounded by said first material 11; and at least one particle 2 located on the surface of said luminescent particle 1.

According to one embodiment, the luminescent particle 1 comprises at least one particle 2 dispersed in the first material 11, wherein said at least one particle 2 emits at a wavelength in the range from 500 to 560 nm; and at least one particle 2 located on the surface of said luminescent particle 1, wherein said at least one particle 2 emits at a wavelength in the range from 600 to 2500 nm.

According to one embodiment, the luminescent particle 1 comprises at least one particle 2 dispersed in the first material 11, wherein said at least one particle 2 emits at a wavelength in the range from 600 to 2500 nm; and at least one particle 2 located on the surface of said luminescent particle 1, wherein said at least one particle 2 emits at a wavelength in the range from 500 to 560 nm.

According to one embodiment, the at least one particle 2 is only located on the surface of said luminescent particle 1. This embodiment is advantageous as the at least one particle 2 will be better excited by the incident light than if said particle 2 was dispersed in the first material 11.

According to one embodiment, the at least one particle 2 located on the surface of said luminescent particle 1 may be chemically or physically adsorbed on said surface.

According to one embodiment illustrated in FIG. 7A and FIG. 8A, the at least one particle 2 located on the surface of said luminescent particle 1 may be adsorbed on said surface.

According to one embodiment illustrated in FIG. 7A and FIG. 8A, the at least one particle 2 located on the surface of said luminescent particle 1 may be adsorbed with a cement on said surface.

According to one embodiment, examples of cement include but are not limited to: polymers, silicone, oxides, or a mixture thereof.

According to one embodiment illustrated in FIG. 7B and FIG. 8B, the at least one particle 2 located on the surface of said luminescent particle 1 may have at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of its volume trapped in the first material 11.

According to one embodiment, the plurality of particles 2 is uniformly spaced on the surface of the luminescent particle 1.

According to one embodiment, each particle 2 of the plurality of particles 2 is spaced from its adjacent particle 2 by an average minimal distance.

According to one embodiment, the average minimal distance between two particles 2 is controlled.

According to one embodiment, the average minimal distance between two particles 2 on the surface of the luminescent particle 1 is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 nm, 20.5 nm, 21 nm, 21.5 nm, 22 nm, 22.5 nm, 23 nm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 nm, 43.5 nm, 44 nm, 44.5 nm, 45 nm, 45.5 nm, 46 nm, 46.5 nm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 nm, 71 nm, 71.5 nm, 72 μm, 72.5 μm, 73 μm, 73.5 μm, 74 μm, 74.5 μm, 75 μm, 75.5 μm, 76 μm, 76.5 nm, 77 nm, 77.5 nm, 78 nm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 2 on the surface of the luminescent particle 1 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 2 on the surface of the luminescent particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment illustrated in FIG. 9, the luminescent particle 1 further comprises at least one nanoparticle 3 dispersed in the first material 11. In this embodiment, said at least one nanoparticle 3 is not dispersed in the second material 12; said at least one nanoparticle 3 may be identical or different from the at least one nanoparticle 3 encapsulated in the second particle 2.

According to one embodiment, the luminescent particle 1 comprises at least one nanoparticle 3 dispersed in the first material 11, wherein said at least one nanoparticle 3 emits at a wavelength in the range from 500 to 560 nm; and at least one nanoparticle 3 in the at least one particle 2, wherein said at least one nanoparticle 3 emits at a wavelength in the range from 600 to 2500 nm.

According to one embodiment, the luminescent particle 1 comprises at least one nanoparticle 3 dispersed in the first material 11, wherein said at least one nanoparticle 3 emits at a wavelength in the range from 600 to 2500 nm; and at least one nanoparticle 3 in the at least one particle 2, wherein said at least one nanoparticle 3 emits at a wavelength in the range from 500 to 560 nm.

According to one embodiment, the luminescent particle 1 exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

Photoluminescence refers to fluorescence and/or phosphorescence.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In one embodiment, the luminescent particle 1 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW.cm^{-2}$ and 100 $kW.cm^{-2}$, more preferably between 10 $mW.cm^{-2}$ and 100 $W.cm^{-2}$, and even more preferably between 10 $mW.cm^{-2}$ and 30 $W.cm^{-2}$.

According to one embodiment, the photon flux or average peak pulse power of the illumination is at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180

W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{-2}$, or 100 kW.cm$^{-2}$.

According to one embodiment, the light illumination described herein provides continuous lighting.

According to one embodiment, the light illumination described herein provides pulsed light.

This embodiment is particularly advantageous as it allows the evacuation of heat and/or electrical charges from nanoparticles 3. This embodiment is also particularly advantageous as using pulsed light allow a longer lifespan of the nanoparticles 3, thus of the luminescent particles 1, indeed under continuous light, nanoparticles 3 degrade faster than under pulsed light.

According to one embodiment, the light illumination described herein provides pulsed light. In this embodiment, if a continuous light illuminates a material with regular periods during which said material is voluntary removed from the illumination, said light may be considered as pulsed light. This embodiment is particularly advantageous as it allows the evacuation of heat and/or electrical charges from nanoparticles 3.

According to one embodiment, said pulsed light has a time off (or time without illumination) of at least 1 µsecond, 2 µseconds, 3 µseconds, 4 µseconds, 5 µseconds, 6 µseconds, 7 µseconds, 8 µseconds, 9 µseconds, 10 µseconds, 11 µseconds, 12 µseconds, 13 µseconds, 14 µseconds, 15 µseconds, 16 µseconds, 17 µseconds, 18 µseconds, 19 µseconds, 20 µseconds, 21 µseconds, 22 µseconds, 23 µseconds, 24 µseconds, 25 µseconds, 26 µseconds, 27 µseconds, 28 µseconds, 29 µseconds, 30 µseconds, 31 µseconds, 32 µseconds, 33 µseconds, 34 µseconds, 35 µseconds, 36 µseconds, 37 µseconds, 38 µseconds, 39 µseconds, 40 µseconds, 41 µseconds, 42 µseconds, 43 µseconds, 44 µseconds, 45 µseconds, 46 µseconds, 47 µseconds, 48 µseconds, 49 µseconds, 50 µseconds, 100 µseconds, 150 µseconds, 200 µseconds, 250 µseconds, 300 µseconds, 350 µseconds, 400 µseconds, 450 µseconds, 500 µseconds, 550 µseconds, 600 µseconds, 650 µseconds, 700 µseconds, 750 µseconds, 800 µseconds, 850 µseconds, 900 µseconds, 950 µseconds, 1 msecond, 2 mseconds, 3 mseconds, 4 mseconds, 5 mseconds, 6 mseconds, 7 mseconds, 8 mseconds, 9 mseconds, 10 mseconds, 11 mseconds, 12 mseconds, 13 mseconds, 14 mseconds, 15 mseconds, 16 mseconds, 17 mseconds, 18 mseconds, 19 mseconds, 20 mseconds, 21 mseconds, 22 mseconds, 23 mseconds, 24 mseconds, 25 mseconds, 26 mseconds, 27 mseconds, 28 mseconds, 29 mseconds, 30 mseconds, 31 mseconds, 32 mseconds, 33 mseconds, 34 mseconds, 35 mseconds, 36 mseconds, 37 mseconds, 38 mseconds, 39 mseconds, 40 mseconds, 41 mseconds, 42 mseconds, 43 mseconds, 44 mseconds, 45 mseconds, 46 mseconds, 47 mseconds, 48 mseconds, 49 mseconds, or 50 mseconds.

According to one embodiment, said pulsed light has a time on (or illumination time) of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, 1 µsecond, 2 µseconds, 3 µseconds, 4 µseconds, 5 µseconds, 6 µseconds, 7 µseconds, 8 µseconds, 9 µseconds, 10 µseconds, 11 µseconds, 12 µseconds, 13 µseconds, 14 µseconds, 15 µseconds, 16 µseconds, 17 µseconds, 18 µseconds, 19 µseconds, 20 µseconds, 21 µseconds, 22 µseconds, 23 µseconds, 24 µseconds, 25 µseconds, 26 µseconds, 27 µseconds, 28 µseconds, 29 µseconds, 30 µseconds, 31 µseconds, 32 µseconds, 33 µseconds, 34 µseconds, 35 µseconds, 36 µseconds, 37 µseconds, 38 µseconds, 39 µseconds, 40 µseconds, 41 µseconds, 42 µseconds, 43 µseconds, 44 µseconds, 45 µseconds, 46 µseconds, 47 µseconds, 48 µseconds, 49 µseconds, or 50 µseconds.

According to one embodiment, said pulsed light has a frequency of at least 10 Hz, 11 Hz, 12 Hz, 13 Hz, 14 Hz, 15 Hz, 16 Hz, 17 Hz, 18 Hz, 19 Hz, 20 Hz, 21 Hz, 22 Hz, 23 Hz, 24 Hz, 25 Hz, 26 Hz, 27 Hz, 28 Hz, 29 Hz, 30 Hz, 31 Hz, 32 Hz, 33 Hz, 34 Hz, 35 Hz, 36 Hz, 37 Hz, 38 Hz, 39 Hz, 40 Hz, 41 Hz, 42 Hz, 43 Hz, 44 Hz, 45 Hz, 46 Hz, 47 Hz, 48 Hz, 49 Hz, 50 Hz, 100 Hz, 150 Hz, 200 Hz, 250 Hz, 300 Hz, 350 Hz, 400 Hz, 450 Hz, 500 Hz, 550 Hz, 600 Hz, 650 Hz, 700 Hz, 750 Hz, 800 Hz, 850 Hz, 900 Hz, 950 Hz, 1 kHz, 2 kHz, 3 kHz, 4 kHz, 5 kHz, 6 kHz, 7 kHz, 8 kHz, 9 kHz, 10 kHz, 11 kHz, 12 kHz, 13 kHz, 14 kHz, 15 kHz, 16 kHz, 17 kHz, 18 kHz, 19 kHz, 20 kHz, 21 kHz, 22 kHz, 23 kHz, 24 kHz, 25 kHz, 26 kHz, 27 kHz, 28 kHz, 29 kHz, 30 kHz, 31 kHz, 32 kHz, 33 kHz, 34 kHz, 35 kHz, 36 kHz, 37 kHz, 38 kHz, 39 kHz, 40 kHz, 41 kHz, 42 kHz, 43 kHz, 44 kHz, 45 kHz, 46 kHz, 47 kHz, 48 kHz, 49 kHz, 50 kHz, 100 kHz, 150 kHz, 200 kHz, 250 kHz, 300 kHz, 350 kHz, 400 kHz, 450 kHz, 500 kHz, 550 kHz, 600 kHz, 650 kHz, 700 kHz, 750 kHz, 800 kHz, 850 kHz, 900 kHz, 950 kHz, 1 MHz, 2 MHz, 3 MHz, 4 MHz, 5 MHz, 6 MHz, 7 MHz, 8 MHz, 9 MHz, 10 MHz, 11 MHz, 12 MHz, 13 MHz, 14 MHz, 15 MHz, 16 MHz, 17 MHz, 18 MHz, 19 MHz, 20 MHz, 21 MHz, 22 MHz, 23 MHz, 24 MHz, 25 MHz, 26 MHz, 27 MHz, 28 MHz, 29 MHz, 30 MHz, 31 MHz, 32 MHz, 33 MHz, 34 MHz, 35 MHz, 36 MHz, 37 MHz, 38 MHz, 39 MHz, 40 MHz, 41 MHz, 42 MHz, 43 MHz, 44 MHz, 45 MHz, 46 MHz, 47 MHz, 48 MHz, 49 MHz, 50 MHz, or 100 MHz.

According to one embodiment, the spot area of the light which illuminates the luminescent particle 1, the particle 2, the nanoparticles 3 and/or the light emitting material 7 is at least 10 µm$^2$, 20 µm$^2$, 30 µm$^2$, 40 µm$^2$, 50 µm$^2$, 60 µm$^2$, 70 µm$^2$, 80 µm$^2$, 90 µm$^2$, 100 µm$^2$, 200 µm$^2$, 300 µm$^2$, 400 µm$^2$, 500 µm$^2$, 600 µm$^2$, 700 µm$^2$, 800 µm$^2$, 900 µm$^2$, $10^3$ µm$^2$, $10^4$ µm$^2$, $10^5$ µm$^2$, 1 mm$^2$, 10 mm$^2$, 20 mm$^2$, 30 mm$^2$, 40 mm$^2$, 50 mm$^2$, 60 mm$^2$, 70 mm$^2$, 80 mm$^2$, 90 mm$^2$, 100 mm$^2$, 200 mm$^2$, 300 mm$^2$, 400 mm$^2$, 500 mm$^2$, 600 mm$^2$, 700 mm$^2$, 800 mm$^2$, 900 mm$^2$, $10^3$ mm$^2$, $10^4$ mm$^2$, $10^5$ mm$^2$, 1 m$^2$, 10 m$^2$, 20 m$^2$, 30 m$^2$, 40 m$^2$, 50 m$^2$, 60 m$^2$, 70 m$^2$, 80 m$^2$, 90 m$^2$, or 100 m$^2$.

According to one embodiment, the emission saturation of the luminescent particle 1, the particle 2, the nanoparticles 3 and/or the light emitting material 7 is reached under a pulsed light with a peak pulse power of at least 1 W.cm$^{-2}$, 5

W.cm$^{-2}$, 10 W.cm$^{-2}$, 20 W.cm$^{-2}$, 30 W.cm$^{-2}$, 40 W.cm$^{-2}$, 50 W.cm$^{-2}$, 60 W.cm$^{-2}$, 70 W.cm$^{-2}$, 80 W.cm$^{2}$, 90 W.cm$^{-2}$, 100 W.cm$^{-2}$, 110 W.cm$^{-2}$, 120 W.cm$^{-2}$, 130 W.cm$^{2}$, 140 W.cm$^{-2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{2}$, 100 kW.cm$^{-2}$, 200 kW.cm$^{-2}$, 300 kW.cm$^{-2}$, 400 kW.cm$^{-2}$, 500 kW.cm$^{-2}$, 600 kW.cm$^{-2}$, 700 kW.cm$^{-2}$, 800 kW.cm$^{-2}$, 900 kW.cm$^{-2}$, or 1 MW.cm$^{-2}$.

According to one embodiment, the emission saturation of the luminescent particle 1, the particle 2, the nanoparticles 3 and/or the light emitting material 7 is reached under a continuous illumination with a peak pulse power of at least 1 W.cm$^{-2}$, 5 W.cm$^{-2}$, 10 W.cm$^{-2}$, 20 W.cm$^{-2}$, 30 W.cm$^{-2}$, 40 W.cm$^{-2}$, 50 W.cm$^{-2}$, 60 W.cm$^{-2}$, 70 W.cm$^{-2}$, 80 W.cm$^{-2}$, 90 W.cm$^{-2}$, 100 W.cm$^{-2}$, 110 W.cm$^{-2}$, 120 W.cm$^{-2}$, 130 W.cm$^{-2}$, 140 W.cm$^{-2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, or 1 kW.cm$^{-2}$.

Emission saturation of particles under illumination with a given photon flux occurs when said particles cannot emit more photons. In other words, a higher photon flux doesn't lead to a higher number of photons emitted by said particles.

According to one embodiment, the FCE (Frequency Conversion Efficiency) of illuminated luminescent particle 1, the particle 2, nanoparticles 3 and/or light emitting material 7 is of at least 1%, 2%, 3%, 4%, 5%, 6%, 7%, 8%, 9%, 10%, 15%, 16%, 17%, 18%, 18%, 19%, 20%, 21%, 22%, 23%, 24%, 25%, 30%, 35%, 40%, 45%, 50%, 55%, 60%, 65%, 70%, 75%, 80%, 85%, 90%, 95%, or 100%. In this embodiment, the FCE was measured at 480 nm.

In one embodiment, the luminescent particle 1 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW.cm$^{-2}$, 50 mW.cm$^{-2}$, 100 mW.cm$^{-2}$, 500 mW.cm$^{-2}$, 1 W.cm$^{-2}$, 5 W.cm$^{-2}$, 10 W.cm$^{-2}$, 20 W.cm$^{-2}$, 30 W.cm$^{-2}$, 40 W.cm$^{-2}$, 50 W.cm$^{-2}$, 60 W.cm$^{-2}$, 70 W.cm$^{-2}$, 80 W.cm$^{-2}$, 90 W.cm$^{-2}$, 100 W.cm$^{-2}$, 110 W.cm$^{-2}$, 120 W.cm$^{-2}$, 130 W.cm$^{-2}$, 140 W.cm$^{-2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{-2}$, or 100 kW.cm$^{-2}$.

In one embodiment, the luminescent particle 1 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW.cm$^{-2}$, 50 mW.cm$^{-2}$, 100 mW.cm$^{-2}$, 500 mW.cm$^{-2}$, 1 W.cm$^{-2}$, 5 W.cm$^{-2}$, 10 W.cm$^{-2}$, 20 W.cm$^{-2}$, 30 W.cm$^{-2}$, 40 W.cm$^{-2}$, 50 W.cm$^{-2}$, 60 W.cm$^{-2}$, 70 W.cm$^{-2}$, 80 W.cm$^{-2}$, 90 W.cm$^{-2}$, 100 W.cm$^{-2}$, 110 W.cm$^{-2}$, 120 W.cm$^{2}$, 130 W.cm$^{-2}$, 140 W.cm$^{-2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{-2}$, or 100 kW.cm$^{-2}$.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the luminescent particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment illustrated in FIG. 10A-B, the luminescent particle 1 further comprises at least one dense particle 9 dispersed in the first material 11. In this embodiment, said at least one dense particle 9 comprises a dense material with a density superior to the density of the first material 11.

According to one embodiment, the dense material has a bandgap superior or equal to 3 eV.

According to one embodiment, examples of dense material include but are not limited to: oxides such as for example tin oxide, silicon oxide, germanium oxide, aluminium oxide, gallium oxide, hafmium oxide, titanium oxide, tantalum oxide, ytterbium oxide, zirconium oxide, yttrium oxide, thorium oxide, zinc oxide, lanthanide oxides, actinide oxides, alkaline earth metal oxides, mixed oxides, mixed oxides thereof; metal sulfides; carbides; nitrides; or a mixture thereof.

According to one embodiment, the at least one dense particle 9 has a maximal packing fraction of 70%, 60%, 50%, 40%, 30%, 20%, 10% or 1%.

According to one embodiment, the at least one dense particle 9 has a density of at least 3, 4, 5, 6, 7, 8, 9 or 10.

According to one embodiment, the first material 11 and the second material 21 have a bandgap of at least 3.0 eV, 3.1 eV, 3.2 eV, 3.3 eV, 3.4 eV, 3.5 eV, 3.6 eV, 3.7 eV, 3.8 eV, 3.9 eV, 4.0 eV, 4.1 eV, 4.2 eV, 4.3 eV, 4.4 eV, 4.5 eV, 4.6 eV, 4.7 eV, 4.8 eV, 4.9 eV, 5.0 eV, 5.1 eV, 5.2 eV, 5.3 eV, 5.4 eV or 5.5 eV.

According to one embodiment, the first material 11 and/or the second material 21 have an extinction coefficient less or equal to $15\times10^{-5}$ at 460 nm.

In one embodiment, the extinction coefficient is measured by an absorbance measuring technique such as absorbance spectroscopy or any other method known in the art.

In one embodiment, the extinction coefficient is measured by an absorbance measurement divided by the length of the path light passing through the sample.

According to one embodiment, the first material 11 and/or the second material 21 are inorganic materials.

According to one embodiment, the first material 11 and/or the second material 21 do not comprise organic molecules.

According to one embodiment, the first material 11 and/or the second material 21 do not comprise polymers.

According to one embodiment, the first material 11 and/or the second material 21 comprise inorganic polymers.

According to one embodiment, the first material 11 and/or the second material 21 are selected from the group consisting of oxide materials, semiconductor materials, wide-bandgap semiconductor materials or a mixture thereof.

According to one embodiment, examples of semiconductor materials include but are not limited to: semiconductors, II-VI semiconductors, or a mixture thereof.

According to one embodiment, examples of wide-bandgap semiconductor materials include but are not limited to: silicon carbide SiC, aluminium nitride AlN, gallium nitride GaN, boron nitride BN, or a mixture thereof.

According to one embodiment, examples of oxide materials include but are not limited to: $SiO_2$, $Al_2O_3$, $TiO_2$, $ZrO_2$, FeO, ZnO, MgO, $SnO_2$, $Nb_2O_5$, $CeO_2$, BeO, $IrO_2$, CaO, $Sc_2O_3$, $Na_2O$, BaO, $K_2O$, $TeO_2$, MnO, $B_2O_3$, $GeO_2$, $As_2O_3$, $Ta_2O_5$, $Li_2O$, SrO, $Y_2O_3$, $HfO_2$, $MoO_2$, $Tc_2O_7$, $ReO_2$, $Co_3O_4$, OsO, $RhO_2$, $Rh_2O_3$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, the first material 11 and/or the second material 21 are selected from the group consisting of silicon oxide, aluminium oxide, titanium oxide, iron oxide, calcium oxide, magnesium oxide, zinc oxide, tin oxide, beryllium oxide, zirconium oxide, niobium oxide, cerium oxide, iridium oxide, scandium oxide, sodium oxide, barium oxide, potassium oxide, tellurium oxide, manganese oxide, boron oxide, germanium oxide, osmium oxide, rhenium oxide, arsenic oxide, tantalum oxide, lithium oxide, strontium oxide, yttrium oxide, hafnium oxide, molybdenum oxide, technetium oxide, rhodium oxide, cobalt oxide, gallium oxide, indium oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, silicon carbide SiC, aluminium nitride AlN, gallium nitride GaN, boron nitride BN, mixed oxides, mixed oxides thereof, or a mixture thereof.

According to one embodiment, the first material 11 and/or the second material 21 comprise or consist of a $ZrO_2/SiO_2$ mixture: $Si_xZr_{1-x}O_2$, wherein $0 \le x \le 1$. In this embodiment, the first material 11 and/or the second material 21 are able to resist to any pH in a range from 0 to 14. This allows for a better protection of the at least one nanoparticle 3.

According to one embodiment, the first material 11 and/or the second material 21 comprise or consist $Si_{0.8}Zr_{0.2}O_2$.

According to one embodiment, the first material 11 and/or the second material 21 comprise or consist of a $HfO_2/SiO_2$ mixture: $Si_xHf_{1-x}O_2$, wherein $0 \le x \le 1$.

According to one embodiment, the first material 11 and/or the second material 21 comprise or consist $Si_{0.8}Hf_{0.2}O_2$.

According to one embodiment, the first material 11 and/or the second material 21 comprise garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the first material 11 and/or the second material 21 comprise or consist of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, mixed oxides, mixed oxides thereof or a mixture thereof; x and y are independently a decimal number from 0 to 10, at the condition that x and y are not simultaneously equal to 0, and $x \neq 0$.

According to one embodiment, the first material 11 and/or the second material 21 comprise or consist of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, mixed oxides, mixed oxides thereof or a mixture thereof.

According to one embodiment, the first material 11 and/or the second material 21 comprise or consist of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, mixed oxides, mixed oxides thereof or a mixture thereof.

According to one embodiment, the first material 11 and/or the second material 21 comprise a material including but not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof, garnets such as for example $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the first material 11 and the second material 21 are independently chosen from the lists of materials cited herein.

According to one embodiment, the first material 11 and/or the second material 21 comprise organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said first material 11 and/or second material 21.

According to one embodiment, the first material 11 and/or the second material 21 do not comprise inorganic polymers.

According to one embodiment, the first material 11 and/or the second material 21 do not comprise $SiO_2$.

According to one embodiment, the first material 11 and/or the second material 21 do not consist of pure $SiO_2$, i.e. 100% $SiO_2$.

According to one embodiment, the first material 11 and/or the second material 21 comprise at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$.

According to one embodiment, the first material 11 and/or the second material 21 comprise less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$.

According to one embodiment, the first material 11 and/or the second material 21 comprise at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$ precursors.

According to one embodiment, the first material 11 and/or the second material 21 comprise less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$ precursors.

According to one embodiment, examples of precursors of $SiO_2$ include but are not limited to: tetramethyl orthosilicate, tetraethyl orthosilicate, polydiethyoxysilane, n-alkyltrimethoxylsilanes such as for example n-butyltrimethoxysilane, n-octyltrimethoxylsilane, n-dodecyltrimethoxysilane, n-octadecyltrimethoxysilane, 3-mercaptopropyltrimethoxysilane, 11-mercaptoundecyltrimethoxysilane, 3-aminopropyltrimethoxysilane, 11-aminoundecyltrimethoxysilane, 3-(2-(2-aminoethylamino)ethylamino)propyltrimethoxysilane, 3-(trimethoxysilyl)propyl methacrylate, 3-(aminopropyl)trimethoxysilane, or a mixture thereof.

According to one embodiment, the first material 11 and/or the second material 21 do not consist of pure $Al_2O_3$, i.e. 100% $Al_2O_3$.

According to one embodiment, the first material 11 and/or the second material 21 comprise at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$.

According to one embodiment, the first material 11 and/or the second material 21 comprise less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$.

According to one embodiment, the first material 11 and/or the second material 21 comprise at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$ precursors.

According to one embodiment, the first material 11 and/or the second material 21 comprise less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$ precursors.

According to one embodiment, the first material 11 and/or the second material 21 do not comprise $TiO_2$.

According to one embodiment, the first material 11 and/or the second material 21 do not consist of pure $TiO_2$, i.e. 100% $TiO_2$.

According to one embodiment, the first material 11 and/or the second material 21 do not comprise zeolite.

According to one embodiment, the first material 11 and/or the second material 21 do not consist of pure zeolite, i.e. 100% zeolite.

According to one embodiment, the first material 11 and/or the second material 21 do not comprise glass.

According to one embodiment, the first material 11 and/or the second material 21 do not comprise vitrified glass.

According to one embodiment, the first material 11 and/or the second material 21 comprise an inorganic polymer.

According to one embodiment, the inorganic polymer is a polymer not containing carbon. According to one embodiment, the inorganic polymer is selected from polysilanes, polysiloxanes (or silicones), polythiazyles, polyaluminosilicates, polygermanes, polystannanes, polyborazylenes, polyphosphazenes, polydichlorophosphazenes, polysulfides, polysulfur and/or nitrides. According to one embodiment, the inorganic polymer is a liquid crystal polymer.

According to one embodiment, the inorganic polymer is a natural or synthetic polymer. According to one embodiment, the inorganic polymer is synthetized by inorganic reaction, radical polymerization, polycondensation, polyaddition, or ring opening polymerization (ROP). According to one embodiment, the inorganic polymer is a homopolymer or a copolymer. According to one embodiment, the inorganic polymer is linear, branched, and/or cross-linked. According to one embodiment, the inorganic polymer is amorphous, semi-crystalline or crystalline.

According to one embodiment, the inorganic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55 000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95 000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the first material 11 and/or the second material 21 comprise additional heteroelements, wherein said additional heteroelements include but are not limited to: Cd, S, Se, Zn, In, Te, Hg, Sn, Cu, N, Ga, Sb, Tl, Mo, Pd, Ce, W, Co, Mn, Si, Ge, B, P, Al, As, Fe, Ti, Zr, Ni, Ca, Na, Ba, K, Mg, Pb, Ag, V, Be, Ir, Sc, Nb, Ta or a mixture thereof. In this embodiment, heteroelements can diffuse in the luminescent particle 1 and/or the at least one particle 2 during heating step. They may form nanoclusters inside the luminescent particle 1 and/or the at least one particle 2. These elements can limit the degradation of the photoluminescence of said luminescent particle 1 and/or the at least one particle 2 during the heating step, and/or drain away the heat if it is a good thermal conductor, and/or evacuate electrical charges.

According to one embodiment, the first material 11 and/or the second material 21 comprise additional heteroelements in small amounts of 0 mole %, 1 mole %, 5 mole %, 10 mole %, 15 mole %, 20 mole %, 25 mole %, 30 mole %, 35 mole %, 40 mole %, 45 mole %, 50 mole % relative to the majority element of said first material 11.

According to one embodiment, the first material 11 and/or the second material 21 comprise $Al_2O_3$, $SiO_2$, MgO, ZnO, $ZrO_2$, $TiO_2$, $IrO_2$, $SnO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, or $Y_2O_3$ additional nanoparticles. These additional nanoparticles can drain away the heat if it is a good thermal conductor, and/or evacuate electrical charges, and/or scatter an incident light.

According to one embodiment, the first material 11 and/or the second material 21 comprise additional nanoparticles in small amounts at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight compared to the luminescent particle 1 and/or the at least one particle 2.

According to one embodiment, the first material 11 and/or the second material 21 have a density ranging from 1 to 10, preferably the first material 11 has a density ranging from 3 to 10.

According to one embodiment, the first material 11 and/or the second material 21 have a density ranging from 1 to 10 g/cm$^3$, preferably the first material 11 has a density ranging from 3 to 10 g/cm$^3$.

According to one embodiment, the first material 11 has a density superior or equal to the density of the second material 21.

According to one embodiment, the refractive index of first material 11 and second material 21 is tuned by the first material 11 and second material 21 chosen.

According to one embodiment, the first material 11 and/or the second material 21 have a refractive index ranging from 1 to 5, from 1.2 to 2.6, from 1.4 to 2.0 at 450 nm.

According to one embodiment, the first material 11 and/or the second material 21 have a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, or 5.0 at 450 nm.

According to one embodiment, the first material 11 has the same refractive index than the second material 21.

According to one embodiment, the first material 11 has a refractive index distinct from the refractive index of the second material 21. This embodiment allows for a wider scattering of light. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the first material 11 has a refractive index superior or equal to the refractive index of the second material 21.

According to one embodiment, the first material 11 has a refractive index inferior to the refractive index of the second material 21.

According to one embodiment, the first material 11 has a difference of refractive index with the refractive index of the second material 21 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2 at 450 nm.

According to one embodiment, the first material 11 has a difference of refractive index with the refractive index of the second material 21 of 0.02 at 450 nm.

According to one embodiment, the first material 11 and/or the second material 21 act as a barrier against oxidation of the at least one nanoparticle 3.

According to one embodiment, the first material 11 and/or the second material 21 are thermally conductive.

According to one embodiment, the first material 11 and/or the second material 21 have a thermal conductivity at standard conditions ranging from 0.1 to 450 W/(m.K), preferably from 1 to 200 W/(m.K), more preferably from 10 to 150 W/(m.K).

According to one embodiment, the first material 11 and/or the second material 21 have a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1

W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

According to one embodiment, the thermal conductivity of the first material 11 and/or the second material 21 may be measured by for example by steady-state methods or transient methods.

According to one embodiment, the first material 11 and/or the second material 21 are not thermally conductive.

According to one embodiment, the first material 11 and/or the second material 21 comprise a refractory material.

According to one embodiment, the first material 11 and/or the second material 21 are electrically insulator. In this embodiment, the quenching of fluorescent properties for fluorescent nanoparticles encapsulated in the second material 21 is prevented when it is due to electron transport. In this embodiment, the luminescent particle 1 may be used as an electrical insulator material exhibiting the same properties as the nanoparticles 3 encapsulated in the second material 21.

According to one embodiment, the first material 11 and/or the second material 21 are electrically conductive. This embodiment is particularly advantageous for an application of the luminescent particle 1 in photovoltaics or LEDs.

According to one embodiment, the first material 11 and/or the second material 21 have an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the first material 11 and/or the second material 21 have an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the first material 11 and/or the second material 21 may be measured for example with an impedance spectrometer.

According to one embodiment, the first material 11 and/or the second material 21 are amorphous.

According to one embodiment, the first material 11 and/or the second material 21 are crystalline.

According to one embodiment, the first material 11 and/or the second material 21 are totally crystalline.

According to one embodiment, the first material 11 and/or the second material 21 are partially crystalline.

According to one embodiment, the first material 11 and/or the second material 21 are monocrystalline.

According to one embodiment, the first material 11 and/or the second material 21 are polycrystalline. In this embodiment, the first material 11 and/or the second material 21 comprise at least one grain boundary.

According to one embodiment, the first material 11 and/or the second material 21 are hydrophobic.

According to one embodiment, the first material 11 and/or the second material 21 are hydrophilic.

According to one embodiment, the first material 11 or the second material 21 is porous.

According to one embodiment, the first material 11 or the second material 21 is considered porous when the quantity adsorbed by the luminescent particle 1 or the at least one particle 2 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the first material 11 or the second material 21 can be hexagonal, vermicular or cubic.

According to one embodiment, the organized porosity of the first material 11 or the second material 21 have a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the first material 11 and/or the second material 21 are not porous.

According to one embodiment, the first material 11 and/or the second material 21 do not comprise pores or cavities.

According to one embodiment, the first material 11 and/or the second material 21 are considered non-porous when the quantity adsorbed by the luminescent particle 1 and/or the at least one particle 2 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the first material 11 or the second material 21 is permeable. In this embodiment, permeation of outer molecular species, gas or liquid in the first material 11 or the second material 21 is possible.

According to one embodiment, the permeable first material 11 or the second material 21 has an intrinsic permeability to fluids higher or equal to $10^{-20}$ $cm^2$, $10^{-19}$ $cm^2$, $10^{-18}$ $cm^2$, $10^{-17}$ $cm^2$, $10^{-16}$ $cm^2$, $10^{-15}$ $cm^2$, $10^{-14}$ $cm^2$, $10^{-13}$ $cm^2$, $10^{-12}$ $cm^2$, $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the first material 11 and/or the second material 21 are impermeable to outer molecular species, gas or liquid. In this embodiment, the first material 11 and/or the second material 21 limit or prevent the degradation of the chemical and physical properties of the at least one nanoparticle 3 from molecular oxygen, water and/or high temperature.

According to one embodiment, the impermeable first material 11 and/or the second material 21 have an intrinsic permeability to fluids less or equal to $10^{-11}$ $cm^2$, $10^{-12}$ $cm^2$, $10^{-13}$ cm$^2$, $10^{-14}$ cm$^2$, $10^{-15}$ cm$^2$, $10^{-16}$ cm$^2$, $10^{-17}$ cm$^2$, $10^{-18}$ cm$^2$, $10^{-19}$ cm$^2$, or $10^{-20}$ cm$^2$.

According to one embodiment, the first material 11 and/or the second material 21 limit or prevent the diffusion of outer molecular species or fluids (liquid or gas) into said first material 11 and/or said second material 21.

According to one embodiment, the first material 11 and/or the second material 21 are optically transparent, i.e. the first material 11 and/or the second material 21 are transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the first material 11 and/or the second material 21 do not absorb all incident light allowing the at least one nanoparticle 3 to absorb all the incident light; and/or the first material 11 and/or the second material 21 do not absorb the light emitted by the at least one nanoparticle 3 allowing to said light emitted to be transmitted through the first material 11 and/or the second material 21.

According to one embodiment, the first material 11 and/or the second material 21 are not optically transparent, i.e. the first material 11 and/or the second material 21 absorb light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the first material 11 and/or the second material 21 absorb part of the incident light allowing the at least one nanoparticle 3 to absorb only a part of the incident light; and/or the first material 11 and/or the second material 21 absorb part of the light emitted by the at least one nanoparticle 3 allowing said light emitted to be partially transmitted through the first material 11 and/or the second material 21.

According to one embodiment, the first material 11 and/or the second material 21 transmit at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the first material 11 and/or the second material 21 transmit a part of the incident light and emits at least one secondary light. In this embodiment, the resulting light is a combination of the remaining transmitted incident light.

According to one embodiment, the first material 11 and/or the second material 21 absorb the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the first material 11 and/or the second material 21 absorb the incident light with wavelength lower than 460 nm.

According to one embodiment, the first material 11 and/or the second material 21 have an extinction coefficient less or equal to $1\times10^{-5}$, $1.1\times10^{-5}$, $1.2\times10^{-5}$, $1.3\times10^{-5}$, $1.4\times10^{-5}$, $1.5\times10^{-5}$, $1.6\times10^{-5}$, $1.7\times10^{-5}$, $1.8\times10^{-5}$, $1.9\times10^{-5}$, $2\times10^{-5}$, $3\times10^{-5}$, $4\times10^{-5}$, $5\times10^{-5}$, $6\times10^{-5}$, $7\times10^{-5}$, $8\times10^{-5}$, $9\times10^{-5}$, $10\times10^{-5}$, $11\times10^{-5}$, $12\times10^{-5}$, $13\times10^{-5}$, $14\times10^{-5}$, $15\times10^{-5}$, $16\times10^{-5}$, $17\times10^{-5}$, $18\times10^{-5}$, $19\times10^{-5}$, $20\times10^{-5}$, $21\times10^{-5}$, $22\times10^{-5}$, $23\times10^{-5}$, $24\times10^{-5}$, or $25\times10^{-5}$ at 460 nm.

According to one embodiment, the first material 11 and/or the second material 21 have an attenuation coefficient less or equal to $1\times10^{-2}$ cm$^{-1}$, $1\times10^{-1}$ cm$^{-1}$, $0.5\times10^{-1}$ cm$^{-1}$, 0.1 cm$^{-1}$, 0.2 cm$^{-1}$, 0.3 cm$^{-1}$, 0.4 cm$^{-1}$, 0.5 cm$^{-1}$, 0.6 cm$^{-1}$, 0.7 cm$^{-1}$, 0.8 cm$^{-1}$, 0.9 cm$^{-1}$, 1 cm$^{-1}$, 1.1 cm$^{-1}$, 1.2 cm$^{-1}$, 1.3 cm$^{-1}$, 1.4 cm$^{-1}$, 1.5 cm$^{-1}$, 1.6 cm$^{-1}$, 1.7 cm$^{-1}$, 1.8 cm$^{-1}$, 1.9 cm$^{-1}$, 2.0 cm$^{-1}$, 2.5 cm$^{-1}$, 3.0 cm$^{-1}$, 3.5 cm$^{-1}$, 4.0 cm$^{-1}$, 4.5 cm$^{-1}$, 5.0 cm$^{-1}$, 5.5 cm$^{-1}$, 6.0 cm$^{-1}$, 6.5 cm$^{-1}$, 7.0 cm$^{-1}$, 7.5 cm$^{-1}$, 8.0 cm$^{-1}$, 8.5 cm$^{-1}$, 9.0 cm$^{-1}$, 9.5 cm$^{-1}$, 10 cm$^{-1}$, 15 cm$^{-1}$, 20 cm$^{-1}$, 25 cm$^{-1}$, or 30 cm$^{-1}$ at 460 nm.

According to one embodiment, the first material 11 and/or the second material 21 have an attenuation coefficient less or equal to $1\times10^{-2}$ cm$^{-1}$, $1\times10^{-1}$ cm$^{-1}$, $0.5\times10^{-1}$ cm$^{-1}$, 0.1 cm$^{-1}$, 0.2 cm$^{-1}$, 0.3 cm$^{-1}$, 0.4 cm$^{-1}$, 0.5 cm$^{-1}$, 0.6 cm$^{-1}$, 0.7 cm$^{-1}$, 0.8 cm$^{-1}$, 0.9 cm$^{-1}$, 1 cm$^{-1}$, 1.1 cm$^{-1}$, 1.2 cm$^{-1}$, 1.3 cm$^{-1}$, 1.4 cm$^{-1}$, 1.5 cm$^{-1}$, 1.6 cm$^{-1}$, 1.7 cm$^{-1}$, 1.8 cm$^{-1}$, 1.9 cm$^{-1}$, 2.0 cm$^{-1}$, 2.5 cm$^{-1}$, 3.0 cm$^{-1}$, 3.5 cm$^{-1}$, 4.0 cm$^{-1}$, 4.5 cm$^{-1}$, 5.0 cm$^{-1}$, 5.5 cm$^{-1}$, 6.0 cm$^{-1}$, 6.5 cm$^{-1}$, 7.0 cm$^{-1}$, 7.5 cm$^{-1}$, 8.0 cm$^{-1}$, 8.5 cm$^{-1}$, 9.0 cm$^{-1}$, 9.5 cm$^{-1}$, 10 cm$^{-1}$, 15 cm$^{-1}$, 20 cm$^{-1}$, 25 cm$^{-1}$, or 30 cm$^{-1}$ at 450 nm.

According to one embodiment, the first material 11 and/or the second material 21 have an optical absorption cross section less or equal to $1.10^{-35}$ cm$^2$, $1.10^{-34}$ cm$^2$, $1.10^{-33}$ cm$^2$, $1.10^{-32}$ cm$^2$, $1.10^{-31}$ cm$^2$, $1.10^{-39}$ cm$^2$, $1.10^{-29}$ cm$^2$, $1.10^{-28}$ cm$^2$, $1.10^{-27}$ cm$^2$, $1.10^{-26}$ cm$^2$, $1.10^{-25}$ cm$^2$, $1.10^{-24}$ cm$^2$, $1.10^{-23}$ cm$^2$, $1.10^{-22}$ cm$^2$, $1.10^{-21}$ cm$^2$, $1.10^{-29}$ cm$^2$, $1.10^{-19}$ cm$^2$, $1.10^{-18}$ cm$^2$, $1.10^{-17}$ cm$^2$, $1.10^{-16}$ cm$^2$, $1.10^{-15}$ cm$^2$, $1.10^{-14}$ cm$^2$, $1.10^{-13}$ cm$^2$, $1.10^{-12}$ cm$^2$, $1.10^{-11}$ cm$^2$, $1.10^{-10}$ cm$^2$, $1.10^{-9}$ cm$^2$, $1.10^{-8}$ cm$^2$, $1.10^{-7}$ cm$^2$, $1.10^{-6}$ cm$^2$, $1.10^{-5}$ cm$^2$, $1.10^{-4}$ cm$^2$, $1.10^{-3}$ cm$^2$, $1.10^{-2}$ cm$^2$ or $1.10^{-1}$ cm$^2$ at 460 nm.

According to one embodiment, the first material 11 and/or the second material 21 are stable under acidic conditions, i.e. at pH inferior or equal to 7. In this embodiment, the first material 11 and/or the second material 21 are sufficiently robust to withstand acidic conditions, meaning that the properties of the luminescent particle 1 are preserved under said conditions.

According to one embodiment, the first material 11 and/or the second material 21 are stable under basic conditions, i.e. at pH superior to 7. In this embodiment, the first material 11 and/or the second material 21 are sufficiently robust to withstand basic conditions, meaning that the properties of the luminescent particle 1 are preserved under said conditions.

According to one embodiment, the first material 11 and/or the second material 21 are physically and chemically stable under various conditions. In this embodiment, the first material 11 and/or the second material 21 are sufficiently robust to withstand the conditions to which the luminescent particle 1 will be subjected.

According to one embodiment, the first material 11 and/or the second material 21 are physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the luminescent particle 1 will be subjected.

According to one embodiment, the first material 11 and/or the second material 21 are physically and chemically stable under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the luminescent particle 1 will be subjected.

According to one embodiment, the first material 11 and/or the second material 21 are physically and chemically stable under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the luminescent particle 1 will be subjected.

According to one embodiment, the first material 11 and/or the second material 21 are physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the luminescent particle 1 will be subjected.

According to one embodiment, the first material 11 and/or the second material 21 are physically and chemically stable under 0%, 10%, 20%, 30%, 40%, 50%, 55%, 60%, 65%, 70%, 75%, 80%, 85%, 90%, 95%, or 99% of humidity and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the luminescent particle 1 will be subjected.

According to one embodiment, the first material 11 and/or the second material 21 are physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the first material 11 and/or the second material 21 are sufficiently robust to withstand the conditions to which the luminescent particle 1 will be subjected.

According to one embodiment, the second material 21 is the same as the first material 11 as described hereabove.

According to one embodiment, the second material 21 is different from the first material 11 as described hereabove.

According to one embodiment, the at least one particle 2 is dispersed in the first material 11.

According to one embodiment, the at least one particle 2 is totally surrounded by or encapsulated in the first material 11.

According to one embodiment, the at least one particle 2 is partially surrounded by or encapsulated in the first material 11.

According to one embodiment, the at least one particle 2 is fluorescent.

According to one embodiment, the at least one particle 2 is phosphorescent.

According to one embodiment, the at least one particle 2 is electroluminescent.

According to one embodiment, the at least one particle 2 is chemiluminescent. According to one embodiment, the at least one particle 2 is triboluminescent.

According to one embodiment, the features of the light emission of particle 2 are sensible to external pressure variations. In this embodiment, "sensible" means that the features of the light emission can be modified by external pressure variations.

According to one embodiment, the wavelength emission peak of particle 2 is sensible to external pressure variations. In this embodiment, "sensible" means that the wavelength emission peak can be modified by external pressure variations, i.e. external pressure variations can induce a wavelength shift.

According to one embodiment, the FWHM of particle 2 is sensible to external pressure variations. In this embodiment, "sensible" means that the FWHM can be modified by external pressure variations, i.e. FWHM can be reduced or increased.

According to one embodiment, the PLQY of particle 2 is sensible to external pressure variations. In this embodiment, "sensible" means that the PLQY can be modified by external pressure variations, i.e. PLQY can be reduced or increased.

According to one embodiment, the features of the light emission of particle 2 are sensible to external temperature variations.

According to one embodiment, the wavelength emission peak of particle 2 is sensible to external temperature variations. In this embodiment, "sensible" means that the wavelength emission peak can be modified by external temperature variations, i.e. external temperature variations can induce a wavelength shift.

According to one embodiment, the FWHM of particle 2 is sensible to external temperature variations. In this embodiment, "sensible" means that the FWHM can be modified by external temperature variations, i.e. FWHM can be reduced or increased.

According to one embodiment, the PLQY of particle 2 is sensible to external temperature variations. In this embodiment, "sensible" means that the PLQY can be modified by external temperature variations, i.e. PLQY can be reduced or increased.

According to one embodiment, the features of the light emission of particle 2 are sensible to external variations of pH.

According to one embodiment, the wavelength emission peak of particle 2 is sensible to external variations of pH. In this embodiment, "sensible" means that the wavelength emission peak can be modified by external variations of pH, i.e. external variations of pH can induce a wavelength shift.

According to one embodiment, the FWHM of particle 2 is sensible to e external variations of pH. In this embodiment, "sensible" means that the FWHM can be modified by external variations of pH, i.e. FWHM can be reduced or increased.

According to one embodiment, the PLQY of particle 2 is sensible to external variations of pH. In this embodiment, "sensible" means that the PLQY can be modified by external variations of pH, i.e. PLQY can be reduced or increased.

According to one embodiment, the particle 2 comprise at least one nanoparticle 3 wherein the wavelength emission peak is sensible to external temperature variations; and at least one nanoparticle 3 wherein the wavelength emission peak is not or less sensible to external temperature variations. In this embodiment, "sensible" means that the wavelength emission peak can be modified by external temperature variations, i.e. wavelength emission peak can be reduced or increased. This embodiment is particularly advantageous for temperature sensor applications.

According to one embodiment, the at least one particle 2 exhibits an emission spectrum with at least one emission peak, wherein said emission peak has a maximum emission wavelength ranging from 400 nm to 50 μm.

According to one embodiment, the at least one particle 2 exhibits an emission spectrum with at least one emission peak, wherein said emission peak has a maximum emission wavelength ranging from 400 nm to 500 nm. In this embodiment, the at least one particle 2 emits blue light.

According to one embodiment, the at least one particle 2 exhibits an emission spectrum with at least one emission peak, wherein said emission peak has a maximum emission wavelength ranging from 500 nm to 560 nm, more preferably ranging from 515 nm to 545 nm. In this embodiment, the at least one particle 2 emits green light.

According to one embodiment, the at least one particle 2 exhibits an emission spectrum with at least one emission peak, wherein said emission peak has a maximum emission wavelength ranging from 560 nm to 590 nm. In this embodiment, the at least one particle 2 emits yellow light.

According to one embodiment, the at least one particle 2 exhibits an emission spectrum with at least one emission peak, wherein said emission peak has a maximum emission wavelength ranging from 590 nm to 750 nm, more preferably ranging from 610 nm to 650 nm. In this embodiment, the at least one particle 2 emits red light.

According to one embodiment, the at least one particle 2 exhibits an emission spectrum with at least one emission peak, wherein said emission peak has a maximum emission wavelength ranging from 750 nm to 50 μm. In this embodiment, the at least one particle 2 emits near infra-red, mid-infra-red, or infra-red light.

According to one embodiment, the at least one particle 2 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the at least one particle 2 exhibits emission spectra with at least one emission peak having a full width half maximum strictly lower than 40 nm, 30 nm, 25 nm, 20 nm, 15 nm, or 10 nm.

According to one embodiment, the at least one particle 2 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the at least one particle 2 exhibits emission spectra with at least one emission peak having a full width at quarter maximum strictly lower than 90 nm, 80 nm, 70 nm, 60 nm, 50 nm, 40 nm, 30 nm, 25 nm, 20 nm, 15 nm, or 10 nm.

According to one embodiment, the at least one particle 2 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the at least one particle 2 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the at least one particle 2 has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the particle 2 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900

$W.cm^{-2}$, 1 $kW.cm^{-2}$, 50 $kW.cm^{-2}$, or 100 $kW.cm^{-2}$. In this embodiment, the particle 2 preferably comprises quantum dots, semiconductor nanoparticles, semiconductor nanocrystals, or semiconductor nanoplatelets.

In one preferred embodiment, the particle 2 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the particle 2 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{2}$, 1 $kW.cm^{-2}$, 50 $kW.cm^{-2}$, or 100 $kW.cm^{-2}$. In this embodiment, the particle 2 preferably comprises quantum dots, semiconductor nanoparticles, semiconductor nanocrystals, or semiconductor nanoplatelets.

In one preferred embodiment, the particle 2 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300

$W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

According to one embodiment, the at least one particle 2 is a colloidal particle.

According to one embodiment, the at least one particle 2 is dispersible in aqueous solvents, organic solvents and/or mixture thereof.

According to one embodiment, the at least one particle 2 is not a metallic particle.

According to one embodiment, the at least one particle 2 comprising the second material 21 has a size above 20 nm.

According to one embodiment, the at least one particle 2 has a size of at least 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of particles 2 has an average size of at least 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5

μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the at least one particle 2 has a largest dimension of at least 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the at least one particle 2 has a smallest dimension of at least 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the at least one particle 2 smaller than the largest dimension of said at least one particle 2 by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the particles 2 have an average size of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44

μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the at least one particle 2 has a smallest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$, 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the at least one particle 2 has a largest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$ 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the surface roughness of the at least one particle 2 is less or equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said at least one particle 2, meaning that the surface of said at least one particle 2 is completely smooth.

According to one embodiment, the surface roughness of the at least one particle 2 is less or equal to 0.5% of the largest dimension of said at least one particle 2, meaning that the surface of said at least one particle 2 is completely smooth.

According to one embodiment, the at least one particle 2 has a spherical shape, an ovoid shape, a discoidal shape, a cylindrical shape, a faceted shape, a hexagonal shape, a triangular shape, a cubic shape, or a platelet shape.

According to one embodiment, the at least one particle 2 has a raspberry shape, a prism shape, a polyhedron shape, a snowflake shape, a flower shape, a thorn shape, a hemisphere shape, a cone shape, a urchin shape, a filamentous shape, a biconcave discoid shape, a worm shape, a tree shape, a dendrite shape, a necklace shape, a chain shape, or a bush shape.

According to one embodiment, the at least one particle 2 has a spherical shape, or the at least one particle 2 is a bead.

According to one embodiment, the particle 2 is hollow, i.e. the particle 2 is a hollow bead.

According to one embodiment, the particle 2 does not have a core/shell structure.

According to one embodiment, the particle 2 has a core/shell structure as described hereafter.

According to one embodiment, the spherical particle 2 has a diameter of at least 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of spherical particles 2 has an average diameter of at least 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical particles 2 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical particle 2 has a unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$ or 0.002 μm$^{-1}$.

According to one embodiment, a statistical set of the spherical particles 21 has an average unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2252 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the curvature of the spherical particle 2 has no deviation, meaning that said particle 2 has a perfect spherical shape. A perfect spherical shape prevents fluctuations of the intensity of the scattered light.

According to one embodiment, the unique curvature of the spherical particle 2 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said particle 2.

According to one embodiment, in a statistical set of particles 2, said particles 2 are polydisperse.

According to one embodiment, in a statistical set of particles 2, said particles 2 are monodisperse.

According to one embodiment, particles 2 in a same luminescent particle 1 are polydisperse.

According to one embodiment, particles 2 in a same luminescent particle 1 are monodisperse.

According to one embodiment, in a statistical set of particles 2, said particles 2 have a narrow size distribution.

According to one embodiment, the at least one particle 2 exhibits at least one other property so that the at least one particle 2 is also: magnetic; ferromagnetic; paramagnetic; superparamagnetic; diamagnetic; plasmonic; piezo-electric; pyro-electric; ferro-electric; drug delivery featured; a light scatterer; an electrical insulator; an electrical conductor; a thermal insulator; a thermal conductor; and/or a local high temperature heating system.

According to one embodiment, the at least one particle 2 exhibits at least one other property comprising one or more of the following: capacity of increasing local electromagnetic field, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the at least one particle 2 is an electrical insulator. In this embodiment, the quenching of fluorescent properties for fluorescent nanoparticles 3 encapsulated in the second material 21 is prevented when it is due to electron transport. In this embodiment, the at least one particle 2 may be used as an electrical insulator material exhibiting the same properties as the nanoparticles 3 encapsulated in the second material 21.

According to one embodiment, the at least one particle 2 is an electrical conductor. This embodiment is particularly advantageous for an application of the luminescent particle 1 in photovoltaics or LEDs.

According to one embodiment, the at least one particle 2 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the at least one particle 2 has an electrical conductivity at standard conditions of at least $1\times10^{-20}$ S/m, $0.5\times10^{-19}$ S/m, $1\times10^{-19}$ S/m, $0.5\times10^{-18}$ S/m, 1×10-18 S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the at least one particle 2 may be measured for example with an impedance spectrometer.

According to one embodiment, the at least one particle 2 is a thermal insulator.

According to one embodiment, the at least one particle 2 is a thermal conductor. In this embodiment, the at least one particle 2 is capable of draining away the heat originating from the nanoparticles 3 encapsulated in the second material 21, or from the environment.

According to one embodiment, the at least one particle 2 has a thermal conductivity at standard conditions ranging from 0.1 to 450 W/(m.K), preferably from 1 to 200 W/(m.K), more preferably from 10 to 150 W/(m.K).

According to one embodiment, the at least one particle 2 has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7

W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

According to one embodiment, the thermal conductivity of the at least one particle 2 may be measured for example by steady-state methods or transient methods.

According to one embodiment, the at least one particle 2 represents at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% by weight of the luminescent particle 1.

According to one embodiment, the loading charge of the at least one particle 2 in the luminescent particle 1 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of the at least one particle 2 in the luminescent particle 1 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the at least one particle 2 is not encapsulated in luminescent particle 1 via physical entrapment or electrostatic attraction.

According to one embodiment, the at least one particle 2 and the first material 1 are not bonded or linked by electrostatic attraction or a functionalized silane based coupling agent.

According to one embodiment, the at least one particle 2 comprised in the luminescent particle 1 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the particles 2 comprised in the same luminescent particle 1 are not aggregated.

According to one embodiment, the particles 2 comprised in the same luminescent particle 1 do not touch, are not in contact.

According to one embodiment, the particles 2 comprised in the same luminescent particle 1 are separated by first material 11.

According to one embodiment, the particles 2 comprised in the same luminescent particle 1 are aggregated.

According to one embodiment, the particles 2 comprised in the same luminescent particle 1 touch, are in contact.

According to one embodiment, the at least one particle 2 comprised in the same luminescent particle 1 can be individually evidenced.

According to one embodiment, the at least one particle 2 comprised in the same luminescent particle 1 can be individually evidenced by transmission electron microscopy or fluorescence scanning microscopy, or any other characterization means known by the person skilled in the art.

According to one embodiment, the plurality of particles 2 is uniformly dispersed in the first material 11.

The uniform dispersion of the plurality of particles 2 in the first material 11 comprised in the luminescent particle 1 prevents the aggregation of said particles 2, thereby preventing the degradation of their properties. For example, in the case of inorganic fluorescent particles, a uniform dispersion will allow the optical properties of said particles to be preserved, and quenching can be avoided.

According to one embodiment, the particles 2 comprised in a luminescent particle 1 are uniformly dispersed within the first material 11 comprised in said luminescent particle 1.

According to one embodiment, the particles 2 comprised in a luminescent particle 1 are dispersed within the first material 11 comprised in said luminescent particle 1.

According to one embodiment, the particles 2 comprised in a luminescent particle 1 are uniformly and evenly dispersed within the first material 11 comprised in said luminescent particle 1.

According to one embodiment, the particles 2 comprised in a luminescent particle 1 are evenly dispersed within the first material 11 comprised in said luminescent particle 1.

According to one embodiment, the particles 2 comprised in a luminescent particle 1 are homogeneously dispersed within the first material 11 comprised in said luminescent particle 1.

According to one embodiment, the dispersion of particles 2 in the first material 11 does not have the shape of a ring, or a monolayer.

According to one embodiment, each particle 2 of the plurality of particles 2 is spaced from its adjacent particle 2 by an average minimal distance.

According to one embodiment, the average minimal distance between two particles 2 is controlled.

According to one embodiment, the average minimal distance is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two particles 2 in the same luminescent particle 1 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 or 1 mm.

According to one embodiment, the average distance between two particles 2 in the same luminescent particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the at least one particle 2 is hydrophobic.

According to one embodiment, the at least one particle 2 is hydrophilic.

According to one embodiment, the at least one particle 2 is ROHS compliant.

According to one embodiment, the at least one particle 2 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the at least one particle 2 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the at least one particle 2 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the at least one particle 2 comprises at least 95%, 90%, 85%, 80%, 75%, 70%, 65%, 60%, 55%, 50%, 45%, 40%, 35%, 30%, 25%, 20%, 15%, 10%, 5%, 1% or 0% of nanoparticles 3 on its surface.

According to one embodiment, each nanoparticle 3 is totally surrounded by or encapsulated in the second material 21.

According to one embodiment, each nanoparticle 3 is partially surrounded by or encapsulated in the second material 21.

According to one embodiment, the at least one particle 2 does not comprise nanoparticles 3 on its surface.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of nanoparticles 3 are comprised in the second material 21. In this embodiment, each of said nanoparticles 3 is completely surrounded by the second material 21.

According to one embodiment, the at least one particle 2 has an oxygen transmission rate ranging from $10^{-7}$ to 10 $cm^3.m^{-2}.day^{-1}$, preferably from $10^{-7}$ to 1 $cm^3.m^{-2}.day^{-1}$, more preferably from $10^{-7}$ to $10^{-1}$ $cm^3.m^{-2}.day^{-1}$, even more preferably from $10^{-7}$ to $10^{-4}$ $cm^3.m^{-2}.day^{-1}$ at room temperature.

According to one embodiment, the at least one particle 2 has a water vapor transmission rate ranging from $10^{-7}$ to 10 $g.m^{-2}.day^{-1}$, preferably from $10^{-7}$ to 1 $g.m^{-2}.day^{-1}$, more preferably from $10^{-7}$ to $10^{-1}$ $g.m^{-2}.day^{-1}$, even more preferably from $10^{-7}$ to $10^{-4}$ $g.m^{-2}.day^{-1}$ at room temperature. A water vapor transmission rate of $10^{-6}$ $g.m^{-2}.day^{-1}$ is particularly adequate for a use on LED.

According to one embodiment, the at least one particle 2 is a homostructure. In this embodiment, the at least one particle 2 does not comprise a shell or a layer of a material surrounding (partially or totally) said at least one particle 2.

According to one embodiment, the at least one particle 2 is not a core/shell structure wherein the core does not comprise nanoparticles 3 and the shell comprises nanoparticles 3.

According to one embodiment, the at least one particle 2 does not comprise an organic shell or an organic layer. In this embodiment, the at least one particle 2 is not covered by any organic ligand or polymer shell.

According to one embodiment illustrated in FIG. 6B, the at least one particle 2 is a heterostructure, comprising a core 22 and at least one shell 23.

According to one embodiment, the at least one shell 23 is not an organic shell. In this embodiment, the at least one particle 2 is not covered by any organic ligand or by a polymeric shell.

According to one embodiment, the at least one shell 23 does not comprise an organic layer.

According to one embodiment, the shell 23 of the core/shell at least one particle 2 comprises an inorganic material. In this embodiment, said inorganic material is the same or different than the second material 21 comprised in the core 22 of the core/shell at least one particle 2.

According to one embodiment, the shell 23 of the core/shell at least one particle 2 consists of an inorganic material. In this embodiment, said inorganic material is the same or different than the second material 21 comprised in the core 22 of the core/shell at least one particle 2.

According to one embodiment, the core 22 of the core/shell at least one particle 2 comprises at least one nanoparticle 3 as described herein and the shell 23 of the core/shell at least one particle 2 does not comprise nanoparticles 3.

According to one embodiment, the core 22 of the core/shell at least one particle 2 comprises at least one nanoparticle 3 as described herein and the shell 23 of the core/shell at least one particle 2 comprises at least one nanoparticle 3.

According to one embodiment, the at least one nanoparticle 3 comprised in the core 22 of the core/shell at least one particle 2 is identical to the at least one nanoparticle 3 comprised in the shell 23 of the core/shell at least one particle 2.

According to one embodiment, the at least one nanoparticle 3 comprised in the core 22 of the core/shell at least one particle 2 is different to the at least one nanoparticle 3 comprised in the shell 23 of the core/shell at least one particle 2. In this embodiment, the resulting core/shell at least one particle 2 will exhibit different properties.

According to one embodiment, the core 22 of the core/shell at least one particle 2 comprises at least one luminescent nanoparticle and the shell 23 of the core/shell at least one particle 2 comprises at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the shell 23 of the core/shell at least one particle 2 comprises at least one luminescent nanoparticle and the core 22 of the core/shell at least one particle 2 comprises at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the core 22 of the core/shell at least one particle 2 and the shell 23 of the core/shell at least one particle 2 comprise at least two different luminescent nanoparticles, wherein said luminescent nanoparticles emit at different emission wavelengths. This means that the core 22 comprises at least one luminescent nanoparticle and the shell 23 comprises at least one luminescent nanoparticle, said luminescent nanoparticles having different emission wavelengths.

In a preferred embodiment, the core 22 of the core/shell at least one particle 2 and the shell 23 of the core/shell at least one particle 2 comprise at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the core 22 of the core/shell at least one particle 2 and the shell 23 of the core/shell at least one particle 2 comprise at least one luminescent nanoparticle emitting in the green region of the visible spectrum and at least one luminescent nanoparticle emitting in the red region of the visible spectrum, thus the at least one particle 2 paired with a blue LED will be a white light emitter.

In a preferred embodiment, the core 22 of the core/shell at least one particle 2 and the shell 23 of the core/shell at least one particle 2 comprise at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the core 22 of the core/shell at least one particle 2 and the shell 23 of the core/shell at least one particle 2 comprise at least one luminescent nanoparticle emitting in the blue region of the visible spectrum and at least one luminescent nanoparticle emitting in the red region of the visible spectrum, thus the at least one particle 2 will be a white light emitter.

In a preferred embodiment, the core 22 of the core/shell at least one particle 2 and the shell 23 of the core/shell at least one particle 2 comprise comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the core 22 of the core/shell at least one particle 2 and the shell 23 of the core/shell at least one particle 2 comprise at least one luminescent nanoparticle emitting in the blue region of the visible spectrum and at least one luminescent nanoparticle emitting in the green region of the visible spectrum.

According to one embodiment, the shell 23 of the at least one particle 2 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the shell 23 of the at least one particle 2 has a thickness homogeneous all along the core 22, i.e. the shell 23 of the at least one particle 2 has a same thickness all along the core 22.

According to one embodiment, the shell 23 of the at least one particle 2 has a thickness heterogeneous along the core 22, i.e. said thickness varies along the core 22.

According to one embodiment, the at least one particle 2 exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

Photoluminescence refers to fluorescence and/or phosphorescence.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In one embodiment, the at least one particle 2 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW.cm^{-2}$ and 100 $kW.cm^{-2}$, more preferably between 10 $mW.cm^{-2}$ and 100 $W.cm^{-2}$, and even more preferably between 10 $mW.cm^{-2}$ and 30 $W.cm^{-2}$.

According to one embodiment, the photon flux or average peak pulse power of the illumination is at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the at least one particle 2 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $mW.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the particle 2 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW.cm^{-2}$, 50 $mW.cm^{-2}$, 100 $mW.cm^{2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one particle 2 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the particle 2 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the photoluminescence of the at least one particle 2 is preserved after encapsulation in the luminescent particle 1.

According to one embodiment, the specific property of the at least one particle 2 is preserved after encapsulation in the luminescent particle 1.

According to one embodiment, the at least one nanoparticle 3 is encapsulated into the second material 21 during the formation of said second material 21. For example, said nanoparticle 3 are not inserted in nor put in contact with the second material 21 which have been previously obtained.

According to one embodiment, the at least one nanoparticle 3 is a luminescent nanoparticle.

According to one embodiment, the luminescent nanoparticle is a fluorescent nanoparticle.

According to one embodiment, the luminescent nanoparticle is a phosphorescent nanoparticle.

According to one embodiment, the luminescent nanoparticle is a chemiluminescent particle.

According to one embodiment, the luminescent nanoparticle is a triboluminescent particle.

According to one embodiment, the luminescent nanoparticle exhibits an emission spectrum with at least one emission peak, wherein said emission peak has a maximum emission wavelength ranging from 400 nm to 50 μm.

According to one embodiment, the luminescent nanoparticle exhibits an emission spectrum with at least one emission peak, wherein said emission peak has a maximum emission wavelength ranging from 400 nm to 500 nm. In this embodiment, the luminescent nanoparticle emits blue light.

According to one embodiment, the luminescent nanoparticle exhibits an emission spectrum with at least one emission peak, wherein said emission peak has a maximum emission wavelength ranging from 500 nm to 560 nm, more preferably ranging from 515 nm to 545 nm. In this embodiment, the luminescent nanoparticle emits green light.

According to one embodiment, the luminescent nanoparticle exhibits an emission spectrum with at least one emission peak, wherein said emission peak has a maximum emission wavelength ranging from 560 nm to 590 nm. In this embodiment, the luminescent nanoparticle emits yellow light.

According to one embodiment, the luminescent nanoparticle exhibits an emission spectrum with at least one emission peak, wherein said emission peak has a maximum emission wavelength ranging from 590 nm to 750 nm, more preferably ranging from 610 nm to 650 nm. In this embodiment, the luminescent nanoparticle emits red light.

According to one embodiment, the luminescent nanoparticle exhibits an emission spectrum with at least one emission peak, wherein said emission peak has a maximum emission wavelength ranging from 750 nm to 50 μm. In this embodiment, the luminescent nanoparticle emits near infra-red, mid-infra-red, or infra-red light.

According to one embodiment, the luminescent nanoparticle exhibits an emission spectrum with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the luminescent nanoparticle exhibits emission spectra with at least one emission peak having a full width half maximum strictly lower than 40 nm, 30 nm, 25 nm, 20 nm, 15 nm, or 10 nm.

According to one embodiment, the luminescent nanoparticle exhibits an emission spectrum with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the luminescent nanoparticle exhibits emission spectra with at least one emission peak having a full width at quarter maximum strictly lower than 40 nm, 30 nm, 25 nm, 20 nm, 15 nm, or 10 nm.

According to one embodiment, the luminescent nanoparticle has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the at least one nanoparticle 3 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the luminescent nanoparticle has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

According to one embodiment, the luminescent nanoparticle is a semiconductor nanoparticle.

According to one embodiment, the luminescent nanoparticle is a semiconductor nanocrystal.

In one embodiment, the nanoparticle 3 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one preferred embodiment, the nanoparticle 3 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the nanoparticle 3 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$, semiconductor nanoparticles, semiconductor nanocrystals, or semiconductor nanoplatelets.

In one preferred embodiment, the nanoparticle 3 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

According to one embodiment, the at least one nanoparticle 3 is a plasmonic nanoparticle.

According to one embodiment, the at least one nanoparticle 3 is a magnetic nanoparticle.

According to one embodiment, at least one nanoparticle 3 is a ferromagnetic nanoparticle.

According to one embodiment, the at least one nanoparticle 3 is a paramagnetic nanoparticle.

According to one embodiment, the at least one nanoparticle 3 is a superparamagnetic nanoparticle.

According to one embodiment, the at least one nanoparticle 3 is a diamagnetic nanoparticle.

According to one embodiment, the at least one nanoparticle 3 is a catalytic nanoparticle.

According to one embodiment, the nanoparticles 3 have photovoltaic properties.

According to one embodiment, the at least one nanoparticle 3 is a pyro-electric nanoparticle.

According to one embodiment, the at least one nanoparticle 3 is a ferro-electric nanoparticle.

According to one embodiment, the at least one nanoparticle 3 is a light scattering nanoparticle.

According to one embodiment, the at least one nanoparticle 3 is electrically insulating.

According to one embodiment, the at least one nanoparticle 3 is electrically conductive.

According to one embodiment, the at least one nanoparticle 3 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the at least one nanoparticle 3 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the at least one nanoparticle 3 may be measured for example with an impedance spectrometer.

According to one embodiment, the at least one nanoparticle 3 is thermally conductive.

According to one embodiment, the at least one nanoparticle 3 has a thermal conductivity at standard conditions ranging from 0.1 to 450 W/(m.K), preferably from 1 to 200 W/(m.K), more preferably from 10 to 150 W/(m.K).

According to one embodiment, the at least one nanoparticle 3 has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

According to one embodiment, the thermal conductivity of the at least one nanoparticle 3 may be measured by steady-state methods or transient methods.

According to one embodiment, the at least one nanoparticle 3 is thermally insulating.

According to one embodiment, the at least one nanoparticle 3 is a local high temperature heating system.

According to one embodiment, the at least one nanoparticle 3 is a dielectric nanoparticle.

According to one embodiment, the at least one nanoparticle 3 is a piezoelectric nanoparticle.

According to one embodiment, the ligands attached to the surface of a nanoparticle 3 is in contact with the second material 21. In this embodiment, said nanoparticle 3 is linked to the second material 21 and the electrical charges from said nanoparticle 3 can be evacuated. This prevents reactions at the surface of the nanoparticles 3 that can be due to electrical charges.

According to one embodiment, the at least one nanoparticle 3 is hydrophobic.

According to one embodiment, the at least one nanoparticle 3 is hydrophilic.

According to one embodiment, the at least one nanoparticle 3 has an average size of at least 0.5 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 µm, 49 µm, 49.5 µm, 50 µm, 50.5 µm, 51 µm, 51.5 µm, 52 µm, 52.5 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the largest dimension of the at least one nanoparticle 3 is at least 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65.5 µm, 66 µm, 66.5 µm, 67 µm, 67.5 µm, 68 µm, 68.5 µm, 69 µm, 9.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the smallest dimension of the at least one nanoparticle 3 is at least 0.5 nm, 1 nm, 1.5 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the smallest dimension of the at least one nanoparticle 3 is smaller than the largest dimension of said nanoparticle 3 by a factor (aspect ratio) of at least 1.5; at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, in a statistical ensemble of nanoparticles 3, said nanoparticles 3 are polydisperse.

According to one embodiment, in a statistical ensemble of nanoparticles 3, said nanoparticles 3 are monodisperse.

According to one embodiment, in a statistical ensemble of nanoparticles 3, said nanoparticles 3 have a narrow size distribution.

According to one embodiment, the size distribution for the smallest dimension of a statistical set of nanoparticles 3 is inferior than 1%, 2%, 3%, 4%, 5%, 6%, 7%, 8%, 9%, 10%, 15%, 20%, 25%, 30%, 35%, or 40% of said smallest dimension.

According to one embodiment, the size distribution for the largest dimension of a statistical set of nanoparticles 3 is inferior than 1%, 2%, 3%, 4%, 5%, 6%, 7%, 8%, 9%, 10%, 15%, 20%, 25%, 30%, 35%, or 40% of said largest dimension.

According to one embodiment, the at least one nanoparticle 3 is hollow.

According to one embodiment, the at least one nanoparticle 3 is not hollow.

According to one embodiment, the at least one nanoparticle 3 is isotropic.

According to one embodiment, examples of shape of isotropic nanoparticle 3 include but are not limited to: sphere 31 (as illustrated in FIG. 2), faceted sphere, prism, polyhedron, or cubic shape.

According to one embodiment, the at least one nanoparticle 3 is not spherical.

According to one embodiment, the at least one nanoparticle 3 is anisotropic.

According to one embodiment, examples of shape of anisotropic nanoparticle 3 include but are not limited to: rod, wire, needle, bar, belt, cone, or polyhedron shape.

According to one embodiment, examples of branched shape of anisotropic nanoparticle 3 include but are not limited to: monopod, bipod, tripod, tetrapod, star, or octopod shape.

According to one embodiment, examples of complex shape of anisotropic nanoparticle 3 include but are not limited to: snowflake, flower, thorn, hemisphere, cone, urchin, filamentous particle, biconcave discoid, worm, tree, dendrite, necklace, or chain.

According to one embodiment, as illustrated in FIG. 3, the at least one nanoparticle 3 has a 2D shape 32.

According to one embodiment, examples of shape of 2D nanoparticle 32 include but are not limited to: sheet, platelet, plate, ribbon, wall, plate triangle, square, pentagon, hexagon, disk or ring.

According to one embodiment, a nanoplatelet is different from a disk or a nanodisk.

According to one embodiment, nanosheets and nanoplatelets are not disks or nanodisks. In this embodiment, the section along the other dimensions than the thickness (width, length) of said nanosheets or nanoplatelets is square or rectangular, while it is circular or ovoidal for disks or nanodisks.

According to one embodiment, nanosheets and nanoplatelets are not disks or nanodisks. In this embodiment, none of the dimensions of said nanosheets and nanoplatelets can be defined as a diameter nor the size of a semi-major axis and a semi-minor axis contrarily to disks or nanodisks.

According to one embodiment, nanosheets and nanoplatelets are not disks or nanodisks. In this embodiment, the curvature at all points along the other dimensions than the thickness (length, width) of said nanosheets or nanoplatelets is below 10 $\mu m^{-1}$, while the curvature for disks or nanodisks is superior on at least one point.

According to one embodiment, nanosheets and nanoplatelets are not disks or nanodisks. In this embodiment, the curvature at at least one point along the other dimensions than the thickness (length, width) of said nanosheets or nanoplatelets is below 10 $\mu m^{-1}$, while the curvature for disks or nanodisks is superior than 10 $\mu m^{-1}$ at all points.

According to one embodiment, a nanoplatelet is different from a quantum dot, or a spherical nanocrystal. A quantum dot is spherical, thus is has a 3D shape and allow confinement of excitons in all three spatial dimensions, whereas the nanoplatelet has a 2D shape and allow confinement of excitons in one dimension and allow free propagation in the other two dimensions. This results in distinct electronic and optical properties, for example the typical photoluminescence decay time of semiconductor platelets is 1 order of magnitude faster than for spherical quantum dots, and the semiconductor platelets also show an exceptionally narrow optical feature with full width at half maximum (FWHM) much lower than for spherical quantum dots.

According to one embodiment, to obtain a ROHS compliant luminescent particle 1, said luminescent particle 1 rather comprises semiconductor nanoplatelets than semiconductor quantum dots. Indeed, a same emission peak position is obtained for semiconductor quantum dots with a diameter d, and semiconductor nanoplatelets with a thickness d/2; thus for the same emission peak position, a semiconductor nanoplatelet comprises less cadmium in weight than a semiconductor quantum dot. Furthermore, if a CdS core is comprised in a core/shell quantum dot or a core/shell (or core/crown) nanoplatelet, then there are more possibilities of shell layers without cadmium in the case of core/shell (or core/crown) nanoplatelet; thus a core/shell (or core/crown) nanoplatelet with a CdS core may comprise less cadmium in weight than a core/shell quantum dot with a CdS core. The lattice difference between CdS and nonCadmium shells is too important for the quantum dot to sustain. Finally, semiconductor nanoplatelets have better absorption properties than semiconductor quantum dots, thus resulting in less cadmium in weight needed in semiconductor nanoplatelets.

According to one embodiment, a nanoplatelet is different from a nanorod or nanowire. A nanorod (or nanowire) has a 1D shape and allow confinement of excitons two spatial dimensions, whereas the nanoplatelet has a 2D shape and allow confinement of excitons in one dimension and allow free propagation in the other two dimensions. This results in distinct electronic and optical properties.

According to one embodiment, as illustrated in FIG. 12A, the at least one nanoparticle 3 is a core nanoparticle 33 without a shell.

According to one embodiment, the at least one nanoparticle 3 is atomically flat. In this embodiment, the atomically flat nanoparticle 3 may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the at least one nanoparticle 3 comprises at least one atomically flat core. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence, or any other characterization means known by the person skilled in the art.

According to one embodiment, the at least one nanoparticle 3 is a core 33/shell 34 nanoparticle, wherein the core 33 is partially or totally covered with at least one shell 34 comprising at least one layer of material.

According to one embodiment, as illustrated in FIG. 12B-C and FIG. 12F-G, the at least one nanoparticle 3 is a core 33/shell 34 nanoparticle, wherein the core 33 is covered with at least one shell (34, 35).

According to one embodiment, the at least one shell (34, 35) has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the at least one nanoparticle 3 is a core 33/shell 34 nanoparticle, wherein the core 33 and the shell 34 are composed of the same material.

According to one embodiment, the at least one nanoparticle 3 is a core 33/shell 34 nanoparticle, wherein the core 33 and the shell 34 are composed of at least two different materials.

According to one embodiment, the at least one nanoparticle 3 is a core 33/shell 34 nanoparticle, wherein the core 33 is a luminescent core covered with at least one shell 34 selected in the group of magnetic material, plasmonic material, dielectric material, piezoelectric material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a magnetic core covered with at least one shell 34 selected in the group of luminescent material, plasmonic material, dielectric material, piezoelectric material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a plasmonic core covered with at least one shell 34 selected in the group of magnetic material, luminescent material, dielectric material, piezoelectric material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a dielectric core covered with at least one shell 34 selected in the group of magnetic material, plasmonic material, luminescent material, piezoelectric material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a piezoelectric core covered with at least one shell 34 selected in the group of magnetic material, plasmonic material, dielectric material, luminescent material, pyro-electric material, ferro-electric material, light scattering material, electrically insulating material, thermally insulating material or catalytic material.

According to one embodiment, the at least one nanoparticle 3 is a core 33/shell 34 nanoparticle, wherein the core 33 is a pyro-electric core covered with at least one shell 34 selected in the group of magnetic material, plasmonic material, dielectric material, luminescent material, piezoelectric material, ferro-electric material, light scattering material, electrically insulating material, thermally insulating material or catalytic material.

According to one embodiment, the at least one nanoparticle 3 is a core 33/shell 34 nanoparticle, wherein the core 33 is a ferro-electric core covered with at least one shell 34 selected in the group of magnetic material, plasmonic material, dielectric material, luminescent material, piezoelectric material, pyro-electric material, light scattering material, electrically insulating material, thermally insulating material or catalytic material.

According to one embodiment, the at least one nanoparticle 3 is a core 33/shell 34 nanoparticle, wherein the core 33 is a light scattering core covered with at least one shell 34 selected in the group of magnetic material, plasmonic material, dielectric material, luminescent material, piezoelectric material, pyro-electric material, ferro-electric material, electrically insulating material, thermally insulating material or catalytic material.

According to one embodiment, the at least one nanoparticle 3 is a core 33/shell 34 nanoparticle, wherein the core 33 is an electrically insulating core covered with at least one shell 34 selected in the group of magnetic material, plasmonic material, dielectric material, luminescent material, piezoelectric material, pyro-electric material, ferro-electric material, light scattering material, thermally insulating material or catalytic material.

According to one embodiment, the at least one nanoparticle 3 is a core 33/shell 34 nanoparticle, wherein the core 33 is a thermally insulating core covered with at least one shell 34 selected in the group of magnetic material, plasmonic material, dielectric material, luminescent material, piezoelectric material, pyro-electric material, ferro-electric material, light scattering material, electrically insulating material or catalytic material.

According to one embodiment, the at least one nanoparticle 3 is a core 33/shell 34 nanoparticle, wherein the core 33 is a catalytic core covered with at least one shell 34 selected in the group of magnetic material, plasmonic material, dielectric material, luminescent material, piezoelectric material, pyro-electric material, ferro-electric material, light scattering material, electrically insulating material or thermally insulating material.

According to one embodiment, the at least one nanoparticle 3 is a core 33/shell 36 nanoparticle, wherein the core 33 is covered with an insulator shell 36. In this embodiment, the insulator shell 36 prevents the aggregation of the cores 33.

According to one embodiment, the insulator shell 36 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm or 500 nm.

According to one embodiment, as illustrated in FIG. 12D and FIG. 12H, the at least one nanoparticle 3 is a core 33/shell (34, 35, 36) nanoparticle, wherein the core 33 is covered with at least one shell (34, 35) and an insulator shell 36.

According to one embodiment, the shells (34, 35, 36) covering the core 33 of the at least one nanoparticle 3 may be composed of the same material.

According to one embodiment, the shells (34, 35, 36) covering the core 33 of the at least one nanoparticle 3 may be composed of at least two different materials.

According to one embodiment, the shells (34, 35, 36) covering the core 33 of the at least one nanoparticle 3 may have the same thickness.

According to one embodiment, the shells (34, 35, 36) covering the core 33 of the at least one nanoparticle 3 may have different thickness.

According to one embodiment, each shell (34, 35, 36) covering the core 33 of the at least one nanoparticle 3 has a thickness homogeneous all along the core 33, i.e. each shell (34, 35, 36) has a same thickness all along the core 33.

According to one embodiment, each shell (34, 35, 36) covering the core 33 of the at least one nanoparticle 3 has a thickness heterogeneous along the core 33, i.e. said thickness varies along the core 33.

According to one embodiment, the at least one nanoparticle 3 is a core 33/insulator shell 36 nanoparticle, wherein examples of insulator shell 36 include but are not limited to: non-porous $SiO_2$, mesoporous $SiO_2$, non-porous MgO, mesoporous MgO, non-porous ZnO, mesoporous ZnO, non-porous $Al_2O_3$, mesoporous $Al_2O_3$, non-porous $ZrO_2$, mesoporous $ZrO_2$, non-porous $TiO_2$, mesoporous $TiO_2$, non-porous $SnO_2$, mesoporous $SnO_2$, or a mixture thereof. Said insulator shell 36 acts as a supplementary barrier against oxidation and can drain away the heat if it is a good thermal conductor.

According to one embodiment, as illustrated in FIG. 12E, the at least one nanoparticle 3 is a core 33/crown 37 nanoparticle with a 2D structure, wherein the core 33 is covered with at least one crown 37.

According to one embodiment, the at least one nanoparticle 3 is a core 33/crown 37 nanoparticle, wherein the core 33 is covered with a crown 37 comprising at least one layer of material.

According to one embodiment, the at least one nanoparticle 3 is a core 33/crown 37 nanoparticle, wherein the core 33 and the crown 37 are composed of the same material.

According to one embodiment, the at least one nanoparticle 3 is a core 33/crown 37 nanoparticle, wherein the core 33 and the crown 37 are composed of at least two different materials.

According to one embodiment, the at least one nanoparticle 3 is a core 33/crown 37 nanoparticle, wherein the core 33 is a luminescent core covered with at least one crown 37 selected in the group of magnetic material, plasmonic material, dielectric material, piezoelectric material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a magnetic core covered with at least one crown 37 selected in the group of luminescent material, plasmonic material, dielectric material, piezoelectric material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a plasmonic core covered with at least one crown 37 selected in the group of magnetic material, luminescent material, dielectric material, piezoelectric material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a dielectric core covered with at least one crown 37 selected in the group of magnetic material, plasmonic material, luminescent material, piezoelectric material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a piezoelectric core covered with at least one crown 37 selected in the group of magnetic material, plasmonic material, dielectric material, luminescent material, pyro-electric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a pyro-electric core covered with at least one crown 37 selected in the group of magnetic material, plasmonic material, dielectric material, luminescent material, piezoelectric material, ferro-electric material, light scattering material, electrically insulating material, thermally insulating material, or catalytic material.

According to one embodiment, the at least one nanoparticle 3 is a core 33/crown 37 nanoparticle, wherein the core 33 is a ferro-electric core covered with at least one crown 37 selected in the group of magnetic material, plasmonic material, dielectric material, luminescent material, piezoelectric material, pyro-electric material, light scattering material, electrically insulating material, thermally insulating material, or catalytic material.

According to one embodiment, the at least one nanoparticle 3 is a core 33/crown 37 nanoparticle, wherein the core 33 is a light scattering core covered with at least one crown 37 selected in the group of magnetic material, plasmonic material, dielectric material, luminescent material, piezoelectric material, pyro-electric material, ferro-electric material, electrically insulating material, thermally insulating material, or catalytic material.

According to one embodiment, the at least one nanoparticle 3 is a core 33/crown 37 nanoparticle, wherein the core 33 is an electrically insulating core covered with at least one crown 37 selected in the group of magnetic material, plasmonic material, dielectric material, luminescent material, piezoelectric material, pyro-electric material, ferro-electric material, light scattering material, thermally insulating material, or catalytic material.

According to one embodiment, the at least one nanoparticle 3 is a core 33/crown 37 nanoparticle, wherein the core 33 is a thermally insulating core covered with at least one crown 37 selected in the group of magnetic material, plasmonic material, dielectric material, luminescent material, piezoelectric material, pyro-electric material, ferro-electric material, light scattering material, electrically insulating material, or catalytic material.

According to one embodiment, the at least one nanoparticle 3 is a core 33/crown 37 nanoparticle, wherein the core 33 is a catalytic core covered with at least one crown 37 selected in the group of magnetic material, plasmonic material, dielectric material, luminescent material, piezoelectric material, pyro-electric material, ferro-electric material, light scattering material, electrically insulating material, or thermally insulating material.

According to one embodiment, the at least one nanoparticle 3 is a core 33/crown 37 nanoparticle, wherein the core 33 is covered with an insulator crown. In this embodiment, the insulator crown prevents the aggregation of the cores 33.

According to one embodiment, the at least one particle 2 comprises at least two nanoparticles 3. In this embodiment, the at least one particle 2 is not a core/shell nanoparticle wherein the core is the at least one nanoparticle 3 and the shell is the second material 21.

According to one embodiment, the at least one particle 2 comprises a plurality of nanoparticles 3.

According to one embodiment, the at least one particle 2 comprises more than ten nanoparticles 3.

According to one embodiment, the at least one particle 2 comprises at least 1, at least 2, at least 3, at least 4, at least 5, at least 6, at least 7, at least 8, at least 9, at least 10, at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 nanoparticles 3.

In a preferred embodiment, the at least one particle 2 comprises at least one luminescent nanoparticle and at least one plasmonic nanoparticle.

According to one embodiment, the number of nanoparticles 3 comprised in the at least one particle 2 depends mainly on the molar ratio or the mass ratio between the chemical species allowing to produce the second material 21 and the at least one nanoparticle 3.

According to one embodiment, the at least one nanoparticle 3 represents at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% by weight of the luminescent particle 1.

According to one embodiment, the loading charge of the at least one nanoparticle 3 in the at least one particle 2 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of the at least one nanoparticle 3 in the at least one particle 2 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the nanoparticle 3 are not encapsulated in particle 2 via physical entrapment or electrostatic attraction.

According to one embodiment, the nanoparticle 3 and the second material 21 are not bonded or linked by electrostatic attraction or a functionalized silane based coupling agent.

According to one embodiment, the at least one nanoparticle 3 comprised in the at least one particle 2 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the nanoparticles 3 comprised in the at least one particle 2 are not aggregated.

According to one embodiment, the nanoparticles 3 comprised in the at least one particle 2 do not touch, are not in contact.

According to one embodiment, the nanoparticles 3 comprised in the at least one particle 2 are separated by second material 21.

According to one embodiment, the at least one nanoparticle 3 comprised in the at least one particle 2 can be individually evidenced.

According to one embodiment, the at least one nanoparticle 3 comprised in the at least one particle 2 can be individually evidenced by transmission electron microscopy or fluorescence scanning microscopy, or any other characterization means known by the person skilled in the art.

According to one embodiment, the plurality of nanoparticles 3 is uniformly dispersed in the second material 21 comprised in the at least one particle 2.

The uniform dispersion of the plurality of nanoparticles 3 in the second material 21 comprised in the at least one particle 2 prevents the aggregation of said nanoparticles 3, thereby preventing the degradation of their properties. For example, in the case of inorganic fluorescent nanoparticles, a uniform dispersion will allow the optical properties of said nanoparticles to be preserved, and quenching can be avoided.

According to one embodiment, the nanoparticles 3 comprised in a luminescent particle 1 are uniformly dispersed within the second material 21 comprised in said luminescent particle 1.

According to one embodiment, the nanoparticles 3 comprised in a luminescent particle 1 are dispersed within the second material 21 comprised in said luminescent particle 1.

According to one embodiment, the nanoparticles 3 comprised in a luminescent particle 1 are uniformly and evenly dispersed within the second material 21 comprised in said luminescent particle 1.

According to one embodiment, the nanoparticles 3 comprised in a luminescent particle 1 are evenly dispersed within the second material 21 comprised in said luminescent particle 1.

According to one embodiment, the nanoparticles 3 comprised in a luminescent particle 1 are homogeneously dispersed within the second material 21 comprised in said luminescent particle 1.

According to one embodiment, the dispersion of nanoparticles 3 in the second material 21 does not have the shape of a ring, or a monolayer.

According to one embodiment, each nanoparticle 3 of the plurality of nanoparticles 3 is spaced from its adjacent nanoparticle 3 by an average minimal distance.

According to one embodiment, the average minimal distance between two nanoparticles 3 is controlled.

According to one embodiment, the average minimal distance is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 300 µm, 400 µm, 500 µm, 600 µm, 700 µm, 800 µm, 900 µm, or 1 mm.

According to one embodiment, the average distance between two nanoparticles 3 in the same particle 2 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 300 µm, 400 µm, 500 µm, 600 µm, 700 µm, 800 µm, 900 µm, or 1 mm.

According to one embodiment, the average distance between two nanoparticles 3 in the same particle 2 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, as illustrated in FIG. 4, the at least one particle 2 comprises a combination of at least two different nanoparticles (31, 32). In this embodiment, the at least one particle 2, thus the resulting luminescent particle 1 will exhibit different properties.

According to one embodiment, the at least one particle 2 comprises at least one luminescent nanoparticle and at least one nanoparticle 3 selected in the group of magnetic nanoparticle, plasmonic nanoparticle, dielectric nanoparticle, piezoelectric nanoparticle, pyro-electric nanoparticle, ferroelectric nanoparticle, light scattering nanoparticle, electrically insulating nanoparticle, thermally insulating nanoparticle, or catalytic nanoparticle.

In a preferred embodiment, the at least one particle 2 comprises at least two different luminescent nanoparticles, wherein said luminescent nanoparticles emit different emission wavelengths.

In a preferred embodiment, the at least one particle 2 comprises at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the at least one particle 2 comprises at least one luminescent nanoparticle emitting in the green region of the visible spectrum and at least one luminescent nanoparticle emitting in the red region of the visible spectrum, thus the luminescent particle 1 paired with a blue LED will be a white light emitter.

In a preferred embodiment, the at least one particle 2 comprises at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the at least one particle 2 comprises at least one luminescent nanoparticle emitting in the blue region of the visible spectrum and at least one luminescent nanoparticle emitting in the red region of the visible spectrum, thus the luminescent particle 1 will be a white light emitter.

In a preferred embodiment, the at least one particle 2 comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the at least one particle 2 comprises at least one luminescent nanoparticle emitting in the blue region of the visible spectrum and at least one luminescent nanoparticle emitting in the green region of the visible spectrum.

In a preferred embodiment, the at least one particle 2 comprises three different luminescent nanoparticles, wherein said luminescent nanoparticles emit at different emission wavelengths or color.

In a preferred embodiment, the at least one particle 2 comprises at least three different luminescent nanoparticles, wherein at least one luminescent nanoparticle emits at a wavelength in the range from 400 to 490 nm, at least one luminescent nanoparticle emits at a wavelength in the range from 500 to 560 nm and at least one luminescent nanoparticle emits at a wavelength in the range from 600 to 2500 nm. In this embodiment, the at least one particle 2 comprises at least one luminescent nanoparticle emitting in the blue region of the visible spectrum, at least one luminescent nanoparticle emitting in the green region of the visible spectrum and at least one luminescent nanoparticle emitting in the red region of the visible spectrum.

According to one embodiment, the at least one particle 2 comprises at least one magnetic nanoparticle and at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the at least one particle 2 comprises at least one plasmonic nanoparticle and at least one nanoparticle 3 selected in the group of luminescent nanoparticle, magnetic nanoparticle, dielectric nanoparticle, piezoelectric nanoparticle, pyro-electric nanoparticle, ferroelectric nanoparticle, light scattering nanoparticle, electrically insulating nanoparticle, thermally insulating nanoparticle, or catalytic nanoparticle.

According to one embodiment, the at least one particle 2 comprises at least one dielectric nanoparticle and at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the at least one particle 2 comprises at least one piezoelectric nanoparticle and at least one nanoparticle 3 selected in the group of luminescent nanoparticle, magnetic nanoparticle, dielectric nanoparticle, plasmonic nanoparticle, pyro-electric nanoparticle, ferroelectric nanoparticle, light scattering nanoparticle, electrically insulating nanoparticle, thermally insulating nanoparticle, or catalytic nanoparticle.

According to one embodiment, the at least one particle 2 comprises at least one pyro-electric nanoparticle and at least one nanoparticle 3 selected in the group of luminescent nanoparticle, magnetic nanoparticle, dielectric nanoparticle, plasmonic nanoparticle, piezoelectric nanoparticle, ferroelectric nanoparticle, light scattering nanoparticle, electrically insulating nanoparticle, thermally insulating nanoparticle, or catalytic nanoparticle.

According to one embodiment, the at least one particle 2 comprises at least one ferro-electric nanoparticle and at least one nanoparticle 3 selected in the group of luminescent nanoparticle, magnetic nanoparticle, dielectric nanoparticle, plasmonic nanoparticle, piezoelectric nanoparticle, pyroelectric nanoparticle, light scattering nanoparticle, electrically insulating nanoparticle, thermally insulating nanoparticle, or catalytic nanoparticle.

According to one embodiment, the at least one particle 2 comprises at least one light scattering nanoparticle and at least one nanoparticle 3 selected in the group of luminescent nanoparticle, magnetic nanoparticle, dielectric nanoparticle, plasmonic nanoparticle, piezoelectric nanoparticle, pyroelectric nanoparticle, ferro-electric nanoparticle, electrically insulating nanoparticle, thermally insulating nanoparticle, or catalytic nanoparticle.

According to one embodiment, the at least one particle 2 comprises at least one electrically insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the at least one particle 2 comprises at least one thermally insulating nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the at least one particle 2 comprises at least one catalytic nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the at least one particle 2 comprises at least one nanoparticle 3 without a shell and at least one nanoparticle 3 selected in the group of core 33/shell 34 nanoparticles 3 and core 33/insulator shell 36 nanoparticles 3.

According to one embodiment, the at least one particle 2 comprises at least one core 33/shell 34 nanoparticle 3 and at least one nanoparticle 3 selected in the group of nanoparticles 3 without a shell and core 33/insulator shell 36 nanoparticles 3.

According to one embodiment, the at least one particle 2 comprises at least one core 33/insulator shell 36 nanoparticle 3 and at least one nanoparticle 3 selected in the group of nanoparticles 3 without a shell and core 33/shell 34 nanoparticles 3.

According to one embodiment, the at least one nanoparticle 3 is ROHS compliant.

According to one embodiment, the at least one nanoparticle 3 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the at least one nanoparticle 3 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the at least one nanoparticle 3 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the specific property of the at least one nanoparticle 3 comprises one or more of the following: fluorescence, phosphorescence, chemiluminescence, capacity of increasing local electromagnetic field, absorbance, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the at least one nanoparticle 3 in the second material 21 exhibits exhibit a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits exhibit a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the at least one nanoparticle 3 in the second material 21 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the at least one nanoparticle 3 in the second material 21 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 in the second material 21 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90°

C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the at least one nanoparticle 3 is a colloidal nanoparticle.

According to one embodiment, the at least one nanoparticle 3 is an electrically charged nanoparticle.

According to one embodiment, the at least one nanoparticle 3 is not an electrically charged nanoparticle.

According to one embodiment, the at least one nanoparticle 3 is not a positively charged nanoparticle.

According to one embodiment, the at least one nanoparticle 3 is not a negatively charged nanoparticle.

According to one embodiment, the at least one nanoparticle 3 is dispersible in aqueous solvents, organic solvents and/or mixture thereof.

According to one embodiment, the at least one nanoparticle 3 is an organic nanoparticle.

According to one embodiment, the organic nanoparticle is composed of a material selected in the group of carbon nanotube, graphene and its chemical derivatives, graphyne, fullerenes, nanodiamonds, boron nitride nanotubes, boron nitride nanosheets, phosphorene and $Si_2BN$.

In one embodiment, the organic material is selected from polyacrylates; polymethacrylate; polyacrylamide; polyester; polyether; polyolefin (or polyalkene); polysaccharide; polyamide; or a mixture thereof; preferably the organic material is an organic polymer.

According to one embodiment, the organic material refers to any element and/or material containing carbon, preferably any element and/or material containing at least one carbon-hydrogen bond.

According to one embodiment, the organic material may be natural or synthetic.

According to one embodiment, the organic material is a small organic compound or an organic polymer.

According to one embodiment, the organic polymer is selected from polyacrylates; polymethacrylates; polyacrylamides; polyamides; polyesters; polyethers; polyoelfins; polysaccharides; polyurethanes (or polycarbamates), polystyrenes; polyacrylonitrile-butadiene-styrene (ABS); polycarbonate; poly(styrene acrylonitrile); vinyl polymers such as polyvinyl chloride; polyvinyl alcohol, polyvinyl acetate, polyvinylpyrrolidone, polyvinyl pyridine, polyvinylimidazole; poly(p-phenylene oxide); polysulfone; polyethersulfone; polyethylenimine; polyphenylsulfone; poly(acrylonitrile styrene acrylate); polyepoxides, polythiophenes, polypyrroles; polyanilines; polyaryletherketones; polyfurans; polyimides; polyimidazoles; polyetherimides; polyketones; polynucleotides; polystyrene sulfonates; polyetherimines; polyamic acid; or any combinations and/or derivatives and/or copolymers thereof.

According to one embodiment, the organic polymer is a polyacrylate, preferably selected from poly(methyl acrylate), poly(ethyl acrylate), poly(propyl acrylate), poly(butyl acrylate), poly(pentyl acrylate), and poly(hexyl acrylate).

According to one embodiment, the organic polymer is a polymethacrylate, preferably selected from poly(methyl methacrylate), poly(ethyl methacrylate), poly(propyl methacrylate), poly(butyl methacrylate), poly(pentyl methacrylate), and poly(hexyl methacrylate). According to one embodiment, the organic polymer is poly(methyl methacrylate) (PMMA).

According to one embodiment, the organic polymer is a polyacrylamide, preferably selected from poly(acrylamide); poly(methyl acrylamide), poly(dimethyl acrylamide), poly(ethyl acrylamide), poly(diethyl acrylamide), poly(propyl acrylamide), poly(isopropyl acrylamide); poly(butyl acrylamide); and poly(tert-butyl acrylamide).

According to one embodiment, the organic polymer is a polyester, preferably selected from poly(glycolic acid) (PGA), poly(lactic acid) (PLA), poly(caprolactone) (PCL), polyhydroxyalcanoate (PHA), polyhydroxybutyrate (PHB), polyethylene adipate, polybutylene succinate, poly(ethylene terephthalate), polybutylene terephthalate), poly(trimethylene terephthalate), polyarylate or any combination thereof.

According to one embodiment, the organic polymer is a polyether, preferably selected from aliphatic polyethers such as poly(glycol ether) or aromatic polyethers. According to one embodiment, the polyether is selected from poly(methylene oxide); poly(ethylene glycol)/poly(ethylene oxide), poly(propylene glycol) and poly(tetrahydrofuran).

According to one embodiment, the organic polymer is a polyolefin (or polyalkene), preferably selected from poly (ethylene), poly(propylene), poly(butadiene), poly(methylpentene), poly(butane) and poly(isobutylene).

According to one embodiment, the organic polymer is a polysaccharide selected from chitosan, dextran, hyaluronic acid, amylose, amylopectin, pullulan, heparin, chitin, cellulose, dextrin, starch, pectin, alginates, carrageenans, fucan, curdlan, xylan, polyguluronic acid, xanthan, arabinan, polymannuronic acid and their derivatives.

According to one embodiment, the organic polymer is a polyamide, preferably selected from polyc aprolac tame, polyauro amide, polyundec anamide, polytetramethylene adipamide, polyhexamethylene adipamide (also called nylon), polyhexamethylene nonanediamide, polyhexamethylene sebacamide, polyhexamethylene dodecanediamide; polydecamethylene sebacamide; Polyhexaméthylène isophtalamide; Polymétaxylylène adipamide; Polymétaphénylène isophtalamide; Polyparaphénylène téréphtalamide; polyphtalimides.

According to one embodiment, the organic polymer is a naturel or synthetic polymer.

According to one embodiment, the organic polymer is synthetized by organic reaction, radical polymerization, polycondensation, polyaddition, or ring opening polymerization (ROP).

According to one embodiment, the organic polymer is a homopolymer or a copolymer. According to one embodiment, the organic polymer is linear, branched, and/or cross-linked. According to one embodiment, the branched organic polymer is brush polymer (or also called comb polymer) or is a dendrimer.

According to one embodiment, the organic polymer is amorphous, semi-crystalline or crystalline. According to one embodiment, the organic polymer is a thermoplastic polymer or an elastomer.

According to one embodiment, the organic polymer is not a polyelectrolyte.

According to one embodiment, the organic polymer is not a hydrophilic polymer.

According to one embodiment, the organic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55 000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95

000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the at least one nanoparticle 3 is an inorganic nanoparticle.

According to one embodiment, the at least one nanoparticle 3 comprises an inorganic material. Said inorganic material is the same or different from the first or second materials.

According to one embodiment, the luminescent particle 1 comprises at least one inorganic nanoparticle and at least one organic nanoparticle.

According to one embodiment, the at least one nanoparticle 3 is not a ZnO nanoparticle.

According to one embodiment, the at least one nanoparticle 3 is not a metal nanoparticle.

According to one embodiment, the luminescent particle 1 does not comprise only metal nanoparticles.

According to one embodiment, the luminescent particle 1 does not comprise only magnetic nanoparticles.

According to one embodiment, the inorganic nanoparticle is a colloidal nanoparticle.

According to one embodiment, the inorganic nanoparticle is amorphous.

According to one embodiment, the inorganic nanoparticle is crystalline.

According to one embodiment, the inorganic nanoparticle is totally crystalline.

According to one embodiment, the inorganic nanoparticle is partially crystalline.

According to one embodiment, the inorganic nanoparticle is monocrystalline.

According to one embodiment, the inorganic nanoparticle is polycrystalline. In this embodiment, each inorganic nanoparticle comprises at least one grain boundary.

According to one embodiment, the inorganic nanoparticle is a nanocrystal.

According to one embodiment, the inorganic nanoparticle is composed of a material selected in the group of metals, halides, chalcogenides, phosphides, sulfides, metalloids, metallic alloys, ceramics such as for example oxides, carbides, or nitrides. Said inorganic nanoparticles are prepared using protocols known to the person skilled in the art.

According to one embodiment, the inorganic nanoparticle is selected in the group of metal nanoparticle, halide nanoparticle, chalcogenide nanoparticle, phosphide nanoparticle, sulfide nanoparticle, metalloid nanoparticle, metallic alloy nanoparticle, phosphor nanoparticle, perovskite nanoparticle, ceramic nanoparticle such as for example oxide nanoparticle, carbide nanoparticle, nitride nanoparticle, or a mixture thereof. Said nanoparticles are prepared using protocols known to the person skilled in the art.

According to one embodiment, the inorganic nanoparticle is selected from metal nanoparticle, halide nanoparticle, chalcogenide nanoparticle, phosphide nanoparticle, sulfide nanoparticle, metalloid nanoparticle, metallic alloy nanoparticle, phosphor nanoparticle, perovskite nanoparticle, ceramic nanoparticle such as for example oxide nanoparticle, carbide nanoparticle, nitride nanoparticle, or a mixture thereof, preferably is a semiconductor nanocrystal.

According to one embodiment, a chalcogenide is a chemical compound consisting of at least one chalcogen anion selected in the group of O, S, Se, Te, Po, and at least one or more electropositive element.

According to one embodiment, the metallic nanoparticles are selected in the group of gold nanoparticles, silver nanoparticles, copper nanoparticles, vanadium nanoparticles, platinum nanoparticles, palladium nanoparticles, ruthenium nanoparticles, rhenium nanoparticles, yttrium nanoparticles, mercury nanoparticles, cadmium nanoparticles, osmium nanoparticles, chromium nanoparticles, tantalum nanoparticles, manganese nanoparticles, zinc nanoparticles, zirconium nanoparticles, niobium nanoparticles, molybdenum nanoparticles, rhodium nanoparticles, tungsten nanoparticles, iridium nanoparticles, nickel nanoparticles, iron nanoparticles, or cobalt nanoparticles.

According to one embodiment, examples of carbide nanoparticles include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide nanoparticles include but are not limited to: $SiO_2$, $Al_2O_3$, $TiO_2$, $ZrO_2$, ZnO, MgO, $SnO_2$, $Nb_2O_5$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide nanoparticles include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride nanoparticles include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x \neq 0$.

According to one embodiment, examples of sulfide nanoparticles include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$ $Sr_yS_x$ $Y_yS_x$ $Hf_yS_x$ $W_yS_x$ $Mo_yS_x$ $Cr_yS_x$ $Tc_yS_x$ $Re_yS_x$ $Ru_yS_x$ $Co_yS_x$, $Os_yS_x$, $Rh_yS_x$ $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x \neq 0$.

According to one embodiment, examples of halide nanoparticles include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide nanoparticles include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, RhS2, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2O_5$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide nanoparticles include but are not limited to: InP, $Cd_3P_2$, $Zn_3P_2$, AlP, GaP, TlP, or a mixture thereof.

According to one embodiment, examples of metalloid nanoparticles include but are not limited to: Si, B, Ge, As, Sb, Te, or a mixture thereof.

According to one embodiment, examples of metallic alloy nanoparticles include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the nanoparticle 3 is a nanoparticle comprising hygroscopic materials such as for example phosphor materials or scintillator materials.

According to one embodiment, the nanoparticle 3 is a perovskite nanoparticle.

According to one embodiment, perovskites comprise a material $A_mB_nX_{3p}$, wherein A is selected from the group consisting of Ba, B, K, Pb, Cs, Ca, Ce, Na, La, Sr, Th, FA (formamidinium $CN_2H_5^+$), or a mixture thereof; B is selected from the group consisting of Fe, Nb, Ti, Pb, Sn, Ge, Bi, Zr, or a mixture thereof; X is selected from the group consisting of O, CI, Br, I, cyanide, thiocyanate, or a mixture thereof; m, n and p are independently a decimal number from 0 to 5; m, n and p are not simultaneously equal to 0; m and n are not simultaneously equal to 0.

According to one embodiment, m, n and p are not equal to 0.

According to one embodiment, examples of perovskites include but are not limited to: $Cs_3Bi_2I_9$, $Cs_3Bi_2Cl_9$, $Cs_3Bi_2Br_9$, $BFeO_3$, $KNbO_3$, $BaTiO_3$, $CH_3NH_3PbI_3$, $CH_3NH_3PbCl_3$, $CH_3NH_3PbBr_3$, $FAPbBr_3$ (with FA formamidinium), $FAPbCl_3$, $FAPbI_3$, $CsPbCl_3$, $CsPbBr_3$, $CsPbI_3$, $CsSnI_3$, $CsSnCl_3$, $CsSnBr_3$, $CsGeCl_3$, $CsGeBr_3$, $CsGeI_3$, $FAPbCl_xBr_yI_z$ (with x, y and z independent decimal number from 0 to 5 and not simultaneously equal to 0).

According to one embodiment, the at least one nanoparticle 3 is a phosphor nanoparticle.

According to one embodiment, the inorganic nanoparticle is a phosphor nanoparticle.

According to one embodiment, examples of phosphor nanoparticles include but are not limited to:

- rare earth doped garnets or garnets such as for example $Y_3Al_5O_{12}$, $Y_3Ga_5O_{12}$, $Y_3Fe_2(FeO_4)_3$, $Y_3Fe_5O_{12}$, $Y_4Al_2O_9$, $YAlO_3$, $RE_{3-n}Al_5O_{12}$:Ce. (RE=Y, Gd, Tb, Lu), $Gd_3Al_5O_{12}$, $Gd_3Ga_5O_{12}$, $Lu_3Al_5O_{12}$, $Fe_3Al_2(SiO_4)_3$, $(Lu_{(1-x-y)}A_xCe_y)_3B_zAl_5O_{12}C_{2z}$ with A=at least one of Sc, La, Gd, Tb or mixture thereof, B at least one of Mg, Sr, Ca, Ba or mixture thereof, C at least one of F, C, Br, I or mixture thereof, $0 \leq x \leq 0.5$, $0.001 \leq y \leq 0.2$, and $0.001 \leq z \leq 0.5$, $(Lu_{0.90}Gd_{0.07}Ce_{0.03})_3Sr_{0.34}Al_5O_{12}F_{0.68}$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, TAG, GAL, LuAG, YAG;
- doped nitridres such as europium doped $CaAlSiN_3$, $Sr(LiAl_3N_4)$:Eu, $SrMg_3SiN_4$:Eu, $La_3Si_6N_{11}$:Ce, (Ca, Sr)$AlSiN_3$:Eu, $(Ca_{0.2}Sr_{0.8})AlSiN_3$, (Ca, Sr, Ba)$_2Si_5N_8$:Eu;
- sulfide-based phosphors such as for example CaS:Eu, SrS:Eu;
- $A_2(MF_6)$: $Mn^{4+}$ wherein A comprises Na, K, Rb, Cs, or $NH_4$ and M comprises Si, Ti, Zr, or Mn, such as for example $Mn^{4+}$ doped potassium fluorosilicate (PFS), $K_2(SiF_6)$:$Mn^{4+}$ or $K_2(TiF_6)$:$Mn^{4+}$, $Na_2SnF_6$:$Mn^{4+}$, $Cs_2SnF_6$:$Mn^{4+}$, $Na_2SiF_6$:$Mn^{4+}$, $Na_2GeF_6$:$Mn^{4+}$;
- oxinitrides such as for example europium doped (Li, Mg, Ca, Y)-α-SiAlON, $SrAl_2Si_3ON_6$:Eu, $Eu_xSi_{6-z}Al_zO_yN_{8-y}$ (y=z−2x), $Eu_{0.018}Si_{5.77}Al_{0.23}O_{0.194}N_{7.806}$, $SrSi_2O_2N_2$:Eu, $Pr^{3+}$ activated (β-SiAlON:Eu;
- silicates such as for example $A_2Si(OD)_4$:Eu with A=Sr, Ba, Ca, Mg, Zn or mixture thereof and D=F, Cl, S, N, Br or mixture thereof, $(SrBaCa)_2SiO_4$:Eu, $Ba_2MgSi_2O_7$:Eu, $Ba_2SiO_4$:Eu, $Sr_3SiO_5$' $(Ca,Ce)_3(Sc,Mg)_2Sl_3O_{12}$;
- carbonitrides such as for example $Y_2Si_4N_6C$, $CsLnSi(CN_2)_4$:Eu with Ln=Y, La or Gd;
- oxycarbonitrides such as for example $Sr_2Si_5N_{8-[(4x/3)+z]}C_xO_{3z/2}$ where wherein $0 \leq x \leq 5.0$, $0.06 < z \leq 0.1$, and $x \neq 3z/2$;
- europium aluminates such as for example $EuAl_6O_{10}$, $EuAl_2O_4$;
- barium oxides such as for example $Ba_{0.93}Eu_{0.07}Al_2O_4$;
- halogenated garnets such as for example $(Lu_{1-a-b-c}Y_aTb_bA_c)_3(Al_{1-d}B_d)_5(O_{1-c}C_e)_{12}$:Ce, Eu, where A is selected from the group consisting of Mg, Sr, Ca, Ba or mixture thereof; B is selected from the group consisting of Ga, In or mixture thereof; C is selected from the group consisting of F, Cl, Br or mixture thereof; and $0 \leq a \leq 1$; $0 \leq b \leq 1$; $0 \leq c < 0.5$; $0 \leq d \leq 1$; and $0 \leq e \leq 0.2$;
- $((Sr_{1-z}M_z)_{1-(x+w)}A_wCe_x)_3(Al_{1-y}Si_y)O_{4+y+3(x-w)}F_{1-y-3(x-w)}$, wherein $0 < x \leq 0.10$, $0 \leq y \leq 0.5$, $0 \leq z \leq 0.5$, $0 \leq w \leq x$, A comprises Li, Na, K, Rb or mixture thereof; and M comprises Ca, Ba, Mg, Zn, Sn or mixture thereof, $(Sr_{0.98}Na_{0.01}Ce_{0.01})_3(Al_{0.9}Si_{0.1})O_{4.1}F_{0.9}$, $(Sr_{0.595}Ca_{0.4}Ce_{0.005})_3(Al_{0.6}Si_{0.4})O_{4.415}F_{0.585}$;

$BaMgAl_{10}O_{17}$:Eu, $Sr_5(PO_4)_3Cl$:Eu, AlN:Eu, $LaSi_3N_5$:Ce, $SrSi_9Al_{19}ON_{31}$:Eu, $SrSi_{6-x}Al_xO_{1+x}N_{8-x}$:Eu;

rare earth doped nanoparticles;

doped nanoparticles;

any phosphors known by the skilled artisan;

or a mixture thereof.

According to one embodiment, examples of phosphor nanoparticles include but are not limited to:

blue phosphors such as for example $BaMgAl_{10}O_{17}:Eu^{2+}$ or $Co^{2+}$, $Sr_5(PO_4)_3Cl:Eu^{2+}$, Al $N:Eu^{2+}$, $LaSi_3N_5:Ce^{3+}$, $SrSi_9Al_{19}ON_{31}:Eu^{2+}$, $SrSi_{6-x}Al_xO_{1+x}N_{8-x}:Eu^{2+}$;

red phosphors such as for example $Mn^{4+}$ doped potassium fluorosilicate (PFS), carbidonitrides, nitrides, sulfides (CaS), $CaAlSiN_3:Eu^{3+}$, $(Ca,Sr)AlSiN_3:Eu^{3+}$, $(Ca, Sr, Ba)_2Si_5N_8:Eu^{3+}$, $SrLiAl_3N_4:Eu^{3+}$, $SrMg_3SiN_4:Eu^{3+}$, red emitting silicates;

orange phosphors such as for example orange emitting silicates, Li, Mg, Ca, or Y doped α-SiAlON;

green phosphors such as for example oxynitrides, carbidonitrides, green emitting silicates, LuAG, green GAL, green YAG, green GaYAG, $\beta$-SiAlON:$Eu^{2+}$, $SrSi_2O_2N_2:Eu^{2+}$; and yellow phosphors such as for example yellow emitting silicates, TAG, yellow YAG, $La_3Si_6N_{11}:Ce^{3+}$ (LSN), yellow GAL.

According to one embodiment, examples of phosphor nanoparticles include but are not limited to: blue phosphors; red phosphors; orange phosphors; green phosphors; and yellow phosphors.

According to one embodiment, the phosphor nanoparticle has an average size of at least 0.5 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the phosphor nanoparticle has an average size ranging from 0.1 μm to 50 μm.

According to one embodiment, the luminescent particle 1 comprises one phosphor nanoparticle.

According to one embodiment, the nanoparticle 3 is a scintillator nanoparticle.

According to one embodiment, examples of scintillator nanoparticles include but are not limited to: NaI(Tl) (thallium-doped sodium iodide), CsI(Tl), CsI(Na), CsI(pure), CsF, KI(Tl), LiI(Eu), $BaF_2$, $CaF_2$(Eu), ZnS(Ag), $CaWO_4$, $CdWO_4$, YAG(Ce) ($Y_3Al_5O_{12}$(Ce)), GSO, LSO, $LaCl_3$(Ce) (lanthanum chloride doped with cerium), $LaBr_3$(Ce) (cerium-doped lanthanum bromide), LYSO ($Lu_{1.8}Y_{0.2}SiO_5$(Ce)), or a mixture thereof.

According to one embodiment, the nanoparticle 3 is a metal nanoparticle (gold, silver, aluminum, magnesium, or copper, alloys).

According to one embodiment, the nanoparticle 3 is an inorganic semiconductor or insulator which can be coated with organic compounds.

According to one embodiment, the inorganic semiconductor or insulator can be, for instance, group IV semiconductors (for instance, Carbon, Silicon, Germanium), group III-V compound semiconductors (for instance, Gallium Nitride, Indium Phosphide, Gallium Arsenide), II-VI compound semiconductors (for instance, Cadmium Selenide, Zinc Selenide, Cadmium Sulfide, Mercury Telluride), inorganic oxides (for instance, Indium Tin Oxide, Aluminum Oxide, Titanium Oxide, Silicon Oxide), and other chalcogenides.

According to one embodiment, the inorganic nanoparticle is a semiconductor nanocrystal.

According to one embodiment, the semiconductor nanocrystal comprises a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystal comprises a core comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystal comprises a material of formula $M_xN_yE_zA_w$, wherein M and/or N is selected from the group consisting of Ib, IIa, IIb, IIIa, IIIb, IVa, IVb, Va, Vb, VIb, VIIb, VIII, or mixtures thereof; E and/or A is selected from the group consisting of Va, VIa, VIIa, or mixtures thereof; x, y, z and w are independently a decimal number from 0 to 5; x, y, z and w are not simultaneously equal to 0; x and y are not simultaneously equal to 0; z and w may not be simultaneously equal to 0.

According to one embodiment, w, x, y and z are independently a decimal number from 0 to 5, at the condition that when w is 0, x, y and z are not 0, when x is 0, w, y and z are not 0, when y is 0, w, x and z are not 0 and when z is 0, w, x and y are not 0.

According to one embodiment, the semiconductor nanocrystal comprises a material of formula $M_xE_y$, wherein M is selected from group consisting of Cd, Zn, Hg, Ge, Sn, Pb, Cu, Ag, Fe, In, Al, Ti, Mg, Ga, Tl, Mo, Pd, W, Cs, Pb, or a mixture thereof; x and y are independently a decimal number from 0 to 5, x and y are not simultaneously equal to 0.

According to one embodiment, the semiconductor nanocrystal comprises a material of formula $M_xE_y$, wherein E is selected from group consisting of S, Se, Te, O, P, C, N, As, Sb, F, Cl, Br, I, or a mixture thereof; x and y are independently a decimal number from 0 to 5, x and y are not simultaneously equal to 0.

According to one embodiment, the semiconductor nanocrystal is selected from the group consisting of a IIb-VIa, IVa-VIa, Ib-IIIa-VIa, IIb-IVa-Va, Ib-VIa, VIII-VIa, IIb-Va, IIIa-VIa, IVb-VIa, IIa-VIa, IIIa-Va, IIIa-VIa, VIb-VIa, and Va-VIa semiconductor.

According to one embodiment, the semiconductor nanocrystal comprises a material $M_xN_yE_zA_w$ selected from the group consisting of CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, $MoS_2$, PdS, $Pd_4S$, $WS_2$, $CsPbCl_3$, $PbBr_3$, $CsPbBr_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, the inorganic nanoparticle is a semiconductor nanoplatelet, nanosheet, nanoribbon, nanowire, nanodisk, nanocube, nanoring, magic size cluster, or sphere such as for example quantum dot.

According to one embodiment, the inorganic nanoparticle is a semiconductor nanoplatelet, nanosheet, nanoribbon, nanowire, nanodisk, nanocube, magic size cluster, or nanoring.

According to one embodiment, the inorganic nanoparticle comprises an initial nanocrystal.

According to one embodiment, the inorganic nanoparticle comprises an initial colloidal nanocrystal.

According to one embodiment, the inorganic nanoparticle comprises an initial nanoplatelet.

According to one embodiment, the inorganic nanoparticle comprises an initial colloidal nanoplatelet.

According to one embodiment, the inorganic nanoparticle is a core nanoparticle, wherein each core is not partially or totally covered with at least one shell comprising at least one layer of inorganic material.

According to one embodiment, the inorganic nanoparticle is a core 33 nanocrystal, wherein each core 33 is not partially or totally covered with at least one shell 34 comprising at least one layer of inorganic material.

According to one embodiment, the inorganic nanoparticle is a core/shell nanoparticle, wherein the core is partially or totally covered with at least one shell comprising at least one layer of inorganic material.

According to one embodiment, the inorganic nanoparticle is a core nanocrystal, wherein the core is not partially or totally covered with a shell comprising at least one layer of inorganic material.

According to one embodiment, the inorganic nanoparticle is a core 33/shell 34 nanocrystals, wherein the core 33 is partially or totally covered with at least one shell 34 comprising at least one layer of inorganic material.

According to one embodiment, the core/shell semiconductor nanocrystal comprises at least one shell 34 comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are independently a decimal number from 0 to 5; x, y, z and w are not simultaneously equal to 0; x and y are not simultaneously equal to 0; z and w may not be simultaneously equal to 0.

According to one embodiment, the core/shell semiconductor nanocrystal comprises two shells (34, 35) comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5;

x, y, z and w are not simultaneously equal to 0; x and y are not simultaneously equal to 0; z and w may not be simultaneously equal to 0.

According to one embodiment, the shell 34 comprises a different material than the material of core 33.

According to one embodiment, the shell 34 comprises the same material than the material of core 33.

According to one embodiment, the shells (34, 35) comprise different materials.

According to one embodiment, the shells (34, 35) comprise the same material.

According to one embodiment, the core/shell semiconductor nanocrystal comprises at least one shell comprising a material of formula $M_xN_yE_zA_w$, wherein M, N, E and A are as described hereabove.

According to one embodiment, examples of core/shell semiconductor nanocrystals include but are not limited to: CdSe/CdS, CdSe/$Cd_xZn_{1-x}S$, CdSe/CdS/ZnS, CdSe/ZnS/CdS, CdSe/ZnS, CdSe/$Cd_xZn_{1-x}S$/ZnS, CdSe/ZnS/$Cd_xZn_{1-x}S$, CdSe/CdS/$Cd_xZn_{1-x}S$, CdSe/ZnSe/ZnS, CdSe/ZnSe/$Cd_xZn_{1-x}S$, $CdSe_xS_{1-x}$/CdS, $CdSe_xS_{1-x}$/CdZnS, $CdSe_xS_{1-x}$/CdS/ZnS, $CdSe_xS_{1-x}$/ZnS/CdS, $CdSe_xS_{1-x}$/ZnS, $CdSe_xS_{1-x}$/$Cd_xZn_{1-x}S$/ZnS, $CdSe_xS_{1-x}$/ZnS/$Cd_xZn_{1-x}S$, $CdSe_xS_{1-x}$/CdS/$Cd_xZn_{1-x}S$, $CdSe_xS_{1-x}$/ZnSe/ZnS, $CdSe_xS_{1-x}$/ZnSe/$Cd_xZn_{1-x}S$, InP/CdS, InP/CdS/ZnSe/ZnS, InP/$Cd_xZn_{1-x}S$, InP/CdS/ZnS, InP/ZnS/CdS, InP/ZnS, InP/$Cd_xZn_{1-x}S$/ZnS, InP/ZnS/$Cd_xZn_{1-x}S$, InP/CdS/$Cd_xZn_{1-x}S$, InP/ZnSe, InP/ZnSe/ZnS, InP/ZnSe/$Cd_xZn_{1-x}S$, InP/$ZnSe_xS_{1-x}$, InP/GaP/ZnS, $In_xZn_{1-x}P$/ZnS, $In_xZn_{1-x}P$/ZnS, InP/GaP/ZnSe, InP/ZnS/ZnSe, InP/GaP/ZnSe/ZnS, InP/ZnS/ZnSe/ZnS, wherein x is a decimal number from 0 to 1.

According to one embodiment, the core/shell semiconductor nanocrystal is ZnS rich, i.e. the last monolayer of the shell is a ZnS monolayer.

According to one embodiment, the core/shell semiconductor nanocrystal is CdS rich, i.e. the last monolayer of the shell is a CdS monolayer.

According to one embodiment, the core/shell semiconductor nanocrystal is $Cd_xZn_{1-x}S$ rich, i.e. the last monolayer of the shell is a $Cd_xZn_{1-x}S$ monolayer, wherein x is a decimal number from 0 to 1.

According to one embodiment, the last atomic layer of the semiconductor nanocrystal is a cation-rich monolayer of cadmium, zinc or indium.

According to one embodiment, the last atomic layer of the semiconductor nanocrystal is an anion-rich monolayer of sulfur, selenium or phosphorus.

According to one embodiment, the inorganic nanoparticle is a core/crown semiconductor nanocrystal.

According to one embodiment, the core/crown semiconductor nanocrystal comprises at least one crown 37 comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the core/crown semiconductor nanocrystal comprises at least one crown comprising a material of formula $M_xN_yE_zA_w$, wherein M, N, E and A are as described hereabove.

According to one embodiment, the crown 37 comprises a different material than the material of core 33.

According to one embodiment, the crown 37 comprises the same material than the material of core 33.

According to one embodiment, the semiconductor nanocrystal is atomically flat. In this embodiment, the atomically flat semiconductor nanocrystal may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanocrystal comprises an atomically flat core. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanocrystal is a semiconductor nanoplatelet.

According to one embodiment, the nanoparticles 3 comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the inorganic nanoparticles comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the semiconductor nanocrystals comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the luminescent particle 1 comprises at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the semiconductor nanocrystal comprises an initial nanoplatelet.

According to one embodiment, the semiconductor nanocrystal comprises an initial colloidal nanoplatelet.

According to one embodiment, the semiconductor nanoplatelet is atomically flat. In this embodiment, the atomically flat nanoplatelet may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanoplatelet is quasi-2D.

According to one embodiment, the semiconductor nanoplatelet comprises an atomically flat core. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence, or any other characterization means known by the person skilled in the art.

According to one embodiment, the semiconductor nanoplatelet is 2D-shaped.

According to one embodiment, the semiconductor nanoplatelet has a thickness tuned at the atomic level.

According to one embodiment, the semiconductor nanoplatelet comprises an initial nanocrystal.

According to one embodiment, the semiconductor nanoplatelet comprises an initial colloidal nanocrystal.

According to one embodiment, the semiconductor nanoplatelet comprises an initial nanoplatelet.

According to one embodiment, the semiconductor nanoplatelet comprises an initial colloidal nanoplatelet.

According to one embodiment, the core 33 of the semiconductor nanoplatelet is an initial nanoplatelet.

According to one embodiment, the initial nanoplatelet comprises a material of formula $M_xN_yE_zA_w$, wherein M, N, E and A are as described hereabove.

According to one embodiment, the thickness of the initial nanoplatelet comprises an alternate of atomic layers of M and E.

According to one embodiment, the thickness of the initial nanoplatelet comprises an alternate of atomic layers of M, N, A and E.

According to one embodiment, a semiconductor nanoplatelet comprises an initial nanoplatelet partially or completely covered with at least one layer of additional material.

According to one embodiment, the at least one layer of additional material comprises a material of formula $M_xN_yE_zA_w$, wherein M, N, E and A are as described hereabove.

According to one embodiment, a semiconductor nanoplatelet comprises an initial nanoplatelet partially or completely covered on a least one facet by at least one layer of additional material.

In one embodiment wherein several layers cover all or part of the initial nanoplatelet, these layers can be composed of the same material or composed of different materials.

In one embodiment wherein several layers cover all or part of the initial nanoplatelet, these layers can be composed such as to form a gradient of materials.

In one embodiment, the initial nanoplatelet is an inorganic colloidal nanoplatelet.

In one embodiment, the initial nanoplatelet comprised in the semiconductor nanoplatelet has preserved its 2D structure.

In one embodiment, the material covering the initial nanoplatelet is inorganic.

In one embodiment, at least one part of the semiconductor nanoplatelet has a thickness greater than the thickness of the initial nanoplatelet.

In one embodiment, the semiconductor nanoplatelet comprises the initial nanoplatelet totally covered with at least one layer of material.

In one embodiment, the semiconductor nanoplatelet comprises the initial nanoplatelet totally covered with a first layer of material, said first layer being partially or completely covered with at least a second layer of material.

In one embodiment, the initial nanoplatelet has a thickness of at least 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the thickness of the initial nanoplatelet is smaller than at least one of the lateral dimensions (length or width) of the initial nanoplatelet by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100; at least 150; at least 200; at least 250; at least 300; at least 350; at least 400; at least 450; at least 500; at least 550; at least 600; at least 650; at least 700; at least 750; at least 800; at least 850; at least 900; at least 950; or at least 1000.

In one embodiment, the initial nanoplatelet has lateral dimensions of at least 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the semiconductor nanoplatelet has a thickness of at least 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the semiconductor nanoplatelet has lateral dimensions of at least 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the thickness of the semiconductor nanoplatelet is smaller than at least one of the lateral dimensions (length or width) of the semiconductor nanoplatelet by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the semiconductor nanoplatelet is obtained by a process of growth in the thickness of at least one face of at least one initial nanoplatelet by deposition of a film or a layer of material on the surface of the at least one initial nanoplatelet; or a process lateral growth of at least one face of at least one initial nanoplatelet by deposition of a film or a layer of material on the surface of the at least one initial nanoplatelet; or any methods known by the person skilled in the art.

In one embodiment, the semiconductor nanoplatelet can comprise the initial nanoplatelet and 1, 2, 3, 4, 5 or more layers covering all or part of the initial nanoplatelet, said layers begin of same composition as the initial nanoplatelet or being of different composition than the initial nanoplatelet or being of different composition one another.

In one embodiment, the semiconductor nanoplatelet can comprise the initial nanoplatelet and at least 1, 2, 3, 4, 5 or more layers in which the first deposited layer covers all or part of the initial nanoplatelet and the at least second deposited layer covers all or part of the previously deposited layer, said layers being of same composition as the initial nanoplatelet or being of different composition than the initial nanoplatelet and possibly of different compositions one another.

According to one embodiment, the semiconductor nanoplatelet has a thickness quantified by a $M_xN_yE_zA_w$ monolayer, wherein M, N, E and A are as described hereabove.

According to one embodiment, the core 33 of the semiconductor nanoplatelet has a thickness of at least 1 $M_xN_yE_zA_w$ monolayer, at least 2 $M_xN_yE_zA_w$ monolayers, at least 3 $M_xN_yE_zA_w$ monolayers, at least 4 $M_xN_yE_zA_w$ monolayers, at least 5 $M_xN_yE_zA_w$ monolayers, wherein M, N, E and A are as described hereabove.

According to one embodiment, the shell 34 of the semiconductor nanoplatelet has a thickness quantified by a $M_xN_yE_zA_w$ monolayer, wherein M, N, E and A are as described hereabove, wherein M, N, E and A are as described hereabove.

According to one embodiment, the photoluminescence of the at least one nanoparticle 3 is preserved after encapsulation in the at least one particle 2 and after encapsulation of said at least one particle 2 in the luminescent particle 1.

According to one embodiment, the specific property of the nanoparticles 3 is preserved after encapsulation in the at least one particle 2 and after encapsulation of said at least one particle 2 in the luminescent particle 1.

According to one embodiment, the size ratio between the luminescent particle 1 and the at least one particle 2 ranges from 10 to 2 000, preferably from 10 to 1 500, more preferably from 10 to 1 000, even more preferably from 10 to 500.

According to one embodiment, the size ratio between the luminescent particle 1 and the at least one nanoparticle 3 ranges from 12 to 100 000, preferably from 50 to 50 000, more preferably from 100 to 10 000, even more preferably from 200 to 1 000.

According to one embodiment, the size ratio between the at least one particle 2 and the at least one nanoparticle 3 ranges from 1.25 to 1 000, preferably from 2 to 500, more preferably from 5 to 250, even more preferably from 5 to 100.

According to one embodiment illustrated in FIG. 11, the luminescent particle 1 is encapsulated in a bigger particle or a bead 8, wherein said bead 8 comprises a third material 81 and the luminescent particle 1 is dispersed in said third material 81.

According to one embodiment, the bead 8 is air processable. This embodiment is particularly advantageous for the manipulation or the transport of said bead 8 and for the use of said bead 8 in a device such as an optoelectronic device.

According to one embodiment, the bead 8 is compatible with standard lithography processes. This embodiment is particularly advantageous for the use of said bead 8 in a device such as an optoelectronic device.

According to one embodiment, the bead 8 is a colloidal particle.

According to one embodiment, the bead 8 is fluorescent.

According to one embodiment, the bead 8 is fluorescent.

According to one embodiment, the bead 8 is phosphorescent.

According to one embodiment, the bead 8 is electroluminescent.

According to one embodiment, the bead 8 is chemiluminescent.

According to one embodiment, the bead 8 exhibits an emission spectrum with at least one emission peak, wherein said emission peak has a maximum emission wavelength ranging from 400 nm to 50 μm.

According to one embodiment, the bead 8 exhibits an emission spectrum with at least one emission peak, wherein said emission peak has a maximum emission wavelength ranging from 400 nm to 500 nm. In this embodiment, the bead 8 emits blue light.

According to one embodiment, the bead 8 exhibits an emission spectrum with at least one emission peak, wherein said emission peak has a maximum emission wavelength ranging from 500 nm to 560 nm, more preferably ranging from 515 nm to 545 nm. In this embodiment, the bead 8 emits green light.

According to one embodiment, the bead 8 exhibits an emission spectrum with at least one emission peak, wherein said emission peak has a maximum emission wavelength ranging from 560 nm to 590 nm. In this embodiment, the bead 8 emits yellow light.

According to one embodiment, the bead 8 exhibits an emission spectrum with at least one emission peak, wherein said emission peak has a maximum emission wavelength ranging from 590 nm to 750 nm, more preferably ranging from 610 nm to 650 nm. In this embodiment, the bead 8 emits red light.

According to one embodiment, the bead 8 exhibits an emission spectrum with at least one emission peak, wherein said emission peak has a maximum emission wavelength ranging from 750 nm to 50 μm. In this embodiment, the bead 8 emits near infra-red, mid-infra-red, or infra-red light.

According to one embodiment, the bead 8 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the bead 8 exhibits emission spectra with at least one emission peak having a full width half maximum strictly lower than 40 nm, 30 nm, 25 nm, 20 nm, 15 nm, or 10 nm.

According to one embodiment, the bead 8 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the bead 8 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the bead 8 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the bead 8 has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the bead 8 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one preferred embodiment, the bead 8 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 W.cm$^{-2}$, 120 W.cm$^{-2}$, 130 W.cm$^{-2}$, 140 W.cm$^{-2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{-2}$, or 100 kW.cm$^{-2}$.

In one embodiment, the bead 8 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 mW.cm$^{-2}$, 50 mW.cm$^{-2}$, 100 mW.cm$^{-2}$, 500 mW.cm$^{-2}$, 1 W.cm$^{-2}$, 5 W.cm$^{-2}$, 10 W.cm$^{-2}$, 20 W.cm$^{-2}$, 30 W.cm$^{-2}$, 40 W.cm$^{-2}$, 50 W.cm$^{-2}$, 60 W.cm$^{-2}$, 70 W.cm$^{-2}$, 80 W.cm$^{-2}$, 90 W.cm$^{-2}$, 100 W.cm$^{-2}$, 110 W.cm$^{-2}$, 120 W.cm$^{-2}$, 130 W.cm$^{-2}$, 140 W.cm$^{-2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{-2}$, or 100 kW.cm$^{-2}$.

In one preferred embodiment, the bead 8 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 mW.cm$^{-2}$, 50 mW.cm$^{-2}$, 100 mW.cm$^{-2}$, 500 mW.cm$^{-2}$, 1 W.cm$^{-2}$, 5 W.cm$^{-2}$, 10 W.cm$^{-2}$, 20 W.cm$^{-2}$, 30 W.cm$^{-2}$, 40 W.cm$^{-2}$, 50 W.cm$^{-2}$, 60 W.cm$^{-2}$, 70 W.cm$^{-2}$, 80 W.cm$^{-2}$, 90 W.cm$^{-2}$, 100 W.cm$^{-2}$, 110 W.cm$^{-2}$, 120 W.cm$^{-2}$, 130 W.cm$^{-2}$, 140 W.cm$^{-2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{-2}$, or 100 kW.cm$^{-2}$.

According to one embodiment, the bead 8 has a size above 50 nm.

According to one embodiment, the bead 8 has a size of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of bead 8 has an average size of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 or 1 mm.

According to one embodiment, the bead 8 has a largest dimension of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the bead 8 has a smallest dimension of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 0 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the bead 8 is smaller than the largest dimension of said bead 8 by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the bead 8 has a smallest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm, 0.0526 μm$^{-1}$, 0.0519 μm$^{-1}$ 0.0513 μm$^{-1}$, 0.0506 μm$^{-1}$, 0.05 μm$^{-1}$, 0.0494 μm$^{-1}$, 0.0488 μm$^{-1}$ 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$; 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the bead 8 has a largest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, in a statistical set of beads 8, said beads 8 are polydisperse. According to one embodiment, in a statistical set of beads 8, said beads 8 are monodisperse.

According to one embodiment, in a statistical set of beads 8, said beads 8 have a narrow size distribution.

According to one embodiment, in a statistical set of beads 8, said beads 8 are not aggregated.

According to one embodiment, the surface roughness of the bead 8 is less or equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said bead 8, meaning that the surface of said bead 8 is completely smooth.

According to one embodiment, the surface roughness of the bead 8 is less or equal to 0.5% of the largest dimension of said bead 8, meaning that the surface of said bead 8 is completely smooth.

According to one embodiment, the bead 8 has a spherical shape, an ovoid shape, a discoidal shape, a cylindrical shape, a faceted shape, a hexagonal shape, a triangular shape, a cubic shape, or a platelet shape.

According to one embodiment, the bead 8 has a spherical shape.

According to one embodiment, the spherical bead 8 has a diameter of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of spherical bead 8 has an average diameter of at least 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical bead 8 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical bead 8 has a unique curvature of at least 200 $μm^{-1}$, 100 $μm^{-1}$, 66.6 $μm^{-1}$, 50 $μm^{-1}$, 33.3 $μm^{-1}$, 28.6 $μm^{-1}$, 25 $μm^{-1}$, 20 $μm^{-1}$, 18.2 $μm^{-1}$, 16.7 $μm^{-1}$, 15.4 $μm^{-1}$, 14.3 $μm^{-1}$, 13.3 $μm^{-1}$, 12.5 $μm^{-1}$, 11.8 $μm^{-1}$, 11.1 $μm^{-1}$, 10.5 $μm^{-1}$, 10 $μm^{-1}$, 9.5 $μm^{-1}$, 9.1 $μm^{-1}$, 8.7 $μm^{-1}$, 8.3 $μm^{-1}$, 8 $μm^{-1}$, 7.7 $μm^{-1}$, 7.4 $μm^{-1}$, 7.1 $μm^{-1}$, 6.9 $μm^{-1}$, 6.7 $μm^{-1}$, 5.7 $μm^{-1}$, 5 $μm^{-1}$, 4.4 $μm^{-1}$, 4 $μm^{-1}$, 3.6 $μm^{-1}$, 3.3 $μm^{-1}$, 3.1 $μm^{-1}$, 2.9 $μm^{-1}$, 2.7 $μm^{-1}$, 2.5 $μm^{-1}$, 2.4 $μm^{-1}$, 2.2 $μm^{-1}$, 2.1 $μm^{-1}$, 2 $μm^{-1}$, 1.3333 $μm^{-1}$, 0.8 $μm^{-1}$, 0.6666 $μm^{-1}$, 0.5714 $μm^{-1}$, 0.5 $μm^{-1}$, 0.4444 $μm^{-1}$, 0.4 $μm^{-1}$, 0.3636 $μm^{-1}$, 0.3333 $μm^{-1}$, 0.3080 $μm^{-1}$, 0.2857 $μm^{-1}$, 0.2667 $μm^{-1}$, 0.25 $μm^{-1}$, 0.2353 $μm^{-1}$, 0.2222 $μm^{-1}$, 0.2105 $μm^{-1}$, 0.2 $μm^{-1}$, 0.1905 $μm^{-1}$, 0.1818 $μm^{-1}$, 0.1739 $μm^{-1}$, 0.1667 $μm^{-1}$, 0.16 $μm^{-1}$, 0.1538 $μm^{-1}$, 0.1481 $μm^{-1}$, 0.1429 $μm^{-1}$, 0.1379 $μm^{-1}$, 0.1333 $μm^{-1}$, 0.1290 $μm^{-1}$, 0.125 $μm^{-1}$, 0.1212 $μm^{-1}$, 0.1176 $μm^{-1}$, 0.1176 $μm^{-1}$, 0.1143 $μm^{-1}$, 0.1111 $μm^{-1}$, 0.1881 $μm^{-1}$, 0.1053 $μm^{-1}$, 0.1026 $μm^{-1}$, 0.1 $μm^{-1}$, 0.0976 $μm^{-1}$, 0.9524 $μm^{-1}$, 0.0930 $μm^{-1}$, 0.0909 $μm^{-1}$, 0.0889 $μm^{-1}$, 0.870 $μm^{-1}$, 0.0851 $μm^{-1}$, 0.0833 $μm^{-1}$, 0.0816 $μm^{-1}$, 0.08 $μm^{-1}$, 0.0784 $μm^{-1}$, 0.0769 $μm^{-1}$, 0.0755 $μm^{-1}$, 0.0741 $μm^{-1}$, 0.0727 $μm^{-1}$, 0.0714 $μm^{-1}$, 0.0702 $μm^{-1}$, 0.0690 $μm^{-1}$, 0.0678 $μm^{-1}$, 0.0667 $μm^{-1}$, 0.0656 $μm^{-1}$, 0.0645 $μm^{-1}$, 0.0635 $μm^{-1}$, 0.0625 $μm^{-1}$, 0.0615 $μm^{-1}$, 0.0606 $μm^{-1}$, 0.0597 $μm^{-1}$, 0.0588 $μm^{-1}$, 0.0580 $μm^{-1}$, 0.0571 $μm^{-1}$, 0.0563 $μm^{-1}$, 0.0556 $μm^{-1}$, 0.0548 $μm^{-1}$, 0.0541 $μm^{-1}$, 0.0533 $μm^{-1}$, 0.0526 $μm^{-1}$, 0.0519 $μm^{-1}$, 0.0513 $μm^{-1}$, 0.0506 $μm^{-1}$, 0.05 $μm^{-1}$, 0.0494 $μm^{-1}$, 0.0488 $μm^{-1}$, 0.0482 $μm^{-1}$, 0.0476 $μm^{-1}$, 0.0471 $μm^{-1}$, 0.0465 $μm^{-1}$, 0.0460 $μm^{-1}$, 0.0455 $μm^{-1}$, 0.0450 $μm^{-1}$, 0.0444 $μm^{-1}$, 0.0440 $μm^{-1}$, 0.0435 $μm^{-1}$, 0.0430 $μm^{-1}$, 0.0426 $μm^{-1}$, 0.0421 $μm^{-1}$, 0.0417 $μm^{-1}$, 0.0412 $μm^{-1}$, 0.0408 $μm^{-1}$, 0.0404 $μm^{-1}$, 0.04 $μm^{-1}$, 0.0396 $μm^{-1}$, 0.0392 $μm^{-1}$, 0.0388 $μm^{-1}$, 0.0385 $μm^{-1}$; 0.0381 $μm^{-1}$, 0.0377 $μm^{-1}$, 0.0374 $μm^{-1}$, 0.037 $μm^{-1}$, 0.0367 $μm^{-1}$, 0.0364 $μm^{-1}$, 0.0360 $μm^{-1}$, 0.0357 $μm^{-1}$, 0.0354 $μm^{-1}$, 0.0351 $μm^{-1}$, 0.0348 $μm^{-1}$, 0.0345 $μm^{-1}$, 0.0342 $μm^{-1}$, 0.0339 $μm^{-1}$, 0.0336 $μm^{-1}$, 0.0333 $μm^{-1}$, 0.0331 $μm^{-1}$, 0.0328 $μm^{-1}$, 0.0325 $μm^{-1}$, 0.0323 $μm^{-1}$, 0.032 $μm^{-1}$, 0.0317 $μm^{-1}$, 0.0315 $μm^{-1}$, 0.0312 $μm^{-1}$, 0.031 $μm^{-1}$, 0.0308 $μm^{-1}$, 0.0305 $μm^{-1}$, 0.0303 $μm^{-1}$, 0.0301 $μm^{-1}$, 0.03 $μm^{-1}$, 0.0299 $μm^{-1}$, 0.0296 $μm^{-1}$, 0.0294 $μm^{-1}$, 0.0292 $μm^{-1}$, 0.029 $μm^{-1}$, 0.0288 $μm^{-1}$, 0.0286 $μm^{-1}$, 0.0284 $μm^{-1}$, 0.0282 $μm^{-1}$, 0.028 $μm^{-1}$, 0.0278 $μm^{-1}$, 0.0276 $μm^{-1}$, 0.0274 $μm^{-1}$, 0.0272 $μm^{-1}$, 0.0270 $μm^{-1}$, 0.0268 $μm^{-1}$, 0.02667 $μm^{-1}$, 0.0265 $μm^{-1}$, 0.0263 $μm^{-1}$, 0.0261 $μm^{-1}$, 0.026 $μm^{-1}$, 0.0258 $μm^{-1}$, 0.0256 $μm^{-1}$, 0.0255 $μm^{-1}$, 0.0253 $μm^{-1}$, 0.0252 $μm^{-1}$, 0.025 $μm^{-1}$, 0.0248 $μm^{-1}$, 0.0247 $μm^{-1}$, 0.0245 $μm^{-1}$, 0.0244 $μm^{-1}$, 0.0242 $μm^{-1}$, 0.0241 $μm^{-1}$, 0.024 $μm^{-1}$, 0.0238 $μm^{-1}$, 0.0237 $μm^{-1}$, 0.0235 $μm^{-1}$, 0.0234 $μm^{-1}$, 0.0233 $μm^{-1}$, 0.231 $μm^{-1}$, 0.023 $μm^{-1}$, 0.0229 $μm^{-1}$, 0.0227 $μm^{-1}$, 0.0226 $μm^{-1}$, 0.0225 $μm^{-1}$, 0.0223 $μm^{-1}$, 0.0222 $μm^{-1}$, 0.0221 $μm^{-1}$, 0.022 $μm^{-1}$, 0.0219 $μm^{-1}$, 0.0217 $μm^{-1}$, 0.0216 $μm^{-1}$, 0.0215 $μm^{-1}$, 0.0214 $μm^{-1}$, 0.0213 $μm^{-1}$, 0.0212 $μm^{-1}$, 0.0211 $μm^{-1}$, 0.021 $μm^{-1}$, 0.0209 $μm^{-1}$, 0.0208 $μm^{-1}$, 0.0207 $μm^{-1}$, 0.0206 $μm^{-1}$, 0.0205 $μm^{-1}$, 0.0204 $μm^{-1}$, 0.0203 $μm^{-1}$, 0.0202 $μm^{-1}$, 0.0201 $μm^{-1}$, 0.02 $μm^{-1}$, or 0.002 $μm^{-1}$.

According to one embodiment, a statistical set of the spherical beads 8 has an average unique curvature of at least 200 $μm^{-1}$, 100 $μm^{-1}$, 66.6 $μm^{-1}$, 50 $μm^{-1}$, 33.3 $μm^{-1}$, 28.6 $μm^{-1}$, 25 $μm^{-1}$, 20 $μm^{-1}$, 18.2 $μm^{-1}$, 16.7 $μm^{-1}$, 15.4 $μm^{-1}$, 14.3 $μm^{-1}$, 13.3 $μm^{-1}$, 12.5 $μm^{-1}$, 11.8 $μm^{-1}$, 11.1 $μm^{-1}$, 10.5 $μm^{-1}$, 10 $μm^{-1}$, 9.5 $μm^{-1}$, 9.1 $μm^{-1}$, 8.7 $μm^{-1}$, 8.3 $μm^{-1}$, 8 $μm^{-1}$, 7.7 $μm^{-1}$, 7.4 $μm^{-1}$, 7.1 $μm^{-1}$, 6.9 $μm^{-1}$, 6.7 $μm^{-1}$, 5.7 $μm^{-1}$, 5 $μm^{-1}$, 4.4 $μm^{-1}$, 4 $μm^{-1}$, 3.6 $μm^{-1}$, 3.3 $μm^{-1}$, 3.1 $μm^{-1}$, 2.9 $μm^{-1}$, 2.7 $μm^{-1}$, 2.5 $μm^{-1}$, 2.4 $μm^{-1}$, 2.2 $μm^{-1}$, 2.1 $μm^{-1}$, 2 $μm^{-1}$, 1.3333 $μm^{-1}$, 0.8 $μm^{-1}$, 0.6666 $μm^{-1}$, 0.5714 $μm^{-1}$, 0.5 $μm^{-1}$, 0.4444 $μm^{-1}$, 0.4 $μm^{-1}$, 0.3636 $μm^{-1}$, 0.3333 $μm^{-1}$, 0.3080 $μm^{-1}$, 0.2857 $μm^{-1}$, 0.2667 $μm^{-1}$, 0.25 $μm^{-1}$, 0.2353 $μm^{-1}$, 0.2222 $μm^{-1}$, 0.2105 $μm^{-1}$, 0.2 $μm^{-1}$, 0.1905 $μm^{-1}$, 0.1818 $μm^{-1}$, 0.1739 $μm^{-1}$, 0.1667 $μm^{-1}$, 0.16 $μm^{-1}$, 0.1538 $μm^{-1}$, 0.1481 $μm^{-1}$, 0.1429 $μm^{-1}$, 0.1379 $μm^{-1}$, 0.1333 $μm^{-1}$, 0.1290 $μm^{-1}$, 0.125 $μm^{-1}$, 0.1212 $μm^{-1}$, 0.1176 $μm^{-1}$, 0.1176 $μm^{-1}$, 0.1143 $μm^{-1}$, 0.1111 $μm^{-1}$, 0.1881 $μm^{-1}$, 0.1053 $μm^{-1}$, 0.1026 $μm^{-1}$, 0.1 $μm^{-1}$, 0.0976 $μm^{-1}$, 0.9524 $μm^{-1}$, 0.0930 $μm^{-1}$, 0.0909 $μm^{-1}$, 0.0889 $μm^{-1}$, 0.870 $μm^{-1}$, 0.0851 $μm^{-1}$, 0.0833 $μm^{-1}$, 0.0816 $μm^{-1}$, 0.08 $μm^{-1}$, 0.0784 $μm^{-1}$, 0.0769 $μm^{-1}$, 0.0755 $μm^{-1}$, 0.0741 $μm^{-1}$, 0.0727 $μm^{-1}$, 0.0714 $μm^{-1}$, 0.0702

$\mu m^{-1}$, 0.0690 $\mu m^{-1}$, 0.0678 $\mu m^{-1}$, 0.0667 $\mu m^{-1}$, 0.0656 $\mu m^{-1}$, 0.0645 $\mu m^{-1}$, 0.0635 $\mu m^{-1}$, 0.0625 $\mu m^{-1}$, 0.0615 $\mu m^{-1}$, 0.0606 $\mu m^{-1}$, 0.0597 $\mu m^{-1}$, 0.0588 $\mu m^{-1}$, 0.0580 $\mu m^{-1}$, 0.0571 $\mu m^{-1}$, 0.0563 $\mu m^{-1}$, 0.0556 $\mu m^{-1}$, 0.0548 $\mu m^{-1}$, 0.0541 $\mu m^{-1}$, 0.0533 $\mu m^{-1}$, 0.0526 $\mu m^{-1}$, 0.0519 $\mu m^{-1}$, 0.0513 $\mu m^{-1}$, 0.0506 $\mu m^{-1}$, 0.05 $\mu m^{-1}$, 0.0494 $\mu m^{-1}$, 0.0488 $\mu m^{-1}$, 0.0482 $\mu m^{-1}$, 0.0476 $\mu m^{-1}$, 0.0471 $\mu m^{-1}$, 0.0465 $\mu m^{-1}$, 0.0460 $\mu m^{-1}$, 0.0455 $\mu m^{-1}$, 0.0450 $\mu m^{-1}$, 0.0444 $\mu m^{-1}$, 0.0440 $\mu m^{-1}$, 0.0435 $\mu m^{-1}$, 0.0430 $\mu m^{-1}$, 0.0426 $\mu m^{-1}$, 0.0421 $\mu m^{-1}$, 0.0417 $\mu m^{-1}$, 0.0412 $\mu m^{-1}$, 0.0408 $\mu m^{-1}$, 0.0404 $\mu m^{-1}$, 0.04 $\mu m^{-1}$, 0.0396 $\mu m^{-1}$, 0.0392 $\mu m^{-1}$, 0.0388 $\mu m^{-1}$, 0.0385 $\mu m^{-1}$, 0.0381 $\mu m^{-1}$, 0.0377 $\mu m^{-1}$, 0.0374 $\mu m^{-1}$, 0.037 $\mu m^{-1}$, 0.0367 $\mu m^{-1}$, 0.0364 $\mu m^{-1}$, 0.0360 $\mu m^{-1}$, 0.0357 $\mu m^{-1}$, 0.0354 $\mu m^{-1}$, 0.0351 $\mu m^{-1}$, 0.0348 $\mu m^{-1}$, 0.0345 $\mu m^{-1}$, 0.0342 $\mu m^{-1}$, 0.0339 $\mu m^{-1}$, 0.0336 $\mu m^{-1}$, 0.0333 $\mu m^{-1}$, 0.0331 $\mu m^{-1}$, 0.0328 $\mu m^{-1}$, 0.0325 $\mu m^{-1}$, 0.0323 $\mu m^{-1}$, 0.032 $\mu m^{-1}$, 0.0317 $\mu m^{-1}$, 0.0315 $\mu m^{-1}$, 0.0312 $\mu m^{-1}$, 0.031 $\mu m^{-1}$, 0.0308 $\mu m^{-1}$, 0.0305 $\mu m^{-1}$, 0.0303 $\mu m^{-1}$, 0.0301 $\mu m^{-1}$, 0.03 $\mu m^{-1}$, 0.0299 $\mu m^{-1}$, 0.0296 $\mu m^{-1}$, 0.0294 $\mu m^{-1}$, 0.0292 $\mu m^{-1}$, 0.029 $\mu m^{-1}$, 0.0288 $\mu m^{-1}$, 0.0286 $\mu m^{-1}$, 0.0284 $\mu m^{-1}$, 0.0282 $\mu m^{-1}$, 0.028 $\mu m^{-1}$, 0.0278 $\mu m^{-1}$, 0.0276 $\mu m^{-1}$, 0.0274 $\mu m^{-1}$, 0.0272 $\mu m^{-1}$; 0.0270 $\mu m^{-1}$, 0.0268 $\mu m^{-1}$, 0.02667 $\mu m^{-1}$, 0.0265 $\mu m^{-1}$, 0.0263 $\mu m^{-1}$, 0.0261 $\mu m^{-1}$, 0.026 $\mu m^{-1}$, 0.0258 $\mu m^{-1}$, 0.0256 $\mu m^{-1}$, 0.0255 $\mu m^{-1}$, 0.0253 $\mu m^{-1}$, 0.0252 $\mu m^{-1}$, 0.025 $\mu m^{-1}$, 0.0248 $\mu m^{-1}$, 0.0247 $\mu m^{-1}$, 0.0245 $\mu m^{-1}$, 0.0244 $\mu m^{-1}$, 0.0242 $\mu m^{-1}$, 0.0241 $\mu m^{-1}$, 0.024 $\mu m^{-1}$, 0.0238 $\mu m^{-1}$, 0.0237 $\mu m^{-1}$, 0.0235 $\mu m^{-1}$, 0.0234 $\mu m^{-1}$, 0.0233 $\mu m^{-1}$, 0.231 $\mu m^{-1}$, 0.023 $\mu m^{-1}$, 0.0229 $\mu m^{-1}$, 0.0227 $\mu m^{-1}$, 0.0226 $\mu m^{-1}$, 0.0225 $\mu m^{-1}$, 0.0223 $\mu m^{-1}$, 0.0222 $\mu m^{-1}$, 0.0221 $\mu m^{-1}$, 0.022 $\mu m^{-1}$, 0.0219 $\mu m^{-1}$, 0.0217 $\mu m^{-1}$, 0.0216 $\mu m^{-1}$, 0.0215 $\mu m^{-1}$, 0.0214 $\mu m^{-1}$, 0.0213 $\mu m^{-1}$, 0.0212 $\mu m^{-1}$, 0.0211 $\mu m^{-1}$, 0.021 $\mu m^{-1}$, 0.0209 $\mu m^{-1}$, 0.0208 $\mu m^{-1}$, 0.0207 $\mu m^{-1}$, 0.0206 $\mu m^{-1}$, 0.0205 $\mu m^{-1}$, 0.0204 $\mu m^{-1}$, 0.0203 $\mu m^{-1}$, 0.0202 $\mu m^{-1}$, 0.0201 $\mu m^{-1}$, 0.02 $\mu m^{-1}$, or 0.002 $\mu m^{-1}$.

According to one embodiment, the curvature of the spherical bead 8 has no deviation, meaning that said bead 8 has a perfect spherical shape. A perfect spherical shape prevents fluctuations of the intensity of the scattered light.

According to one embodiment, the unique curvature of the spherical bead 8 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said bead 8.

Bead 8 with an average size less than 1 μm have several advantages compared to bigger particles comprising the same number of luminescent particles 1: i) increasing the light scattering compared to bigger particles; ii) obtaining more stable colloidal suspensions compared to bigger particles, when they are dispersed in a solvent; iii) having a size compatible with pixels of at least 100 nm.

Bead 8 with an average size larger than 1 μm have several advantages compared to smaller particles comprising the same number of luminescent particles 1: i) reducing light scattering compared to smaller particles; ii) having whispering-gallery wave modes; iii) having a size compatible with pixels larger than or equal to 1 μm; iv) increasing the average distance between nanoparticles 3 comprised in the luminescent particle 1, resulting in a better heat draining; v) increasing the average distance between nanoparticles 3 comprised in the luminescent particle 1 and the surface of said luminescent particle 1, thus better protecting the nanoparticles 3 against oxidation, or delaying oxidation resulting from a chemical reaction with chemical species coming from the outer space of said luminescent particle 1; vi) increasing the mass ratio between the luminescent particle 1 and nanoparticle 3 comprised in the luminescent particle 1 compared to smaller luminescent particles 1, thus reducing the mass concentration of chemical elements subject to ROHS standards, making it easier to comply with ROHS requirements.

According to one embodiment, the bead 8 is ROHS compliant.

According to one embodiment, the bead 8 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the bead 8 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the bead 8 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the bead 8 comprises heavier chemical elements than the main chemical element present in the third material 81. In this embodiment, said heavy chemical elements in the bead 8 will lower the mass concentration of chemical elements subject to ROHS standards, allowing said bead 8 to be ROHS compliant.

According to one embodiment, examples of heavy chemical elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the bead 8 exhibits at least one other property so that the bead 8 is also: magnetic; ferromagnetic; paramagnetic; superparamagnetic; diamagnetic; plasmonic; piezo-electric; pyro-electric; ferro-electric; drug delivery featured; a light scatterer; an electrical insulator; an electrical conductor; a thermal insulator; a thermal conductor; and/or a local high temperature heating system.

According to one embodiment, the bead 8 exhibits at least one other property comprising one or more of the following: capacity of increasing local electromagnetic field, magnetization, magnetic coercivity, catalytic yield, catalytic properties, photovoltaic properties, photovoltaic yield, electrical polarization, thermal conductivity, electrical conductivity, permeability to molecular oxygen, permeability to molecular water, or any other properties.

According to one embodiment, the bead 8 is an electrical insulator. In this embodiment, the quenching of fluorescent properties for fluorescent nanoparticles 3 encapsulated in the second material 21 is prevented when it is due to electron transport. In this embodiment, the bead 8 may be used as an electrical insulator material exhibiting the same properties as the nanoparticles 3 encapsulated in the second material 21.

According to one embodiment, the bead 8 is an electrical conductor. This embodiment is particularly advantageous for an application of the luminescent particle 1 in photovoltaics or LEDs.

According to one embodiment, the bead 8 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the bead 8 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the bead 8 may be measured for example with an impedance spectrometer.

According to one embodiment, the bead 8 is a thermal insulator.

According to one embodiment, the bead 8 is a thermal conductor. In this embodiment, the bead 8 is capable of draining away the heat originating from the luminescent particle 1, or from the environment.

According to one embodiment, the bead 8 has a thermal conductivity at standard conditions ranging from 0.1 to 450 W/(m.K), preferably from 1 to 200 W/(m.K), more preferably from 10 to 150 W/(m.K).

According to one embodiment, the bead 8 has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380

W/(m.K), 390 W/(m.K), 400 W/(m.K), 410 W/(m.K), 420 W/(m.K), 430 W/(m.K), 440 W/(m.K), or 450 W/(m.K).

According to one embodiment, the thermal conductivity of the bead 8 may be measured for example by steady-state methods or transient methods.

According to one embodiment, the bead 8 is hydrophobic.

According to one embodiment, the bead 8 is hydrophilic.

According to one embodiment, the bead 8 is surfactant-free. In this embodiment, the surface of the bead 8 will be easy to functionalize as said surface will not be blocked by any surfactant molecule.

According to one embodiment, the bead 8 is not surfactant-free.

According to one embodiment, the bead 8 is amorphous.

According to one embodiment, the bead 8 is crystalline.

According to one embodiment, the bead 8 is totally crystalline.

According to one embodiment, the bead 8 is partially crystalline.

According to one embodiment, the bead 8 is monocrystalline.

According to one embodiment, the bead 8 is polycrystalline. In this embodiment, the bead 8 comprises at least one grain boundary.

According to one embodiment, the bead 8 is porous.

According to one embodiment, the bead 8 is considered porous when the quantity adsorbed by the bead 8 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the bead 8 can be hexagonal, vermicular or cubic.

According to one embodiment, the organized porosity of the bead 8 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the bead 8 is not porous.

According to one embodiment, the bead 8 does not comprise pores or cavities.

According to one embodiment, the bead 8 is considered non-porous when the quantity adsorbed by said bead 8 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the bead 8 is permeable.

According to one embodiment, the permeable bead 8 has an intrinsic permeability to fluids higher or equal to $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the bead 8 is impermeable to outer molecular species, gas or liquid.

According to one embodiment, the impermeable bead 8 has an intrinsic permeability to fluids less or equal to $10^{-11}$ $cm^2$, $10^{-12}$ $cm^2$, $10^{-13}$ $cm^2$, $10^{-14}$ $cm^2$, or $10^{-15}$ $cm^2$.

According to one embodiment, the bead 8 has an oxygen transmission rate ranging from $10^{-7}$ to $10^{-1}$ $cm^3.m^{-2}.day^{-1}$, preferably from $10^{-7}$ to $10^{-4}$ $cm^3.m^{-2}.day^{-1}$, more preferably from $10^{-7}$ to $10^{-1}$ $cm^3.m^{-2}.day^{-1}$, even more preferably from $10^{-7}$ to $10^{4}$ $cm^3.m^{-2}.day^{-1}$ at room temperature.

According to one embodiment, the bead 8 has a water vapor transmission rate ranging from $10^{-7}$ to 10 $g.m^{-2}.day^{-1}$, preferably from $10^{-7}$ to 1 $g.m^{-2}.day^{-1}$, more preferably from $10^{-7}$ to $10^{-1}$ $g.m^{-2}.day^{-1}$, even more preferably from $10^{-7}$ to $10^{-4}$ $g.m^{-2}.day^{-1}$ at room temperature. A water vapor transmission rate of $10^{-6}$ $g.m^{-2}.day^{-1}$ is particularly adequate for a use on LED.

According to one embodiment, the bead 8 is optically transparent, i.e. the bead 8 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the bead 8 comprises at least one luminescent particle 1 dispersed in the third material 81.

According to one embodiment, the bead 8 does not comprise only one luminescent particle 1 dispersed in the third material 81. In this embodiment, the bead 8 is not a core/shell particle wherein the luminescent particle 1 is the core with a shell of the third material 81.

According to one embodiment, the bead 8 comprises at least two luminescent particles 1 dispersed in the third material 81.

According to one embodiment, the bead 8 comprises a plurality of luminescent particles 1 dispersed in the third material 81.

According to one embodiment, the bead 8 comprises at least 1, at least 2, at least 3, at least 4, at least 5, at least 6, at least 7, at least 8, at least 9, at least 10, at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 luminescent particles 1 dispersed in the third material 81.

According to one embodiment, the luminescent particle 1 is totally surrounded by or encapsulated in the third material 81.

According to one embodiment, the luminescent particle 1 is partially surrounded by or encapsulated in the third material 81.

According to one embodiment, the luminescent particle 1 represents at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% by weight of the bead 8.

According to one embodiment, the loading charge of the luminescent particle 1 in the bead 8 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of the luminescent particle 1 in the bead 8 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the luminescent particle 1 comprised in the bead 8 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the luminescent particles 1 comprised in the same bead 8 are not aggregated.

According to one embodiment, the luminescent particles 1 comprised in the same bead 8 do not touch, are not in contact.

According to one embodiment, the luminescent particles 1 comprised in the same bead 8 are separated by third material 81.

According to one embodiment, the luminescent particles 1 comprised in the same bead 8 are aggregated.

According to one embodiment, the luminescent particles 1 comprised in the same bead 8 touch, are in contact.

According to one embodiment, the luminescent particle 1 comprised in the same bead 8 can be individually evidenced.

According to one embodiment, the luminescent particle 1 comprised in the same bead 8 can be individually evidenced by transmission electron microscopy or fluorescence scanning microscopy, or any other characterization means known by the person skilled in the art.

According to one embodiment, the plurality of luminescent particles 1 is uniformly dispersed in the third material 81.

The uniform dispersion of the plurality of luminescent particles 1 in the third material 81 comprised in the bead 8 prevents the aggregation of said luminescent particles 1, thereby preventing the degradation of their properties. For example, in the case of inorganic fluorescent particles, a uniform dispersion will allow the optical properties of said particles to be preserved, and quenching can be avoided.

According to one embodiment, each luminescent particle 1 of the plurality of luminescent particles 1 is spaced from its adjacent luminescent particle 1 by an average minimal distance.

According to one embodiment, the average minimal distance between two luminescent particles 1 is controlled.

According to one embodiment, the average minimal distance is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two luminescent particles 1 in the same bead 8 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 300 µm, 400 µm, 500 µm, 600 µm, 700 µm, 800 µm, 900 µm, or 1 mm.

According to one embodiment, the average distance between two luminescent particles 1 in the same bead 8 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the bead 8 comprises a combination of at least two different luminescent particles 1. In this embodiment, the resulting bead 8 will exhibit different properties.

In a preferred embodiment, the bead 8 comprises at least two different luminescent particles 1, wherein at least one luminescent particle 1 emits at a wavelength in the range from 500 to 560 nm, and at least one luminescent particle 1 emits at a wavelength in the range from 600 to 2500 nm. In this embodiment, the bead 8 comprises at least one luminescent particle 1 emitting in the green region of the visible spectrum and at least one luminescent particle 1 emitting in the red region of the visible spectrum, thus the bead 8 paired with a blue LED will be a white light emitter.

In a preferred embodiment, the bead 8 comprises at least two different luminescent particles 1, wherein at least one luminescent particle 1 emits at a wavelength in the range from 400 to 490 nm, and at least one luminescent particle 1 emits at a wavelength in the range from 600 to 2500 nm. In this embodiment, the bead 8 comprises at least one luminescent particle 1 emitting in the blue region of the visible spectrum and at least one luminescent particle 1 emitting in the red region of the visible spectrum, thus the bead 8 will be a white light emitter.

In a preferred embodiment, the bead 8 comprises at least two luminescent different particles 1, wherein at least one luminescent particle 1 emits at a wavelength in the range from 400 to 490 nm, and at least one luminescent particle 1 emits at a wavelength in the range from 500 to 560 nm. In this embodiment, the bead 8 comprises at least one luminescent particle 1 emitting in the blue region of the visible spectrum and at least one luminescent particle 1 emitting in the green region of the visible spectrum.

In a preferred embodiment, the bead 8 comprises three different luminescent particles 1, wherein said luminescent particles 1 emit different emission wavelengths or color.

In a preferred embodiment, the bead 8 comprises at least three different luminescent particles 1, wherein at least one luminescent particle 1 emits at a wavelength in the range from 400 to 490 nm, at least one luminescent particle 1 emits at a wavelength in the range from 500 to 560 nm and at least one luminescent particle 1 emits at a wavelength in the range from 600 to 2500 nm. In this embodiment, the bead 8 comprises at least one luminescent particle 1 emitting in the blue region of the visible spectrum, at least one luminescent particle 1 emitting in the green region of the visible spectrum and at least one luminescent particle 1 emitting in the red region of the visible spectrum.

In a preferred embodiment, the bead 8 does not comprise any luminescent particle 1 on its surface. In this embodiment, the at least luminescent particle 1 is completely surrounded by the third material 81.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of luminescent particles 1 are comprised in the third material 81. In this embodiment, each of said luminescent particles 1 is completely surrounded by the third material 81.

According to one embodiment, the bead 8 comprises at least 100%, 95%, 90%, 85%, 80%, 75%, 70%, 65%, 60%, 55%, 50%, 45%, 40%, 35%, 30%, 25%, 20%, 15%, 10%, 5%, 1% or 0% of luminescent particles 1 on its surface.

According to one embodiment, the bead 8 comprises at least one luminescent particle 1 dispersed in the third material 81, i.e. totally surrounded by said third material 81; and at least one luminescent particle 1 located on the surface of said bead 8.

According to one embodiment, the luminescent particle 1 is only located on the surface of said bead 8. This embodiment is advantageous as the luminescent particle 1 will be better excited by the incident light than if said luminescent particle 1 was dispersed in the third material 81.

According to one embodiment, the luminescent particle 1 located on the surface of said bead 8 may be chemically or physically adsorbed on said surface.

According to one embodiment, the luminescent particle 1 located on the surface of said bead 8 may be adsorbed on said surface.

According to one embodiment, the luminescent particle 1 located on the surface of said bead 8 may be adsorbed with a cement on said surface.

According to one embodiment, examples of cement include but are not limited to: polymers, silicon, oxides, or a mixture thereof.

According to one embodiment, the luminescent particle 1 located on the surface of said bead 8 may have at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of its volume trapped in the third material 81.

According to one embodiment, the plurality of luminescent particles 1 is uniformly is uniformly spaced on the surface of the bead 8.

According to one embodiment, each luminescent particle 1 of the plurality of luminescent particles 1 is spaced from its adjacent luminescent particle 1 by an average minimal distance.

According to one embodiment, the average minimal distance between two luminescent particles 1 is controlled.

According to one embodiment, the average minimal distance between two luminescent particles 1 on the surface of the bead 8 is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two luminescent particles 1 on the surface of the bead 8 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two luminescent particles 1 on the surface of the bead 8 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the bead 8 exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

Photoluminescence refers to fluorescence and/or phosphorescence.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In one embodiment, the bead 8 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW.cm^{-2}$ and 100 $kW.cm^{-2}$, more preferably between 10 $mW.cm^{-2}$ and 100 $W.cm^{-2}$, and even more preferably between 10 $mW.cm^{-2}$ and 30 $W.cm^{-2}$.

According to one embodiment, the photon flux or average peak pulse power of the illumination is at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the bead 8 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{2}$, 90 $W.cm^{2}$, 100 $W.cm^{2}$, 110 $W.cm^{2}$, 120 $W.cm^{2}$, 130 $W.cm^{2}$, 140 $W.cm^{2}$, 150 $W.cm^{2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the bead 8 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW.cm^{-2}$, 50 $mW.cm^{-2}$, 100 $mW.cm^{-2}$, 500 $mW.cm^{2}$, 1 $W.cm^{-2}$, 5 $W.cm^{-2}$, 10 $W.cm^{2}$, 20 $W.cm^{-2}$, 30 $W.cm^{-2}$, 40 $W.cm^{-2}$, 50 $W.cm^{2}$, 60 $W.cm^{-2}$, 70 $W.cm^{2}$, 80 $W.cm^{2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{2}$, 1 $kW.cm^{-2}$, 50 $kW.cm^{-2}$, or 100 $kW.cm^{-2}$.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its photoluminescence quantum yield (PLQY) of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40°

C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the bead 8 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the third material 81 has a bandgap of at least 3.0 eV, 3.1 eV, 3.2 eV, 3.3 eV, 3.4 eV, 3.5 eV, 3.6 eV, 3.7 eV, 3.8 eV, 3.9 eV, 4.0 eV, 4.1 eV, 4.2 eV, 4.3 eV, 4.4 eV, 4.5 eV, 4.6 eV, 4.7 eV, 4.8 eV, 4.9 eV, 5.0 eV, 5.1 eV, 5.2 eV, 5.3 eV, 5.4 eV or 5.5 eV.

According to one embodiment, the third material 81 is selected from the group consisting of oxide materials, semiconductor materials, wide-bandgap semiconductor materials or a mixture thereof.

According to one embodiment, examples of semiconductor materials include but are not limited to: III-V semiconductors, II-VI semiconductors, or a mixture thereof.

According to one embodiment, examples of wide-bandgap semiconductor materials include but are not limited to: silicon carbide SiC, aluminium nitride AlN, gallium nitride GaN, boron nitride BN, or a mixture thereof.

According to one embodiment, examples of oxide materials include but are not limited to: $SiO_2$, $Al_2O_3$, $TiO_2$, $ZrO_2$, FeO, ZnO, MgO, $SnO_2$, $Nb_2O_5$, $CeO_2$, BeO, $IrO_2$, CaO, $Sc_2O_3$, $Na_2O$, BaO, $K_2O$, $TeO_2$, MnO, $B_2O_3$, $GeO_2$, $As_2O_3$, $Ta_2O_5$, $Li_2O$, SrO, $Y_2O_3$, $HfO_2$, $MoO_2$, $Tc_2O_7$, $ReO_2$, $Co_3O_4$, OsO, $RhO_2$, $Rh_2O_3$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, the third material 81 is selected from the group consisting of silicon oxide, aluminium oxide, titanium oxide, iron oxide, calcium oxide, magnesium oxide, zinc oxide, tin oxide, beryllium oxide, zirconium oxide, niobium oxide, cerium oxide, iridium oxide, scandium oxide, sodium oxide, barium oxide, potassium oxide, tellurium oxide, manganese oxide, boron oxide, germanium oxide, osmium oxide, rhenium oxide, arsenic oxide, tantalum oxide, lithium oxide, strontium oxide, yttrium oxide, hafnium oxide, molybdenum oxide, technetium oxide, rhodium oxide, cobalt oxide, gallium oxide, indium oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, silicon carbide SiC, aluminium nitride AlN, gallium nitride GaN, boron nitride BN, mixed oxides, mixed oxides thereof, or a mixture thereof.

According to one embodiment, the third material 81 comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO)_3$, $Ca_3Cr_2(SiO)_3$, $Al_5Lu_3O_{12}$, GAL, GaYAG, or a mixture thereof.

According to one embodiment, the third material 81 comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, mixed oxides, mixed oxides thereof or a mixture thereof; x and y are independently a decimal number from 0 to 10, at the condition that x and y are not simultaneously equal to 0, and $x \neq 0$.

According to one embodiment, the third material 81 comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, mixed oxides, mixed oxides thereof or a mixture thereof.

According to one embodiment, the third material 81 comprises or consists of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, mixed oxides, mixed oxides thereof or a mixture thereof.

According to one embodiment, the third material 81 comprises a material including but not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof, garnets such as for example $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the third material 81 comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said third material 81.

According to one embodiment, the third material 81 does not comprise $SiO_2$.

According to one embodiment, the third material 81 does not consist of pure $SiO_2$, i.e. 100% $SiO_2$.

According to one embodiment, the third material 81 does not comprise glass.

According to one embodiment, the third material 81 does not comprise vitrified glass.

According to one embodiment, the third material 81 comprises additional heteroelements, wherein said additional heteroelements include but are not limited to: Cd, S, Se, Zn, In, Te, Hg, Sn, Cu, N, Ga, Sb, Tl, Mo, Pd, Ce, W, Co, Mn, Si, Ge, B, P, Al, As, Fe, Ti, Zr, Ni, Ca, Na, Ba, K, Mg, Pb, Ag, V, Be, Ir, Sc, Nb, Ta or a mixture thereof. In this embodiment, heteroelements can diffuse in the bead 8 and/or the luminescent particle 1 and/or the at least one particle 2 during heating step. They may form nanoclusters inside the bead 8 and/or the luminescent particle 1 and/or the at least one particle 2. These elements can limit the degradation of the photoluminescence of said bead 8 and/or the luminescent particle 1 and/or the at least one particle 2 during the heating step, and/or drain away the heat if it is a good thermal conductor, and/or evacuate electrical charges.

According to one embodiment, the first material 11 and/or the second material 21 comprise additional heteroelements in small amounts of 0 mole %, 1 mole %, 5 mole %, 10 mole %, 15 mole %, 20 mole %, 25 mole %, 30 mole %, 35 mole %, 40 mole %, 45 mole %, 50 mole % relative to the majority element of said first material 11.

According to one embodiment, the third material 81 comprises $Al_2O_3$, $SiO_2$, MgO, ZnO, $ZrO_2$, $TiO_2$, $IrO_2$, $SnO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, or $Y_2O_3$ additional nanoparticles. These additional nanoparticles can drain away the heat if it is a good thermal conductor, and/or evacuate electrical charges, and/or scatter an incident light.

According to one embodiment, the third material 81 comprises additional nanoparticles in small amounts at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight compared to the bead 8 and/or the luminescent particle 1 and/or the at least one particle 2.

According to one embodiment, the third material 81 has a density ranging from 1 to 10, preferably the third material 81 has a density ranging from 3 to 10.

According to one embodiment, the third material 81 has a density superior or equal to the density of the first material 11.

According to one embodiment, the third material 81 has a density superior or equal to the density of the second material 21.

According to one embodiment, the third material 81 has a refractive index ranging from 1 to 5, from 1.2 to 2.6, from 1.4 to 2.0 at 450 nm.

According to one embodiment, the third material 81 has a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 at 450 nm.

According to one embodiment, the third material 81 has the same refractive index than the second material 21.

According to one embodiment, the third material 81 has the same refractive index than the first material 11.

According to one embodiment, the third material 81 has a refractive index distinct from the refractive index of the first material 11. This embodiment allows for a wider scattering of light. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the third material 81 has a refractive index distinct from the refractive index of the second material 21. This embodiment allows for a wider scattering of light. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the third material 81 has a refractive index superior or equal to the refractive index of the first material 11.

According to one embodiment, the third material 81 has a refractive index superior or equal to the refractive index of the second material 21.

According to one embodiment, the first material 11 has a refractive index inferior to the refractive index of the second material 21.

According to one embodiment, the third material 81 has a refractive index inferior to the refractive index of the first material 11.

According to one embodiment, the third material 81 has a refractive index inferior to the refractive index of the second material 21.

According to one embodiment, the third material 81 has a difference of refractive index with the refractive index of the first material 11 and/or the second material 21 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2 at 450 nm.

According to one embodiment, the third material 81 has a difference of refractive index with the refractive index of the first material 11 and/or the second material 21 of 0.02 at 450 nm.

According to one embodiment, the third material 81 acts as a barrier against oxidation of the at least one nanoparticle 3.

According to one embodiment, the third material 81 is thermally conductive.

According to one embodiment, the third material 81 has a thermal conductivity at standard conditions ranging from 0.1 to 450 W/(m.K), preferably from 1 to 200 W/(m.K), more preferably from 10 to 150 W/(m.K).

According to one embodiment, the third material 81 has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

According to one embodiment, the thermal conductivity of the third material 81 may be measured by for example by steady-state methods or transient methods.

According to one embodiment, the third material 81 is not thermally conductive.

According to one embodiment, the third material 81 comprises a refractory material.

According to one embodiment, the third material 81 is electrically insulator. In this embodiment, the quenching of fluorescent properties for fluorescent nanoparticles encapsulated in the second material 21 is prevented when it is due to electron transport. In this embodiment, the bead 8 may be used as an electrical insulator material exhibiting the same properties as the nanoparticles 3 encapsulated in the second material 21.

According to one embodiment, the third material 81 are electrically conductive. This embodiment is particularly advantageous for an application of the bead 8 in photovoltaics or LEDs.

According to one embodiment, the third material 81 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the third material 81 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10$ S/m, $1\times10$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the third material 81 may be measured for example with an impedance spectrometer.

According to one embodiment, the third material 81 is amorphous.

According to one embodiment, the third material 81 is crystalline.

According to one embodiment, the third material 81 is totally crystalline.

According to one embodiment, the third material 81 is partially crystalline.

According to one embodiment, the third material 81 is monocrystalline.

According to one embodiment, the third material 81 is polycrystalline. In this embodiment, the third material 81 comprises at least one grain boundary.

According to one embodiment, the third material 81 is hydrophobic.

According to one embodiment, the third material 81 is hydrophilic.

According to one embodiment, the third material 81 is porous.

According to one embodiment, the third material 81 is considered porous when the quantity adsorbed by the bead 8 determined by adsorption-desorption of nitrogen in the Brunauer Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the third material 81 can be hexagonal, vermicular or cubic.

According to one embodiment, the organized porosity of the third material 81 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the third material 81 is not porous.

According to one embodiment, the third material 81 does not comprise pores or cavities.

According to one embodiment, the third material 81 is considered non-porous when the quantity adsorbed by the bead 8 determined by adsorption-desorption of nitrogen in the Brunauer Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the third material 81 is permeable. In this embodiment, permeation of outer molecular species, gas or liquid in the f third material 81 is possible.

According to one embodiment, the permeable third material 81 has an intrinsic permeability to fluids higher or equal to $10^{-20}$ $cm^2$, $10^{-19}$ $cm^2$, $10^{-}cm^2$, $10^{-17}$ $cm^2$, $10^{-16}$ $cm^2$, $10^{-15}$ $cm^2$, $10^{-14}$ $cm^2$, $10^{-13}$ $cm^2$, $10^{-12}$ $cm^2$, $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the third material 81 is impermeable to outer molecular species, gas or liquid. In this embodiment, the third material 81 limits or prevents the degradation of the chemical and physical properties of the at least one nanoparticle 3 from molecular oxygen, water and/or high temperature.

According to one embodiment, the impermeable third material 81 has an intrinsic permeability to fluids less or equal to $10^{-11}$ $cm^2$, $10^{-12}$ $cm^2$, $10^{-13}$ $cm^2$, $10^{-14}$ $cm^2$, $10^{-15}$ $cm^2$, $10^{-16}$ $cm^2$, $10^{-17}$ $cm^2$, $10^{-18}$ $cm^2$, $10^{-19}$ $cm^2$, or $10^{-20}$ $cm^2$.

According to one embodiment, the third material 81 limits or prevents the diffusion of outer molecular species or fluids (liquid or gas) into said third material 81.

According to one embodiment, the third material 81 is optically transparent, i.e. the third material 81 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the third material 81 does not absorb all incident light allowing the at least one nanoparticle 3 to absorb all the incident light; and/or the third material 81 does not absorb the light emitted by the at least one nanoparticle 3 allowing to said light emitted to be transmitted through the third material 81.

According to one embodiment, the third material 81 is not optically transparent, i.e. the third material 81 absorbs light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the third material 81 absorbs part of the incident light allowing the at least one nanoparticle 3 to absorb only a part of the incident light; and/or the third material 81 absorbs part of the light emitted by the at least one nanoparticle 3 allowing said light emitted to be partially transmitted through the third material 81.

According to one embodiment, the third material 81 is stable under acidic conditions, i.e. at pH inferior or equal to 7. In this embodiment, the third material 81 is sufficiently robust to withstand acidic conditions, meaning that the properties of the bead 8 are preserved under said conditions.

According to one embodiment, the third material 81 is stable under basic conditions, i.e. at pH superior to 7. In this embodiment, the third material 81 is sufficiently robust to withstand basic conditions, meaning that the properties of the bead 8 are preserved under said conditions.

According to one embodiment, the third material 81 is physically and chemically stable under various conditions. In this embodiment, the third material 81 is sufficiently robust to withstand the conditions to which the bead 8 will be subjected.

According to one embodiment, the third material 81 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0%, 10%, 20%, 30%, 40%, 50%, 55%, 60%, 65%, 70%, 75%, 80%, 85%, 90%, 95%, or 99% of humidity and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the third material 81 is sufficiently robust to withstand the conditions to which the bead 8 will be subjected.

According to one embodiment, the third material 81 is the same as the second material 21 as described hereabove.

According to one embodiment, the third material 81 is different from the first material 11 as described hereabove.

According to one embodiment, the third material 81 is different from the second material 21 as described hereabove.

According to one embodiment, the particle 1 does not comprise nanoparticles coated with grease and encapsulated in $SiO_2$. In this embodiment, grease can refer to lipids as, for example, long apolar carbon chain molecules; phosphlipid molecules that possess a charged end group; polymers such as block copolymers or copolymers, wherein one portion of polymer has a domain of long apolar carbon chains, either part of the backbone or part of the polymeric sidechain; or long hydrocarbon chains that have a terminal functional group that includes carboxylates, sulfates, phosphonates or thiols.

According to a preferred embodiment, examples of luminescent particle 1 include but are not limited to: semiconductor nanoparticles encapsulated in an inorganic material dispersed in $Al_2O_3$, $HfO_2$, $Si_{0.8}Hf_{0.2}O_2$, ZnS, ZnO, MgO, or $SiO_2$; semiconductor nanocrystals encapsulated in an inorganic material dispersed in $Al_2O_3$, $HfO_2$, $Si_{0.8}Hf_{0.2}O_2$, ZnS, ZnO, MgO, or $SiO_2$; semiconductor nanoplatelets encapsulated in an inorganic material dispersed in $Al_2O_3$, $HfO_2$, $Si_{0.8}Hf_{0.2}O_2$, ZnS, ZnO, MgO, or $SiO_2$; perovskite nanoparticles encapsulated in an inorganic material dispersed in $Al_2O_3$, $HfO_2$, $Si_{0.8}Hf_{0.2}O_2$, ZnS, ZnO, MgO, or $SiO_2$; phosphor nanoparticles encapsulated in an inorganic material dispersed in $Al_2O_3$, $HfO_2$, $Si_{0.8}Hf_{0.2}O_2$, ZnS, ZnO, MgO, or $SiO_2$; semiconductor nanoplatelets coated with grease dispersed in $Al_2O_3$, $HfO_2$, $Si_{0.8}Hf_{0.2}O_2$, ZnS, ZnO, MgO, or $SiO_2$; or a mixture thereof. In this embodiment, grease can refer to lipids as, for example, long apolar carbon chain molecules; phosphlipid molecules that possess a charged end group; polymers such as block copolymers or copolymers, wherein one portion of polymer has a domain of long apolar carbon chains, either part of the backbone or part of the polymeric sidechain; or long hydrocarbon chains that have a terminal functional group that includes carboxylates, sulfates, phosphonates or thiols.

According to a preferred embodiment, examples of luminescent particle 1 include but are not limited to: CdSe/CdZnS@$SiO_2$@$Al_2O_3$, CdSe/CdZnS@$Si_xCd_yZn_zO_w$@$Al_2O_3$, CdSe/CdZnS—Au@$SiO_2$@$Al_2O_3$, CdSeS/CdZnS@$SiO_2$@$Al_2O_3$, InP/ZnSe/ZnS@$SiO_2$@$Al_2O_3$, CdSeS/CdZnS@$SiO_2$@$Al_2O_3$, phosphor nanoparticles@$SiO_2$@$Al_2O_3$, $Fe_3O_4$@$SiO_2$@$Al_2O_3$, InP/ZnS@$SiO_2$@$Al_2O_3$, CdSe/CdZnS—Au@$SiO_2$@$Al_2O_3$, CdSe/CdS/ZnS@$SiO_2$@$Al_2O_3$; CdSe/CdZnS@$SiO_2$@ZnO, CdSe/CdZnS@$Si_xCd_yZn_zO_w$@ZnO, CdSe/CdZnS—Au@$SiO_2$@ZnO, CdSeS/CdZnS@$SiO_2$@ZnO, InP/ZnSe/ZnS@$SiO_2$@ZnO, CdSeS/CdZnS@$SiO_2$@ZnO, phosphor nanoparticles@$SiO_2$@ZnO, $Fe_3O_4$@$SiO_2$@ZnO, InP/ZnS@$SiO_2$@ZnO, CdSe/CdZnS—Au@$SiO_2$@ZnO, CdSe/CdS/ZnS@$SiO_2$@ZnO; CdSe/CdZnS@$SiO_2$@$HfO_2$, CdSe/CdZnS@$Si_xCd_yZn_zO_w$@$HfO_2$, CdSe/CdZnS—Au@$SiO_2$@$HfO_2$, CdSeS/CdZnS@$SiO_2$@$HfO_2$, InP/ZnSe/ZnS@$SiO_2$@$HfO_2$, CdSeS/CdZnS@$SiO_2$@$HfO_2$, phosphor nanoparticles@$SiO_2$@$HfO_2$, $Fe_3O_4$@$SiO_2$@$HfO_2$, InP/ZnS@$SiO_2$@$HfO_2$, CdSe/CdZnS—Au@$SiO_2$@$HfO_2$, CdSe/CdS/ZnS@$SiO_2$@$HfO_2$; CdSe/CdZnS@$SiO_2$@MgO, CdSe/CdZnS@$Si_xCd_yZn_zO_w$@MgO, CdSe/CdZnS—Au@$SiO_2$@MgO, CdSeS/CdZnS@$SiO_2$@MgO, InP/ZnSe/ZnS@$SiO_2$@MgO, CdSeS/CdZnS@$SiO_2$@MgO, phosphor nanoparticles@$SiO_2$@MgO, $Fe_3O_4$@$SiO_2$@MgO, InP/ZnS@$SiO_2$@MgO, CdSe/CdZnS—Au@$SiO_2$@MgO, CdSe/CdS/ZnS@$SiO_2$@MgO; CdSe/CdZnS@$Al_2O_3$@$SiO_2$, InP/ZnS@$Al_2O_3$@$SiO_2$, $CH_5N_2$—$PbBr_3$@$Al_2O_3$@$SiO_2$, CdS/ZnS@$Al_2O_3$@$SiO_2$, CdSeS/CdZnS@$Al_2O_3$@$SiO_2$, CdSeS/ZnS@$Al_2O_3$@$SiO_2$, $Fe_3O_4$@$Al_2O_3$@$SiO_2$, CdSe/CdZnS-phosphor nanoparticles@$Al_2O_3$@$SiO_2$; CdSe/CdZnS@$Al_2O_3$@ZnO, InP/ZnS@$Al_2O_3$@ZnO, $CH_5N_2$—$PbBr_3$@$Al_2O_3$@ZnO, CdS/ZnS@$Al_2O_3$@ZnO, CdSeS/CdZnS@$Al_2O_3$@ZnO, CdSeS/ZnS@$Al_2O_3$@ZnO, $Fe_3O_4$@$Al_2O_3$@ZnO, CdSe/CdZnS-phosphor nanoparticles@$Al_2O_3$@ZnO; CdSe/CdZnS@$Al_2O_3$@$HfO_2$, InP/ZnS@$Al_2O_3$@$HfO_2$, $CH_5N_2$—$PbBr_3$@$Al_2O_3$@$HfO_2$, CdS/ZnS@$Al_2O_3$@$HfO_2$, CdSeS/CdZnS@$Al_2O_3$@$HfO_2$, CdSeS/ZnS@$Al_2O_3$@$HfO_2$, $Fe_3O_4$@$Al_2O_3$@$HfO_2$, CdSe/CdZnS-phosphor nanoparticles@$Al_2O_3$@$HfO_2$; CdSe/CdZnS@$Al_2O_3$@MgO, InP/ZnS@$Al_2O_3$@MgO, $CH_5N_2$—$PbBr_3$@$Al_2O_3$@MgO, CdS/ZnS@$Al_2O_3$@MgO, CdSeS/CdZnS@$Al_2O_3$@MgO, CdSeS/ZnS@$Al_2O_3$@MgO, $Fe_3O_4$@$Al_2O_3$@MgO, CdSe/CdZnS-phosphor nanoparticles @$Al_2O_3$@MgO; CdSe/CdZnS@ZnO@$Al_2O_3$, CdSe/CdZnS@ZnO@$Al_2O_3$, phosphor nanoparticles@ZnO@$Al_2O_3$; CdSe/CdZnS@ZnO@$HfO_2$, CdSe/CdZnS@ZnO@$HfO_2$, phosphor nanoparticles@ZnO@$HfO_2$; CdSe/CdZnS@ZnO@$SiO_2$, CdSe/CdZnS@ZnO@$SiO_2$, phosphor nanoparticles @ZnO@$SiO_2$; CdSe/CdZnS@ZnO@MgO, CdSe/CdZnS@ZnO@MgO, phosphor nanoparticles@ZnO@MgO; phosphor nanoparticles@$HfO_2$@$Al_2O_3$, CdSe/CdZnS@$HfO_2$@$Al_2O_3$, CdSeS/CdZnS@$HfO_2$@$Al_2O_3$, InP/ZnS@$HfO_2$@$Al_2O_3$, CdSeS/CdZnS@$HfO_2$@$Al_2O_3$, InP/ZnSe/ZnS@$HfO_2$@$Al_2O_3$, CdSe/CdZnS—$Fe_3O_4$@$HfO_2$@$Al_2O_3$; phosphor nanoparticles@$HfO_2$@$SiO_2$, CdSe/CdZnS@$HfO_2$@$SiO_2$, CdSeS/CdZnS@$HfO_2$@$SiO_2$, InP/ZnS@$HfO_2$@$SiO_2$, CdSeS/CdZnS@$HfO_2$@$SiO_2$, InP/ZnSe/ZnS@$HfO_2$@$SiO_2$, CdSe/CdZnS—$Fe_3O_4$@$HfO_2$@$SiO_2$; phosphor nanoparticles@$HfO_2$@ZnO, CdSe/CdZnS@$HfO_2$@ZnO, CdSeS/CdZnS@$HfO_2$@ZnO, InP/ZnS@$HfO_2$@ZnO, CdSeS/CdZnS@$HfO_2$@ZnO, InP/ZnSe/ZnS@$HfO_2$@ZnO, CdSe/CdZnS—$Fe_3O_4$@$HfO_2$@ZnO; phosphor nanoparticles@$HfO_2$@MgO, CdSe/CdZnS@$HfO_2$@MgO, CdSeS/CdZnS@$HfO_2$@MgO, InP/ZnS@$HfO_2$@MgO, CdSeS/CdZnS@$HfO_2$@MgO, InP/ZnSe/ZnS@$HfO_2$@MgO, CdSe/CdZnS—$Fe_3O_4$@$HfO_2$@MgO; InP/GaP/ZnSe/ZnS@$Al_2O_3$@$HfO_2$; InP/ZnS/ZnSe/ZnS@$Al_2O_3$@$HfO_2$; CdSe/CdZnS@$HfO_2$@$Si_{0.8}Hf_{0.2}O_2$; CdSe/CdZnS@$Al_2O_3$@$HfO_2$; CdSe/CdZnS@$Al_2O_3$ and $SnO_2$ particles encapsulated in $Al_2O_3$; phosphor particles@$Al_2O_3$@$HfO_2$ CdSe/CdZnS@$HfO_2$@$Al_2O_3$; CdSe/CdZnS@$HfO_2$ and $SnO_2$ particles encapsulated in $Al_2O_3$; phosphor particles@$HfO_2$@$Al_2O_3$; CdSe/CdZnS@$HfO_2$@$SiO_2$ comprising $SnO_2$ nanoparticles; semiconductor nanoplatelets@$Al_2O_3$@$SiO_2$; semiconductor nanoplatelets@$HfO_2$@$SiO_2$; semiconductor nanoplatelets@$Al_2O_3$@$SiO_2$; CdSe/CdZnS@$HfO_2$@$SiO_2$; or a mixture thereof; wherein phosphor nanoparticles include but are not limited to: Yttrium aluminium garnet particles (YAG, $Y_3Al_5O_{12}$), (Ca,Y)-α-SiAlON:Eu particles, $((Y,Gd)_3(Al,Ga)_5O_{12}:Ce)$ particles, $CaAlSiN_3$:Eu particles, sulfide-based phosphor particles, PFS:$Mn^{4+}$ particles (potassium fluorosilicate).

According to one embodiment, the luminescent particle 1 does not comprise quantum dots encapsulated in $TiO_2$, semiconductor nanocrystals encapsulated in $TiO_2$, or semiconductor nanoplatelet encapsulated in $TiO_2$.

According to one embodiment, the luminescent particle 1 does not comprise a spacer layer between the nanoparticles 3 and the first or second material.

According to one embodiment, the luminescent particle 1 does not comprise one core/shell nanoparticle wherein the core is luminescent and emits red light, and the shell is a spacer layer between the nanoparticles 3 and the first or second material.

According to one embodiment, the luminescent particle 1 does not comprise a core/shell nanoparticle and a plurality of nanoparticles 3, wherein the core is luminescent and emits red light, and the shell is a spacer layer between the nanoparticles 3 and the first or second material.

According to one embodiment, the luminescent particle 1 does not comprise at least one luminescent core, a spacer layer, an encapsulation layer and a plurality of quantum dots, wherein the luminescent core emits red light, and the spacer layer is situated between said luminescent core and the first or second material 2.

According to one embodiment, the luminescent particle 1 does not comprise a luminescent core sourrounded by a spacer layer and emitting red light.

According to one embodiment, the luminescent particle 1 does not comprise nanoparticles covering or surrounding a luminescent core.

According to one embodiment, the luminescent particle 1 does not comprise nanoparticles covering or surrounding a luminescent core emitting red light.

According to one embodiment, the luminescent particle 1 does not comprise a luminescent core made by a specific material selected from the group consisting of silicate phosphor, aluminate phosphor, phosphate phosphor, sulfide phosphor, nitride phosphor, nitrogen oxide phosphor, and combination of aforesaid two or more materials; wherein said luminescent core is covered by a spacer layer.

Another object of the invention is the luminescent particle 1 of the invention, wherein said luminescent particle 1 is functionalized.

A functionalized luminescent particle 1 can then be dispersed in a host material for further use.

According to one embodiment, the host material may comprise an ionic crystal based on acetate, carbonate, chloride, citrate, cyanide, fluoride, nitrate, nitrite, phosphate, or sulfate.

Some applications, for example biological applications, require particles to be functionalized with a biocompatible agent for example.

According to one embodiment, the luminescent particle 1 of the invention is functionalized with a specific-binding component, wherein said specific-binding component includes but is not limited to: antigens, steroids, vitamins, drugs, haptens, metabolites, toxins, environmental pollutants, amino acids, peptides, proteins, antibodies, polysaccharides, nucleotides, nucleosides, oligonucleotides, psoralens, hormones, nucleic acids, nucleic acid polymers, carbohydrates, lipids, phospholipids, lipoproteins, lipopolysaccharides, liposomes, lipophilic polymers, synthetic polymers, polymeric microparticles, biological cells, virus and combinations thereof. Preferred peptides include, but are not limited to: neuropeptides, cytokines, toxins, protease substrates, and protein kinase substrates. Preferred protein conjugates include enzymes, antibodies, lectins, glycoproteins, histones, albumins, lipoproteins, avidin, streptavidin, protein A, protein G, phycobiliproteins and other fluorescent proteins, hormones, toxins and growth factors. Preferred nucleic acid polymers are single- or multi-stranded, natural or synthetic DNA or RNA oligonucleotides, or DNA/RNA hybrids, or incorporating an unusual linker such as morpholine derivatized phosphides, or peptide nucleic acids such as N-(2-aminoethyl)glycine units, where the nucleic acid contains fewer than 50 nucleotides, more typically fewer than 25 nucleotides. The functionalization of the luminescent particle 1 of the invention can be made using techniques known in the art.

Another object of the invention relates to light emitting material 7 comprising at least one host material 71 and at least one luminescent particle 1 of the invention, wherein said at least one luminescent particle 1 is dispersed in the at least one host material 71 (as illustrated in FIG. 13A).

The light emitting material 7 allows the protection of the luminescent particle 1 from molecular oxygen, water and/or high temperature by the at least one host material 71. Therefore, deposition of a supplementary protective layer on top of said light emitting material 7 is not compulsory, which can save time, money and loss of luminescence.

According to one embodiment, the host material 71 surrounds, encapsulates and/or covers partially or totally at least one luminescent particle 1.

According to one embodiment, the light emitting material 7 further comprises a plurality of luminescent particle 1.

According to one embodiment illustrated in FIG. 18 C-D, the light emitting material 7 comprises at least two host materials 71. In this embodiment, the host materials may be different or identical.

According to one embodiment, the light emitting material 7 comprises a plurality of host materials 71.

According to one embodiment, the plurality of luminescent particles 1 is uniformly dispersed in the host material 71.

According to one embodiment, the loading charge of luminescent particles 1 in the host material 71 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of luminescent particles 1 in the host material 71 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the luminescent particles 1 dispersed in the host material 71 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the luminescent particles 1 dispersed in the host material 71 have a packing fraction of less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the luminescent particles 1 are adjoining, are in contact.

According to one embodiment, in the same host material 71, the luminescent particles 1 are not aggregated.

According to one embodiment, the luminescent particles 1 do not touch, are not in contact.

According to one embodiment in the same host material 71, the luminescent particles 1 do not touch, are not in contact.

According to one embodiment, the luminescent particles 1 are separated by the host material 71.

According to one embodiment, the luminescent particles 1 can be individually evidenced for example by conventional microscopy, transmission electron microscopy, scanning transmission electron microscopy, scanning electron microscopy, or fluorescence scanning microscopy.

According to one embodiment, each luminescent particle 1 of the plurality of luminescent particles 1 is spaced from its adjacent luminescent particle 1 by an average minimal distance.

According to one embodiment, the average minimal distance between two luminescent particles 1 is controlled.

According to one embodiment, the average minimal distance between two luminescent particles 1 in the host material 71 or in a statistical set of luminescent particles 1 is at least 1 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two luminescent particles 1 in the host material 71 or in a statistical set of luminescent particles 1 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two luminescent particles 1 in the host material 71 or in a statistical set of luminescent particles 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10%

According to one embodiment, the light emitting material 7 does not comprise optically transparent void regions.

According to one embodiment, the light emitting material 7 does not comprise void regions surrounding the at least one luminescent particle 1.

According to one embodiment, as illustrated in FIG. 13B, the light emitting material 7 further comprises at least one particle comprising an inorganic material 14; and a plurality of nanoparticles, wherein said inorganic material 14 is different from the first material 11 comprised in the luminescent particle 1 of the invention. In this embodiment, said at least one particle comprising an inorganic material 14 is empty, i.e. does not comprise any nanoparticle.

According to one embodiment, the light emitting material 7 further comprises at least one particle comprising an inorganic material 14; and a plurality of nanoparticles, wherein said inorganic material 14 is the same as the first material 11 comprised in the luminescent particle 1 of the invention. In this embodiment, said at least one particle comprising an inorganic material 14 is empty, i.e. does not comprise any nanoparticle.

According to one embodiment, the light emitting material 7 further comprises at least one particle comprising an inorganic material 14, wherein said inorganic material 14 is the same as the first material 11 comprised in the luminescent particle 1 of the invention. In this embodiment, said at least one particle comprising an inorganic material 14 is empty, i.e. does not comprise any nanoparticle.

According to one embodiment, the light emitting material 7 further comprises at least one particle comprising an inorganic material 14, wherein said inorganic material 14 is different from the first material 11 comprised in the luminescent particle 1 of the invention. In this embodiment, said at least one particle comprising an inorganic material 14 is empty, i.e. does not comprise any nanoparticle.

According to one embodiment, the light emitting material 7 further comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight of particle comprising an inorganic material 14.

According to one embodiment, the particle comprising an inorganic material 14 has a different size than the at least one luminescent particle 1.

According to one embodiment, the particle comprising an inorganic material 14 has the same size as the at least one luminescent particle 1.

According to one embodiment, the light emitting material 7 further comprises a plurality of nanoparticles. In this embodiment, said nanoparticles are different from the nanoparticles 3 comprised in the at least one luminescent particle 1.

According to one embodiment, the light emitting material 7 further comprises a plurality of nanoparticles. In this embodiment, said nanoparticles are the same as the nanoparticles 3 comprised in the at least one luminescent particle 1.

According to one embodiment, the light emitting material 7 further comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight of nanoparticles, wherein said nanoparticles are not comprised in the at least one luminescent particle 1.

According to one embodiment, the light emitting material 7 is free of oxygen.

According to one embodiment, the light emitting material 7 is free of water.

In another embodiment, the light emitting material 7 may further comprise at least one solvent.

In another embodiment, the light emitting material 7 does not comprise a solvent.

In another embodiment, the light emitting material 7 may further comprise a liquid including but not limited to: 1-methoxy-2-propanol, 2-pyrrolidinone, C4 to C8 1,2-alkanediol, aliphatic or alicycle ketone, methyl ethyl ketone, C1-C4 alkanol such as for example methanol, ethanol, methanol propanol, or isopropanol, ketones, esters, ether of ethylene glycol or propylene glycol, acetals, acrylic resin, polyvinyl acetate, polyvinyl alcohol, polyamide resin, polyurethane resin, epoxy resin, alkyd ester, nitrated cellulose, ethyl cellulose, sodium carboxymethyl cellulose, alkyds, maleics, cellulose derivatives, formaldehyde, rubber resin, phenolics, propyl acetate, glycol ether, aliphatic hydrocarbon, acetate, ester. acrylic, cellulose ester, nitrocellulose, modified resin, alkoxylated alcohol, 2-pyrrolidone, a homolog of 2-pyrrolidone, glycol, water, or a mixture thereof.

According to one embodiment, the light emitting material 7 comprises a liquid at a level of at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight compared to the total weight of the light emitting material 7.

According to one embodiment, the light emitting material 7 further comprises scattering particles dispersed in the host material 71. Examples of scattering particles include but are not limited to: $SiO_2$, $ZrO_2$, ZnO, MgO, $SnO_2$, $TiO_2$, Au, Ag, alumina, barium sulfate, PTFE, barium titanate and the like. Said scattering particles can help increasing light scattering in the interior of the light emitting material 7, so that there are more interactions between the photons and the scattering particles and, therefore, more light absorption by the particles.

According to one embodiment, the light emitting material 7 comprises scattering particles and does not comprise luminescent particles 1 in the at least one host material 71.

In one embodiment, the light emitting material 7 further comprises thermal conductor particles dispersed in the host material 71. Examples of thermal conductor particles include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the host material 71 is increased.

According to one embodiment, the light emitting material 7 exhibits an emission spectrum with at least one emission peak, wherein said emission peak has a maximum emission wavelength ranging from 400 nm to 50 μm.

According to one embodiment, the light emitting material 7 exhibits an emission spectrum with at least one emission peak, wherein said emission peak has a maximum emission wavelength ranging from 400 nm to 500 nm. In this embodiment, the light emitting material 7 emits blue light.

According to one embodiment, the light emitting material 7 exhibits an emission spectrum with at least one emission peak, wherein said emission peak has a maximum emission wavelength ranging from 500 nm to 560 nm, more preferably ranging from 515 nm to 545 nm. In this embodiment, the light emitting material 7 emits green light.

According to one embodiment, the light emitting material 7 exhibits an emission spectrum with at least one emission peak, wherein said emission peak has a maximum emission wavelength ranging from 560 nm to 590 nm. In this embodiment, the light emitting material 7 emits yellow light.

According to one embodiment, the light emitting material 7 exhibits an emission spectrum with at least one emission peak, wherein said emission peak has a maximum emission wavelength ranging from 590 nm to 750 nm, more preferably ranging from 610 nm to 650 nm. In this embodiment, the light emitting material 7 emits red light.

According to one embodiment, the light emitting material 7 exhibits an emission spectrum with at least one emission peak, wherein said emission peak has a maximum emission wavelength ranging from 750 nm to 50 μm. In this embodiment, the light emitting material 7 emits near infra-red, mid-infra-red, or infra-red light.

According to one embodiment, the light emitting material 7 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the light emitting material 7 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the light emitting material 7 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

In one embodiment, the light emitting material 7 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW.cm^{-2}$ and 100 $kW.cm^{-2}$ and more preferably between 10 $mW.cm^{-2}$ and 100 $W.cm^{-2}$, and even more preferably between 10 $mW.cm^{-2}$ and 30 $W.cm^{-2}$.

According to one embodiment, the photon flux or average peak pulse power of the illumination is at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the light emitting material 7 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW.cm^2$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^2$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^2$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^2$, or 100 $kW.cm^2$.

In one embodiment, the light emitting material 7 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

According to one embodiment, the host material 71 is free of oxygen.

According to one embodiment, the host material 71 is free of water.

According to one embodiment, the host material 71 limits or prevents the degradation of the chemical and physical properties of the at least one luminescent particle 1 from molecular oxygen, water and/or high temperature.

According to one embodiment, the host material 71 is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the host material 71 has a refractive index ranging from 1.0 to 3.0, from 1.2 to 2.6, from 1.4 to 2.0 at 450 nm.

According to one embodiment, the host material 71 has a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 at 450 nm.

According to one embodiment, the host material 71 has a refractive index distinct from the refractive index of the first material 11 comprised in the at least one luminescent particle 1 or from the refractive index of the luminescent particle 1. This embodiment allows for a wider scattering of light. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the host material 71 has a difference of refractive index with the refractive index of the first material 11 comprised in the at least one luminescent particle 1 or with the refractive index of the luminescent particle 1 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2.

According to one embodiment, the host material 71 has a difference of refractive index with the first material 11 comprised in the at least one luminescent particle 1 ranging from 0.02 to 2, ranging from 0.02 to 1.5, ranging from 0.03 to 1.5, ranging from 0.04 to 1.5, ranging from 0.05 to 1.5, ranging from 0.02 to 1.2, ranging from 0.03 to 1.2, ranging from 0.04 to 1.2, ranging from 0.05 to 1.2, ranging from 0.05 to 1, ranging from 0.1 to 1, ranging from 0.2 to 1, ranging from 0.3 to 1, ranging from 0.5 to 1, ranging from 0.05 to 2, ranging from 0.1 to 2, ranging from 0.2 to 2, ranging from 0.3 to 2, or ranging from 0.5 to 2.

The difference of refractive index was measured at 450 nm.

According to one embodiment, the host material 71 has a refractive index superior or equal to the refractive index of the first material 11.

According to one embodiment, the host material 71 has a refractive index inferior to the refractive index of the first material 11.

According to one embodiment, the host material 71 has a difference of refractive index with the refractive index of the second material 21 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2 at 450 nm.

According to one embodiment, the host material 71 has a refractive index superior or equal to the refractive index of the second material 21.

According to one embodiment, the host material 71 has a refractive index inferior to the refractive index of the second material 21.

According to one embodiment, the at least one luminescent particle 1 in the host material 71 is configured to scatter light.

According to one embodiment, the light emitting material 7 has a haze factor ranging from 1% to 100%.

According to one embodiment, the light emitting material 7 has a haze factor of at least 1%, 2%, 3%, 4%, 5%, 10%, 15%, 20%, 25%, 30%, 35%, 40%, 45%, 50%, 55%, 60%, 65%, 70%, 75%, 80%, 85%, 90%, 95%, or 100%.

The haze factor is calculated by the ratio between the intensity of light scattered by the material beyond the viewing angle and the total intensity transmitted by the material when illuminated with a light source.

According to one embodiment, the viewing angle used to measure the haze factor ranges from 0° to 20°.

According to one embodiment, the viewing angle used to measure the haze factor is at least 0°, 1°, 2°, 3°, 4°, 5°, 6°, 7°, 8°, 9°, 10°, 11°, 12°, 13°, 14°, 15°, 16°, 17°, 18°, 19°, or 20°.

According to one embodiment, the at least one luminescent particle 1 in the host material 71 is configured to serve as a waveguide. In this embodiment, the refractive index of the at least one luminescent particle 1 is higher than the refractive index of the host material 71.

According to one embodiment, the luminescent particle 1 has a spherical shape. The spherical shape may permit to the light to circulate in the luminescent particle 1 without leaving said luminescent particle such as to operate as a waveguide. The spherical shape may permit to the light to have whispering-gallery wave modes. Furthermore, a perfect spherical shape prevents fluctuations of the intensity of the scattered light.

According to one embodiment, the at least one luminescent particle 1 in the host material 71 is configured to generate multiple reflections of light inside said luminescent particle 1.

According to one embodiment, the host material 71 has a refractive index equal to the refractive index of the first material 11 comprised in the at least one luminescent particle 1. In this embodiment, scattering of light is prevented.

According to one embodiment, the host material 71 is a thermal insulator.

According to one embodiment, the host material 71 is a thermal conductor.

According to one embodiment, the host material 71 has a thermal conductivity at standard conditions ranging from 0.1 to 450 W/(m.K), preferably from 1 to 200 W/(m.K), more preferably from 10 to 150 W/(m.K).

According to one embodiment, the host material 71 has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1

W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

According to one embodiment, the host material 71 is electrically insulator.

According to one embodiment, the host material 71 is electrically conductive.

According to one embodiment, the host material 71 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the host material 71 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10$ S/m, $1\times10$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the host material 71 may be measured for example with an impedance spectrometer.

According to one embodiment, the host material 71 can be cured into a shape of a film, thereby generating a film.

According to one embodiment, the host material 71 is polymeric.

According to one embodiment, the host material 71 comprises an organic material as described hereafter.

According to one embodiment, the host material 71 comprises an organic polymer as described hereafter.

According to one embodiment, the host material 71 can polymerize by heating it and/or by exposing it to UV light.

According to one embodiment, the polymeric host material 71 includes but is not limited to: silicone based polymers, polydimethylsiloxanes (PDMS), polyethylene terephthalate, polyesters, polyacrylates, polymethacrylates, polycarbonate, poly(vinyl alcohol), polyvinylpyrrolidone, polyvinylpyridine, polysaccharides, poly(ethylene glycol), melamine resins, a phenol resin, an alkyl resin, an epoxy resin, a polyurethane resin, a maleic resin, a polyamide resin, an alkyl resin, a maleic resin, terpenes resins, an acrylic resin or acrylate based resin such as PMMA, copolymers forming the resins, co-polymers, block co-polymers, polymerizable monomers comprising an UV initiator or thermic initiator, or a mixture thereof.

According to one embodiment, the polymeric host material 71 includes but is not limited to: thermosetting resin, photosensitive resin, photoresist resin, photocurable resin, or dry-curable resin. The thermosetting resin and the photocurable resin are cured using heat and light, respectively. For the use of the dry hard resin, the resin is cured by applying heat to a solvent in which the at least one luminescent particle 1 is dispersed.

When a thermosetting resin or a photocurable resin is used, the composition of the resulting light emitting material 7 is equal to the composition of the raw material of the light emitting material 7. However, when a dry-curable resin is used, the composition of the resulting light emitting material 7 may be different from the composition of the raw material of the light emitting material 7. During the dry-curing by heat, the solvent is partially evaporated. Thus, the volume ratio of luminescent particle 1 in the raw material of the light emitting material 7 may be lower than the volume ratio of luminescent particle 1 in the resulting light emitting material 7.

Upon curing of the resin, a volume contraction is caused. According to one embodiment, a least 2%, 3%, 4%, 5%, 6%, 7%, 8%, 9%, 10%, 15%, or 20%, of contraction are aroused from a thermosetting resin or a photocurable resin. According to one embodiment, a dry-curable resin is contracted by at least 0.1%, 0.2%, 0.3%, 0.4%, 0.5%, 0.6%, 0.7%, 0.8%, 0.9%, 1%, 1.5%, 2%, 2.5%, 3%, 3.5%, 4%, 4.5%, 5%, 5.5%, 6%, 6.5%, 7%, 7.5%, 8%, 8.5%, 9%, 9.5%, 10%, 15%, or 20%. The contraction of the resin may cause movement of the luminescent particles 1, which may be lower the degree of dispersion of the luminescent particles 1 in the light emitting material 7. However, embodiments of the present invention can maintain high dispersibility by preventing the movement of the luminescent particles 1 by introducing other particles in said light emitting material 7.

In one embodiment, the host material 71 may be a polymerizable formulation which can include monomers, oligomers, polymers, or mixture thereof.

In one embodiment, the polymerizable formulation may further comprise a crosslinking agent, a scattering agent, a photo initiator or a thermal initiator.

In one embodiment, the polymerizable formulation includes but is not limited to: monomers, oligomers or polymers made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, n-butyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In another embodiment, the polymerizable formulation includes but is not limited to: monomers, oligomers or polymers made from an alkyl acrylamide or alkyl methacrylamide such as acrylamide, Alkylacrylamide, N-tert-Butylacrylamide, Diacetone acrylamide, N,N-Diethylacrylamide, N-(Isobutoxymethyl)acrylamide, N-(3-Methoxypropyl) acrylamide, N-Diphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-1Tris (hydroxymethyl)methyllacrylamide, N,N-Diethylmethacrylamide, N, NDimethyl acryl amide, N-13-(Dimethylamino)propyll methacrylamide, N-(Hydroxymethyl)acrylamide, 2-Hydroxypropyl methacrylamide, N-Isopropylmethacrylamide, Methacrylamide, N-(Triphenylmethyl)methacrylamide, poly (3,4-ethylenedioxythiopene), poly(ethylene dioxythiophene)/poly(styrene sulfonic acid) (PEDOT/PSS), an aqueous solution of polyaniline/camphor sulfonic acid (PANI/CSA), PTPDES, Et-PIT-DEK, PPBA, and similar derivatives.

In one embodiment, the polymerizable formulation includes but is not limited to: monomers, oligomers or polymers made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, examples of crosslinking agent include but are not limited to: di-acrylate, tri-acrylate, tetra-acrylate, di-methacrylate, tri-methacrylate and tetra-methacrylate monomers derivatives and the like. Another example of crosslinking agent includes but is not limited to: monomers, oligomers or polymers made from di- or trifunctional monomers such as allyl methacrylate, diallyl maleate, 1,3-butanediol dimethacrylate, 1,4-butanediol dimethacrylate, 1,6-hexanediol dimethacrylate, pentaerythritol triacrylate, trimethylolpropane triacrylate, Ethylene glycol dimethacrylate, Triethylene glycol dimethacrylate, N,N-methylenebis(acrylamide), N,N'-Hexamethylenebis (methacrylamide), and divinyl benzene.

In one embodiment, the polymerizable formulation may further comprise scattering particles Examples of scattering particles include but are not limited to: $SiO_2$, $ZrO_2$, ZnO, MgO, $SnO_2$, Au, Ag, $TiO_2$, alumina, barium sulfate, PTFE, barium titanate and the like.

In one embodiment, the polymerizable formulation may further comprise a thermal conductor. Examples of thermal conductor include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the host material 71 is increased.

In one embodiment, the polymerizable formulation may further comprise a photo initiator. Examples of photo initiator include but are not limited to: α-hydroxyketone, phenylglyoxylate, benzyldimethyl-ketal, α-aminoketone, monoacylphosphine oxides, bisacylphosphine oxides, phosphine oxide, benzophenone and derivatives, polyvinyl cinnamate, metallocene or iodonium salt derivatives and the like. Another example of photo initiator includes Irgacure® photoinitiator and Esacure® photoinitiator and the like.

In one embodiment, the polymerizable formulation may further comprise a thermal initiator. Examples of thermal initiator include but are limited to: peroxide compounds, azo compounds such as azobisisobutyronitrile (AIBN) and 4,4-Azobis(4-cyanovaleric acid), potassium and ammonium persulfate, tert-Butyl peroxide, benzoyl peroxide and the like.

In one embodiment, the polymeric host material 71 may be a polymerized solid made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, nbutyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In one embodiment, the polymeric host material 71 may be a polymerized solid made from an alkyl acrylamide or alkyl methacrylamide such as acrylamide, Alkylacrylamide, Ntert-Butylacrylamide, Diacetone acrylamide, N,N-Diethylacrylamide, N-Isobutoxymethyl)acrylamide, N-(3-Methoxypropyl)acrylamide, NDiphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris (hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, NIsopropylmethacrylamide, Methacryl amide, N-(Triphenylmethyl)methacrylamide, poly (3,4-ethylenedioxythiopene), poly(ethylene dioxythiophene)/poly(styrene sulfonic acid) (PEDOT/PSS), an aqueous solution of polyaniline/camphor sulfonic acid (PANI/CSA), PTPDES, Et-PIT-DEK, PPBA, and similar derivatives.

In one embodiment, the polymeric host material 71 may be a polymerized solid made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifluoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives;

allylic alcohol derivatives for example, vinylethylene carbonate, disubstituted olefins such as maleic and fumaric compounds for example, maleic anhydride, diethylfumarate, and the like, and mixtures thereof.

In one embodiment, the polymeric host material 71 may be PMMA, Poly(lauryl methacrylate), glycolized poly(ethylene terephthalate), Poly(maleic anhydride altoctadecene), or mixtures thereof.

In another embodiment, the light emitting material 7 may further comprise at least one solvent. According to this embodiment, the solvent is one that allows the solubilization of the luminescent particles 1 of the invention and polymeric host material 71 such as for example, pentane, hexane, heptane, 1,2-hexanediol, 1,5-pentanediol, cyclohexane, petroleum ether, toluene, benzene, xylene, chlorobenzene, carbon tetrachloride, chloroform, dichloromethane, 1,2-dichloroethane, THF (tetrahydrofuran), acetonitrile, acetone, ethanol, methanol, ethyl acetate, ethylene glycol, diglyme (diethylene glycol dimethyl ether), diethyl ether, DME (1,2-dimethoxy-ethane, glyme), DMF (dimethylformamide), NMF (N-methylformamide), FA (Formamide), DMSO (dimethyl sulfoxide), 1,4-Dioxane, triethyl amine, alkoxy alcohol, alkyl alcohol, alkyl benzene, alkyl benzoate, alkyl naphthalene, amyl octanoate, anisole, aryl alcohol, benzyl alcohol, butyl benzene, butyrophenon, cis-decalin, dipropylene glycol methyl ether, dodecyl benzene, propylene glycol methyl ether acetate (PGMEA), mesitylene, methoxy propanol, methylbenzoate, methyl naphthalene, methyl pyrrolidinone, phenoxy ethanol, 1,3-propanediol, pyrrolidinone, trans-decalin, valerophenone, or mixture thereof.

According to one embodiment, the light emitting material 7 comprises at least two solvents as described hereabove. In this embodiment, the solvents are miscible together.

According to one embodiment, the light emitting material 7 comprises a blend of solvents as described hereabove. In this embodiment, the solvents are miscible together.

According to one embodiment, the light emitting material 7 comprises a plurality of solvents as described hereabove. In this embodiment, the solvents are miscible together.

According to one embodiment, the solvent comprised in the light emitting material 7 is miscible with water.

In another embodiment, the light emitting material 7 comprises a blend of solvents such as for example: a blend of benzyl alcohol and butyl benzene, a blend of benzyl alcohol and anisole, a blend of benzyl alcohol and mesitylene, a blend of butyl benzene and anisole, a blend of butyl benzene and mesitylene, a blend of anisole and mesitylene, a blend of dodecyl benzene and cis-decalin, a blend of dodecyl benzene and benzyl alcohol, a blend of dodecyl benzene and butyl benzene, a blend of dodecyl benzene and anisole, a blend of dodecyl benzene and mesitylene, a blend of cis-decalin and benzyl alcohol, a blend of cis-decalin and butyl benzene, a blend of cis-decalin and anisole, a blend of cis-decalin and mesitylene, a blend of trans-decalin and benzyl alcohol, a blend of trans-decalin and butyl benzene, a blend of trans-decalin and anisole, a blend of trans-decalin and mesitylene, a blend of methyl pyrrolidinone and anisole, a blend of methylbenzoate and anisole, a blend of methyl pyrrolidinone and methyl naphthalene, a blend of methyl pyrrolidinone and methoxy propanol, a blend of methyl pyrrolidinone and phenoxy ethanol, a blend of methyl pyrrolidinone and amyl octanoate, a blend of methyl pyrrolidinone and trans-decalin, a blend of methyl pyrrolidinone and mesitylene, a blend of methyl pyrrolidinone and butyl benzene, a blend of methyl pyrrolidinone and dodecyl benzene, a blend of methyl pyrrolidinone and benzyl alcohol, a blend of anisole and methyl naphthalene, a blend of anisole and methoxy propanol, a blend of anisole and phenoxy ethanol, a blend of anisole and amyl octanoate, a blend of methylbenzoate and methyl naphthalene, a blend of methylbenzoate and methoxy propanol, a blend of methylbenzoate and phenoxy ethanol, a blend of methylbenzoate and amyl octanoate, a blend of methylbenzoate and cis-decalin, a blend of methylbenzoate and trans-decalin, a blend of methylbenzoate and mesitylene, a blend of methylbenzoate and butyl benzene, a blend of methylbenzoate and dodecyl benzene, a blend of methylbenzoate and benzyl alcohol, a blend of methyl naphthalene and methoxy propanol, a blend of methyl naphthalene and phenoxy ethanol, a blend of methyl naphthalene and amyl octanoate, a blend of methyl naphthalene and cis-decalin, a blend of methyl naphthalene and trans-decalin, a blend of methyl naphthalene and mesitylene, a blend of methyl naphthalene and butyl benzene, a blend of methyl naphthalene and dodecyl benzene, a blend of methyl naphthalene and benzyl alcohol, a blend of methoxy propanol and phenoxy ethanol, a blend of methoxy propanol and amyl octanoate, a blend of methoxy propanol and cis-decalin, a blend of methoxy propanol and trans-decalin, a blend of methoxy propanol and mesitylene, a blend of methoxy propanol and butyl benzene, a blend of methoxy propanol and dodecyl benzene, a blend of methoxy propanol and benzyl alcohol, a blend of phenoxy ethanol and amyl octanoate, a blend of phenoxy propanol and mesitylene, a blend of phenoxy propanol and butyl benzene, a blend of phenoxy propanol and dodecyl benzene, a blend of phenoxy propanol and benzyl alcohol, a blend of amyl octanoate and cis-decalin, a blend of amyl octanoate and trans-decalin, a blend of amyl octanoate and mesitylene, a blend of amyl octanoate and butyl benzene, a blend of amyl octanoate and dodecyl benzene, a blend of amyl octanoate and benzyl alcohol, or a combination thereof.

According to one embodiment, the light emitting material 7 comprises a blend of valerophenon and dipropyleneglycol methyl ether, a blend of valerophenon and butyrophenon, a blend of dipropyleneglycol methyl ether and butyrophenon, a blend of dipropyleneglycol methyl ether and 1,3-propanediol, a blend of butyrophenon and 1,3-propanediol, a blend of dipropyleneglycol methyl ether, 1,3-propanediol, and water, or a combination thereof.

According to one embodiment, the light emitting material 7 comprises a blend of three, four, five, or more solvents can be used for the vehicle. For example, the vehicle can comprise a blend of three, four, five, or more solvents selected from pyrrolidinone, methyl pyrrolidinone, anisole, alkyl benzoate, methylbenzoate, alkyl naphthalene, methyl naphthalene, alkoxy alcohol, methoxy propanol, phenoxy ethanol, amyl octanoate, cis-decalin, trans-decalin, mesitylene, alkyl benzene, butyl benzene, dodecyl benzene, alkyl alcohol, aryl alcohol, benzyl alcohol, butyrophenon, dipropylene glycol methyl ether, valerophenon, and 1,3-propanediol. According to one embodiment, the light emitting material 7 comprises three or more solvents selected from cis-decalin, trans-decalin, benzyl alcohol, butyl benzene, anisole, mesitylene, and dodecyl benzene.

In some embodiments, each of the solvents in each of the blends listed above is present in an amount of at least 5% by weight based on the total weight of the host material 71, for example, at least 10% by weight, at least 15% by weight, at least 20% by weight, at least 25% by weight, at least 30% by weight, at least 35% by weight, or at least 40% by weight. In some embodiments, each of the solvents in each of the blends listed can comprise 50% by weight of the light emitting material 7 based on the total weight of the light emitting material 7.

According to one embodiment, the host material 71 comprises a film-forming material. In this embodiment, the film-forming material is a polymer or an inorganic material as described hereabove.

According to one embodiment, the host material 71 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% by weight of a film-forming material.

According to one embodiment, the film-forming material is polymeric, i.e. comprises or consists of polymers and/or monomers as described hereabove.

According to one embodiment, the film-forming material is inorganic, i.e. it comprises or consists of an inorganic material as described hereafter.

In another embodiment, the light emitting material 7 comprises the luminescent particles 1 of the invention and a polymeric host material 71, and does not comprise a solvent. In this embodiment, the luminescent particles 1 and host material 71 can be mixed by extrusion.

According to another embodiment, the host material 71 is inorganic.

According to one embodiment, the host material 71 does not comprise glass.

According to one embodiment, the host material 71 does not comprise vitrified glass.

According to one embodiment, examples of inorganic host material 71 include but are not limited to: materials obtainable by sol-gel process, metal oxides such as for example $SiO_2$, $Al_2O_3$, $TiO_2$, $ZrO_2$, ZnO, MgO, $SnO_2$, $IrO_2$, or a mixture thereof. Said host material 71 acts as a supplementary barrier against oxidation and can drain away the heat if it is a good thermal conductor.

According to one embodiment, the host material 71 is composed of a material selected in the group of metals, halides, chalcogenides, phosphides, sulfides, metalloids, metallic alloys, ceramics such as for example oxides, carbides, or nitrides. Said host material 71 is prepared using protocols known to the person skilled in the art.

According to one embodiment, a chalcogenide is a chemical compound consisting of at least one chalcogen anion selected in the group of O, S, Se, Te, Po, and at least one or more electropositive element.

According to one embodiment, the metallic host material 71 is selected in the group of gold, silver, copper, vanadium, platinum, palladium, ruthenium, rhenium, yttrium, mercury, cadmium, osmium, chromium, tantalum, manganese, zinc, zirconium, niobium, molybdenum, rhodium, tungsten, iridium, nickel, iron, or cobalt.

According to one embodiment, examples of carbide host material 71 include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x\neq0$.

According to one embodiment, examples of oxide host material 71 include but are not limited to: $SiO_2$, $Al_2O_3$, $TiO_2$, $ZrO_2$, ZnO, MgO, $SnO_2$, $Nb_2O_5$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide host material 71 include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride host material 71 include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x\neq0$.

According to one embodiment, examples of sulfide host material 71 include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $AS_yS_x$, $Fe_yS_x$, $Ta_yS_x$, $Li_yS_x$, $Sr_yS_x$, $Y_yS_x$, $Hf_yS_x$, $W_yS_x$, $MO_yS_x$, $Cr_yS_x$, $Tc_yS_x$, $Re_yS_x$, $Ru_yS_x$, $Co_yS_x$, $OS_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x\neq0$.

According to one embodiment, examples of halide host material 71 include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide host material 71 include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, RhS2, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2O_5$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide host material 71 include but are not limited to: InP, $Cd_3P_2$, $Zn_3P_2$, AlP, GaP, TlP, or a mixture thereof.

According to one embodiment, examples of metalloid host material 71 include but are not limited to: Si, B, Ge, As, Sb, Te, or a mixture thereof.

According to one embodiment, examples of metallic alloy host material 71 include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the host material 71 comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$ $Mg_3Al_2(SiO_4)_3$ $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the host material 71 comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, CdS, ZnS, ZnSe, CdZnS, CdZnSe, Au, Na, Fe, Cu, Al, Ag, Mg, mixed oxides, mixed oxides thereof or a mixture thereof; x and y are independently a decimal number from 0 to 10, at the condition that x and y are not simultaneously equal to 0, and $x \neq 0$.

According to one embodiment, the host material 71 comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, CdS, ZnS, ZnSe, CdZnS, CdZnSe, Au, Na, Fe, Cu, Al, Ag, Mg, mixed oxides, mixed oxides thereof or a mixture thereof.

According to one embodiment, the host material 71 comprises or consists of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, zinc sulfide, cadmium sulfide, zinc selenium, cadmium zinc selenium, cadmium zinc sulfide, gold, sodium, iron, copper, aluminium, silver, magnesium, mixed oxides, mixed oxides thereof or a mixture thereof.

According to one embodiment, the host material 71 comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said host material 71.

According to one embodiment, the host material 71 comprises a polymeric host material as described hereabove, an inorganic host material as described hereabove, or a mixture thereof.

According to one embodiment, the light emitting material 7 comprises at least one host material 71.

According to one embodiment, the light emitting material 7 comprises at least two host materials 71. In this embodiment, the host materials can be identical or different from each other.

According to one embodiment, the light emitting material 7 comprises a plurality of host materials 71. In this embodiment, the host materials can be identical or different from each other.

In one embodiment, the light emitting material 7 of the invention comprises at least one population of luminescent particles 1. In one embodiment, a population of luminescent particles 1 is defined by the maximum emission wavelength.

In one embodiment, the light emitting material 7 comprises two populations of luminescent particles 1 emitting different colors or wavelengths.

In one embodiment, the concentration of the at least two populations of luminescent particles 1 comprised in the light emitting material 7 and emitting different colors or wavelengths, is controlled to predetermine the light intensity of each secondary light emitted by each of the least two populations of luminescent particles 1, after excitation by an incident light.

In one embodiment, the light emitting material 7 comprises luminescent particles 1 which emit green light and red light upon downconversion of a blue light source. In this embodiment, the light emitting material 7 is configured to transmit a predetermined intensity of the blue light from the light source and to emit a predetermined intensity of secondary green and red lights, allowing to emit a resulting tri-chromatic white light.

According to one embodiment, the light emitting material 7 comprises at least one luminescent particle 1 comprising at least one nanoparticle 3 that emits green light upon downconversion of a blue light source.

According to one embodiment, the light emitting material 7 comprises at least one luminescent particle 1 comprising at least one nanoparticles 3 that emits orange light upon downconversion of a blue light source.

According to one embodiment, the light emitting material 7 comprises at least one luminescent particle 1 comprising at least one nanoparticles 3 that emits yellow light upon downconversion of a blue light source.

According to one embodiment, the light emitting material 7 comprises at least one luminescent particle 1 comprising at least one nanoparticles 3 that emits purple light upon downconversion of a blue light source.

In one embodiment, the light emitting material 7 comprises two populations of luminescent particles 1, a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, the light emitting material 7 comprises three populations of luminescent particles 1, a first population of luminescent particles 1 with a maximum emission wavelength between 440 and 499 nm, more preferably between 450 and 495 nm, a second population of luminescent particles 1 with a maximum emission wavelength between 500 nm and 560 nm, more preferably between 515 nm and 545 nm and a third population of luminescent particles 1 with a maximum emission wavelength between 600 nm and 2500 nm, more preferably between 610 nm and 650 nm.

In one embodiment, the light emitting material 7 is splitted in several areas, each of them comprises a different population of luminescent particles 1 emitting different colors or wavelengths.

In one embodiment, the light emitting material 7 has a shape of a film.

In one embodiment, the light emitting material 7 is a film.

In one embodiment, the light emitting material 7 is processed by extrusion.

In one embodiment, the light emitting material 7 is an optical pattern. In this embodiment, said pattern may be formed on a support as described herein.

In one embodiment, the support as described herein can be heated or cooled down by an external system.

In one embodiment, the light emitting material 7 is a light collection pattern. In this embodiment, said pattern may be formed on a support as described herein.

In one embodiment, the light emitting material 7 is a light diffusion pattern. In this embodiment, said pattern may be formed on a support as described herein.

In one embodiment, the light emitting material 7 is made of a stack of two films, each of them comprises a different population of luminescent particles 1 emitting different colors or wavelengths.

In one embodiment, the light emitting material 7 is made of a stack of a plurality of films, each of them comprises a different population of luminescent particles 1 emitting different colors or wavelengths.

According to one embodiment, the light emitting material 7 has a thickness between 30 nm and 10 cm, more preferably between 100 nm and 1 cm, even more preferably between 100 nm and 1 mm.

According to one embodiment, the light emitting material 7 has a thickness less than 200 μm. This embodiment is particularly advantageous as that the light conversion efficiency is greatly improved when the surface roughness value is approximately 10 nm. For example, in this embodiment, the light conversion efficiency can be 80% or more.

According to one embodiment, the light emitting material 7 has a thickness ranging from 30 μm to 120 μm. This embodiment is particularly advantageous the light conversion efficiency is improved when the surface roughness value is in a range from 10 nm to 300 nm. For example, in this embodiment, the light conversion efficiency can be 80% or more.

According to one embodiment, the light emitting material 7 has a thickness of at least 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.1 μm, 4.2 μm, 4.3 μm, 4.4 μm, 4.5 μm, 4.6 μm, 4.7 μm, 4.8 μm, 4.9 μm, 5 μm, 5.1 μm, 5.2 μm, 5.3 μm, 5.4 μm, 5.5 μm, 5.5 μm, 5.6 μm, 5.7 μm, 5.8 μm, 5.9 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the light emitting material 7 absorbs at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the light emitting material 7 transmits at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 scatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 backscatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 transmits a part of the incident light and emits at least one secondary light. In this embodiment, the resulting light is a combination of the remaining transmitted incident light.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm, 350 nm, 400 nm, 450 nm, 455 nm, 460 nm, 470 nm, 480 nm, 490 nm, 500 nm, 510 nm, 520 nm, 530 nm, 540 nm, 550 nm, 560 nm, 570 nm, 580 nm, 590 nm, or 600 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 350 nm. According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 400 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 450 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 455 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 460 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 470 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 480 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 490 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 500 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 510 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 520 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 530 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 540 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 550 nm. According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 560 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 570 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 580 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 590 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 600 nm.

According to one embodiment, the increase in absorption efficiency of incident light by the light emitting material 7 is at least of 1%, 2%, 3%, 4%, 5%, 6%, 7%, 8%, 9%, 10%, 20%, 30%, 40%, 50%, 55%, 60%, 65%, 70%, 75%, 80%, 85%, 90%, 95%, or 100% compared to bare nanoparticles 3. Bare nanoparticles 3 refers here to nanoparticles 3 that are not encapsulated in a second material 21.

According to one embodiment, the increase in emission efficiency of secondary light by the light emitting material 7 is less than 1%, 2%, 3%, 4%, 5%, 6%, 7%, 8%, 9%, 10%, 20%, 30%, 40%, 50%, 55%, 60%, 65%, 70%, 75%, 80%, 85%, 90%, 95%, or 100% compared to bare nanoparticles 3.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20°

C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In another embodiment, the light emitting material 7 comprising at least one population of luminescent particles 1, may further comprise at least one population of converters having phosphor properties. Examples of converter having phosphor properties include, but are not limited to: garnets (LuAG, GAL, YAG, GaYAG), silicates, oxynitrides/oxycarbidonitrides, nintrides/carbidonitrides, $Mn^{4+}$ red phosphors (PFS/KFS), quantum dots.

According to one embodiment, luminescent particles 1 of the invention are incorporated in the host material 71 at a level ranging from 100 ppm to 500 000 ppm in weight.

According to one embodiment, luminescent particles 1 of the invention are incorporated in the host material 71 at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight.

According to one embodiment, the light emitting material 7 comprises less than 95%, 90%, 80%, 70%, 60%, 50%, 40%, 30%, 20%, preferably 10% in weight of luminescent particles 1 of the invention.

According to one embodiment, the loading charge of luminescent particles 1 in the light emitting material 7 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of luminescent particles 1 in the light emitting material 7 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the luminescent particles 1 dispersed in the light emitting material 7 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the luminescent particles 1 dispersed in the light emitting material 7 have a packing fraction of less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the light emitting material 7 comprises at least 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 15 wt %, 20 wt %, 25 wt %, 30 wt %, 35 wt %, 40 wt %, 45 wt %, 50 wt %, 55 wt %, 60 wt %, 65 wt %, 70 wt %, 75 wt %, 80 wt %, 85 wt %, 90 wt %, 95 wt %, or 99 wt % of luminescent particle 1.

According to one embodiment, in the light emitting material 7, the weight ratio between the host material 71 and the luminescent particle 1 of the invention is at least 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, or 50%.

According to one embodiment, the light emitting material 7 is ROHS compliant.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the light emitting material 7 comprise heavier chemical elements or materials based on heavier chemical elements than the main chemical element present in the host material 71 and/or the first material 11. In this embodiment, said heavy chemical elements in the light emitting material 7 will lower the mass concentration of chemical elements subject to ROHS standards, allowing said light emitting material 7 to be ROHS compliant.

According to one embodiment, examples of heavy elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the light emitting material 7 comprises one or more materials useful in forming at least one of a hole transport layer, a hole injection layer, an electron transport layer, an electron injection layer, and an emissive layer, of a light-emitting device.

According to one embodiment, the light emitting material 7 comprises a material that is cured or otherwise processed to form a layer on a support.

According to one embodiment, the light emitting material 7 comprises a binder that is an organic material as described herein, an inorganic material as described herein, or a mixture thereof.

According to one embodiment, examples of binders include but are not limited to: a crosslinked body of an inorganic material as described herein such as, for example, a silicic acid such as sodium silicate, potassium silicate, or silicate soda.

According to one embodiment, the binder is a liquid in which $SiO_2$ (anhydrous silicate) and $Na_2O$ (soda oxide) or $K_2O$ (potassium oxide) are mixed with a predetermined ratio. In this embodiment, the molecular formula is represented by $Na_2O.nSiO_2$.

According to one embodiment, the binder comprised in the light emitting material 7 has a difference of linear expansion coefficient with the support on which is deposited said light emitting material 7. In this embodiment, the difference of linear expansion coefficient between the binder and the support is less than 8 ppm/K. This embodiment is particularly advantageous as it prevents peeling between the support and the light emitting material 7. This is because that the stress inside the light emitting material 7, accompanied by heat generation, is sufficiently eased even though the light emitting material 7 generates heat by irradiation with the excitation light.

According to a preferred embodiment, examples of light emitting material 7 include but are not limited to: luminescent particle 1 dispersed in sol gel materials, silicone, polymers such as for example PMMA, PS, or a mixture thereof.

According to one embodiment, the light emitting material 7 may be used as a light source. According to one embodiment, the light emitting material 7 may be used in a light source. According to one embodiment, the light emitting material 7 may be used as a color filter. According to one embodiment, the light emitting material 7 may be used in a color filter.

According to one embodiment, the light emitting material 7 may be used in addition to a color filter.

According to one embodiment illustrated in FIG. 18A-B, the light emitting material 7 forms a color conversion layer 73. In this embodiment, said color conversion layer 73 comprises at least one light emitting material 7, i.e. said color conversion layer 73 can comprise one light emitting material 7 or a plurality of light emitting materials 7.

According to one embodiment, said color conversion layer 73 comprises at least one light emitting material 7 comprising at least one luminescent particle 1 surrounded partially or totally by at least one host material 71; wherein said at least one light emitting material 7 is configured to emit a secondary light in response to an excitation; and wherein the first material 11 has a difference of refractive index compared to the at least one host material 71 superior or equal to 0.02 at 450 nm.

According to one embodiment, the color conversion layer 73 has a thickness between 0 nm and 10 cm, more preferably between 100 nm and 1 cm, even more preferably between 100 nm and 1 mm.

According to one embodiment, the color conversion layer 73 has a thickness less than 200 μm. This embodiment is particularly advantageous as that the light conversion efficiency is greatly improved when the surface roughness value is approximately 10 nm. For example, in this embodiment, the light conversion efficiency can be 80% or more.

According to one embodiment, the color conversion layer 73 has a thickness ranging from 30 μm to 120 μm. This embodiment is particularly advantageous the light conversion efficiency is improved when the surface roughness Ra value is in a range from 10 nm to 300 nm. For example, in this embodiment, the light conversion efficiency can be 80% or more.

According to one embodiment, the color conversion layer 73 comprises a binder as described herein.

According to one embodiment, the binder comprised in the color conversion layer 73 has a difference of linear expansion coefficient with the support on which is deposited said color conversion layer 73. In this embodiment, the difference of linear expansion coefficient between the binder and the support is less than 8 ppm/K. This embodiment is particularly advantageous as it prevents peeling between the support and the color conversion layer 73. This is because that the stress inside the color conversion layer 73, accompanied by heat generation, is sufficiently eased even though the color conversion layer 73 generates heat by irradiation with the excitation light.

Another object of the invention relates to a support supporting at least one luminescent particle 1 of the invention and/or at least one light emitting material 7 as described here above.

In one embodiment, the at least one luminescent particle 1 of the invention and/or at least one light emitting material 7 are deposited on the support by drop-casting, spin coating, dip coating, inkjet printing, lithography, spray, plating, electroplating, or any other means known by the person skilled in the art.

In one embodiment, the support supports at least one population of luminescent particles 1. In one embodiment, the support supports at least one light emitting material 7 comprising at least one population of luminescent particles 1. In the present application, a population of luminescent particles 1 is defined by the maximum emission wavelength.

In one embodiment, the support supports two populations of luminescent particles 1 emitting different colors or wavelengths. In one embodiment, the support supports at least one light emitting material 7 comprising two populations of luminescent particles 1 emitting different colors or wavelengths. In one embodiment, the support supports two light emitting materials 7 each comprising one population of luminescent particles 1, the populations comprised in each light emitting material 7 emitting different colors or wavelengths.

In one embodiment, the support supports luminescent particles 1 which emit green light and red light upon downconversion of a blue light source. Thus, the blue light from the light source(s) pass through the luminescent particle 1, where predetermined amounts of green and red light are mixed with the remaining blue light to create the tri-chromatic white light. In one embodiment, the support supports at least one light emitting material 7 comprising luminescent particles 1 which emit green light and red light upon downconversion of a blue light source. In this embodiment, the at least one light emitting material 7 is configured to transmit a predetermined intensity of the incident blue light and to emit a predetermined intensity of secondary green and red lights, allowing to emit a resulting trichromatic white light. In one embodiment, the support supports at least one light emitting material 7 comprising at least one luminescent particle 1 which emits green light, and at least one light emitting material 7 comprising at least one luminescent particle 1 which emits red light upon downconversion of a blue light source. In this embodiment, the at least one light emitting material 7 is configured to transmit a predetermined intensity of the incident blue light and to emit a predetermined intensity of secondary green and red lights, allowing to emit a resulting tri-chromatic white light.

In one embodiment, the support supports two populations of luminescent particles 1, a first population with a maximum emission wavelength between 500 nm and 560 nm, more preferably between 515 nm and 545 nm and a second population with a maximum emission wavelength between 600 nm and 2500 nm, more preferably between 610 nm and 650 nm. In one embodiment, the support supports at least one light emitting material 7 comprising two populations of luminescent particles 1, a first population with a maximum emission wavelength between 500 nm and 560 nm, more preferably between 515 nm and 545 nm and a second population with a maximum emission wavelength between 600 nm and 2500 nm, more preferably between 610 nm and 650 nm. In one embodiment, the support supports two light emitting material 7 each comprising at least one population of luminescent particles 1, a first light emitting material 7 comprising a first population with a maximum emission wavelength between 500 nm and 560 nm, more preferably between 515 nm and 545 nm and a second light emitting material 7 comprising a second population with a maximum emission wavelength between 600 nm and 2500 nm, more preferably between 610 nm and 650 nm.

In one embodiment, the support supports two populations of luminescent particles 1, a first population with at least one emission peak having a full width half maximum lower than 90 nm, 80 nm, 70 nm, 60 nm, 50 nm, 40 nm, 30 nm, 25 nm, 20 nm, 15 nm, or 10 nm and a second population with at least one emission peak having a full width half maximum lower than 90 nm, 80 nm, 70 nm, 60 nm, 50 nm, 40 nm, 30 nm, 25 nm, 20 nm, 15 nm, or 10 nm. In one embodiment, the support supports at least one light emitting material 7 comprising two populations of luminescent particles 1, a first population with at least one emission peak having a full width half maximum lower than 90 nm, 80 nm, 70 nm, 60 nm, 50 nm, 40 nm, 30 nm, 25 nm, 20 nm, 15 nm, or 10 nm and a second population with at least one emission peak having a full width half maximum lower than 90 nm, 80 nm, 70 nm, 60 nm, 50 nm, 40 nm, 30 nm, 25 nm, 20 nm, 15 nm, or 10 nm. In one embodiment, the support supports two light emitting material 7 each comprising at least one population of luminescent particles 1, a first light emitting material 7 comprising a first population with at least one emission peak having a full width half maximum lower than 90 nm, 80 nm, 70 nm, 60 nm, 50 nm, 40 nm, 30 nm, 25 nm, 20 nm, 15 nm, or 10 nm and a second light emitting material 7 comprising a second population with at least one emission peak having a full width half maximum lower than 90 nm, 80 nm, 70 nm, 60 nm, 50 nm, 40 nm, 30 nm, 25 nm, 20 nm, 15 nm, or 10 nm.

In one embodiment, the support supports two populations of luminescent particles 1, a first population with at least one emission peak having a full width at quarter maximum lower than 90 nm, 80 nm, 70 nm, 60 nm, 50 nm, 40 nm, 30 nm, 25 nm, 20 nm, 15 nm, or 10 nm and a second population with at least one emission peak having a full width at quarter maximum lower than 90 nm, 80 nm, 70 nm, 60 nm, 50 nm, 40 nm, 30 nm, 25 nm, 20 nm, 15 nm, or 10 nm. In one embodiment, the support supports at least one light emitting material 7 comprising two populations of luminescent particles 1, a first population with at least one emission peak having a full width at quarter maximum lower than 90 nm, 80 nm, 70 nm, 60 nm, 50 nm, 40 nm, 30 nm, 25 nm, 20 nm, 15 nm, or 10 nm and a second population with at least one emission peak having a full width at quarter maximum lower than 90 nm, 80 nm, 70 nm, 60 nm, 50 nm, 40 nm, 30 nm, 25 nm, 20 nm, 15 nm, or 10 nm. In one embodiment, the support supports two light emitting material 7 each comprising at least one population of luminescent particles 1, a first light emitting material 7 comprising a first population with at least one emission peak having a full width at quarter maximum lower than 90 nm, 80 nm, 70 nm, 60 nm, 50 nm, 40 nm, 30 nm, 25 nm, 20 nm, 15 nm, or 10 nm and a second light emitting material 7 comprising a second population with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

In one embodiment, the at least one luminescent particle 1 and/or the at least one light emitting material 7 on a support is encapsulated into a multilayered system. In one embodiment, the multilayer system comprises at least two, at least three layers.

In one embodiment, the multilayered system may further comprise at least one auxiliary layer.

According to one embodiment, the auxiliary layer is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the auxiliary layer does not absorb any light allowing the luminescent particle 1 and/or the light emitting material 7 to absorb all the incident light.

According to one embodiment, the auxiliary layer limits or prevents the degradation of the chemical and physical properties of the at least one luminescent particle 1 from molecular oxygen, water and/or high temperature. According to one embodiment, the auxiliary layer protects the at least one light emitting material 7 from molecular oxygen, water and/or high temperature.

According to one embodiment, the auxiliary layer is thermally conductive.

According to one embodiment, the auxiliary layer has a thermal conductivity at standard conditions ranging from 0.1 to 450 W/(m.K), preferably from 1 to 200 W/(m.K), more preferably from 10 to 150 W/(m.K).

According to one embodiment, the auxiliary layer has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1

W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

According to one embodiment, the auxiliary layer is a polymeric auxiliary layer.

According to one embodiment, the one or more components of the auxiliary layer can include a polymerizable component, a crosslinking agent, a scattering agent, a rheology modifier, a filler, a photoinitiator, or a thermal initiator as described here after or above.

According to one embodiment, the auxiliary layer comprises scattering particles. Examples of scattering particles include but are not limited to: $SiO_2$, $ZrO_2$, ZnO, MgO, $SnO_2$, $TiO_2$, Au, Ag, alumina, barium sulfate, PTFE, barium titanate and the like.

In one embodiment, the auxiliary layer further comprises thermal conductor particles. Examples of thermal conductor particles include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the auxiliary layer is increased.

According to one embodiment, the auxiliary layer comprises a polymeric host material 71 as described here above.

According to one embodiment, the auxiliary layer comprises an inorganic host material 71 as described here above.

In one embodiment, the auxiliary layer has a thickness between 30 nm and 1 cm, between 100 nm and 1 mm, preferably between 100 nm and 500 μm.

According to one embodiment, the auxiliary layer has a thickness of at least 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.1 μm, 4.2 μm, 4.3 μm, 4.4 μm, 4.5 μm, 4.6 μm, 4.7 μm, 4.8 μm, 4.9 μm, 5 μm, 5.1 μm, 5.2 μm, 5.3 μm, 5.4 μm, 5.5 μm, 5.5 μm, 5.6 μm, 5.7 μm, 5.8 μm, 5.9 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 cm.

According to one embodiment, the at least one luminescent particle 1 or the multilayered system comprising at least one luminescent particle 1 is covered by at least one protective layer. According to one embodiment, the at least one light emitting material 7 or the multilayered system comprising at least one light emitting material 7 is covered by at least one protective layer.

In one embodiment, the at least one luminescent particle 1 or the multilayered system comprising at least one luminescent particle 1 is surrounded by at least one protective layer. In one embodiment, the at least one light emitting material 7 or the multilayered system comprising at least one light emitting material 7 is surrounded by at least one protective layer.

In one embodiment, the at least one luminescent particle 1 or the multilayered system comprising at least one luminescent particle 1 is covered by at least one auxiliary layer, both being then surrounded by at least one protective layer. In one embodiment, the at least one light emitting material 7 or the multilayered system comprising at least one light emitting material 7 is covered by at least one auxiliary layer, both being then surrounded by at least one protective layer.

In one embodiment, the at least one luminescent particle 1 or the multilayered system comprising at least one luminescent particle 1 is covered at least one auxiliary layer and/or at least one protective layer. In one embodiment, the at least one light emitting material 7 or the multilayered system comprising at least one light emitting material 7 is covered at least one auxiliary layer and/or at least one protective layer.

In one embodiment, the protective layer is a planarization layer.

In one embodiment, the protective layer is an oxygen, ozone and/or water impermeable layer. In this embodiment, the protective layer is a barrier against oxidation, and limits or prevents the degradation of the chemical and physical properties of the at least one luminescent particles 1 and/or the at least one emitting material from molecular oxygen, ozone and/or water.

In one embodiment, the protective layer is an oxygen, ozone and/or water non-permeable layer. In this embodiment, the protective layer is a barrier against oxidation, and limits or prevents the degradation of the chemical and physical properties of the at least one luminescent particles 1 and/or the at least one emitting material from molecular oxygen, ozone and/or water.

According to one embodiment, the protective layer is thermally conductive.

According to one embodiment, the protective layer has a thermal conductivity at standard conditions ranging from 0.1 to 450 W/(m.K), preferably from 1 to 200 W/(m.K), more preferably from 10 to 150 W/(m.K).

According to one embodiment, the protective layer has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

In one embodiment, the protective layer can be made of glass, PET (Polyethylene terephthalate), PDMS (Polydimethylsiloxane), PES (Polyethersulfone), PEN (Polyethylene naphthalate), PC (Polycarbonate), PI (Polyimide), PNB (Polynorbornene), PAR (Polyarylate), PEEK (Polyetheretherketone), PCO (Polycyclic olefins), PVDC (Polyvinylidene chloride), Nylon, ITO (Indium tin oxide), FTO (Fluorine doped tin oxide), cellulose, $Al_2O_3$, $AlO_xN_y$, $SiO_xC_y$, $SiO_2$, $SiO_x$, $SiN_x$, $SiC_x$, $ZrO_2$, $TiO_2$, MgO, ZnO, $SnO_2$, ceramic, organic modified ceramic, or mixture thereof.

In one embodiment, the protective layer can be deposited by PECVD (Plasma Enhanced Chemical Vapor Deposition), ALD (Atomic Layer Deposition), CVD (Chemical Vapor Deposition), iCVD (Initiator Chemical Vapor Deposition), Cat-CVD (Catalytic Chemical Vapor Deposition).

According to one embodiment, the protective layer may comprise scattering particles. Examples of scattering particles include but are not limited to: $SiO_2$, $ZrO_2$, ZnO, MgO, $SnO_2$, $TiO_2$, Au, Ag, alumina, barium sulfate, PTFE, barium titanate and the like.

In one embodiment, the protective layer further comprises thermal conductor particles. Examples of thermal conductor particles include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the protective layer is increased.

In one embodiment, the support can be a substrate, a LED, a LED array, a vessel, a tube, a solar panel, a panel, or a container. Preferably the support is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

LED used herein includes LED, LED chip 5 and micro-sized LED 6.

In one embodiment, the support can be a fabric, a piece of clothes, wood, plastic, ceramic, glass, steel, metal, or any active surfaces.

In one embodiment, active surfaces are interactive surfaces.

In one embodiment, active surfaces are surfaces destined to be included in an optoelectronic device, or a display device.

In one embodiment, the support is reflective.

In one embodiment, the support comprises a material allowing to reflect the light such as for example a metal like aluminium, silver, a glass, a polymer or a plastic.

In one embodiment, the support is thermally conductive.

According to one embodiment, the support has a thermal conductivity at standard conditions ranging from 0.5 to 450 W/(m.K), preferably from 1 to 200 W/(m.K), more preferably from 10 to 150 W/(m.K).

According to one embodiment, the support has a thermal conductivity at standard conditions of at least 0.1 W/(m.K), 0.2 W/(m.K), 0.3 W/(m.K), 0.4 W/(m.K), 0.5 W/(m.K), 0.6 W/(m.K), 0.7 W/(m.K), 0.8 W/(m.K), 0.9 W/(m.K), 1 W/(m.K), 1.1 W/(m.K), 1.2 W/(m.K), 1.3 W/(m.K), 1.4 W/(m.K), 1.5 W/(m.K), 1.6 W/(m.K), 1.7 W/(m.K), 1.8 W/(m.K), 1.9 W/(m.K), 2 W/(m.K), 2.1 W/(m.K), 2.2 W/(m.K), 2.3 W/(m.K), 2.4 W/(m.K), 2.5 W/(m.K), 2.6 W/(m.K), 2.7 W/(m.K), 2.8 W/(m.K), 2.9 W/(m.K), 3 W/(m.K), 3.1 W/(m.K), 3.2 W/(m.K), 3.3 W/(m.K), 3.4 W/(m.K), 3.5 W/(m.K), 3.6 W/(m.K), 3.7 W/(m.K), 3.8 W/(m.K), 3.9 W/(m.K), 4 W/(m.K), 4.1 W/(m.K), 4.2 W/(m.K), 4.3 W/(m.K), 4.4 W/(m.K), 4.5 W/(m.K), 4.6 W/(m.K), 4.7 W/(m.K), 4.8 W/(m.K), 4.9 W/(m.K), 5 W/(m.K), 5.1 W/(m.K), 5.2 W/(m.K), 5.3 W/(m.K), 5.4 W/(m.K), 5.5 W/(m.K), 5.6 W/(m.K), 5.7 W/(m.K), 5.8 W/(m.K), 5.9 W/(m.K), 6 W/(m.K), 6.1 W/(m.K), 6.2 W/(m.K), 6.3 W/(m.K), 6.4 W/(m.K), 6.5 W/(m.K), 6.6 W/(m.K), 6.7 W/(m.K), 6.8 W/(m.K), 6.9 W/(m.K), 7 W/(m.K), 7.1 W/(m.K), 7.2 W/(m.K), 7.3 W/(m.K), 7.4 W/(m.K), 7.5 W/(m.K), 7.6 W/(m.K), 7.7 W/(m.K), 7.8 W/(m.K), 7.9 W/(m.K), 8 W/(m.K), 8.1 W/(m.K), 8.2 W/(m.K), 8.3 W/(m.K), 8.4 W/(m.K), 8.5 W/(m.K), 8.6 W/(m.K), 8.7 W/(m.K), 8.8 W/(m.K), 8.9 W/(m.K), 9 W/(m.K), 9.1 W/(m.K), 9.2 W/(m.K), 9.3 W/(m.K), 9.4 W/(m.K), 9.5 W/(m.K), 9.6 W/(m.K), 9.7 W/(m.K), 9.8 W/(m.K), 9.9 W/(m.K), 10 W/(m.K), 10.1 W/(m.K), 10.2 W/(m.K), 10.3 W/(m.K), 10.4 W/(m.K), 10.5 W/(m.K), 10.6 W/(m.K), 10.7 W/(m.K), 10.8 W/(m.K), 10.9 W/(m.K), 11 W/(m.K), 11.1 W/(m.K), 11.2 W/(m.K), 11.3 W/(m.K), 11.4 W/(m.K), 11.5 W/(m.K), 11.6 W/(m.K), 11.7 W/(m.K), 11.8 W/(m.K), 11.9 W/(m.K), 12 W/(m.K), 12.1 W/(m.K), 12.2 W/(m.K), 12.3 W/(m.K), 12.4 W/(m.K), 12.5 W/(m.K), 12.6 W/(m.K), 12.7 W/(m.K), 12.8 W/(m.K), 12.9 W/(m.K), 13 W/(m.K), 13.1 W/(m.K), 13.2 W/(m.K), 13.3 W/(m.K), 13.4 W/(m.K), 13.5 W/(m.K), 13.6 W/(m.K), 13.7 W/(m.K), 13.8 W/(m.K), 13.9 W/(m.K), 14 W/(m.K), 14.1 W/(m.K), 14.2 W/(m.K), 14.3 W/(m.K), 14.4 W/(m.K), 14.5 W/(m.K), 14.6 W/(m.K), 14.7 W/(m.K), 14.8 W/(m.K), 14.9 W/(m.K), 15 W/(m.K), 15.1 W/(m.K), 15.2 W/(m.K), 15.3 W/(m.K), 15.4 W/(m.K), 15.5 W/(m.K), 15.6 W/(m.K), 15.7 W/(m.K), 15.8 W/(m.K), 15.9 W/(m.K), 16 W/(m.K), 16.1 W/(m.K), 16.2 W/(m.K), 16.3 W/(m.K), 16.4 W/(m.K), 16.5 W/(m.K), 16.6 W/(m.K), 16.7 W/(m.K), 16.8 W/(m.K), 16.9 W/(m.K), 17 W/(m.K), 17.1 W/(m.K), 17.2 W/(m.K), 17.3 W/(m.K), 17.4 W/(m.K), 17.5 W/(m.K), 17.6 W/(m.K), 17.7 W/(m.K), 17.8 W/(m.K), 17.9 W/(m.K), 18 W/(m.K), 18.1 W/(m.K), 18.2 W/(m.K), 18.3 W/(m.K), 18.4 W/(m.K), 18.5 W/(m.K), 18.6 W/(m.K), 18.7 W/(m.K), 18.8 W/(m.K), 18.9 W/(m.K), 19 W/(m.K), 19.1 W/(m.K), 19.2 W/(m.K), 19.3 W/(m.K), 19.4 W/(m.K), 19.5 W/(m.K), 19.6 W/(m.K), 19.7 W/(m.K), 19.8 W/(m.K), 19.9 W/(m.K), 20 W/(m.K), 20.1 W/(m.K), 20.2 W/(m.K), 20.3 W/(m.K), 20.4 W/(m.K), 20.5 W/(m.K), 20.6 W/(m.K), 20.7 W/(m.K), 20.8 W/(m.K), 20.9 W/(m.K), 21 W/(m.K), 21.1 W/(m.K), 21.2 W/(m.K), 21.3 W/(m.K), 21.4 W/(m.K), 21.5 W/(m.K), 21.6 W/(m.K), 21.7 W/(m.K), 21.8 W/(m.K), 21.9 W/(m.K), 22 W/(m.K), 22.1 W/(m.K), 22.2 W/(m.K), 22.3 W/(m.K), 22.4 W/(m.K), 22.5 W/(m.K), 22.6 W/(m.K), 22.7 W/(m.K), 22.8 W/(m.K), 22.9 W/(m.K), 23 W/(m.K), 23.1 W/(m.K), 23.2 W/(m.K), 23.3 W/(m.K), 23.4 W/(m.K), 23.5 W/(m.K), 23.6 W/(m.K), 23.7 W/(m.K), 23.8 W/(m.K), 23.9 W/(m.K), 24 W/(m.K), 24.1 W/(m.K), 24.2 W/(m.K), 24.3 W/(m.K), 24.4 W/(m.K), 24.5 W/(m.K), 24.6 W/(m.K), 24.7 W/(m.K), 24.8 W/(m.K), 24.9 W/(m.K), 25 W/(m.K), 30 W/(m.K), 40 W/(m.K), 50 W/(m.K), 60 W/(m.K), 70 W/(m.K), 80 W/(m.K), 90 W/(m.K), 100 W/(m.K), 110 W/(m.K), 120 W/(m.K), 130 W/(m.K), 140 W/(m.K), 150 W/(m.K), 160 W/(m.K), 170 W/(m.K), 180 W/(m.K), 190 W/(m.K), 200 W/(m.K), 210 W/(m.K), 220 W/(m.K), 230 W/(m.K), 240 W/(m.K), 250 W/(m.K), 260 W/(m.K), 270 W/(m.K), 280 W/(m.K), 290 W/(m.K), 300 W/(m.K), 310 W/(m.K), 320 W/(m.K), 330 W/(m.K), 340 W/(m.K), 350 W/(m.K), 360 W/(m.K), 370 W/(m.K), 380 W/(m.K), 390 W/(m.K), 400 W/(m.K), 410 W/(m.K), 420 W/(m.K), 430 W/(m.K), 440 W/(m.K), or 450 W/(m.K).

According to one embodiment, the substrate comprises GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride.

According to one embodiment, the substrate comprises Au, Ag, Pt, Ru, Ni, Co, Cr, Cu, Sn, Rh Pd, Mn, Ti or a mixture thereof.

According to one embodiment, the substrate comprises silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

Another object of the invention relates to the use of luminescent particle 1 of the invention.

According to one embodiment, the luminescent particle 1 of the invention is used in paint.

According to one embodiment, the luminescent particle 1 of the invention is used in ink.

According to one embodiment, the luminescent particle 1 of the present invention and/or the light emitting material 7 as described above is used for optoelectronics. In this embodiment, the luminescent particle 1 of the present invention and/or the light emitting material 7 as described above is comprised in an optoelectronic device. Examples of optoelectronic devices include but are not limited to: a display device, a diode, a light emitting diode (LED), a microLED, an array of LED or microLED, a laser, a transistor, or a supercapacitor or an IR camera or a barcode.

According to one embodiment, the luminescent particle 1 of the present invention and/or the light emitting material 7 as described above is used in lighting applications. In this embodiment, examples of lighting applications include but are not limited to: lighting for farming and/or horticulture applications or installations such as for example greenhouses, or indoor plant growing; specialized lighting such as for example retail lighting such as for example lighting in clothing stores, grocery stores, retail stores, or malls; street lighting; commercial lighting; entertainment lighting such as for example concert lighting, studio TV lighting, movie lighting, stage lighting, club lighting, photography lighting, or architecture lighting; airfield lighting; healthcare lighting such as for example lighting in hospitals, clinics, or medical offices; hospitality lighting such as for example lighting in hotels and resorts, casinos, restaurants, bars and nightclubs, convention centers, spas and wellness centers; industrial lighting such as for example lighting in warehouses, manufacturing, distribution centers, transportation, parking facilities, or public utilities; medical and examination lighting; sport lighting such as for example lighting in sports Facilities, theme parks, museums, parks, art installations, theaters, or entertainment complexes; or eco-friendly lighting. The luminescent particle 1 and/or the light emitting material 7 of the invention can improve the appeal and/or the preservation of the items sold in stores when used in the lighting installations of said sotres.

According to one embodiment, the luminescent particle 1 of the present invention is used in Quantum Dot Enhanced Films (QDEF) to replace regular quantum dots. In particular, a luminescent particle 1 comprising quantum dots, semiconductor nanoplatelets, or a mixture of at least one quantum dot and at least one semiconductor nanoplatelet is used in QDEF.

According to one embodiment, the luminescent particle 1 and/or the light emitting material 7 of the invention is used on chip: on microLEDs, LEDs, an array of microLEDs, or an array of LEDs. In particular, a luminescent particle 1 comprising quantum dots emitting red light, semiconductor nanoplatelets emitting red light, or a mixture of at least one quantum dot and at least one semiconductor nanoplatelet emitting red light is used on chip.

According to one embodiment, the luminescent particle 1 and/or the light emitting material 7 of the invention is used in a color filter, or as a color filter.

According to one embodiment, the luminescent particle 1 and/or the light emitting material 7 of the invention is used in microLED, LED, or large LED videowalls.

According to one embodiment, the luminescent particle 1 of the invention is used as an electroluminescent quantum dot at the subpixel level, i.e. said luminescent particle 1 is used inside individual subpixels within a pixel array being charged by electrical current to create refined patterns and colors.

According to one embodiment, the luminescent particle 1 and/or the light emitting material 7 of the invention is used for videoprojection, i.e. it is used in videoprojection devices.

According to one embodiment, the luminescent particle 1 and/or the light emitting material 7 of the invention is used in a display apparatus comprising at least one light source and a rotating wheel, wherein said at least one light source is configured to provide an illumination and/or an excitation for the luminescent particle 1 and/or the light emitting material 7. The light of the light sourcemeet the rotating wheel comprising the luminescent particle 1 and/or the light emitting material 7. the rotating wheel comprises several zones including at least one zone comprising the luminescent particle 1 and/or the light emitting material 7 or including at least two zones each comprising the luminescent particle 1 and/or the light emitting material 7 able to emit secondary lights at different wavelengths. At least one zone may be free of the luminescent particle 1 and/or the light emitting device 7, empty or optically transparent in order to permit the primary light to be transmitted through the rotating wheel without emission of any secondary light.

According to one embodiment, the luminescent particle 1 of the invention is used for the optical calibration of optical instruments such as spectrophotometers. Indeed, as the optical properties of said luminescent particle 1 are stable in time and temperature, it is possible to keep them for a long period of time and use them during the calibration procedure of spectrophotometers.

According to one embodiment, the optoelectronic device is a display device, a diode, a light emitting diode (LED), a laser, a photodetector, a transistor, a supercapacitor, a barcode, a LED, a microLED, an array of LED, an array of microLED, or an IR camera.

According to one embodiment, the luminescent particle 1 of the present invention and/or the light emitting material 7 is used for luminescence detection.

According to one embodiment, the luminescent particle 1 of the present invention and/or the light emitting material 7 is used for bioimaging, biotargeting, biosensing, medical imaging, diagnostic, therapy, or theranostics.

According to one embodiment, the luminescent particle 1 of the invention and/or the light emitting material 7 is used for catalysis.

According to one embodiment, the luminescent particle 1 of the invention is used in drug delivery.

According to one embodiment, the luminescent particle 1 of the invention and/or the light emitting material 7 is used in energy storage devices.

According to one embodiment, the luminescent particle 1 of the invention and/or the light emitting material 7 is used in energy production devices.

According to one embodiment, the luminescent particle 1 of the invention and/or the light emitting material 7 is used in enery conversion devices.

According to one embodiment, the luminescent particle 1 of the invention and/or the light emitting material 7 is used in enery transport devices.

According to one embodiment, the luminescent particle 1 of the invention and/or the light emitting material 7 is used in photovoltaic cells.

According to one embodiment, the luminescent particle 1 of the invention and/or the light emitting material 7 is used in lighting devices.

According to one embodiment, the luminescent particle 1 of the invention and/or the light emitting material 7 is used in sensor devices.

According to one embodiment, the luminescent particle 1 of the invention comprising fluorescent nanoparticles is used in pressure sensor devices. In this embodiment, a pressure exerted on said luminescent particle 1 (and therefore on the fluorescent nanoparticles) induces a shift in the emission wavelength.

Another object of the invention relates to an optoelectronic device comprising at least one luminescent particle 1 and/or at least one light emitting material 7 as described here above.

According to one embodiment, the optoelectronic device is a display device, a diode, a light emitting diode (LED), a laser, a photodetector, a transistor, a supercapacitor, a barcode, a LED, a microLED, an array of LED, an array of microLED, or an IR camera.

LED used herein includes LED, LED chip 5 and microsized LED 6.

According to one embodiment, the optoelectronic device comprises at least one LED and at least one luminescent particle 1 and/or at least one light emitting material 7 as described here above.

According to one embodiment, a pixel comprises at least one LED.

According to one embodiment, a pixel comprises at least 1, 2, 3, 4, 5, 10, 20, 30, 40, 50, 60, 70, 80, 90, 100, 500, 1000, 5000, 10000, 50000, 100000, 150000, 200000, 250000, 300000, 350000, 400000, 450000, 500000, 550000, 600000, 650000, 750000, 800000, 850000, 900000, 950000, $10^6$, $10^7$, $10^8$, $10^9$, $10^{10}$, $10^{11}$, or $10^{12}$ LEDs.

According to one embodiment, the at least one luminescent particle 1 or the at least one light emitting material 7 is on top of a LED chip 5 or a microsized LED 6.

According to one embodiment, the at least one luminescent particle 1 or the at least one light emitting material 7 is on top of at least one LED of a LED array or a microsized LED 6 array.

According to one embodiment, the at least one luminescent particle 1 or the at least one light emitting material 7 is deposited and patterned on top of at least one LED of a LED array or a microsized LED 6 array.

According to one embodiment, the at least one luminescent particle 1 or the at least one light emitting material 7 is deposited and patterned on top of a LED, at least one LED of a LED array, a microsized LED 6 or at least one LED of a microsized LED 6 array using a lift-off technique, lithography, or a direct etching of the at least one luminescent particle 1 or the at least one light emitting material 7.

In one embodiment, as illustrated in FIG. 14A, the at least one luminescent particle 1 covers the LED chip 5.

In one embodiment, as illustrated in FIG. 14B, the at least one luminescent particle 1 covers and surrounds partially or totally the LED chip 5.

In one embodiment, the at least one light emitting material 7 as described above covers the LED chip 5.

In one embodiment, the at least one light emitting material 7 as described above covers and surrounds partially or totally the LED chip 5.

In one embodiment, as illustrated in FIG. 16A, the at least one luminescent particle 1 or the at least one light emitting material 7 covers a pixel of a microsized LED 6 array without overlapping between the pixels of said microsized LED 6 array.

In one embodiment, the at least one luminescent particle 1 or the at least one light emitting material 7 covers partially a pixel of a microsized LED 6 array without overlapping between the pixels of said microsized LED 6 array.

In one embodiment, as illustrated in FIG. 16B, the at least one luminescent particle 1 or the at least one light emitting material 7 covers and surrounds partially or totally a pixel of a microsized LED 6 array without overlapping between the pixels of said microsized LED 6 array.

In one embodiment, the at least one luminescent particle 1 or the at least one light emitting material 7 covers a microsized LED 6 array without overlapping between the pixels of said microsized LED 6 array.

In one embodiment, the at least one luminescent particle 1 or the at least one light emitting material 7 covers partially a microsized LED 6 array without overlapping between the pixels of said microsized LED 6 array.

In one embodiment, the at least one luminescent particle 1 or the at least one light emitting material 7 covers and surrounds partially or totally a microsized LED 6 array without overlapping between the pixels of said microsized LED 6 array.

In one embodiment, one population of luminescent particles 1 is deposited on a microsized LED 6 array. In one embodiment, a population of luminescent particles 1 is defined by the maximum emission wavelength.

In one embodiment, at least one population of luminescent particles 1 is deposited on a pixel of a microsized LED 6 array.

In one embodiment, two populations of luminescent particles 1 emitting different colors or wavelengths are deposited on a microsized LED 6 array.

In one embodiment, two populations of luminescent particles 1 which emit green light and red light upon downconversion of a blue light source are deposited on a microsized LED 6 array.

In one embodiment, the two populations of luminescent particles 1 comprise a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, a light emitting material 7 as described here above comprising one population of luminescent particles 1 is deposited on a microsized LED 6 array.

In one embodiment, a light emitting material 7 as described here above comprising at least one population of luminescent particles 1 is deposited a microsized LED 6 array.

In one embodiment, a light emitting material 7 as described here above comprising two populations of luminescent particles 1 emitting different colors or wavelengths is deposited on a microsized LED 6 array.

In one embodiment, the light emitting material 7 comprises two populations of luminescent particles 1, a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, two light emitting materials 7 as described here above each comprising one population of luminescent particles 1 emitting different colors or wavelengths are deposited on a microsized LED 6 array.

In one embodiment, the two light emitting materials 7 each comprise one population of luminescent particles 1, a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

According to one embodiment, the primary light is a blue light with an emission wavelength ranging from 400 nm to 470 nm, preferably at about 450 nm.

According to one embodiment, the primary light is a UV light with an emission wavelength ranging from 200 nm to 400 nm, preferably at about 390 nm.

In one embodiment, the LED chip 5 or the microsized LED 6 is a blue LED with a wavelength ranging from 400 nm to 470 nm such as for instance a gallium nitride based diode.

In one embodiment, the LED chip 5 or the microsized LED 6 is a blue LED with a wavelength ranging from 400 nm to 470 nm. In one embodiment, the LED chip 5 or the microsized LED 6 has an emission peak at about 405 nm. In one embodiment, the LED chip 5 or the microsized LED 6 has an emission peak at about 447 nm. In one embodiment, the LED chip 5 or the microsized LED 6 has an emission peak at about 455 nm.

In one embodiment, the LED chip 5 or the microsized LED 6 is a UV LED with a wavelength ranging from 200 nm to 400 nm. In one embodiment, the LED chip 5 or the microsized LED 6 has an emission peak at about 253 nm. In one embodiment, the LED chip 5 or the microsized LED 6 has an emission peak at about 365 nm. In one embodiment, the LED chip 5 or the microsized LED 6 has an emission peak at about 395 nm.

In one embodiment, the LED chip 5 or the microsized LED 6 is a green LED with a wavelength ranging from 500 nm to 560 nm. In one embodiment, the LED chip 5 or the microsized LED 6 has an emission peak at about 515 nm. In one embodiment, the LED chip 5 or the microsized LED 6 has an emission peak at about 525 nm. In one embodiment, the LED chip 5 or the microsized LED 6 has an emission peak at about 540 nm.

In one embodiment, the LED chip 5 or the microsized LED 6 is a red LED with a wavelength ranging from 750 to 850 nm. In one embodiment, the LED chip 5 or the microsized LED 6 has an emission peak at about 755 nm. In one embodiment, the LED chip 5 or the microsized LED 6 has an emission peak at about 800 nm. In one embodiment, the LED chip 5 or the microsized LED 6 has an emission peak at about 850 nm.

In one embodiment, the LED chip 5 or the microsized LED 6 has a photon flux or average peak pulse power between 1 $\mu W.cm^{-2}$ and 1 $kW.cm^{-2}$ and more preferably between 1 $mW.cm^{-2}$ and 100 $W.cm^{-2}$, and even more preferably between 1 $mW.cm^{-2}$ and 30 $W.cm^{-2}$.

In one embodiment, the LED chip 5 or the microsized LED 6 has a photon flux or average peak pulse power of at least 1 $\mu W.cm^{-2}$, 10 $\mu W.cm^{-2}$, 100 $\mu W.cm^{-2}$, 500 $\mu W.cm^{-2}$, 1 $mW.cm^{-2}$, 10 $mW.cm^{-2}$, 100 $mW.cm^{-2}$, 500 $mW.cm^{-2}$, 1 $W.cm^{-2}$, 10 $W.cm^{-2}$, 100 $W.cm^{-2}$, 500 $W.cm^{-2}$, or 1 $kW.cm^{-2}$.

In one embodiment, the LED chip 5 is a GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride diode.

In one embodiment, the microsized LED 6 is a GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride diode.

In one embodiment, a LED array comprises an array of GaN diodes, GaSb diodes, GaAs diodes, GaAsP diodes, GaP diodes, InP diodes, SiGe diodes, InGaN diodes, GaAlN diodes, GaAlPN diodes, AlN diodes, AlGaAs diodes, AlGaP diodes, AlGaInP diodes, AlGaN diodes, AlGaInN diodes, ZnSe diodes, Si diodes, SiC diodes, diamond diodes, boron nitride diodes or a mixture thereof.

According to one embodiment, a pixel comprises at least one microsized LED 6.

According to one embodiment, at least one pixel comprises a unique microsized LED 6.

According to one embodiment, at least one pixel comprises one microsized LED 6. In this embodiment, the microsized LED 6 and the one pixel are combined.

According to one embodiment, as illustrated in FIG. 15, the pixel pitch D is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3 7 mm, 3.8 mm, 3 9 mm, 4 mm, 4.1 mm, 4.2 mm, 4 3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the pixel pitch D is smaller than 10 μm.

According to one embodiment, the pixel size is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18

μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the optoelectronic device comprises LEDs, microLEDs, at least one array of LED or at least one array of microLED, on which at least one luminescent particle 1 and/or at least one light emitting material 7 is deposited. According to one embodiment, red emitting luminescent particle 1 and/or light emitting material 7, and green emitting luminescent particle 1 and/or light emitting material 7 are deposited alternatively on LEDs, microLEDs, at least one array of LED or at least one array of microLED, preferably blue LEDs, microLEDs, at least one array of LED or at least one array of microLED thus creating an alternance of red-green emitting pixels. According to one embodiment, red emitting luminescent particle 1 and/or light emitting material 7, green emitting luminescent particle 1 and/or light emitting material 7, no luminescent particle 1 and/or light emitting material 7 are deposited alternatively on LEDs, microLEDs, at least one array of LED or at least one array of microLED, preferably blue LEDs, microLEDs, at least one array of LED or at least one array of microLED, thus creating an alternance of blue-red-green emitting pixels.

According to one embodiment, the luminescent particle 1 and/or light emitting material 7 deposited on LEDs, microLEDs, at least one array of LED or at least one array of microLED is covered with an auxiliary layer as described herein, preferably a blue absorbing resin so that only red and green secondary light can be emitted.

According to one embodiment, the optoelectronic device comprises at least one film of luminescent particle 1 and/or at least one light emitting material 7 deposited on at least one array of LED, at least one array of microLED, or a pixel.

According to one embodiment, after deposition, the at least one luminescent particle 1 or the at least one light emitting material 7 is coated with an auxiliary layer as described here above. In this embodiment, the auxiliary layer limits or prevents the degradation of the chemical and physical properties of the at least one luminescent particle 1 or the at least one light emitting material 7 from molecular oxygen, ozone, water and/or high temperature.

According to one embodiment, after deposition, the at least one luminescent particle 1 or the at least one light emitting material 7 is coated with a protective layer as described here above. In this embodiment, the protective layer limits or prevents the degradation of the chemical and physical properties of the at least one luminescent particle 1 or the at least one light emitting material 7 from molecular oxygen, ozone, water and/or high temperature.

In one embodiment, the at least one luminescent particle 1 or the at least one light emitting material 7 exhibits photoluminescence quantum yield (PLQY) decrease of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $mW.cm^{-2}$ and 100 $kW.cm^{-2}$ and more preferably between 10 $mW.cm^{-2}$ and 100 $W.cm^{-2,}$ and even more preferably between 10 $mW.cm^{-2}$ and 30 $W.cm^{-2}$.

According to one embodiment, the photon flux or average peak pulse power of the illumination is at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170 $W.cm^{-2}$, 180 $W.cm^{-2}$, 190 $W.cm^{-2}$, 200 $W.cm^{-2}$, 300 $W.cm^{-2}$, 400 $W.cm^{-2}$, 500 $W.cm^{-2}$, 600 $W.cm^{-2}$, 700 $W.cm^{-2}$, 800 $W.cm^{-2}$, 900 $W.cm^{-2}$, 1 $kW.cm^{-2}$, 50 $kW.cm^{-2}$, or 100 $kW.cm^{-2}$.

In one embodiment, the at least one luminescent particle 1 or the at least one light emitting material 7 exhibits photoluminescence quantum yield (PQLY) decrease of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW.cm^{-2}$, 50 $mW.cm^{-2}$, 100 $mW.cm^{-2}$, 500 $mW.cm^{-2}$, 1 $W.cm^{-2}$, 5 $W.cm^{-2}$, 10 $W.cm^{-2}$, 20 $W.cm^{-2}$, 30 $W.cm^{-2}$, 40 $W.cm^{-2}$, 50 $W.cm^{-2}$, 60 $W.cm^{-2}$, 70 $W.cm^{-2}$, 80 $W.cm^{-2}$, 90 $W.cm^{-2}$, 100 $W.cm^{-2}$, 110 $W.cm^{-2}$, 120 $W.cm^{-2}$, 130 $W.cm^{-2}$, 140 $W.cm^{-2}$, 150 $W.cm^{-2}$, 160 $W.cm^{-2}$, 170

W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{-2}$, or 100 kW.cm$^{-2}$.

In one embodiment, the at least one luminescent particle 1 or the at least one light emitting material 7 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW.cm$^{-2}$, 50 mW.cm$^{-2}$, 100 mW.cm$^{-2}$, 500 mW.cm$^{-2}$, 1 W.cm$^{-2}$, 5 W.cm$^{-2}$, 10 W.cm$^{-2}$, 20 W.cm$^{-2}$, 30 W.cm$^{-2}$, 40 W.cm$^{-2}$, 50 W.cm$^{-2}$, 60 W.cm$^{-2}$, 70 W.cm$^{-2}$, 80 W.cm$^{-2}$, 90 W.cm$^{-2}$, 100 W.cm$^{-2}$, 110 W.cm$^{-2}$, 120 W.cm$^{-2}$, 130 W.cm$^{-2}$, 140 W.cm$^{-2}$, 150 W.cm$^{-2}$, 160 W.cm$^{-2}$, 170 W.cm$^{-2}$, 180 W.cm$^{-2}$, 190 W.cm$^{-2}$, 200 W.cm$^{-2}$, 300 W.cm$^{-2}$, 400 W.cm$^{-2}$, 500 W.cm$^{-2}$, 600 W.cm$^{-2}$, 700 W.cm$^{-2}$, 800 W.cm$^{-2}$, 900 W.cm$^{-2}$, 1 kW.cm$^{-2}$, 50 kW.cm$^{-2}$, or 100 kW.cm$^{-2}$.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW.cm$^{-2}$, 50 mW.cm$^{2}$, 100 mW.cm$^{-2}$, 500 mW.cm$^{-2}$, 1 W.cm$^{-2}$, 5 W.cm$^{-2}$, 10 W.cm$^{-2}$, 20 W.cm$^{-2}$, 30 W.cm$^{-2}$, 40 W.cm$^{-2}$, 50 W.cm$^{-2}$, 60 W.cm$^{-2}$, 70 W.cm$^{-2}$, 80 W.cm$^{-2}$, 90 W.cm$^{-2}$, 100 W.cm$^{-2}$, 110 W.cm$^{-2}$, 120 W.cm$^{-2}$, 130 W.cm$^{-2}$, 140 W.cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% under a humidity of at least 0%, 10%, 20%, 30%, 40%, 50%, 55%, 60%, 65%, 70%, 75%, 80%, 85%, 90%, 95%, or 100%, under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% under a humidity of at least 0%, 10%, 20%, 30%, 40%, 50%, 55%, 60%, 65%, 70%, 75%, 80%, 85%, 90%, 95%, or 100%, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a decrease of the intensity of at least one emission peak of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$, and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a humidity of at least 0%, 10%, 20%, 30%, 40%, 50%, 55%, 60%, 65%, 70%, 75%, 80%, 85%, 90%, 95%, or 100%, under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a humidity of at least 0%, 10%, 20%, 30%, 40%, 50%, 55%, 60%, 65%, 70%, 75%, 80%, 85%, 90%, 95%, or 100%, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits a shift of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$, and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits an increase of the full width half maximum of at least one emission peak of less than 60 nm, 55 nm, 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under a humidity of at least 0%, 10%, 20%, 30%, 40%, 50%, 55%, 60%, 65%, 70%, 75%, 80%, 85%, 90%, 95%, or 100%, under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the optoelectronic device exhibits an increase of the full width half maximum of at least one emission peak of less than 90%, 80%, 70%, 60%, 50%, 40%, 30%, 25%, 20%, 15%, 10%, 5%, or 0% under a humidity of at least 0%, 10%, 20%, 30%, 40%, 50%, 55%, 60%, 65%, 70%, 75%, 80%, 85%, 90%, 95%, or 100%, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm under light illumination with a photon flux or average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700

W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$, under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under a temperature of at least 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under a humidity of at least 0%, 10%, 20%, 30%, 40%, 50%, 55%, 60%, 65%, 70%, 75%, 80%, 85%, 90%, 95%, or 100%.

In one embodiment, the optoelectronic device exhibits an increase of the full width half maximum of at least one emission peak of less than 50 nm, 45 nm, 40 nm, 35 nm, 30 nm, 25 nm, 20 nm, 15 nm, 10 nm, 5 nm, 4 nm, 3 nm, 2 nm, or 1 nm after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$ and under a humidity of at least 0%, 10%, 20%, 30%, 40%, 50%, 55%, 60%, 65%, 70%, 75%, 80%, 85%, 90%, 95%, or 100%.

Another object of the invention relates to a method for obtaining the luminescent particles 1 of the invention.

In one embodiment, the method comprises the following steps:

1. preparing particles 2 comprising at least one nanoparticle 3 dispersed in a second material 21:
   (a) preparing a solution A by mixing:
   at least one colloidal suspension comprising at least one nanoparticle 3;
   at least one precursor of the second material 21;
   at least one organic solvent; and
   optionally at least one surfactant, additional nanoparticles and/or at least one heteroelement precursor.
   (b) preparing an aqueous solution B optionally comprising additional nanoparticles and/or at least one heteroelement precursor;
   (c) forming droplets of solution A by a first means for forming droplets;
   (d) forming droplets of solution B by a second means for forming droplets;
   (e) mixing said droplets;
   (f) dispersing the mixed droplets in a gas flow;
   (g) heating said dispersed droplets at a temperature sufficient to obtain resulting particles 2;
   (h) cooling of said particles 2; and
   (i) separating and collecting said particles 2.
2. preparing luminescent particles 1 comprising at least one particle 2 obtained at step (1) and a first material 11:
   (a) preparing a solution C by mixing:
   at least one suspension comprising at least one particle 2;
   at least one precursor of the first material 11;
   at least one organic solvent; and
   optionally at least one surfactant, additional nanoparticles, at least one heteroelement precursor, at least one dense particle 9 and/or at least one suspension comprising at least one nanoparticle 3.
   (b) preparing an aqueous solution D optionally comprising: additional nanoparticles, at least one heteroelement precursor, at least one dense particle 9 and/or at least one suspension comprising at least one nanoparticle 3;
   (c) forming droplets of solution C by a first means for forming droplets;
   (d) forming droplets of solution D by a second means for forming droplets;
   (e) mixing said droplets;
   (f) dispersing the mixed droplets in a gas flow;
   (g) heating said dispersed droplets at a temperature sufficient to obtain resulting luminescent particles 1;
   (h) cooling of said luminescent particles 1; and
   (i) separating and collecting said luminescent particles 1.

wherein the aqueous solution B and/or the aqueous solution D may be acidic or basic solutions.

In one embodiment, the method comprises the following steps:

1. preparing particles 2 comprising at least one nanoparticle 3 dispersed in a second material 21:
   (a) preparing a solution A by mixing:
   at least one colloidal suspension comprising at least one nanoparticle 3;
   at least one precursor of the second material 21; and
   optionally at least one organic solvent, at least one aqueous solvent, at least one base or one acid, water, at least one surfactant, additional nanoparticles and/or at least one heteroelement precursor.
   (b) forming droplets of solution A by a first means for forming droplets;
   (c) dispersing said droplets in a gas flow;
   (d) heating said dispersed droplets at a temperature sufficient to obtain resulting particles 2;
   (e) cooling of said particles 2; and
   (f) separating and collecting said particles 2.
2. preparing luminescent particles 1 comprising at least one particle 2 obtained at step (1) and a first material 11:
   (a) preparing a solution C by mixing:
   at least one suspension comprising at least one particle 2;
   at least one precursor of the first material 11; and
   optionally at least one organic solvent, at least one aqueous solvent, at least one base or one acid, water, at least one surfactant, additional nanoparticles, at least one heteroelement precursor, at least one dense particle 9 and/or at least one suspension comprising at least one nanoparticle 3.

(b) forming droplets of solution C by a first means for forming droplets;

(c) dispersing said droplets in a gas flow; (d) heating said dispersed droplets at a temperature sufficient to obtain resulting luminescent particles 1;

(e) cooling of said luminescent particles 1; and (f) separating and collecting said luminescent particles 1.

In one embodiment, the method comprises the following steps:

1. preparing particles 2 comprising at least one nanoparticle 3 dispersed in a second material 21:

(a) preparing a solution A by mixing:

at least one colloidal suspension comprising at least one nanoparticle 3;

at least one precursor of the second material 21;

at least one organic solvent; and optionally at least one surfactant, additional nanoparticles and/or at least one heteroelement precursor.

(b) preparing an aqueous solution B optionally comprising additional nanoparticles and/or at least one heteroelement precursor;

(c) forming droplets of solution A by a first means for forming droplets;

d) forming droplets of solution B by a second means for forming droplets;

(e) mixing said droplets;

(f) dispersing the mixed droplets in a gas flow;

(g) heating said dispersed droplets at a temperature sufficient to obtain resulting particles 2;

(h) cooling of said particles 2; and (i) separating and collecting said particles 2.

2. preparing luminescent particles 1 comprising at least one particle 2 obtained at step (1) and a first material 11:

(a) preparing a solution C by mixing:

at least one suspension comprising at least one particle 2;

at least one solvent;

at least one hydrolysis catalyst at least one heteroelement precursor optionally at least one surfactant, additional nanoparticles, at least one heteroelement precursor, at least one condensation catalyst and/or at least one suspension comprising at least one nanoparticle 3.

(b) preparing a solution D comprising:

at least one precursor of the first material 11, optionally at least one solvent, at least one heteroelement precursor, and/or at least one suspension comprising at least one nanoparticle 3;

(c) adding solution D to solution C at a speed sufficient to deposit an uniform layer of material 11 at the surface of particle 2;

(d) letting the mixture react at a sufficient temperature, ranging from 20° C. to 100° C., and time, ranging from 10 min to 3 h, to obtain luminescent particles 1;

(e) separating and collecting said luminescent particles 1

(f) washing said luminescent particles 1

(g) drying said luminescent particles 1.

In one embodiment, the method comprises the following steps:

1. preparing particles 2 comprising at least one nanoparticle 3 dispersed in a second material 21:

(a) preparing a solution A by mixing:

at least one colloidal suspension comprising at least one nanoparticle 3;

at least one precursor of the second material 21;

at least one organic solvent; and optionally at least one surfactant, additional nanoparticles and/or at least one heteroelement precursor.

(b) preparing an aqueous solution B optionally comprising additional nanoparticles and/or at least one heteroelement precursor;

(c) forming droplets of solution A by a first means for forming droplets;

(d) forming droplets of solution B by a second means for forming droplets;

(e) mixing said droplets;

(f) dispersing the mixed droplets in a gas flow;

(g) heating said dispersed droplets at a temperature sufficient to obtain resulting particles 2;

(h) cooling of said particles 2; and (i) separating and collecting said particles 2.

2. preparing luminescent particles 1 comprising at least one particle 2 obtained at step (1), at least one dense particle 9 and a first material 11:

(a) preparing a solution C by mixing:

at least one surfactant to generate micelles;

at least one hydrophobic compound and/or organic solvent;

(b) preparing an aqueous solution D by mixing:

at least one particle 2;

at least one water or one aqueous solvent optionally at least one base or one acid, water, at least one heteroelement precursor, at least one dense particle 9 and/or at least one suspension comprising at least one nanoparticle 3.

(c) forming a microemulsion of solution D within solution C (droplets of D);

(d) maintaining the apparent pH to a value 2 points higher or lower than the isoelectric point of material 21 so that particles 2 will be preferentially present in solution D;

(e) adding at least one precursor of the first material 11 to the mixture under stirring;

(f) optionally, an aqueous solution containing at least one base or one acid is added along with the solution described in (e);

(g) letting the mixture react at a sufficient temperature, ranging from 20° C. to 100° C., and time, ranging from 10 min to 3 h, to obtain luminescent particles 1;

(h) separating and collecting said luminescent particles 1;

(i) washing and drying said luminescent particles 1.

In one embodiment, the method comprises the following steps:

1. preparing particles 2 comprising at least one nanoparticle 3 dispersed in a second material 21:

(a) preparing a solution A by mixing:

at least one colloidal suspension comprising at least one nanoparticle 3;

at least one precursor of the second material 21; and optionally at least one organic solvent, at least one aqueous solvent, at least one base or one acid, water, at least one surfactant, additional nanoparticles and/or at least one heteroelement precursor.

(b) forming droplets of solution A by a first means for forming droplets;
(c) dispersing said droplets in a gas flow;
(d) heating said dispersed droplets at a temperature sufficient to obtain resulting particles 2;
(e) cooling of said particles 2; and
(f) separating and collecting said particles 2.

2. preparing cores 12 comprising at least one particle 2 obtained at step (1) and a first material 11:
(a) preparing a solution C by mixing:
at least one suspension comprising at least one particle 2;
at least one precursor of the first material 11; and
optionally at least one organic solvent, at least one aqueous solvent, at least one base or one acid, water, at least one surfactant, additional nanoparticles, at least one heteroelement precursor, at least one dense particle 9 and/or at least one suspension comprising at least one nanoparticle 3.
(b) forming droplets of solution C by a first means for forming droplets;
(c) dispersing said droplets in a gas flow;
(d) heating said dispersed droplets at a temperature sufficient to obtain resulting cores 12;
(e) cooling of said cores 12; and
(f) separating and collecting said cores 12.

3. preparing luminescent particles 1 comprising a core 12 obtained at step (2) and at least one shell 13 using Fluidized Bed ALD technique:
(a) preparing and sustain a fluidized bed of at least one core 12 under inert gas flow
optionally a mixture of at least one dense particle 9 and/or at least one particle 1 on which at least one particle 2 is physically adsorbed;
(b) injecting in the inlet inert gas flow vapor of at least one precursor of the material of the shell 13;
(c) maintaining the precursor injection for a period long enough to form a full monolayer of precursor of the material of the shell 13 at the surface of the core 12;
(d) stopping the feed of the vapor of the precursor of the material of the shell 13 and flush the solid and the line with a flow of inert gas;
(e) injecting in the inlet inert gas flow vapor of water or at least one heteroelement precursor;
(f) maintaining the precursor injection for a period long enough to form a full monolayer of precursor material of the material of the shell 13 at the surface of the core 12;
(g) stopping the feed of the vapor of water or the heteroelement precursor and flush the solid and the line with a flow of inert gas;
(h) Repeat steps (b) to (g) in a sufficient amount of time to obtain resulting heterostructured luminescent particles 1;
(i) flush the solid and the line with a flow of inert gas;
(j) separating and collecting said heterostructured luminescent particles 1.

In one embodiment, the method comprises the following steps:

1. preparing particles 2 comprising at least one nanoparticle 3 dispersed in a second material 21 using reverse micellar (or emulsion) method, micellar (or emulsion) method, and/or Stöber method.
2. preparing luminescent particles 1 comprising at least one particle 2 obtained at step (1) and a first material 11:
(a) preparing a solution C by mixing:
at least one suspension comprising at least one particle 2;
at least one precursor of the first material 11;
at least one organic solvent; and
optionally at least one surfactant, additional nanoparticles, at least one heteroelement precursor, at least one dense particle 9 and/or at least one suspension comprising at least one nanoparticle 3.
(b) preparing an aqueous solution D optionally comprising: additional nanoparticles, at least one heteroelement precursor, at least one dense particle 9 and/or at least one suspension comprising at least one nanoparticle 3;
(c) forming droplets of solution C by a first means for forming droplets;
(d) forming droplets of solution D by a second means for forming droplets;
(e) mixing said droplets;
(f) dispersing the mixed droplets in a gas flow;
(g) heating said dispersed droplets at a temperature sufficient to obtain resulting luminescent particles 1;
(h) cooling of said luminescent particles 1; and
(i) separating and collecting said luminescent particles 1.

wherein the aqueous solution B and/or the aqueous solution D may be acidic or basic solutions.

In one embodiment, the method comprises the following steps:

1. preparing particles 2 comprising at least one nanoparticle 3 dispersed in a second material 21 using reverse micellar (or emulsion) method, micellar (or emulsion) method, and/or Stöber method.
2. preparing luminescent particles 1 comprising at least one particle 2 obtained at step (1) and a first material 11:
(a) preparing a solution C by mixing:
at least one suspension comprising at least one particle 2;
at least one precursor of the first material 11; and
optionally at least one organic solvent, at least one aqueous solvent, at least one base or one acid, water, at least one surfactant, additional nanoparticles, at least one heteroelement precursor, at least one dense particle 9 and/or at least one suspension comprising at least one nanoparticle 3.
(b) forming droplets of solution C by a first means for forming droplets;
(c) dispersing said droplets in a gas flow;
(d) heating said dispersed droplets at a temperature sufficient to obtain resulting luminescent particles 1;
(e) cooling of said luminescent particles 1; and
(f) separating and collecting said luminescent particles 1.

In one embodiment, the method comprises the following steps:

1. preparing particles 2 comprising at least one nanoparticle 3 dispersed in a second material 21 using reverse micellar (or emulsion) method, micellar (or emulsion) method, and/or Stöber method.
2. preparing luminescent particles 1 comprising at least one particle 2 obtained at step (1) and a first material 11:

(a) preparing a solution C by mixing:
at least one suspension comprising at least one particle 2;
at least one solvent;
at least one hydrolysis catalyst
at least one heteroelement precursor
optionally at least one surfactant, additional nanoparticles, at least one heteroelement precursor, at least one condensation catalyst and/or at least one suspension comprising at least one nanoparticle 3.
(b) preparing a solution D comprising:
at least one precursor of the first material 11,
optionally at least one solvent, at least one heteroelement precursor, and/or at least one suspension comprising at least one nanoparticle 3;
(c) adding solution D to solution C at a speed sufficient to deposit an uniform layer of material 11 at the surface of particle 2;
(d) letting the mixture react at a sufficient temperature, ranging from 20° C. to 100° C., and time, ranging from 10 min to 3 h, to obtain luminescent particles 1;
(e) separating and collecting said luminescent particles 1
(f) washing said luminescent particles 1
(g) drying said luminescent particles 1.

In one embodiment, the method comprises the following steps:

1. preparing particles 2 comprising at least one nanoparticle 3 dispersed in a second material 21 using reverse micellar (or emulsion) method, micellar (or emulsion) method, and/or Stöber method.
2. preparing luminescent particles 1 comprising at least one particle 2 obtained at step (1), at least one dense particle 9 and a first material 11:
(a) preparing a solution C by mixing:
at least one surfactant to generate micelles;
at least one hydrophobic compound and/or organic solvent;
(b) preparing an aqueous solution D by mixing:
at least one particle 2;
at least one water or one aqueous solvent
optionally at least one base or one acid, water, at least one heteroelement precursor, at least one dense particle 9 and/or at least one suspension comprising at least one nanoparticle 3.
(c) forming a microemulsion of solution D within solution C (droplets of D);
(d) maintaining the apparent pH to a value 2 points higher or lower than the isoelectric point of material 21 so that particles 2 will be preferentially present in solution D;
(e) adding at least one precursor of the first material 11 to the mixture under stirring;
(f) optionally, an aqueous solution containing at least one base or one acid is added along with the solution described in (e);
(g) letting the mixture react at a sufficient temperature, ranging from 20° C. to 100° C., and time, ranging from 10 min to 3 h, to obtain luminescent particles 1;
(h) separating and collecting said luminescent particles 1;
(i) washing and drying said luminescent particles 1.

In one embodiment, the method comprises the following steps:

1. preparing particles 2 comprising at least one nanoparticle 3 dispersed in a second material 21 using reverse micellar (or emulsion) method, micellar (or emulsion) method, and/or Stöber method.
2. preparing cores 12 comprising at least one particle 2 obtained at step (1) and a first material 11:
(a) preparing a solution C by mixing:
at least one suspension comprising at least one particle 2;
at least one precursor of the first material 11; and
optionally at least one organic solvent, at least one aqueous solvent, at least one base or one acid, water, at least one surfactant, additional nanoparticles, at least one heteroelement precursor, at least one dense particle 9 and/or at least one suspension comprising at least one nanoparticle 3.
(b) forming droplets of solution C by a first means for forming droplets;
(c) dispersing said droplets in a gas flow;
(d) heating said dispersed droplets at a temperature sufficient to obtain resulting cores 12;
(e) cooling of said cores 12; and
(f) separating and collecting said cores 12.
3. preparing luminescent particles 1 comprising a core 12 obtained at step (2) and at least one shell 13 using Fluidized Bed ALD technique:
(a) preparing and sustain a fluidized bed of at least one core 12 under inert gas flow
optionally a mixture of at least one dense particle 9 and/or at least one particle 1 on which at least one particle 2 is physically adsorbed;
(b) injecting in the inlet inert gas flow vapor of at least one precursor of the material of the shell 13;
(c) maintaining the precursor injection for a period long enough to form a full monolayer of precursor of the material of the shell 13 at the surface of the core 12;
(d) stopping the feed of the vapor of the precursor of the material of the shell 13 and flush the solid and the line with a flow of inert gas;
(e) injecting in the inlet inert gas flow vapor of water or at least one heteroelement precursor;
(f) maintaining the precursor injection for a period long enough to form a full monolayer of precursor material of the material of the shell 13 at the surface of the core 12;
(g) stopping the feed of the vapor of water or the heteroelement precursor and flush the solid and the line with a flow of inert gas;
(h) Repeat steps (b) to (g) in a sufficient amount of time to obtain resulting heterostructured luminescent particles 1;
(i) flush the solid and the line with a flow of inert gas;
(j) separating and collecting said heterostructured luminescent particles 1.

In one embodiment, the method comprises the following steps:

1. preparing particles 2 comprising at least one nanoparticle 3 dispersed in a second material 21:
(a) preparing a solution A by mixing:
at least one colloidal suspension comprising at least one nanoparticle 3;
at least one precursor of the second material 21;
at least one organic solvent; and
optionally at least one surfactant, additional nanoparticles and/or at least one heteroelement precursor.

(b) preparing an aqueous solution B optionally comprising additional nanoparticles and/or at least one heteroelement precursor;
(c) forming droplets of solution A by a first means for forming droplets;
(d) forming droplets of solution B by a second means for forming droplets;
(e) mixing said droplets;
(f) dispersing the mixed droplets in a gas flow;
(g) heating said dispersed droplets at a temperature sufficient to obtain resulting particles 2;
(h) cooling of said particles 2; and
(i) separating and collecting said particles 2.

2. preparing luminescent particles 1 comprising at least one particle 2 obtained at step (1) and a first material 11 using reverse micellar (or emulsion) method, micellar (or emulsion) method, and/or Stöber method.

wherein the aqueous solution B and/or the aqueous solution D may be acidic or basic solutions.

In one embodiment, the method comprises the following steps:

1. preparing particles 2 comprising at least one nanoparticle 3 dispersed in a second material 21:
(a) preparing a solution A by mixing:
at least one colloidal suspension comprising at least one nanoparticle 3;
at least one precursor of the second material 21; and
optionally at least one organic solvent, at least one aqueous solvent, at least one base or one acid, water, at least one surfactant, additional nanoparticles and/or at least one heteroelement precursor.
(b) forming droplets of solution A by a first means for forming droplets;
(c) dispersing said droplets in a gas flow;
(d) heating said dispersed droplets at a temperature sufficient to obtain resulting particles 2;
(e) cooling of said particles 2; and
(f) separating and collecting said particles 2.

2. preparing luminescent particles 1 comprising at least one particle 2 obtained at step (1) and a first material 11 using reverse micellar (or emulsion) method, micellar (or emulsion) method, and/or Stöber method.

In one embodiment, the method comprises the following steps:

1. preparing particles 2 comprising at least one nanoparticle 3 dispersed in a second material 21:
(a) preparing a solution A by mixing:
at least one colloidal suspension comprising at least one nanoparticle 3;
at least one precursor of the second material 21; at least one organic solvent; and
optionally at least one surfactant, additional nanoparticles and/or at least one heteroelement precursor.
(b) preparing an aqueous solution B optionally comprising additional nanoparticles and/or at least one heteroelement precursor;
(c) forming droplets of solution A by a first means for forming droplets;
(d) forming droplets of solution B by a second means for forming droplets;
(e) mixing said droplets;
(f) dispersing the mixed droplets in a gas flow;
(g) heating said dispersed droplets at a temperature sufficient to obtain resulting particles 2;
(h) cooling of said particles 2; and
(i) separating and collecting said particles 2.

2. preparing luminescent particles 1 comprising at least one particle 2 obtained at step (1) and a first material 11 using reverse micellar (or emulsion) method, micellar (or emulsion) method, and/or Stöber method.

In one embodiment, the method comprises the following steps:

1. preparing particles 2 comprising at least one nanoparticle 3 dispersed in a second material 21:
(a) preparing a solution A by mixing:
at least one colloidal suspension comprising at least one nanoparticle 3;
at least one precursor of the second material 21;
at least one organic solvent; and
optionally at least one surfactant, additional nanoparticles and/or at least one heteroelement precursor.
(b) preparing an aqueous solution B optionally comprising additional nanoparticles and/or at least one heteroelement precursor;
(c) forming droplets of solution A by a first means for forming droplets;
(d) forming droplets of solution B by a second means for forming droplets;
(e) mixing said droplets;
(f) dispersing the mixed droplets in a gas flow;
(g) heating said dispersed droplets at a temperature sufficient to obtain resulting particles 2;
(h) cooling of said particles 2; and
(i) separating and collecting said particles 2.

2. preparing luminescent particles 1 comprising at least one particle 2 obtained at step (1), at least one dense particle 9 and a first material 11 using reverse micellar (or emulsion) method, micellar (or emulsion) method, and/or Stöber method.

In one embodiment, the method comprises the following steps:

1. preparing particles 2 comprising at least one nanoparticle 3 dispersed in a second material 21:
(a) preparing a solution A by mixing:
at least one colloidal suspension comprising at least one nanoparticle 3;
at least one precursor of the second material 21; and
optionally at least one organic solvent, at least one aqueous solvent, at least one base or one acid, water, at least one surfactant, additional nanoparticles and/or at least one heteroelement precursor.
(b) forming droplets of solution A by a first means for forming droplets;
(c) dispersing said droplets in a gas flow;
(d) heating said dispersed droplets at a temperature sufficient to obtain resulting particles 2;
(e) cooling of said particles 2; and
(f) separating and collecting said particles 2.

2. preparing cores 12 comprising at least one particle 2 obtained at step (1) and a first material 11 using reverse micellar (or emulsion) method, micellar (or emulsion) method, and/or Stöber method.

3. preparing luminescent particles 1 comprising a core 12 obtained at step (2) and at least one shell 13 using Fluidized Bed ALD technique:
(a) preparing and sustain a fluidized bed of at least one core 12 under inert gas flow
optionally a mixture of at least one dense particle 9 and/or at least one particle 1 on which at least one particle 2 is physically adsorbed;
(b) injecting in the inlet inert gas flow vapor of at least one precursor of the material of the shell 13;

(c) maintaining the precursor injection for a period long enough to form a full monolayer of precursor of the material of the shell 13 at the surface of the core 12;

(d) stopping the feed of the vapor of the precursor of the material of the shell 13 and flush the solid and the line with a flow of inert gas;

(e) injecting in the inlet inert gas flow vapor of water or at least one heteroelement precursor;

(f) maintaining the precursor injection for a period long enough to form a full monolayer of precursor material of the material of the shell 13 at the surface of the core 12;

(g) stopping the feed of the vapor of water or the heteroelement precursor and flush the solid and the line with a flow of inert gas;

(h) Repeat steps (b) to (g) in a sufficient amount of time to obtain resulting heterostructured luminescent particles 1;

(i) flush the solid and the line with a flow of inert gas;

(j) separating and collecting said heterostructured luminescent particles 1.

The luminescent particle 1, the at least one nanoparticle 2, the at least one nanoparticle 3, the dense particle 9, the first material 11, the second material 21 are as described herein.

According to one embodiment, the method of the invention further comprises a step of preparing particles 1 comprising at least one particle 2 dispersed in a first material 11, wherein said step involves reverse micellar (or emulsion) method.

According to one embodiment, step (2) of preparing particles 1, comprising at least one particle 2 dispersed in a first material 11, involves reverse micellar (or emulsion) method.

According to one embodiment, the method of the invention further comprises a step of preparing particles 2 comprising at least one nanoparticle 3 dispersed in a second material 21, wherein said step involves reverse micellar (or emulsion) method.

According to one embodiment, step (1) of preparing particles 2, comprising at least one nanoparticle 3 dispersed in a second material 21, involves reverse micellar (or emulsion) method.

According to one embodiment, the method of the invention may comprise steps involving methods such as for example reverse micellar (or emulsion) method, micellar (or emulsion) method, Stöber method.

Herein, reverse micellar (or emulsion) method may refer to inverse micellar (or emulsion) method, reverse micellar (or microemulsion) method, inverse micellar (or microemulsion) method, and/or inverse microemulsion micelles method.

According to one embodiment, the step of preparing particles 2 using reverse micellar (or emulsion) method comprises:

adding an aqueous suspension of nanoparticles 3 in a solution comprising at least one organic solvent and at least one surfactant;

optionally adding at least one base, and/or at least one acid;

adding to the previously obtained solution a solution comprising at least one precursor of the second material 21 to form a microemulsion, said solution may comprise at least one base, and/or at least one acid, said solution can be added in several times;

hydrolyzing the obtained microemulsion; and separating and collecting particles 2.

According to one embodiment, the step of preparing particles 1 using reverse micellar (or emulsion) method comprises:

adding an aqueous suspension of particles 2 in a solution comprising at least one organic solvent and at least one surfactant;

optionally adding at least one base, and/or at least one acid;

adding to the previously obtained solution a solution comprising at least one precursor of the first material 11 to form a microemulsion, said solution may comprise at least one base, and/or at least one acid, said solution can be added in several times;

hydrolyzing the obtained microemulsion; and separating and collecting particles 1.

According to one embodiment, the method of the invention does not comprise ALD steps (Atomic Layer Deposition), especially to encapsulate the at least one particle 2 in a luminescent particle 1.

According to one embodiment, the at least one precursor of the first material 11 and/or the at least one precursor of the second material 21 may be hydrolyzed prior to step (1-a) and/or (2-a) respectively in at acidic pH.

According to one embodiment, the at least one precursor of the first material 11 and/or the at least one precursor of the second material 21 may be hydrolyzed prior to step (1-a) and/or (2-a) respectively in at basic pH.

According to one embodiment, the at least one colloidal suspension comprising a plurality of nanoparticles 3 may be transferred in an acidic aqueous solution prior to step (1-a) and/or step (2-a).

According to one embodiment, the at least one colloidal suspension comprising a plurality of nanoparticles 3 may be transferred in a basic aqueous solution prior to step (1-a) and/or step (2-a).

In one embodiment, water, at least one acid, at least one base, at least one organic solvent, at least one aqueous solvent, or at least one surfactant is added in step (1-a), in step (1-b), in step (2-a) and/or in step (2-b).

According to one embodiment, at least one solution comprising additional nanoparticles selected in the group of $Al_2O_3$, $SiO_2$, MgO, ZnO, $ZrO_2$, $IrO_2$, $SnO_2$, $TiO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, $Y_2O_3$, or a mixture thereof is added to solution A, solution B, solution C and/or solution D. In this embodiment, $Al_2O_3$, $SiO_2$, MgO, ZnO, $ZrO_2$, $TiO_2$, $IrO_2$, $SnO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, or $Y_2O_3$ additional nanoparticles can drain away the heat if it is a good thermal conductor.

According to one embodiment, solution A and solution B are miscible.

According to one embodiment, solution A and solution B are not miscible.

According to one embodiment, solution A and solution B are immiscible.

According to one embodiment, solution C and solution D are miscible.

According to one embodiment, solution C and solution D are not miscible.

According to one embodiment, solution C and solution D are immiscible.

In one embodiment, the droplets of solution B are replaced by vapors of solution B. In this embodiment, said means for forming droplets do not form droplets but uses the vapors of the solution comprised in a container.

In one embodiment, the droplets of solution D are replaced by vapors of solution D. In this embodiment, said means for forming droplets do not form droplets but uses the vapors of the solution comprised in a container.

In one embodiment, the droplets of solution A are replaced by vapors of solution A. In this embodiment, said means for forming droplets do not form droplets but uses the vapors of the solution comprised in a container.

In one embodiment, the droplets of solution C are replaced by vapors of solution C. In this embodiment, said means for forming droplets do not form droplets but uses the vapors of the solution comprised in a container.

According to one embodiment, vapors of a solution are obtained by heating said solution with an external heating system.

According to one embodiment, examples for the solution capable of producing reactive vapors include but are not limited to water, a volatile acid such as for example HCl or $HNO_3$, a base such as for example ammonia, ammonium hydroxide, or tetramethylammonium hydroxide, or a metal alkoxide such as for example an alkoxide of silicon or aluminium such as for example tetramethyl orthosilicate or tetraethyl orthosilicate.

According to one embodiment, the droplets of solution A are replaced by a gas such as for example air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the droplets of solution C are replaced by a gas such as for example air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the droplets of solution B are replaced by a gas such as for example air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the droplets of solution D are replaced by a gas such as for example air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, at least one solution capable of producing reactive vapors is added.

According to one embodiment, the reactive vapors react with at least one precursor comprised in solution A or solution B.

According to one embodiment, the reactive vapors react with at least one precursor comprised in solution C or solution D.

According to one embodiment, at least one solution capable of releasing gas is added.

According to one embodiment, examples for the released gas include but are not limited to air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the released gas reacts with at least one precursor comprised in solution A or solution B.

According to one embodiment, the released gas reacts with at least one precursor comprised in solution C or solution D.

According to one embodiment, the means for forming droplets and a container comprising a solution capable of producing reactive vapors or a solution capable of releasing gas are working in series.

According to one embodiment, the means for forming droplets and a container comprising a solution capable of producing reactive vapors or a solution capable of releasing gas are working in parallel.

According to one embodiment, the aqueous solution comprises at least one aqueous solvent.

According to one embodiment, the organic solvent includes but is not limited to: pentane, hexane, heptane, 1,2-hexanediol, 1,5-pentanediol, octane, decane, dodecane, toluene, tetrahydrofuran, chloroform, acetone, acetic acid, n-methylformamide, n,n-dimethylformamide, dimethylsulfoxide, octadecene, squalene, amines such as for example tri-n-octylamine, 1,3-diaminopropane, oleylamine, hexadecylamine, octadecylamine, squalene, alcohols such as for example ethanol, methanol, isopropanol, 1-butanol, 1-hexanol, 1-decanol, propane-2-ol, ethanediol, 1,2-propanediol, alkoxy alcohol, alkyl alcohol, alkyl benzene, alkyl benzoate, alkyl naphthalene, amyl octanoate, anisole, aryl alcohol, benzyl alcohol, butyl benzene, butyrophenon, cis-decalin, dipropylene glycol methyl ether, dodecyl benzene, mesitylene, methoxy propanol, methylbenzoate, methyl naphthalene, methyl pyrrolidinone, phenoxy ethanol, 1,3-propanediol, pyrrolidinone, trans-decalin, valerophenone, or a mixture thereof.

According to one embodiment, the at least one precursor of the first material 11 and/or the second material 21 comprises said element and is capable of liberating said element in solution.

According to one embodiment, the at least one precursor of the first material 11 and/or the second material 21 is an alkoxide precursor of formula $XM_a(OR)_b$, wherein:

- M is said element;
- R is a linear alkyl chain comprising a range of 1 to 25 carbon atoms, R includes but is not limited to: methyl, ethyl, isopropyl, n-butyl, or octyl;
- X is optional and is a linear alkyl chain that can comprise an alcohol group, a thiol group, an amino group, or a carboxylic group, comprising a range of 1 to 25 carbon atoms; and
- a and b are independently a decimal number from 0 to 5.

According to one embodiment, the alkoxide precursor of formula $XM_a(OR)_b$ includes but is not limited to: tetramethyl orthosilicate, tetraethyl orthosilicate, polydiethyoxysilane, n-alkyltrimethoxylsilanes such as for example n-butyltrimethoxysilane, n-octyltrimethoxylsilane, n-dodecyltrimethoxysilane, n-octadecyltrimethoxysilane, 3-mercaptopropyltrimethoxysilane, 11-mercaptoundecyltrimethoxysilane, 3-aminopropyltrimethoxysilane, 11-aminoundecyltrimethoxysilane, 3-(2-(2-aminoethylamino)ethylamino)propyltrimethoxysilane, 3-(trimethoxysilyl)propyl methacrylate, 3-(aminopropyl)trimethoxysilane, aluminium tri-sec butoxide, aluminium isopropxide, aluminium ethoxide, aluminium tert-butoxide, titanium butoxide, isopropxide, aluminium ethoxide, aluminium tert-butoxide, or a mixture thereof.

According to one embodiment, the at least one precursor of the first material 11 and/or the second material 21 is an inorganic halide precursor.

According to one embodiment, the halide precursor includes but is not limited to: halide silicates such as for example ammonium fluorosilicate, sodium fluorosilicate, or a mixture thereof.

According to one embodiment, the at least one precursor of the first material 11 and/or the second material 21 is a pure solid precursor.

According to one embodiment, the pure solid precursor includes but is not limited to: pure solid silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, or a mixture thereof.

According to one embodiment, the at least one precursor of the first material 11 and/or the second material 21 is an inorganic oxide precursor.

According to one embodiment, the at least one precursor of the first material 11 and/or the second material 21 is an inorganic hydroxide precursor.

According to one embodiment, the at least one precursor of the first material 11 and/or the second material 21 is an inorganic salt.

According to one embodiment, the at least one precursor of the first material 11 and/or the second material 21 is an inorganic complex.

According to one embodiment, the at least one precursor of the first material 11 and/or the second material 21 is an inorganic cluster.

According to one embodiment, the at least one precursor of the first material 11 and/or the second material 21 is an organometallic compound $M_a(Y_cR_b)_d$, wherein:

- M is said element;
- Y is an halogenide, or a amide;
- R is an alkyl chain or alkenyl chain or alkinyl chain comprising a range of 1 to 25 carbon atoms, R includes but is not limited to: methyl, ethyl, isopropyl, n-butyl, or octyl;
- a, b, c and d are independently a decimal number from 0 to 5.

According to one embodiment, examples of the organometallic compound $Ma(Y_cR_b)_d$ include but are not limited to: Grignard reagents; metallocenes; metal amidinates; metal alkyl halides; metal alkyls such as for example dimethylzinc, diethylzinc, dimethylcadmium, diethylcadmium, dimethylindium or diethylindium; metal and metalloid amides such as $Al[N(SiMe_3)_2]_3$, $Cd[N(SiMe_3)_2]_2$, $Hf[NMe_2]_4$, $In[N(SiMe_3)_2]_3$, $Sn(NMe_2)_2$, $Sn[N(SiMe_3)_2]_2$, $Zn[N(SiMe_3)_2]_2$ or $Zn[(NiBu_2)_2]_2$, dineopentylcadmium, zinc diethylthiocarbamate, bis(3-diethylaminopropyl)cadmium, (2,2'-bipyridine)dimethylcadmium, cadmium ethylxanthate; trimethyl aluminium, triisobutylaluminum, trioctylaluminum, triphenylaluminum, dimethyl aluminium, trimethyl zinc, dimethyl zinc, diethylzinc, $Zn[N(TMS)_2]_2$, $Zn[CF_3SO_2)_2N]_2$, $Zn(Ph)_2$, $Zn(C_6F_5)_2$, $Zn(TMHD)_2$ (β-diketonate), $Hf[C_5H_4(CH_3)]_2(CH_3)_2$, $HfCH_3(OCH_3)[C_5H_4(CH_3)]_2$, $[[(CH_3)_3Si]_2N]_2HfCl_2$, $(C_5H_5)_2Hf(CH_3)_2$, $[(CH_2CH_3)_2N]_4Hf$, $[CH_3)_2N]_4Hf$, $[(CH_3)_2N]_4Hf$, $[(CH_3)(C_2H_5)N]_4Hf$, $[(CH_3)(C_2H_5)N]_4Hf$, 2,2',6,6'-tetramethyl-3,5-heptanedione zirconium ($Zr(THD)_4$), $C_{10}H_{12}Zr$, $Zr(CH_3C_5H_4)_2CH_3$ $OCH_3$, $C_{22}H_{36}Zr$, $[(C_2H_5)_2N]_4Zr$, $[(CH_3)_2N]_4Zr$, $[(CH_3)_2N]_4Zr$, $Zr(NCH_3C_2H_5)_4$, $Zr(NCH_3C_2H_5)_4$, $C_{18}H_{32}O_6Zr$, $Zr(C_8H_{15}O_2)_4$, $Zr(OCC(CH_3)_3CHCOC(CH_3)_3)_4$, $Mg(C_5H_5)_2$, $C_{20}H_{30}Mg$; or a mixture thereof.

According to one embodiment, the at least one precursor of the first material 11 and/or the second material 21 includes but is not limited to: carboxylates, carbonates, thiolates, alkoxides, oxides, phosphates, sulfates, nitrates, acetates, chlorides, bromides, acetylacetonate or a mixture thereof.

According to one embodiment, the at least one precursor of cadmium includes but is not limited to: cadmium carboxylates $Cd(R—COO)_2$, wherein R is a linear alkyl chain comprising a range of 1 to 25 carbon atoms; cadmium oxide CdO; cadmium sulfate $Cd(SO_4)$; cadmium nitrate $Cd(NO_3)_2.4H_2O$; cadmium acetate $(CH_3COO)_2Cd.2H_2O$; cadmium chloride $CdCl_2.2.5H_2O$; dimethylcadmium; dineopentylcadmium; bis(3-diethylaminopropyl)cadmium; (2,2'-bipyridine)dimethylcadmium; cadmium ethylxanthate; cysteine or a mixture thereof.

According to one embodiment, the at least one precursor of selenium includes but is not limited to: solid selenium; tri-n-alkylphosphine selenide such as for example tri-n-butylphosphine selenide or tri-n-octylphosphine selenide; selenium oxide $SeO_2$; hydrogen selenide $H_2Se$; diethylselenide; methylallylselenide; salts such as for example magnesium selenide, calcium selenide, sodium selenide, potassium selenide; or a mixture thereof.

According to one embodiment, the at least one precursor of zinc includes but is not limited to: zinc carboxylates $Zn(R—COO)_2$, wherein R is a linear alkyl chain comprising a range of 1 to 25 carbon atoms; zinc oxide ZnO; zinc sulfate $Zn(SO_4),xH_2O$ where x is from 1 to 7; zinc nitrate $Zn(NO_3)_2,xH_2O$ where x is from 1 to 4; zinc acetate $(CH_3COO)_2Zn.2H_2O$; zinc chloride $ZnCl_2$; diethylzinc ($Et_2Zn$); chloro(ethoxycarbonylmethyl)zinc; or a mixture thereof.

According to one embodiment, the at least one precursor of sulfur includes but is not limited to: solid sulfur; sulfur oxides; tri-n-alkylphosphine sulfide such as for example tri-n-butylphosphine sulfide or tri-n-octylphosphine sulfide; hydrogen sulfide $H_2S$; thiols such as for example n-butanethiol, n-octanethiol or n-dodecanethiol; diethylsulfide; methylallylsulfide; salts such as for example magnesium sulfide, calcium sulfide, sodium sulfide, potassium sulfide; or a mixture thereof.

According to one embodiment, the at least one precursor of phosphorus includes but is not limited to: solid phosphorus; phosphine; tri-n-alkylphosphine sulfide such as for example tri-n-butylphosphine sulfide or tri-n-octylphosphine sulfide; tri-n-alkylphosphine selenide such as for example tri-n-butylphosphine selenide or tri-n-octylphosphine selenide; or a mixture thereof.

According to one embodiment, molecular oxygen and/or molecular water are removed from the aqueous solvent prior to steps (1-a) and (2-a).

According to one embodiment, molecular oxygen and/or molecular water are removed from the organic solvent prior to steps (1-a) and (2-a).

According to one embodiment, methods to remove molecular oxygen and/or molecular water known to those of skill in the art may be used to remove molecular oxygen and/or molecular water from solvents, such as for example distilling or degassing said solvent.

According to one embodiment, the neutral aqueous solution has a pH of 7.

According to one embodiment, the neutral pH is 7.

According to one embodiment, the basic aqueous solution has a pH higher than 7.

According to one embodiment, the basic pH is higher than 7.

According to one embodiment, the basic aqueous solution has a pH of at least 7.1, 7.2, 7.3, 7.4, 7.5, 7.6, 7.7, 7.8, 7.9, 8, 8.1, 8.2, 8.3, 8.4, 8.5, 8.6, 8.7, 8.8, 8.9, 9, 9.1, 9.2, 9.3, 9.4, 9.5, 9.6, 9.7, 9.8, 9.9, 10, 10.1, 10.2, 10.3, 10.4, 10.5, 10.6, 10.7, 10.8, 10.9, 11, 11.1, 11.2, 11.3, 11.4, 11.5, 11.6, 11.7, 11.8, 11.9, 12, 12.1, 12.2, 12.3, 12.4, 12.5, 12.6, 12.7, 12.8, 12.9, 13, 13.1, 13.2, 13.3, 13.4, 13.5, 13.6, 13.7, 13.8, 13.9, or 14.

According to one embodiment, the basic pH is at least 7.1, 7.2, 7.3, 7.4, 7.5, 7.6, 7.7, 7.8, 7.9, 8, 8.1, 8.2, 8.3, 8.4, 8.5, 8.6, 8.7, 8.8, 8.9, 9, 9.1, 9.2, 9.3, 9.4, 9.5, 9.6, 9.7, 9.8, 9.9, 10, 10.1, 10.2, 10.3, 10.4, 10.5, 10.6, 10.7, 10.8, 10.9, 11, 11.1, 11.2, 11.3, 11.4, 11.5, 11.6, 11.7, 11.8, 11.9, 12, 12.1, 12.2, 12.3, 12.4, 12.5, 12.6, 12.7, 12.8, 12.9, 13, 13.1, 13.2, 13.3, 13.4, 13.5, 13.6, 13.7, 13.8, 13.9, or 14.

According to one embodiment, the base includes but is not limited to: sodium hydroxide, potassium hydroxide, ammonium hydroxide, sodium tetraborate decahydrated, sodium ethoxide, lithium hydroxide, rubidium hydroxide, cesium hydroxide, magnesium hydroxide, calcium hydroxide, strontium hydroxide, barium hydroxide, imidazole, methylamine, potassium tert-butoxide, ammonium pyridine, a tetra-alkylammonium hydroxide such as for example tetramethylammonium hydroxide, tetraethylammonium hydroxide, tetrapropylammonium hydroxide and tetrabutylammonium hydroxide, or a mixture thereof.

According to one embodiment, the acidic aqueous solution has a pH lower than 7.

According to one embodiment, the acidic pH is lower than 7.

According to one embodiment, the acidic aqueous solution has a pH of at least 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, 4, 4.1, 4.2, 4.3, 4.4, 4.5, 4.6, 4.7, 4.8, 4.9, 5, 5.1, 5.2, 5.3, 5.4, 5.5, 5.6, 5.7, 5.8, 5.9, 6, 6.1, 6.2, 6.3, 6.4, 6.5, 6.6, 6.7, 6.8, or 6.9.

According to one embodiment, the acidic pH is at least 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, 4, 4.1, 4.2, 4.3, 4.4, 4.5, 4.6, 4.7, 4.8, 4.9, 5, 5.1, 5.2, 5.3, 5.4, 5.5, 5.6, 5.7, 5.8, 5.9, 6, 6.1, 6.2, 6.3, 6.4, 6.5, 6.6, 6.7, 6.8, or 6.9.

According to one embodiment, the acid includes but is not limited to: acetic acid, hydrochloric acid, hydrobromic acid, hydroiodic acid, hydrofluoric acid, sulfuric acid, nitric acid, boric acid, oxalic acid, maleic acid, lipoic acid, urocanic acid, 3-mercaptopropionic acid, phosphonic acid such as for example butylphosphonic acid, octylphosphonic acid and dodecylphosphonic acid, or a mixture thereof.

According to one embodiment, the nanoparticles 3 may be aligned under a magnetic field or an electrical field prior or during the method of the invention. In this embodiment, the nanoparticles 3 can act as magnets if said nanoparticles are ferromagnetic; or the resulting luminescent particles 1 can emit a polarized light if the nanoparticles 3 are luminescent.

According to one embodiment, the optional hydrolysis is controlled to the extent that the quantity of water present in the reaction medium is solely due to the addition of water which is introduced voluntarily.

According to one embodiment, the optional hydrolysis is partial or complete.

According to one embodiment, the optional hydrolysis is performed in a humid atmosphere.

According to one embodiment, the optional hydrolysis is performed in an anhydrous atmosphere. In this embodiment, the atmosphere of optional hydrolysis comprises no humidity.

According to one embodiment, the temperature of optional hydrolysis is at least −50° C., −40° C., −30° C., −20° C., −10° C., 0° C., 10° C., 20° C., 30° C., 40° C., 50° C., 60° C., 70° C., 80° C., 90° C., 100° C., 110° C., 120° C., 130° C., 140° C., 150° C., 160° C., 170° C., 180° C., 190° C., or 200° C.

According to one embodiment, the time of optional hydrolysis is at least 1 sec, 2 sec, 3 sec, 4 sec, 5 sec, 6 sec, 7 sec, 8 sec, 9 sec, 10 sec, 15 sec, 20 sec, 25 sec, 30 sec, 35 sec, 40 sec, 45 sec, 50 sec, 55 sec, 60 sec, 1.5 min, 2 min, 2.5 min, 3 min, 3.5 min, 4 min, 4.5 min, 5 min, 5.5 min, 6 min, 6.5 min, 7 min, 7.5 min, 8 min, 8.5 min, 9 min, 9.5 min, 10 min, 11 min, 12 min, 13 min, 14 min, 15 min, 16 min, 17 min, 18 min, 19 min, 20 min, 21 min, 22 min, 23 min, 24 min, 25 min, 26 min, 27 min, 28 min, 29 min, 30 min, 31 min, 32 min, 33 min, 34 min, 35 min, 36 min, 37 min, 38 min, 39 min, 40 min, 41 min, 42 min, 43 min, 44 min, 45 min, 46 min, 47 min, 48 min, 49 min, 50 min, 51 min, 52 min, 53 min, 54 min, 55 min, 56 min, 57 min, 58 min, 59 min, 1 h, 6 h, 12 h, 18 h, 24 h, 30 h, 36 h, 42 h, 48 h, 54 h, 60 h, 66 h, 72 h, 78 h, 84 h, 90 h, 96 h, 102 h, 108 h, 114 h, 120 h, 126 h, 132 h, 138 h, 144 h, 150 h, 156 h, 162 h, 168 h, 8 days, 9 days, 10 days, 11 days, 12 days, 13 days, 14 days, 15 days, 16 days, 17 days, 18 days, 19 days, 20 days, 21 days, 22 days, 23 days, 24 days, 25 days, 26 days, 27 days, 28 days, 29 days, or 30 days.

According to one embodiment, the at least one nanoparticle 3 and/or the particle 2 are suspended in an organic solvent, wherein said organic solvent includes but is not limited to: hexane, heptane, pentane, octane, decane, dodecane, cyclohexane, toluene, tetrahydrofuran, chloroform, acetone, acetic acid, n-methylformamide, n,n-dimethylformamide, dimethylsulfoxide, octadecene, squalene, amines such as for example tri-n-octylamine, 1,3-diaminopropane, oleylamine, hexadecylamine, octadecylamine, squalene, alcohols such as for example ethanol, methanol, isopropanol, 1-butanol, 1-hexanol, 1-decanol, propane-2-ol, ethanediol, 1,2-propanediol or a mixture thereof.

According to one embodiment, the at least one nanoparticle 3 and/or the particle 2 are suspended in water.

According to one embodiment, the ligands at the surface of the at least one nanoparticle 3 and/or the particle 2 are C3 to C20 alkanethiol ligands such as for example propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, or a mixture thereof. In this embodiment, C3 to C20 alkanethiol ligands help control the hydrophobicity of the nanoparticles surface.

According to one embodiment, the at least one nanoparticle 3 and/or the particle 2 are transferred in an aqueous solution by exchanging the ligands at the surface of the at least one nanoparticle 3 and/or the particle 2. In this embodiment, the exchanging ligands include but are not limited to: 2-mercaptoacetic acid, 3-mercaptopropionic acid, 12-mercaptododecanoic acid, 2-mercaptoehtyltrimethoxysilane, 3-mercaptopropyltrimethoxysilane, 12-mercaptododecyltrimethoxysilane, 11-mercaptol-undecanol, 16-hydroxyhexadecanoic acid, ricinoleic acid, cysteamine, or a mixture thereof.

According to one embodiment, the ligands at the surface of the at least one nanoparticle 3 and/or the particle 2 are exchanged with at least one exchanging ligand comprising at least one atom of Si, Al, Ti, B, P, Ge, As, Fe, T, Z, Ni, Zn, Ca, Na, K, Mg, Pb, Ag, V, P, Te, Mn, Ir, Sc, Nb, or Sn. In this embodiment, the at least one exchanging ligand comprises at least one atom of at least one precursor of the first material 11 and/or second material 21 allowing the at least one nanoparticle 3 and/or the particle 2 to be uniformly dispersed in the particles 2 and/or luminescent particles 1. In the case of at least one exchanging ligand comprising at least one atom of Si, the surface of the at least one nanoparticle 3 can be silanized before mixing step with the precursor solution.

According to one embodiment, at least one exchanging ligand comprising at least one atom of Si, Al, Ti, B, P, Ge, As, Fe, T, Z, Ni, Zn, Ca, Na, K, Mg, Pb, Ag, V, P, Te, Mn, Ir, Sc, Nb, or Sn. includes but is not limited to: mercapto-functional silanes such as for example 2-mercaptoethyltrimethoxysilane, 3-mercaptopropyltrimethoxysilane, 12-mercaptododecyltrimethoxysilane; 2-aminooehtyltrimethoxysilane; 3-aminopropyltrimethoxysilane, 12-aminododecyltrimethoxysilane; or a mixture thereof.

According to one embodiment, the ligands at the surface of the at least one nanoparticle 3 and/or the particle 2 are partially exchanged with at least one exchanging ligand comprising at least one atom of Si, Al, Ti, B, P, Ge, As, Fe, T, Z, Ni, Zn, Ca, Na, K, Mg, Pb, Ag, V, P, Te, Mn, Ir, Sc, Nb, or Sn. In this embodiment, the at least one exchanging ligand comprising at least one atom of Si, Al, Ti, B, P, Ge, As, Fe, T, Z, Ni, Zn, Ca, Na, K, Mg, Pb, Ag, V, P, Te, Mn, Ir, Sc, Nb, or Sn includes but is not limited to: n-alkyltrimethoxylsilanes such as for example n-butyltrimethoxysilane, n-octyltrimethoxylsilane, n-dodecyltrimethoxysilane, n-octadecyltrimethoxysilane; 2-aminooehtyltrimethoxysilane; 3-aminopropyltrimethoxysilane; 12-aminododecyltrimethoxysilane.

According to one embodiment, at least one ligand comprising at least one atom of silicon, aluminium or titanium is added to the at least one colloidal suspension comprising at least one nanoparticle 3 and/or the particle 2. In this embodiment, the at least one ligand comprising at least one atom of silicon, aluminium or titanium includes but is not limited to: n-alkyltrimethoxylsilanes such as for example n-butyltrimethoxysilane, n-octyltrimethoxylsilane, n-dodecyltrimethoxysilane, n-octadecyltrimethoxysilane; 2-aminooehtyltrimethoxysilane; 3-aminopropyltrimethoxysilane; 12-aminododecyltrimethoxysilane. In this embodiment, the ligands at the surface of the at least one nanoparticle 3 and/or the particle 2 and the at least one ligand comprising at least one atom of silicon, aluminium or titanium are interdigitated at the surface of the at least one nanoparticle 3 and/or the particle 2, allowing the at least one nanoparticle 3 and/or the particle 2 to be uniformly dispersed in the particles 2 and/or luminescent particles 1.

According to one embodiment, the ligands at the surface of the at least one nanoparticle 3 and/or the particle 2 are exchanged with at least one exchanging ligand which is a copolymer, block copolymer and/or a multidendate ligand.

In one embodiment of the invention, said at least one exchanging ligand which is a copolymer comprises at least 2 monomers, said monomers being:

- one anchoring monomer comprising a first moiety $M_A$ having affinity for the surface of the nanoparticle 3 and/or the particle 2, and
- one hydrophilic monomer comprising a second moiety $M_B$ having a high water solubility.

In one embodiment of the invention, said at least one exchanging ligand which is a copolymer has the following formula I:

$$(A)x(B)y$$

wherein

A comprising at least one anchoring monomer comprising a first moiety $M_A$ having affinity for the surface of the nanoparticle 3 and/or the particle 2 as described here above, B comprising at least one hydrophilic monomer comprising a second moiety $M_B$ having a high water solubility, and each of x and y is independently a positive integer, preferably an integer ranging from 1 to 499, from 1 to 249, from 1 to 99, or from 1 to 24.

In one embodiment of the invention, the at least one exchanging ligand which is a copolymer has the following formula II:

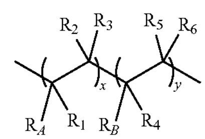

wherein $R_A$ represents a group comprising the first moiety $M_A$ having affinity for the surface of the nanoparticle 3 and/or the particle 2 as described here above, $R_B$ represents a group comprising the second moiety $M_B$ having a high water solubility, $R_1$, $R_2$, $R_3$, $R_4$, $R_5$, $R_6$ can be independently H, or a group selected from an alkyl, alkenyl, aryl, hydroxyle, halogen, alkoxy, carboxylate, each of x and y is independently a positive integer, preferably an integer ranging from 1 to 499.

In another embodiment of the invention, the at least one exchanging ligand which is a copolymer comprising at least 2 monomers has the following formula II':

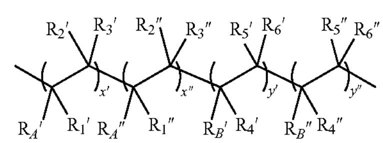

wherein $R_A'$ and $R_A''$ represent respectively a group comprising the first moiety $M_A'$ and $M_A''$ having affinity for the surface of the nanoparticle 3 and/or the particle 2, $R_B'$ and $R_B''$ represent respectively a group comprising the second moiety $M_B'$ and $M_B''$ having a high water solubility, $R_1'$, $R_2'$, $R_3'$, $R_1''$, $R_2''$, $R_3''$, $R_4'$, $R_5'$, $R_6'$, $R_4''$, $R_5''$, $R_6''$ can be independently H, or a group selected from an alkyl, alkenyl, aryl, hydroxyle, halogen, alkoxy, carboxylate, each of x' and x'' is independently a positive integer, preferably an integer ranging from 0 to 499, with the condition that at least one of x' and x'' is not 0, each of y' and y'' is independently a positive integer, preferably an integer ranging from 0 to 499, with the condition that at least one of y' and y'' is not 0.

In one embodiment of the invention, said at least one exchanging ligand which is a copolymer is synthesized from at least 2 monomers, said monomers being:

- one anchoring monomer wherein $M_A$ is a dithiol group,
- one hydrophilic monomer wherein $M_B$ is a sulfobetaine group.

In another embodiment of the invention, said at least one exchanging ligand which is a copolymer is synthesized from at least 3 monomers, said monomers being:

one anchoring monomer as defined here above, one hydrophilic monomer as defined here above, and one functionalizable monomer comprising a reactive function $M_c$.

In one embodiment of the invention, said at least one exchanging ligand which is a copolymer has the following formula III:

$$(A)_x(B)_y(C)_z$$

wherein

A comprises at least one anchoring monomer comprising a first moiety $M_A$ having affinity for the surface of a nanocrystal as described here above, B comprises at least one hydrophilic monomer comprising a second moiety $M_B$ having a high water solubility, C comprises at least one functionalizable monomer comprising a third moiety $M_C$ having a reactive function, and each of x, y and z is independently a positive integer, preferably an integer ranging from 1 to 498.

In said embodiment, the at least one exchanging ligand which is a copolymer has the following formula IV:

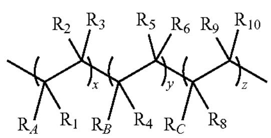

wherein $R_A$, $R_B$, $R_1$, $R_2$, $R_3$, $R_4$, $R_5$ and $R_6$ are defined here above, $R_C$ represents a group comprising the third moiety $M_C$, and $R_8$, $R_9$ and $R_{10}$ can be independently H, or a group selected from an alkyl, alkenyl, aryl, hydroxyl, halogen, alcoxy, carboxylate, each of x, y and z is independently a positive integer, preferably an integer ranging from 1 to 498.

In another embodiment of the invention, said at least one exchanging ligand which is a copolymer comprising at least 2 monomers has the following formula IV':

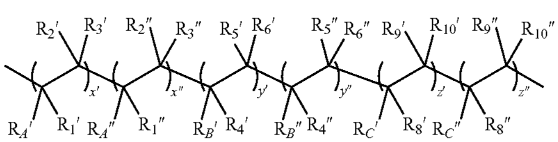

wherein $R_A'$, $R_A''$, $R_B'$, $R_B''$, $R_1'$, $R_2'$, $R_3'$, $R_1''$, $R_2''$, $R_3''$, $R_4'$, $R_5'$, $R_6'$, $R_4''$, $R_5''$, and $R_6''$ are defined here above, $R_C'$ and $R_C''$ represent respectively a group comprising the third moiety $M_C'$ and $M_C''$, and $R_8'$, $R_9'$, $R_{10}'$, $R_8''$, $R_9''$, and $R_{10}''$ can be independently H, or a group selected from an alkyl, alkenyl, aryl, hydroxyl, halogen, alcoxy, carboxylate, each of x' and x" is independently a positive integer, preferably an integer ranging from 0 to 499, with the condition that at least one of x' and x" is not 0, each of y' and y" is independently a positive integer, preferably an integer ranging from 0 to 499, with the condition that at least one of y' and y" is not 0, each of z' and z" is independently a positive integer, preferably an integer ranging from 0 to 499, with the condition that at least one of z' and z" is not 0.

According to one embodiment, the at least one exchanging ligand which is a copolymer is obtained from at least 2 monomers, said monomers being:

one anchoring monomer $M_A$ having a side-chain comprising a first moiety $M_A$ having affinity for the surface of the nanoparticle 3 and/or the particle 2; and one hydrophilic monomer $M_B$ having a side-chain comprising a second moiety $M_B$ being hydrophilic;

and wherein one end of copolymer is H and the other end comprises a functional group or a bioactive group.

According to one embodiment, the at least one exchanging ligand which is a copolymer is of general formula (V):

H—P[(A)x-co-(B)y]n-L—R wherein

A represents an anchoring monomer having a side-chain comprising a first moiety $M_A$ having affinity for the surface of the nanoparticle 3 and/or the particle 2;

B represents a hydrophilic monomer having a side-chain comprising a second moiety $M_B$ being hydrophilic;

n represents a positive integer, preferably an integer ranging from 1 to 1000, preferably from 1 to 499, from 1 to 249 or from 1 to 99;

x and y represent each independently a percentage of n, wherein x and y are different from 0% of n and different from 100% of n, preferably ranging from more than 0% to less than 100% of n, preferably from more than 0% to 80% of n, from more than 0% to 50% of n;

wherein x+y is equal to 100% of n;

R represents:

a functional group selected from the group comprising —$NH_2$, —COOH, —OH, —SH, —CHO, ketone, halide; activated ester such as for example N—hydroxysuccinimide ester, N-hydroxyglutarimide ester or maleimide ester; activated carboxylic acid such as for example acid anhydride or acid halide; isothiocyanate; isocyanate; alkyne; azide; glutaric anhydride, succinic anhydride, maleic anhydride; hydrazide; chloroformate, maleimide, alkene, silane, hydrazone, oxime and furan; and a bioactive group selected from the group comprising avidin or streptavidin; antibody such as a monoclonal antibody or a single chain antibody; sugars; a protein or peptide sequence having a specific binding affinity for an affinity target, such as for example an avimer or an affibody (the affinity target may be for example a protein, a nucleic acid, a peptide, a metabolite or a small molecule), antigens, steroids, vitamins, drugs, haptens, metabolites, toxins, environmental pollutants, amino acids, peptides, proteins, aptamers, nucleic acids, nucleotides, peptide nucleic acid (PNA), folates, carbohydrates, lipids, phospholipid, lipoprotein, lipopolysaccharide, liposome hormone, polysaccharide, polymers, polyhistidine tags, fluorophores; and L represents a bound or a spacer selected from the group comprising alkylene, alkenylene, arylene or arylalkyl linking groups having 1 to 50 chain atoms, wherein the linking group can be optionally interrupted or terminated by —O—, —S—, —$NR_7$—, wherein $R_7$ is H or alkyl, —CO—, —NHCO—, —CONH— or a combination thereof; or a spacer selected from the group comprising DNA, RNA, peptide nucleic acid (PNA), polysaccharide, peptide.

In a specific embodiment, the at least one exchanging ligand which is a copolymer is of formula (V-a):

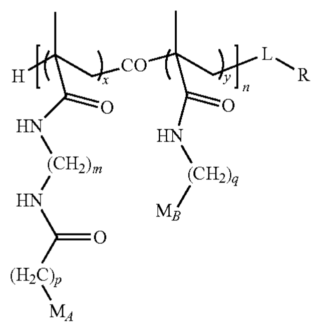

wherein n, x, y, L, R, $M_A$ and $M_B$ are as defined above;

wherein q is an integer ranging from 1 to 20, preferably from 1 to 10, preferably from 1 to 5, preferably 2, 3, 4, m is an integer ranging from 1 to 20, preferably from 1 to 10, preferably from 1 to 5, preferably 2, 3, 4 and p is an integer ranging from 1 to 20, preferably from 1 to 10, preferably from 1 to 6, preferably 3, 4, 5.

In a specific embodiment, the at least one exchanging ligand which is a copolymer is of formula (V-b):

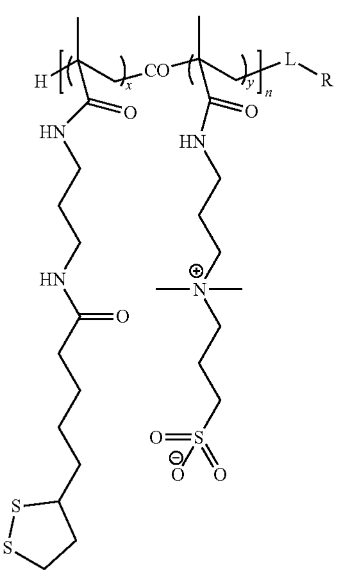

wherein n, x, y, L and R are as defined in formula (V) above; or a reduced form thereof.

In another specific embodiment, the at least one exchanging ligand which is a copolymer is of formula (V-c):

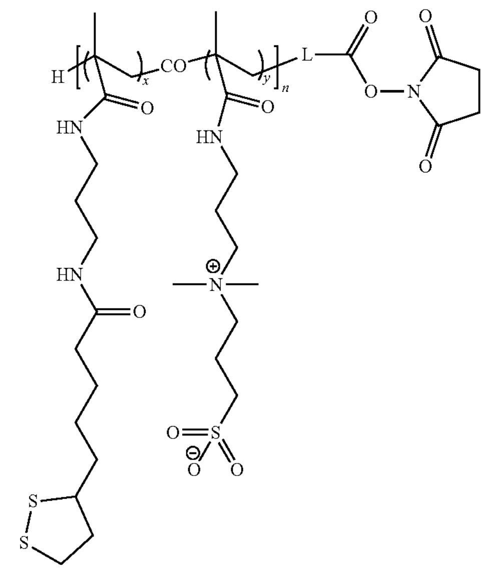

wherein n, x, y and L are as defined in formula (V) above; or a reduced form thereof.

In another specific embodiment, the at least one exchanging ligand which is a copolymer is of formula (V-d):

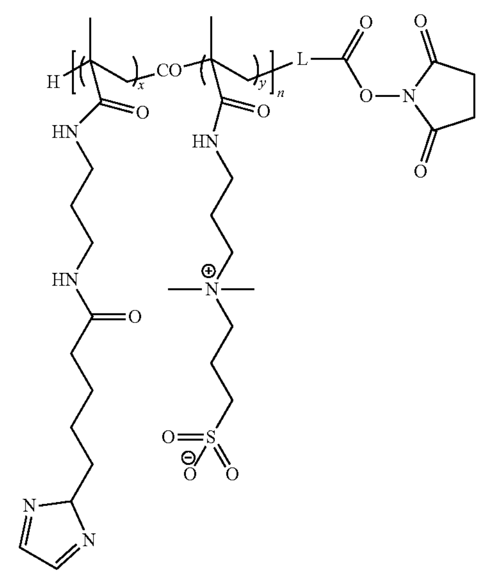

wherein n, x, y and L are as defined in formula (V) above; or a reduced form thereof.

In another specific embodiment, the at least one exchanging ligand which is a copolymer is of formula (V-e):

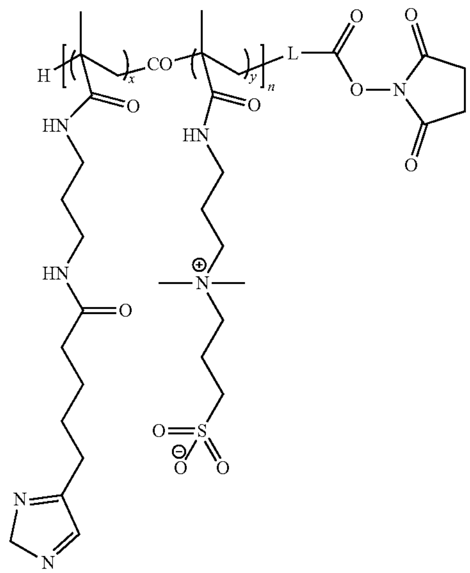

wherein n, x, y and L are as defined in formula (V) above; or a reduced form thereof.

According to one embodiment, the at least one exchanging ligand which is a copolymer is of general formula (VI):

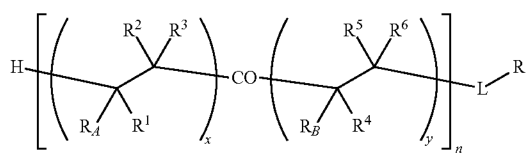

wherein n, x, y, L and R are as defined in formula (V);

$R_A$ represents a group comprising the first moiety $M_A$ having affinity for the surface of the nanoparticle 3 and/or the particle 2;

$R_B$ represents a group comprising the second moiety $M_B$ being hydrophilic;

$R^1$, $R^2$, $R^3$, $R^4$, $R^5$ and $R^6$ represent each independently H or a group selected from the alkyl, alkenyl, aryl, hydroxyl, halogen, alkoxy and carboxylate, amide.

According to one embodiment, the at least one exchanging ligand which is a copolymer is of general formula (VII):

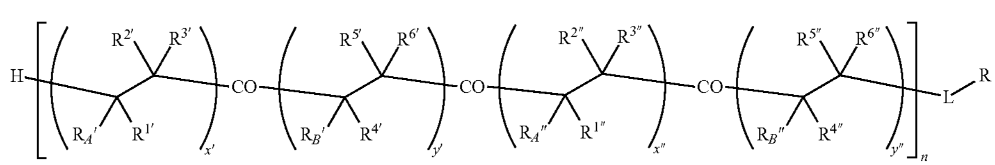

wherein

L and R are as defined in formula (V);

$R_A$' and $R_A$" represent respectively a group comprising a first moiety $M_A$' and a group comprising a first moiety $M_A$", said moieties $M_A$' and $M_A$" having affinity for the surface of the nanoparticle 3 and/or the particle 2;

$R_B$' and $R_B$" represent respectively a group comprising a second moiety $M_B$' and a group comprising a second moiety $M_B$", said moieties $M_B$' and $M_B$" being hydrophilic;

$R^{1\prime}$, $R^{2\prime}$, $R^{3\prime}$, $R^{4\prime}$, $R^{5\prime}$, $R^{6\prime}$, $R^{1\prime\prime}$, $R^{2\prime\prime}$, $R^{3\prime\prime}$, $R^{4\prime\prime}$, $R^{5\prime\prime}$ and $R^{6\prime\prime}$ represent each independently H or a group selected from the alkyl, alkenyl, aryl, hydroxyl, halogen, alkoxy and carboxylate, amide;

n represents a positive integer, preferably an integer ranging from 1 to 1000, preferably from 1 to 499, from 1 to 249 or from 1 to 99;

x' and x" represent each independently a percentage of n, wherein at least one of x' and x" is different from 0% of n; wherein x' and x" are different from 100% of n, preferably x' and x" are ranging from more than 0% to less than 100% of n, preferably from more than 0% to 50% of n, from more than 0% to 50% of n;

y' and y" represent each independently a percentage of n, wherein at least one of y' and y" is different from 0% of n; wherein y' and y" are different from 100% of n, preferably y' and y" are from more than 0% to less than 100% of n, preferably from more than 0% to 50% of n, from more than 0% to 50% of n;

wherein x'+x"+y'+y" is equal to 100% of n.

In another embodiment, of the invention, the at least one exchanging ligand which is a copolymer is synthesized from at least 3 monomers, said monomers being:

- one anchoring monomer A as defined above,
- one hydrophilic monomer B as defined above,
- one hydrophobic monomer C having a side-chain comprising a hydrophobic function $M_C$, and wherein one end of copolymer is H and the other end comprises a functional group or a bioactive group.

According to one embodiment, the at least one exchanging ligand which is a copolymer is of general formula (VIII):

$$H\text{—}P[(A)_x\text{-co-}(B)_y\text{-co-}(C)_z]_n\text{-L-R}$$

wherein

A, B, L, R and n are as defined above;

C represents an hydrophobic monomer having a side-chain comprising a moiety $M_C$ being hydrophobic;

x, y and z represent each independently a percentage of n, wherein x and y are different from 0% of n and different from 100% of n, preferably x, y and z are ranging from more than 0% to less than 100% of n, preferably from more than 0% to 80% of n, from more than 0% to 50% of n and wherein x+y+z is equal to 100% of n.

According to one embodiment, the at least one exchanging ligand which is a copolymer is of general formula (IX):

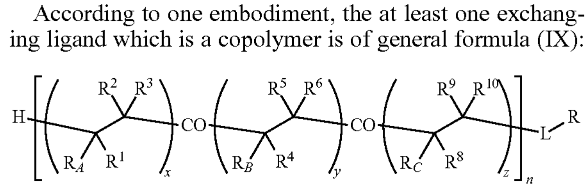

wherein n, L, R, $R_A$, $R_B$, $R^1$, $R^2$, $R^3$, $R^4$, $R^5$ and $R^6$ are as defined above;

$R_C$ represents a group comprising the third moiety $M_C$ being hydrophobic;

$R^8$, $R^9$, and $R^{19}$ represent each independently H or a group selected from the alkyl, alkenyl, aryl, hydroxyl, halogen, alkoxy and carboxylate, amide;

x, y and z represent each independently a percentage of n, wherein x and y are different from 0% of n and different from 100% of n, preferably x, y and z are ranging from more than 0% to less than 100% of n, preferably from more than 0% to 80% of n, from more than 0% to 50% of n; and wherein x+y+z is equal to 100% of n.

In one embodiment of the invention, x+y is ranging from 5 to 500, from 5 to 250, from 5 to 100, from 5 to 75, from 5 to 50, from 10 to 50, from 10 to 30, from 5 to 35, from 5 to 25, from 15 to 25. In one embodiment of the invention, x+y+z is ranging from 5 to 750, 5 to 500, 5 to 150, 5 to 100, 10 to 75, 10 to 50, 5 to 50, 15 to 25, 5 to 25. In one embodiment of the invention, x'+x"+y'+y" is ranging from 5 to 500, from 5 to 250, from 5 to 100, from 5 to 75, from 5 to 50, from 10 to 50, from 10 to 30, from 5 to 35, from 5 to 25, from 15 to 25. In one embodiment of the invention, said x is equal to x'+x". In one embodiment of the invention, said y is equal to y'+y". In one embodiment of the invention, x'+x"+y'+y"+z'+z" is ranging from 5 to 750, 5 to 500, 5 to 150, 5 to 100, 10 to 75, 10 to 50, 5 to 50, 15 to 25, 5 to 25. In one embodiment of the invention, said z is equal to z'+z".

In one embodiment, the first moiety $M_A$ having affinity for the surface of the nanoparticle 3 and/or the particle 2 has preferably affinity for a metal present at the surface of the nanoparticle 3 and/or the particle 2 or for a material present at the surface of the nanoparticle 3 and/or the particle 2 and selected in the group of O, S, Se, Te, N, P, As, and mixture thereof.

In one embodiment of the invention, said at least one exchanging ligand which is a copolymer comprising at least 2 monomers has a plurality of monomers including the monomer A and the monomer B. In one embodiment, said ligand is a random or block copolymer. In another embodiment, said ligand is a random or block copolymer consisting essentially of monomer A and monomer B. In one embodiment of the invention, said ligand is a multi-dentate ligand.

In one embodiment of the invention, said first moiety $M_A$ having affinity for the surface of the nanoparticle 3 and/or the particle 2 and in particular affinity for a metal present at the surface of the nanoparticle 3 and/or the particle 2 includes, but is not limited to, a thiol moiety, a dithiol moiety, an imidazole moiety, a catechol moiety, a pyridine moiety, a pyrrole moiety, a thiophene moiety, a thiazole moiety, a pyrazine moiety, a carboxylic acid or carboxylate moiety, a naphthyridine moiety, a phosphine moiety, a phosphine oxide moiety, a phenol moiety, a primary amine moiety, a secondary amine moiety, a tertiary amine moiety, a quaternary amine moiety, an aromatic amine moiety, or a combination thereof.

In one embodiment of the invention, said first moiety $M_A$ having affinity for the surface of the nanoparticle 3 and/or the particle 2 and in particular affinity for a material selected in the group of O, S, Se, Te, N, P, As, and mixture thereof, includes, but is not limited to, an imidazole moiety, a pyridine moiety, a pyrrole moiety, a thiazole moiety, a pyrazine moiety, a naphthyridine moiety, a phosphine moiety, a phosphine oxide moiety, a primary amine moiety, a secondary amine moiety, a tertiary amine moiety, a quaternary amine moiety, an aromatic amine moiety, or a combination thereof.

In one embodiment of the invention, said first moiety $M_A$ is not a dihydrolipoic acid (DHLA) moiety.

In another embodiment of the invention, said first moiety $M_A$ is not an imidazole moiety.

In one embodiment, monomers A and B are methacrylamide monomers.

In one embodiment of the invention, said second moiety $M_B$ having a high water solubility includes, but is not limited to, a zwitterionic moiety (i.e. any compound having both a negative charge and a positive charge, preferably a group with both an ammonium group and a sulfonate group or a group with both an ammonium group and a carboxylate group) such as for example an aminocarboxylate, an aminosulfonate, a carboxybetaine moiety wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a sulfobetaine moiety wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a phosphobetaine wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a phosphorylcholine, a phosphocholine moiety, and combinations thereof or a PEG moiety.

An example of a suitable PEG moiety is —[O—CH2-CHR']$_n$—R", wherein R' can be H or $C_1$-$C_3$ alkyl, R" can be H, —OH, $C_1$-$C_6$ alkyl, $C_1$-$C_6$ alkoxy, aryl, aryloxy, arylalkyl, or arylalkoxy and n can be an integer in the range of 1 to 120, preferably of 1 to 60, more preferably of 1 to 30.

In one embodiment, when B comprises a monomer comprising a second moiety $M_B$ which is a PEG moiety, then B further comprises at least one monomer comprising a second moiety $M_B$ which is not a PEG moiety.

In another embodiment of the invention, said second moiety $M_B$ having a high water solubility is not a PEG moiety.

In one embodiment of the invention, said moiety $M_A$ comprises said moieties $M_A$' and $M_A$".

In one embodiment of the invention, said moiety $M_B$ comprises said moieties $M_B$' and $M_B$".

In one embodiment of the invention, said first moieties $M_A$' and $M_A$" having affinity for the surface of the nanoparticle 3 and/or the particle 2 and in particular affinity for a metal present at the surface of the nanoparticle 3 and/or the particle 2 include, but is not limited to, a thiol moiety, a dithiol moiety, an imidazole moiety, a catechol moiety, a pyridine moiety, a pyrrole moiety, a thiophene moiety, a thiazole moiety, a pyrazine moiety, a carboxylic acid or carboxylate moiety, a naphthyridine moiety, a phosphine moiety, a phosphine oxide moiety, a phenol moiety, a primary amine moiety, a secondary amine moiety, a tertiary amine moiety, a quaternary amine moiety, an aromatic amine moiety, or a combination thereof.

In one embodiment of the invention, said first moieties $M_A$' and $M_A$" having affinity for the surface of the nanoparticle 3 and/or the particle 2 and in particular affinity for a material selected in the group of O, S, Se, Te, N, P, As, and mixture thereof, include, but is not limited to, an imidazole moiety, a pyridine moiety, a pyrrole moiety, a thiazole moiety, a pyrazine moiety, a naphthyridine moiety, a phosphine moiety, a phosphine oxide moiety, a primary amine moiety, a secondary amine moiety, a tertiary amine moiety, a quaternary amine moiety, an aromatic amine moiety, or a combination thereof.

In one embodiment of the invention, said first moiety $M_A$' having affinity for the surface of the nanoparticle 3 and/or the particle 2 is a dithiol moiety and said first moiety $M_A$" having affinity for the surface of the nanoparticle 3 and/or the particle 2 is an imidazole moiety.

In one embodiment of the invention, said second moieties $M_B$' and $M_B$" having a high water solubility include, but is not limited to, a zwitterionic moiety (i.e. any compound having both a negative charge and a positive charge, preferably a group with both an ammonium group and a sulfonate group or a group with both an ammonium group and a carboxylate group) such as for example an aminocarboxylate, an aminosulfonate, a carboxybetaine moiety wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a sulfobetaine moiety wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a phosphobetaine wherein the ammonium group may be included in an aliphatic chain, a five-membered cycle, a five-membered heterocycle comprising 1, 2 or 3 further nitrogen atoms, a six-membered cycle, a six-membered heterocycle comprising 1, 2, 3 or 4 further nitrogen atoms, a phosphorylcholine, a phosphocholine moiety, and combinations thereof or a PEG moiety, or a poly(ether)glycol moiety, wherein if $M_B$' is a PEG moiety, then $M_B$" is not a PEG moiety and inversely.

In one embodiment of the invention, said second moiety $M_B$' having a high water solubility is a sulfobetaine group and said second moiety $M_B$" having a high water solubility is a PEG moiety.

In one embodiment of the invention, said third moiety $M_c$ having a reactive function can form a covalent bond with a selected agent under selected conditions and includes, but is not limited to, any moiety having an amine group such as a primary amine group, any moiety having an azido group, any moiety having an halogen group, any moiety having an alkenyl group, any moiety having an alkynyl group, any moiety having an acidic function, any moiety having an activated acidic function, any moiety having an alcoholic group, any moiety having an activated alcoholic group, any moiety having a thiol group. It can also be a small molecule, such as biotin, that can bind with high affinity to a macromolecule, such as a protein or an antibody.

According to one embodiment, the reactive function of $M_c$ may be protected by any suitable protective group commonly used in the chemical practice. Protection and deprotection may be performed by any suitable method known in the art and adapted to the structure of the molecule to be protected. The reactive function of $M_c$ may be protected during the synthesis of the ligand and removed after the polymerization step. The reactive group of $M_C$ may alternatively be introduced in the ligand after the polymerization step.

In another embodiment of the invention, said third moiety $M_C$ having a reactive function can form a non covalent bond with a selective binding counterpart and said third moiety $M_C$ having a reactive function includes, but is not limited to, biotin that binds its counterpart streptavidin, a nucleic acid that binds its counterpart a sequence-complementary nucleic acid, FK506 that binds its counterpart FKBP, an antibody that binds its counterpart the corresponding antigen.

In one embodiment of the invention, $R_C$ comprising the third moiety $M_C$ can have the formula $L_C$-$M_C$, wherein $L_C$ can be a bond or an alkylene, alkenylene, a PEG moiety, or arylene linking group having 1 to 8 chain atoms and can be optionally interrupted or terminated by —O—, —S—, —$NR_7$—, wherein $R_7$ is H or alkyl, —CO—, —NHCO—, —CONH— or a combination thereof and $M_c$ corresponds to the third moiety as described here above.

An example of a suitable PEG moiety is —[O—$CH_2$—CHR']$_n$—, wherein R' can be H or $C_1$-$C_3$ alkyl, and n can be an integer in the range of 0 to 30.

According to one embodiment, the functional group is selected from the group comprising —NH2, —COOH, —OH, —SH, —CHO, ketone, halide; activated ester such as for example N-hydroxysuccinimide ester, N-hydroxyglutarimide ester or maleimide ester; activated carboxylic acid such as for example acid anhydride or acid halide; isothiocyanate; isocyanate; alkyne; azide; glutaric anhydride, succinic anhydride, maleic anhydride; hydrazide; chloroformate, maleimide, alkene, silane, hydrazone, oxime and furan.

According to one embodiment, the bioactive group is selected from the group comprising avidin or streptavidin; antibody such as a monoclonal antibody or a single chain antibody; sugars; a protein or peptide sequence having a specific binding affinity for an affinity target, such as for example an avimer or an affibody (the affinity target may be for example a protein, a nucleic acid, a peptide, a metabolite or a small molecule), antigens, steroids, vitamins, drugs, haptens, metabolites, toxins, environmental pollutants, amino acids, peptides, proteins, aptamers, nucleic acids, nucleotides, peptide nucleic acid (PNA), folates, carbohydrates, lipids, phospholipid, lipoprotein, lipopolysaccharide, liposome hormone, polysaccharide, polymers, polyhistidine tags, fluorophores.

In one embodiment of the invention, $R_A$ comprising the first moiety $M_A$ can have the formula -$L_A$-$M_A$, wherein $L_A$ can be a bond or an alkylene, alkenylene, or arylene linking group having 1 to 8 chain atoms and can be optionally interrupted or terminated by —O—, —S—, —$NR_7$—, wherein $R_7$ is H or alkyl, —CO—, —NHCO—, —CONH— or a combination thereof and $M_A$ corresponds to the first moiety as described here above.

In one embodiment of the invention, $R_B$ comprising the second moiety $M_B$ can have the formula -$L_B$-$M_B$, wherein $L_B$ can be a bond or an alkylene, alkenylene, or arylene linking group having 1 to 8 chain atoms and can be optionally interrupted or terminated by —O—, —S—, —$NR_7$—, wherein $R_7$ is H or alkyl, —CO—, —NHCO—, —CONH— or a combination thereof and $M_B$ corresponds to the second moiety as described here above.

According to one embodiment, the at least one colloidal suspension comprising at least one nanoparticle 3 has a concentration in said nanoparticle 3 of at least 0.001%, 0.002%, 0.003%, 0.004%, 0.005%, 0.006%, 0.007%, 0.008%, 0.009%, 0.01%, 0.02%, 0.03%, 0.04%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95% by weight.

According to one embodiment, the at least one nanoparticle 3 is not synthetized in a particle 2 in situ during the method.

According to one embodiment, the at least one nanoparticle 3 is encapsulated into the second material 21 during the formation of said second material 21. For example, said nanoparticle 3 is not inserted in nor put in contact with the second material 21 which have been previously obtained.

According to one embodiment, the at least one nanoparticle 3 is not encapsulated in the particle 2 via physical entrapment. In this embodiment, the particle 2 is not a preformed particle in which nanoparticle 3 is inserted via physical entrapment.

According to one embodiment, the particle 2 is not encapsulated in the luminescent particle 1 via physical entrapment. In this embodiment, the luminescent particle 1 is not a preformed particle in which particle 2 are inserted via physical entrapment.

According to one embodiment, examples of the surfactant include but are not limited to: carboxylic acids such as for example oleic acid, acetic acid, octanoic acid; thiols such as octanethiol, hexanethiol, butanethiol; 4-mercaptobenzoic acid; amines such as for example oleylamine, 1,6-hexanediamine, octylamine; phosphonic acids; antibodies; or a mixture thereof.

According to one embodiment, the method for obtaining the particles 2 and/or the luminescent particles 1 of the invention is not surfactant-free. In this embodiment, the nanoparticles may be better stabilized in solution during the method allowing to limit or prevent any degradation of their chemical or physical properties during the method. Furthermore, the colloidal stability of the particles 2 and/or the luminescent particles 1 may be enhanced, especially it may be easier to disperse the particles 2 and/or the luminescent particles 1 in solution at the end of the method.

According to one embodiment, the method for obtaining the particles 2 and/or the luminescent particles 1 of the invention is surfactant-free. In this embodiment, the surface of the particles 2 and/or the luminescent particles 1 obtained or obtainable by the method of the invention will be easy to functionalize as said surface will not be blocked by any surfactant molecule.

According to one embodiment, the means for forming droplets is a droplets former.

According to one embodiment, the means for forming droplets is configured to produce droplets.

According to one embodiment, the means for forming droplets comprises an atomizer According to one embodiment, the means for forming droplets is spray-drying or spray-pyrolysis.

According to one embodiment, the means for forming droplets is not spray-drying or spray-pyrolysis.

According to one embodiment, the means for forming droplets comprises an ultrasound dispenser, or a drop by drop delivering system using gravity, centrifuge force or static electricity.

According to one embodiment, the means for forming droplets comprises a tube or a cylinder.

According to one embodiment, the means for forming droplets are located and are working in a series.

According to one embodiment, the means for forming droplets are located and are working in parallel.

According to one embodiment, the means for forming droplets do not face each other.

According to one embodiment, the means for forming droplets are not arranged coaxially oppositely.

According to one embodiment, the droplets of solution A and solution B are simultaneously formed.

According to one embodiment, the droplets of solution C and solution D are simultaneously formed.

According to one embodiment, the droplets of solution A are formed prior to the formation of droplets of solution B.

According to one embodiment, the droplets of solution C are formed prior to the formation of droplets of solution D.

According to one embodiment, the droplets of solution B are formed prior to the formation of droplets of solution A.

According to one embodiment, the droplets of solution D are formed prior to the formation of droplets of solution C.

According to one embodiment, the droplets of solution A and the droplets of solution B are dispersed in a gas flow in the same tube.

According to one embodiment, the droplets of solution C and the droplets of solution D are dispersed in a gas flow in the same tube.

According to one embodiment, the droplets of solution A and the droplets of solution B are dispersed in a gas flow in two distinct tubes.

According to one embodiment, the droplets of solution C and the droplets of solution D are dispersed in a gas flow in two distinct tubes.

According to one embodiment, the droplets of solution A and solution B are homogeneously mixed.

According to one embodiment, the droplets of solution C and solution D are homogeneously mixed.

According to one embodiment, the droplets of solution A and solution B do not homogeneously mix, particularly if solution A and solution B are not miscible.

According to one embodiment, the droplets of solution C and solution D do not homogeneously mix, particularly if solution C and solution D are not miscible.

According to one embodiment, the droplets are spherical.

According to one embodiment, the droplets are polydisperse.

According to one embodiment, the droplets are monodisperse.

According to one embodiment, the size of the particles 2 and/or the luminescent particles 1 is correlated to the diameter of the droplets. The smaller the size of the droplets, the smaller the size of the resulting particles 2 and/or luminescent particles 1.

According to one embodiment, the size of the particles 2 and/or the luminescent particles 1 is smaller than the diameter of the droplets.

According to one embodiment, the droplets have a diameter of at least 10 nm, 50 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 50 μm, 100 μm, 150 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.5 cm, or 2 cm.

According to one embodiment, the droplets are dispersed in a gas flow, wherein the gas includes but is not limited to: air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the gas flow has a rate ranging from 0.01 to $1\times10^{10}$ $cm^3/s$.

According to one embodiment, the gas flow has a rate of at least 0.01 $cm^3/s$, 0.02 $cm^3/s$, 0.03 $cm^3/s$, 0.04 $cm^3/s$, 0.05 $cm^3/s$, 0.06 $cm^3/s$, 0.07 $cm^3/s$, 0.08 $cm^3/s$, 0.09 $cm^3/s$, 0.1 $cm^3/s$, 0.15 $cm^3/s$, 0.25 $cm^3/s$, 0.3 $cm^3/s$, 0.35 $cm^3/s$, 0.4 $cm^3/s$, 0.45 $cm^3/s$, 0.5 $cm^3/s$, 0.55 $cm^3/s$, 0.6 $cm^3/s$, 0.65 $cm^3/s$, 0.7 $cm^3/s$, 0.75 $cm^3/s$, 0.8 $cm^3/s$, 0.85 $cm^3/s$, 0.9 $cm^3/s$, 0.95 $cm^3/s$, 1 $cm^3/s$, 1.5 $cm^3/s$, 2 $cm^3/s$, 2.5 $cm^3/s$, 3 $cm^3/s$, 3.5 $cm^3/s$, 4 $cm^3/s$, 4.5 $cm^3/s$, 5 $cm^3/s$, 5.5 $cm^3/s$, 6 $cm^3/s$, 6.5 $cm^3/s$, 7 $cm^3/s$, 7.5 $cm^3/s$, 8 $cm^3/s$, 8.5 $cm^3/s$, 9 $cm^3/s$, 9.5 $cm^3/s$, 10 $cm^3/s$, 15 $cm^3/s$, 20 $cm^3/s$, 25 $cm^3/s$, 30 $cm^3/s$, 35 $cm^3/s$, 40 $cm^3/s$, 45 $cm^3/s$, 50 $cm^3/s$, 55 $cm^3/s$, 60 $cm^3/s$, 65 $cm^3/s$, 70 $cm^3/s$, 75 $cm^3/s$, 80 $cm^3/s$, 85 $cm^3/s$, 90 $cm^3/s$, 95 $cm^3/s$, 100 $cm^3/s$, $5\times10^2$ $cm^3/s$, $1\times10^3$ $cm^3/s$, $5\times10^3$ $cm^3/s$, $1\times10^4$ $cm^3/s$, $5\times10^4$ $cm^3/s$, $1\times10^5$ $cm^3/s$, $5\times10^5$ $cm^3/s$, or $1\times10^6$ $cm^3/s$.

According to one embodiment, the gas inlet pressure is at least 0, 0.5, 1, 1.5, 2, 2.5, 3, 3.5, 4, 4.5, 5, 5.5, 6, 6.5, 7, 7.5, 8, 8.5, 9, 9.5, or 10 bar.

According to one embodiment, the feed rate of solution A, solution B, solution C and solution D i.e. the flow of said solutions sprayed into the device, is in the range from 1 mL/h to 10000 mL/h, from 5 mL/h to 5000 mL/h, from 10 mL/h to 2000 mL/h, from 30 mL/h to 1000 mL/h.

According to one embodiment, the feed rate of solution A is at least 1 mL/h, 1.5 mL/h, 2.5 mL/h, 3 mL/h, 3.5 mL/h, 4 mL/h, 4.5 mL/h, 5 mL/h, 5.5 mL/h, 6 mL/h, 6.5 mL/h, 7 mL/h, 7.5 mL/h, 8 mL/h, 8.5 mL/h, 9 mL/h, 9.5 mL/h, 10 mL/h, 10.5 mL/h, 11 mL/h, 11.5 mL/h, 12 mL/h, 12.5 mL/h, 13 mL/h, 13.5 mL/h, 14 mL/h, 14.5 mL/h, 15 mL/h, 15.5 mL/h, 16 mL/h, 16.5 mL/h, 17 mL/h, 17.5 mL/h, 18 mL/h, 18.5 mL/h, 19 mL/h, 19.5 mL/h, 20 mL/h, 20.5 mL/h, 21 mL/h, 21.5 mL/h, 22 mL/h, 22.5 mL/h, 23 mL/h, 23.5 mL/h, 24 mL/h, 24.5 mL/h, 25 mL/h, 25.5 mL/h, 26 mL/h, 26.5 mL/h, 27 mL/h, 27.5 mL/h, 28 mL/h, 28.5 mL/h, 29 mL/h, 29.5 mL/h, 30 mL/h, 30.5 mL/h, 31 mL/h, 31.5 mL/h, 32 mL/h, 32.5 mL/h, 33 mL/h, 33.5 mL/h, 34 mL/h, 34.5 mL/h, 35 mL/h, 35.5 mL/h, 36 mL/h, 36.5 mL/h, 37 mL/h, 37.5 mL/h, 38 mL/h, 38.5 mL/h, 39 mL/h, 39.5 mL/h, 40 mL/h, 40.5 mL/h, 41 mL/h, 41.5 mL/h, 42 mL/h, 42.5 mL/h, 43 mL/h, 43.5 mL/h, 44 mL/h, 44.5 mL/h, 45 mL/h, 45.5 mL/h, 46 mL/h, 46.5 mL/h, 47 mL/h, 47.5 mL/h, 48 mL/h, 48.5 mL/h, 49 mL/h, 49.5 mL/h, 50 mL/h, 50.5 mL/h, 51 mL/h, 51.5 mL/h, 52 mL/h, 52.5 mL/h, 53 mL/h, 53.5 mL/h, 54 mL/h, 54.5 mL/h, 55 mL/h, 55.5 mL/h, 56 mL/h, 56.5 mL/h, 57 mL/h, 57.5 mL/h, 58 mL/h, 58.5 mL/h, 59 mL/h, 59.5 mL/h, 60 mL/h, 60.5 mL/h, 61 mL/h, 61.5 mL/h, 62 mL/h, 62.5 mL/h, 63 mL/h, 63.5 mL/h, 64 mL/h, 64.5 mL/h, 65 mL/h, 65.5 mL/h, 66 mL/h, 66.5 mL/h, 67 mL/h, 67.5 mL/h, 68 mL/h, 68.5 mL/h, 69 mL/h, 69.5 mL/h, 70 mL/h, 70.5 mL/h, 71 mL/h, 71.5 mL/h, 72 mL/h, 72.5 mL/h, 73 mL/h, 73.5 mL/h, 74 mL/h, 74.5 mL/h, 75 mL/h, 75.5 mL/h, 76 mL/h, 76.5 mL/h, 77 mL/h, 77.5 mL/h, 78 mL/h, 78.5 mL/h, 79 mL/h, 79.5 mL/h, 80 mL/h, 80.5 mL/h, 81 mL/h, 81.5 mL/h, 82 mL/h, 82.5 mL/h, 83 mL/h, 83.5 mL/h, 84 mL/h, 84.5 mL/h, 85 mL/h, 85.5 mL/h, 86 mL/h, 86.5 mL/h, 87 mL/h, 87.5 mL/h, 88 mL/h, 88.5 mL/h, 89 mL/h, 89.5 mL/h, 90 mL/h, 90.5 mL/h, 91 mL/h, 91.5 mL/h, 92 mL/h, 92.5 mL/h, 93 mL/h, 93.5 mL/h, 94 mL/h, 94.5 mL/h, 95 mL/h, 95.5 mL/h, 96 mL/h, 96.5 mL/h, 97 mL/h, 97.5 mL/h, 98 mL/h, 98.5 mL/h, 99 mL/h, 99.5 mL/h, 100 mL/h, 200 mL/h, 250 mL/h, 300 mL/h, 350 mL/h, 400 mL/h, 450 mL/h, 500 mL/h, 550 mL/h, 600 mL/h, 650 mL/h, 700 mL/h, 750 mL/h, 800 mL/h, 850 mL/h, 900 mL/h, 950 mL/h, 1000 mL/h, 1500 mL/h, 2000 mL/h, 2500 mL/h, 3000 mL/h, 3500 mL/h, 4000 mL/h, 4500 mL/h, 5000 mL/h, 5500 mL/h, 6000 mL/h, 6500 mL/h, 7000 mL/h, 7500 mL/h, 8000 mL/h, 8500 mL/h, 9000 mL/h, 9500 mL/h, or 10000 mL/h.

According to one embodiment, the feed rate of solution B is at least 1 mL/h, 1.5 mL/h, 2.5 mL/h, 3 mL/h, 3.5 mL/h, 4 mL/h, 4.5 mL/h, 5 mL/h, 5.5 mL/h, 6 mL/h, 6.5 mL/h, 7 mL/h, 7.5 mL/h, 8 mL/h, 8.5 mL/h, 9 mL/h, 9.5 mL/h, 10 mL/h, 10.5 mL/h, 11 mL/h, 11.5 mL/h, 12 mL/h, 12.5 mL/h, 13 mL/h, 13.5 mL/h, 14 mL/h, 14.5 mL/h, 15 mL/h, 15.5 mL/h, 16 mL/h, 16.5 mL/h, 17 mL/h, 17.5 mL/h, 18 mL/h, 18.5 mL/h, 19 mL/h, 19.5 mL/h, 20 mL/h, 20.5 mL/h, 21 mL/h, 21.5 mL/h, 22 mL/h, 22.5 mL/h, 23 mL/h, 23.5 mL/h, 24 mL/h, 24.5 mL/h, 25 mL/h, 25.5 mL/h, 26 mL/h, 26.5 mL/h, 27 mL/h, 27.5 mL/h, 28 mL/h, 28.5 mL/h, 29 mL/h, 29.5 mL/h, 30 mL/h, 30.5 mL/h, 31 mL/h, 31.5 mL/h, 32 mL/h, 32.5 mL/h, 33 mL/h, 33.5 mL/h, 34 mL/h, 34.5 mL/h, 35 mL/h, 35.5 mL/h, 36 mL/h, 36.5 mL/h, 37 mL/h, 37.5 mL/h, 38 mL/h, 38.5 mL/h, 39 mL/h, 39.5 mL/h, 40 mL/h, 40.5 mL/h, 41 mL/h, 41.5 mL/h, 42 mL/h, 42.5 mL/h, 43 mL/h, 43.5 mL/h, 44 mL/h, 44.5 mL/h, 45 mL/h, 45.5 mL/h, 46 mL/h, 46.5 mL/h, 47 mL/h, 47.5 mL/h, 48 mL/h, 48.5 mL/h, 49 mL/h, 49.5 mL/h, 50 mL/h, 50.5 mL/h, 51 mL/h, 51.5 mL/h, 52 mL/h, 52.5 mL/h, 53 mL/h, 53.5 mL/h, 54 mL/h, 54.5 mL/h, 55 mL/h, 55.5 mL/h, 56 mL/h, 56.5 mL/h, 57 mL/h, 57.5 mL/h, 58 mL/h, 58.5 mL/h, 59 mL/h, 59.5 mL/h, 60 mL/h, 60.5 mL/h, 61 mL/h, 61.5 mL/h, 62 mL/h, 62.5 mL/h, 63 mL/h, 63.5 mL/h, 64 mL/h, 64.5 mL/h, 65 mL/h, 65.5 mL/h, 66 mL/h, 66.5 mL/h, 67 mL/h, 67.5 mL/h, 68 mL/h, 68.5 mL/h, 69 mL/h, 69.5 mL/h, 70 mL/h, 70.5 mL/h, 71 mL/h, 71.5 mL/h, 72 mL/h, 72.5 mL/h, 73 mL/h, 73.5 mL/h, 74 mL/h, 74.5 mL/h, 75 mL/h, 75.5 mL/h, 76 mL/h, 76.5 mL/h, 77 mL/h, 77.5 mL/h, 78 mL/h, 78.5 mL/h, 79 mL/h, 79.5 mL/h, 80 mL/h, 80.5 mL/h, 81 mL/h, 81.5 mL/h, 82 mL/h, 82.5 mL/h, 83 mL/h, 83.5 mL/h, 84 mL/h, 84.5 mL/h, 85 mL/h, 85.5 mL/h, 86 mL/h, 86.5 mL/h, 87 mL/h, 87.5 mL/h, 88 mL/h, 88.5 mL/h, 89 mL/h, 89.5 mL/h, 90 mL/h, 90.5 mL/h, 91 mL/h, 91.5 mL/h, 92 mL/h, 92.5 mL/h, 93 mL/h, 93.5 mL/h, 94 mL/h, 94.5 mL/h, 95 mL/h, 95.5 mL/h, 96 mL/h, 96.5 mL/h, 97 mL/h, 97.5 mL/h, 98 mL/h, 98.5 mL/h, 99 mL/h, 99.5 mL/h, 100 mL/h, 200 mL/h, 250 mL/h, 300 mL/h, 350 mL/h, 400 mL/h, 450 mL/h, 500 mL/h, 550 mL/h, 600 mL/h, 650 mL/h, 700 mL/h, 750 mL/h, 800 mL/h, 850 mL/h, 900 mL/h, 950 mL/h, 1000 mL/h, 1500 mL/h, 2000 mL/h, 2500 mL/h, 3000 mL/h, 3500 mL/h, 4000 mL/h, 4500 mL/h, 5000 mL/h, 5500 mL/h, 6000 mL/h, 6500 mL/h, 7000 mL/h, 7500 mL/h, 8000 mL/h, 8500 mL/h, 9000 mL/h, 9500 mL/h, or 10000 mL/h.

According to one embodiment, the feed rate of solution C is at least 1 mL/h, 1.5 mL/h, 2.5 mL/h, 3 mL/h, 3.5 mL/h, 4 mL/h, 4.5 mL/h, 5 mL/h, 5.5 mL/h, 6 mL/h, 6.5 mL/h, 7 mL/h, 7.5 mL/h, 8 mL/h, 8.5 mL/h, 9 mL/h, 9.5 mL/h, 10 mL/h, 10.5 mL/h, 11 mL/h, 11.5 mL/h, 12 mL/h, 12.5 mL/h, 13 mL/h, 13.5 mL/h, 14 mL/h, 14.5 mL/h, 15 mL/h, 15.5 mL/h, 16 mL/h, 16.5 mL/h, 17 mL/h, 17.5 mL/h, 18 mL/h, 18.5 mL/h, 19 mL/h, 19.5 mL/h, 20 mL/h, 20.5 mL/h, 21 mL/h, 21.5 mL/h, 22 mL/h, 22.5 mL/h, 23 mL/h, 23.5 mL/h, 24 mL/h, 24.5 mL/h, 25 mL/h, 25.5 mL/h, 26 mL/h, 26.5 mL/h, 27 mL/h, 27.5 mL/h, 28 mL/h, 28.5 mL/h, 29 mL/h, 29.5 mL/h, 30 mL/h, 30.5 mL/h, 31 mL/h, 31.5 mL/h, 32 mL/h, 32.5 mL/h, 33 mL/h, 33.5 mL/h, 34 mL/h, 34.5 mL/h, 35 mL/h, 35.5 mL/h, 36 mL/h, 36.5 mL/h, 37 mL/h, 37.5 mL/h, 38 mL/h, 38.5 mL/h, 39 mL/h, 39.5 mL/h, 40 mL/h, 40.5 mL/h, 41 mL/h, 41.5 mL/h, 42 mL/h, 42.5 mL/h, 43 mL/h, 43.5 mL/h, 44 mL/h, 44.5 mL/h, 45 mL/h, 45.5 mL/h, 46 mL/h, 46.5 mL/h, 47 mL/h, 47.5 mL/h, 48 mL/h, 48.5 mL/h, 49 mL/h, 49.5 mL/h, 50 mL/h, 50.5 mL/h, 51 mL/h, 51.5 mL/h, 52 mL/h, 52.5 mL/h, 53 mL/h, 53.5 mL/h, 54 mL/h, 54.5 mL/h, 55 mL/h, 55.5 mL/h, 56 mL/h, 56.5 mL/h, 57 mL/h, 57.5 mL/h, 58 mL/h, 58.5 mL/h, 59 mL/h, 59.5 mL/h, 60 mL/h, 60.5 mL/h, 61 mL/h, 61.5 mL/h, 62 mL/h, 62.5 mL/h, 63 mL/h, 63.5 mL/h, 64 mL/h, 64.5 mL/h, 65 mL/h, 65.5 mL/h, 66 mL/h, 66.5 mL/h, 67 mL/h, 67.5 mL/h, 68 mL/h, 68.5 mL/h, 69 mL/h, 69.5 mL/h, 70 mL/h, 70.5 mL/h, 71 mL/h, 71.5 mL/h, 72 mL/h, 72.5 mL/h, 73 mL/h, 73.5 mL/h, 74 mL/h, 74.5 mL/h, 75 mL/h, 75.5 mL/h, 76 mL/h, 76.5 mL/h, 77 mL/h, 77.5 mL/h, 78 mL/h, 78.5 mL/h, 79 mL/h, 79.5 mL/h, 80 mL/h, 80.5 mL/h, 81 mL/h, 81.5 mL/h, 82 mL/h, 82.5 mL/h, 83 mL/h, 83.5 mL/h, 84 mL/h, 84.5 mL/h, 85 mL/h, 85.5 mL/h, 86 mL/h, 86.5 mL/h, 87 mL/h, 87.5 mL/h, 88 mL/h, 88.5 mL/h, 89 mL/h, 89.5 mL/h, 90 mL/h, 90.5 mL/h, 91 mL/h, 91.5 mL/h, 92 mL/h, 92.5 mL/h, 93 mL/h, 93.5 mL/h, 94 mL/h, 94.5 mL/h, 95 mL/h, 95.5 mL/h, 96 mL/h, 96.5 mL/h, 97 mL/h, 97.5 mL/h, 98 mL/h, 98.5 mL/h, 99 mL/h, 99.5 mL/h, 100 mL/h, 200 mL/h, 250 mL/h, 300 mL/h, 350 mL/h, 400 mL/h, 450 mL/h, 500 mL/h, 550 mL/h, 600 mL/h, 650 mL/h, 700 mL/h, 750 mL/h, 800 mL/h, 850 mL/h, 900 mL/h, 950 mL/h, 1000 mL/h, 1500 mL/h, 2000 mL/h, 2500 mL/h, 3000 mL/h, 3500 mL/h, 4000 mL/h, 4500 mL/h, 5000 mL/h, 5500 mL/h, 6000 mL/h, 6500 mL/h, 7000 mL/h, 7500 mL/h, 8000 mL/h, 8500 mL/h, 9000 mL/h, 9500 mL/h, or 10000 mL/h.

According to one embodiment, the feed rate of solution D is at least 1 mL/h, 1.5 mL/h, 2.5 mL/h, 3 mL/h, 3.5 mL/h, 4 mL/h, 4.5 mL/h, 5 mL/h, 5.5 mL/h, 6 mL/h, 6.5 mL/h, 7 mL/h, 7.5 mL/h, 8 mL/h, 8.5 mL/h, 9 mL/h, 9.5 mL/h, 10 mL/h, 10.5 mL/h, 11 mL/h, 11.5 mL/h, 12 mL/h, 12.5 mL/h, 13 mL/h, 13.5 mL/h, 14 mL/h, 14.5 mL/h, 15 mL/h, 15.5 mL/h, 16 mL/h, 16.5 mL/h, 17 mL/h, 17.5 mL/h, 18 mL/h, 18.5 mL/h, 19 mL/h, 19.5 mL/h, 20 mL/h, 20.5 mL/h, 21 mL/h, 21.5 mL/h, 22 mL/h, 22.5 mL/h, 23 mL/h, 23.5 mL/h, 24 mL/h, 24.5 mL/h, 25 mL/h, 25.5 mL/h, 26 mL/h, 26.5 mL/h, 27 mL/h, 27.5 mL/h, 28 mL/h, 28.5 mL/h, 29 mL/h, 29.5 mL/h, 30 mL/h, 30.5 mL/h, 31 mL/h, 31.5 mL/h, 32 mL/h, 32.5 mL/h, 33 mL/h, 33.5 mL/h, 34 mL/h, 34.5 mL/h, 35 mL/h, 35.5 mL/h, 36 mL/h, 36.5 mL/h, 37 mL/h, 37.5 mL/h, 38 mL/h, 38.5 mL/h, 39 mL/h, 39.5 mL/h, 40 mL/h, 40.5 mL/h, 41 mL/h, 41.5 mL/h, 42 mL/h, 42.5 mL/h, 43 mL/h, 43.5 mL/h, 44 mL/h, 44.5 mL/h, 45 mL/h, 45.5 mL/h, 46 mL/h, 46.5 mL/h, 47 mL/h, 47.5 mL/h, 48 mL/h, 48.5 mL/h, 49 mL/h, 49.5 mL/h, 50 mL/h, 50.5 mL/h, 51 mL/h, 51.5 mL/h, 52 mL/h, 52.5 mL/h, 53 mL/h, 53.5 mL/h, 54 mL/h, 54.5 mL/h, 55 mL/h, 55.5 mL/h, 56 mL/h, 56.5 mL/h, 57 mL/h, 57.5 mL/h, 58 mL/h, 58.5 mL/h, 59 mL/h, 59.5 mL/h, 60 mL/h, 60.5 mL/h, 61 mL/h, 61.5 mL/h, 62 mL/h, 62.5 mL/h, 63 mL/h, 63.5 mL/h, 64 mL/h, 64.5 mL/h, 65 mL/h, 65.5 mL/h, 66 mL/h, 66.5 mL/h, 67 mL/h, 67.5 mL/h, 68 mL/h, 68.5 mL/h, 69 mL/h, 69.5 mL/h, 70 mL/h, 70.5 mL/h, 71 mL/h, 71.5 mL/h, 72 mL/h, 72.5 mL/h, 73 mL/h, 73.5 mL/h, 74 mL/h, 74.5 mL/h, 75 mL/h, 75.5 mL/h, 76 mL/h, 76.5 mL/h, 77 mL/h, 77.5 mL/h, 78 mL/h, 78.5 mL/h, 79 mL/h, 79.5 mL/h, 80 mL/h, 80.5 mL/h, 81 mL/h, 81.5 mL/h, 82 mL/h, 82.5 mL/h, 83 mL/h, 83.5 mL/h, 84 mL/h, 84.5 mL/h, 85 mL/h, 85.5 mL/h, 86 mL/h, 86.5 mL/h, 87 mL/h, 87.5 mL/h, 88 mL/h, 88.5 mL/h, 89 mL/h, 89.5 mL/h, 90 mL/h, 90.5 mL/h, 91 mL/h, 91.5 mL/h, 92 mL/h, 92.5 mL/h, 93 mL/h, 93.5 mL/h, 94 mL/h, 94.5 mL/h, 95 mL/h, 95.5 mL/h, 96 mL/h, 96.5 mL/h, 97 mL/h, 97.5 mL/h, 98 mL/h, 98.5 mL/h, 99 mL/h, 99.5 mL/h, 100 mL/h, 200 mL/h, 250 mL/h, 300 mL/h, 350 mL/h, 400 mL/h, 450 mL/h, 500 mL/h, 550 mL/h, 600 mL/h, 650 mL/h, 700 mL/h, 750 mL/h, 800 mL/h, 850 mL/h, 900 mL/h, 950 mL/h, 1000 mL/h, 1500 mL/h, 2000 mL/h, 2500 mL/h, 3000 mL/h, 3500 mL/h, 4000 mL/h, 4500 mL/h, 5000 mL/h, 5500 mL/h, 6000 mL/h, 6500 mL/h, 7000 mL/h, 7500 mL/h, 8000 mL/h, 8500 mL/h, 9000 mL/h, 9500 mL/h, or 10000 mL/h.

According to one embodiment, the droplets are heated at a temperature sufficient to evaporate the solvent from the said droplets.

According to one embodiment, the droplets are heated at least at 0° C., 10° C., 15° C., 20° C., 25° C., 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., or 1400° C.

According to one embodiment, the droplets are heated at less than 0° C., 10° C., 15° C., 20° C., 25° C., 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., or 1400° C.

According to one embodiment, the droplets are dried at least at 0° C., 25° C., 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., or 1400° C.

According to one embodiment, the droplets are dried at less than 0° C., 25° C., 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., or 1400° C.

According to one embodiment, the droplets are not heated. According to one embodiment, the time of heating step is at least 0.1 seconds, 0.2 seconds, 0.3 seconds, 0.4 seconds, 0.5 seconds, 1 second, 1.5 seconds, 2 seconds, 2.5 seconds, 3 seconds, 3.5 seconds, 4 seconds, 4.5 seconds, 5 seconds, 5.5 seconds, 6 seconds, 6.5 seconds, 7 seconds, 7.5 seconds, 8 seconds, 8.5 seconds, 9 seconds, 9.5 seconds, 10 seconds, 10.5 seconds, 11 seconds, 11.5 seconds, 12 seconds, 12.5 seconds, 13 seconds, 13.5 seconds, 14 seconds, 14.5 seconds, 15 seconds, 15.5 seconds, 16 seconds, 16.5 seconds, 17 seconds, 17.5 seconds, 18 seconds, 18.5 seconds, 19 seconds, 19.5 seconds, 20 seconds, 21 seconds, 22 seconds, 23 seconds, 24 seconds, 25 seconds, 26 seconds, 27 seconds, 28 seconds, 29 seconds, 30 seconds, 31 seconds, 32 seconds, 33 seconds, 34 seconds, 35 seconds, 36 seconds, 37 seconds, 38 seconds, 39 seconds, 40 seconds, 41 seconds, 42 seconds, 43 seconds, 44 seconds, 45 seconds, 46 seconds, 47 seconds, 48 seconds, 49 seconds, 50 seconds, 51 seconds, 52 seconds, 53 seconds, 54 seconds, 55 seconds, 56 seconds, 57 seconds, 58 seconds, 59 seconds, or 60 seconds.

According to one embodiment, the droplets are heated using a flame.

According to one embodiment, the droplets are heated using a heat gun.

According to one embodiment, the heating step takes place in a tubular furnace.

According to one embodiment, the droplets are heated by convection as heat transfer.

According to one embodiment, the droplets are heated by infra-red radiation.

According to one embodiment, the droplets are heated by micro-waves.

According to one embodiment, the particles 2 and the luminescent particles 1 are cooled down at a temperature inferior to the heating temperature.

According to one embodiment, the particles 2 and the luminescent particles 1 are cooled down at a temperature of at least −200° C., −180° C., −160° C., −140° C., −120° C., −100° C., −80° C., −60° C., −40° C., −20° C., 0° C., 20° C., 40° C., 60° C., 80° C., or 100° C.

According to one embodiment, the cooling step is fact and the time of cooling step is at least 0.1° C./s, 1° C./s, 10° C./sec, 50° C./sec, 100° C./sec, 150° C./sec, 200° C./sec, 250° C./sec, 300° C./sec, 350° C./sec, 400° C./sec, 450° C./sec, 500° C./sec, 550° C./sec, 600° C./sec, 650° C./sec, 700° C./sec, 750° C./sec, 800° C./sec, 850° C./sec, 900° C./sec, 950° C./sec, or 1000° C./sec.

According to one embodiment, the particles 2 and/or the luminescent particles 1 are not separated depending on their size and are collected using a unique membrane filter with a pore size ranging from 1 nm to 300 μm.

According to one embodiment, the particles 2 and/or the luminescent particles 1 are not separated depending on their size and are collected using at least two membrane filters with a pore size ranging from 1 nm to 300 μm.

According to one embodiment, the particles 2 and/or the luminescent particles 1 are separated and collected depending on their size using at least two successive membrane filters with different pore sizes ranging from 1 nm to 300 μm.

According to one embodiment, the membrane filter includes but is not limited to: hydrophobic polytetrafluoroethylene, hydrophilic polytetrafluoroethylene, polyethersulfone, nylon, cellulose, glass fibers, polycarbonate, polypropylene, polyvinyl chloride, polyvinylidene fluoride, silver, polyolefin, polypropylene prefilter, or a mixture thereof.

According to one embodiment, the particles 2 and/or the luminescent particles 1 are collected as powder from the membrane filter by scrubbing the membrane filter.

According to one embodiment, the particles 2 and/or the luminescent particles 1 are collected as powder on a conveyor belt used as membrane filter. In this embodiment, said conveyor belt is activated to collect the powder continuously during the method by scrubbing said conveyor belt.

According to one embodiment, the conveyor belt used as membrane filter has a pore size ranging from 1 nm to 300 μm.

According to one embodiment, the particles 2 and/or the luminescent particles 1 are collected from the membrane filter by sonicating said membrane filter in an organic solvent.

According to one embodiment, the particles 2 and/or the luminescent particles 1 are collected from the membrane filter by sonicating said membrane filter in an aqueous solvent.

According to one embodiment, the particles 2 and/or the luminescent particles 1 are collected from the membrane filter by sonicating said membrane filter in a polar solvent.

According to one embodiment, the particles 2 and/or the luminescent particles 1 are collected from the membrane filter by sonicating said membrane filter in an apolar solvent.

According to one embodiment, the particles 2 and/or the luminescent particles 1 are separated and collected depending on their size.

According to one embodiment, the particles 2 and/or the luminescent particles 1 are separated and collected depending on their loading charge.

According to one embodiment, the particles 2 and/or the luminescent particles 1 are separated and collected depending on their packing fraction.

According to one embodiment, the particles 2 and/or the luminescent particles 1 are separated and collected depending on their chemical composition.

According to one embodiment, the particles 2 and/or the luminescent particles 1 are separated and collected depending on their specific property.

According to one embodiment, the particles 2 and/or the luminescent particles 1 are separated and collected depending on their size using a temperature induced separation, or magnetic induced separation.

According to one embodiment, the particles 2 and/or the luminescent particles 1 are separated and collected depending on their size using an electrostatic precipitator.

According to one embodiment, the particles 2 and/or the luminescent particles 1 are separated and collected depending on their size using a sonic or gravitational dust collector.

According to one embodiment, the particles 2 and/or the luminescent particles 1 are separated depending on their size by using a cyclonic separation.

According to one embodiment, the particles 2 and/or the luminescent particles 1 are collected in a spiral-shaped tube. In this embodiment, the particles 2 and/or the luminescent particles 1 will deposit on the inner walls of said tube, then the particles 2 and/or the luminescent particles 1 can be recovered by the introduction of an organic or aqueous solvent into said tube.

According to one embodiment, the particles 2 and/or the luminescent particles 1 are collected in an aqueous solution containing potassium ions.

According to one embodiment, the particles 2 and/or the luminescent particles 1 are collected in an aqueous solution.

According to one embodiment, the particles 2 and/or the luminescent particles 1 are collected in an organic solution.

According to one embodiment, the particles 2 and/or the luminescent particles 1 are collected in a polar solvent.

According to one embodiment, the particles 2 and/or the luminescent particles 1 are collected in an apolar solvent.

According to one embodiment, the particles 2 and/or the luminescent particles 1 are collected onto a support comprising a material such as for example silica, quartz, silicon, gold, copper, $Al_2O_3$, ZnO, $SnO_2$, MgO, GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride.

In one embodiment, the support is reflective.

In one embodiment, the support comprises a material allowing to reflect the light such as for example a metal like aluminium or silver, a glass, a polymer.

In one embodiment, the support is thermally conductive.

According to one embodiment, the support has a thermal conductivity at standard conditions ranging from 0.5 to 450 W/(m·K), preferably from 1 to 200 W/(m·K), more preferably from 10 to 150 W/(m·K).

According to one embodiment, the support has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4

W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the substrate comprises Au, Ag, Pt, Ru, Ni, Co, Cr, Cu, Sn, Rh Pd, Mn, Ti or a mixture thereof.

According to one embodiment, the substrate comprises silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

In one embodiment, the support can be a substrate, a LED, a LED array, a vessel, a tube, a solar panel, a panel, or a container. Preferably the support is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the particles 2 and/or the luminescent particles 1 are suspended in an inert gas such as He, Ne, Ar, Kr, Xe or $N_2$.

According to one embodiment, the particles 2 and/or the luminescent particles 1 are collected onto a functionalized support.

According to one embodiment, the functionalized support is functionalized with a specific-binding component, wherein said specific-binding component includes but is not limited to: antigens, steroids, vitamins, drugs, haptens, metabolites, toxins, environmental pollutants, amino acids, peptides, proteins, antibodies, polysaccharides, nucleotides, nucleosides, oligonucleotides, psoralens, hormones, nucleic acids, nucleic acid polymers, carbohydrates, lipids, phospholipids, lipoproteins, lipopolysaccharides, liposomes, lipophilic polymers, synthetic polymers, polymeric microparticles, biological cells, virus and combinations thereof. Preferred peptides include, but are not limited to: neuropeptides, cytokines, toxins, protease substrates, and protein kinase substrates. Preferred protein conjugates include enzymes, antibodies, lectins, glycoproteins, histones, albumins, lipoproteins, avidin, streptavidin, protein A, protein G, phycobiliproteins and other fluorescent proteins, hormones, toxins and growth factors. Preferred nucleic acid polymers are single- or multi-stranded, natural or synthetic DNA or RNA oligonucleotides, or DNA/RNA hybrids, or incorporating an unusual linker such as morpholine derivatized phosphides, or peptide nucleic acids such as N-(2-aminoethyl)glycine units, where the nucleic acid contains fewer than 50 nucleotides, more typically fewer than 25 nucleotides. The functionalization of the functionalized support can be made using techniques known in the art.

According to one embodiment, the particles 2 and/or the luminescent particles 1 are dispersed in water.

According to one embodiment, the particles 2 and/or the luminescent particles 1 are dispersed in an organic solvent, wherein said organic solvent includes but is not limited to: hexane, heptane, pentane, octane, decane, dodecane, toluene, tetrahydrofuran, chloroform, acetone, acetic acid, n-methylformamide, n,n-dimethylformamide, dimethylsulfoxide, octadecene, squalene, amines such as for example tri-n-octylamine, 1,3-diaminopropane, oleylamine, hexadecylamine, octadecylamine, squalene, alcohols such as for example ethanol, methanol, isopropanol, 1-butanol, 1-hexanol, 1-decanol, propane-2-ol, ethanediol, 1,2-propanediol or a mixture thereof.

According to one embodiment, the particles 2 and/or the luminescent particles 1 are sonicated in a solution. This embodiment allows dispersion of said particles 2 and/or luminescent particles 1 in solution.

According to one embodiment, the particles 2 and/or the luminescent particles 1 are dispersed in a solution comprising at least one surfactant described here above. This embodiment prevents the aggregation of said particles 2 and/or luminescent particles 1 in solution.

According to one embodiment, the method for obtaining the particles 2 and/or the luminescent particles 1 of the invention does not comprise an additional heating step to heat t the particles 2 and/or the luminescent particles 1 after the final step of the method of the invention, the temperature of this additional heating step being at least 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., 1400° C., 1450° C., or 1500° C. Indeed, an additional heating step, especially at high temperature, may cause the degradation of the specific property of the at least one nanoparticle 3, for example it may cause the quenching of the fluorescence for fluorescent nanoparticles comprised in the particles 2 and/or the luminescent particles 1.

According to one embodiment, the method for obtaining the particles 2 and/or the luminescent particles 1 of the invention further comprises an additional heating step to heat the particles 2 and/or the luminescent particles 1. In this embodiment, said additional heating step takes place after the final step of the method of the invention.

According to one embodiment, the temperature of the additional heating step is at least 50° C., 100° C., 150° C., 200° C., 250° C., 300° C., 350° C., 400° C., 450° C., 500° C., 550° C., 600° C., 650° C., 700° C., 750° C., 800° C., 850° C., 900° C., 950° C., 1000° C., 1050° C., 1100° C., 1150° C., 1200° C., 1250° C., 1300° C., 1350° C., 1400° C., 1450° C., or 1500° C.

According to one embodiment, the time of the additional heating step is at least 5 min, 10 15 min, 20 min, 25 min, 30 min, 35 min, 40 min, 45 min, 50 min, 55 min, 60 min, 1.5 hours, 2 hours, 2.5 hours, 3 hours, 3.5 hours, 4 hours, 4.5 hours, 5 hours, 5.5 hours, 6 hours, 6.5 hours, 7 hours, 7.5 hours, 8 hours, 8.5 hours, 9 hours, 9.5 hours, 10 hours, 11 hours, 12 hours, 13 hours, 14 hours, 15 hours, 16 hours, 17 hours, 18 hours, 19 hours, 20 hours, 21 hours, 22 hours, 23 hours, 24 hours, 30 hours, 36 hours, 42 hours, 48 hours, 54 hours, 60 hours, 66 hours, 72 hours, 78 hours, 84 hours, 90 hours, 96 hours, 102 hours, 108 hours, 114 hours, 120 hours, 126 hours, 132 hours, 138 hours, 144 hours, 150 hours, 156 hours, 162 hours or 168 hours.

According to one embodiment, the method for obtaining the particles 2 and/or the luminescent particles 1 of the invention further comprises a step of functionalization of said particles 2 and/or luminescent particles 1.

According to one embodiment, the particles 2 and/or the luminescent particles 1 are functionalized as described hereabove.

According to one embodiment, the method further comprises a step of forming a shell on the particles 2 and/or the luminescent particles 1.

According to one embodiment, prior the step of forming a shell on the particles 2 and/or the luminescent particles 1, said particles 2 and/or luminescent particles 1 are separated, collected, dispersed and/or suspended as described hereabove.

According to one embodiment, prior the step of forming a shell on the particles 2 and/or the luminescent particles 1, said particles 2 and/or luminescent particles 1 are not separated, collected, dispersed and/or suspended.

According to one embodiment, the shell forming step comprises directing the particles 2 and/or the luminescent particles 1 suspended in a gas to a tube wherein they are placed in the presence of at least one molecule comprising silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, chlorine cadmium, sulfur, selenium, indium, tellurium, mercury, tin, copper, nitrogen, gallium, antimony, thallium, molybdenum, palladium, cerium, tungsten, cobalt, manganese, or a mixture thereof; and molecular oxygen to form a shell of the corresponding oxide, mixed oxides, mixed oxides thereof or a mixture thereof.

According to one embodiment, the shell forming step comprises directing the particles 2 and/or the luminescent particles 1 suspended in a gas to a tube wherein they are alternatively placed in the presence of molecules comprising silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, chlorine cadmium, sulfur, selenium, indium, tellurium, mercury, tin, copper, nitrogen, gallium, antimony, thallium, molybdenum, palladium, cerium, tungsten, cobalt, manganese, or a mixture thereof; and molecular oxygen to form a shell of the corresponding oxide, mixed oxides, mixed oxides thereof or a mixture thereof.

According to one embodiment, the shell forming step may be repeated at least twice using different or same molecules comprising silicon, boron, phosphorus, germanium, arsenic, aluminium, iron, titanium, zirconium, nickel, zinc, calcium, sodium, barium, potassium, magnesium, lead, silver, vanadium, tellurium, manganese, iridium, scandium, niobium, tin, cerium, beryllium, tantalum, sulfur, selenium, nitrogen, fluorine, chlorine cadmium, sulfur, selenium, indium, tellurium, mercury, tin, copper, nitrogen, gallium, antimony, thallium, molybdenum, palladium, cerium, tungsten, cobalt, manganese, or a mixture thereof. In this embodiment, the thickness of the shell is increased.

According to one embodiment, the shell forming step comprises directing the particles 2 and/or the luminescent particles 1 suspended in a gas to a tube wherein they are subjected to an Atomic Layer Deposition (ALD) process to form a shell on the particles 2 and/or the luminescent particles 1, said shell comprising silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, the shell forming step by ALD may be repeated at least twice using different or same shell precursors. In this embodiment, the thickness of the shell is increased.

According to one embodiment, the tube for the shell forming step may be straight, spiral or ring-shaped.

According to one embodiment, during the shell forming step, the particles 2 and/or the luminescent particles 1 may be deposited on a support as described hereabove. In this embodiment, said support is in the tube, or is the tube itself.

According to one embodiment, the shell forming step comprises dispersing the particles 2 and/or the luminescent particles 1 in a solvent and subjecting them to a heating step as described hereabove.

According to one embodiment, the shell forming step comprises dispersing the particles 2 and/or the luminescent particles 1 in a solvent and subjecting them to the method of the invention. In this embodiment, the method of the invention can be repeated with the particles 2 and/or the luminescent particles 1 at least once, or several times to obtain at least one or several shells respectively.

According to one embodiment, after the shell forming step, the particles 2 and/or the luminescent particles 1 are separated, collected, dispersed and/or suspended as described hereabove.

According to one embodiment, the size of the particles 2 and/or the luminescent particles 1 can be controlled by the heating temperature, the heating time, the cooling temperature, the quantity of solution A, B, C and/or D, the concentration of solution A, B, C and/or D, the hydrolysis time, the hydrolysis temperature, the at least one nanoparticle 3 concentration in the colloidal suspension of at least one nanoparticle 3, the nature of the acid and/or the base in solution A, B, C and/or D, the nature of the organic solvent, the nature of the gases injected into the system, or the geometry and the dimensions of the various elements of the device implementing the method.

According to one embodiment, the size distribution of the particles 2 and/or the luminescent particles 1 can be controlled by the heating temperature, the heating time, the cooling temperature, the quantity of solution A, B, C and/or D, the concentration of solution A, B, C and/or D, the hydrolysis time, the hydrolysis temperature, the at least one nanoparticle 3 concentration in the colloidal suspension of at least one nanoparticle 3, the nature of the acid and/or the base in solution A, B, C and/or D, the nature of the organic solvent, the nature of the gases injected into the system, or the geometry and the dimensions of the various elements of the device implementing the method.

According to one embodiment, the degree of filling of the particles 2 by the at least one nanoparticle 3 can be controlled by the heating temperature, the heating time, the cooling temperature, the quantity of solution A, B, C and/or D, the concentration of solution A, B, C and/or D, the hydrolysis time, the hydrolysis temperature, the at least one nanoparticle 3 concentration in the colloidal suspension of at least one nanoparticle 3, the nature of the acid and/or the base in solution A, B, C and/or D, the nature of the organic solvent, the nature of the gases injected into the system, or the geometry and the dimensions of the various elements of the device implementing the method.

According to one embodiment, the degree of filling of the luminescent particles 1 by the at least one nanoparticle 2 can be controlled by the heating temperature, the heating time, the cooling temperature, the quantity of solution A, B, C and/or D, the concentration of solution A, B, C and/or D, the hydrolysis time, the hydrolysis temperature, the at least one nanoparticle 3 concentration in the colloidal suspension of at least one nanoparticle 3, the nature of the acid and/or the base in solution A, B, C and/or D, the nature of the organic solvent, the nature of the gases injected into the system, or the geometry and the dimensions of the various elements of the device implementing the method.

According to one embodiment, the density of the particles 2 and/or the luminescent particles 1 can be controlled by the heating temperature, the heating time, the cooling temperature, the quantity of solution A, B, C and/or D, the concentration of solution A, B, C and/or D, the hydrolysis time, the hydrolysis temperature, the at least one nanoparticle 3 concentration in the colloidal suspension of at least one nanoparticle 3, the nature of the acid and/or the base in solution A, B, C and/or D, the nature of the organic solvent, the nature of the gases injected into the system, or the geometry and the dimensions of the various elements of the device implementing the method.

According to one embodiment, the porosity of the particles 2 and/or the luminescent particles 1 can be controlled by the heating temperature, the heating time, the cooling temperature, the quantity of solution A, B, C and/or D, the concentration of solution A, B, C and/or D, the hydrolysis time, the hydrolysis temperature, the at least one nanoparticle 3 concentration in the colloidal suspension of at least one nanoparticle 3, the nature of the acid and/or the base in solution A, B, C and/or D, the nature of the organic solvent, the nature of the gases injected into the system, or the geometry and the dimensions of the various elements of the device implementing the method.

According to one embodiment, the permeability of the particles 2 and/or the luminescent particles 1 can be controlled by the heating temperature, the heating time, the cooling temperature, the quantity of solution A, B, C and/or D, the concentration of solution A, B, C and/or D, the hydrolysis time, the hydrolysis temperature, the at least one nanoparticle 3 concentration in the colloidal suspension of at least one nanoparticle 3, the nature of the acid and/or the base in solution A, B, C and/or D, the nature of the organic solvent, the nature of the gases injected into the system, or the geometry and the dimensions of the various elements of the device implementing the method.

According to one embodiment, the method further comprises the dispersion of the as-obtained particles in a $H_2$ gas flow. In this embodiment, said $H_2$ gas flow will allow the passivation of defects in the nanoparticle 3, the particle 2, the first material 11, the second material 21 and/or the luminescent particle 1.

Another object of the invention relates to a luminescent particle 1 or a population of luminescent particles 1 obtainable or obtained by the method of the invention. In the present application, a population of luminescent particles 1 is defined by the maximum emission wavelength.

According to one embodiment, the luminescent particle 1 or the population of luminescent particles 1 obtainable or obtained by the method of the invention is functionalized as described hereabove.

According to one embodiment, at least 0%, 5%, 10%, 15%, 20%, 25%, 30%, 35%, 40%, 45%, 50%, 55%, 60%, 65%, 70%, 75%, 80%, 85%, 90%, or 95% of the luminescent particles 1 obtainable or obtained by the method of the invention are empty, i.e. they do not comprise any nanoparticles 3.

In another aspect, the invention further relates to a display apparatus 61 comprising a backlight unit and a least one color conversion layer 73 and or at least one light emitting material 7. The backlight unit comprises a light source 6111 and a light guide configured to provide an excitation to the at least one light emitting material 7 and is well known by the skilled artisan.

According to one embodiment, the light source 6111 is configured to supply at least one primary light.

According to one embodiment, the at least one primary light is monochromatic.

According to one embodiment, the at least one primary light is polychromatic.

According to one embodiment, the at least one primary light emitted by the light source 6111 has a wavelength ranging from 200 nm to 50 μm, from 200 nm to 800 nm, from 400 nm to 470 nm, from 400 nm to 500 nm, from 400 nm to 600 nm, from 400 nm to 700 nm, from 400 nm to 800 nm, from 800 nm to 1200 nm, from 1200 nm to 1500 nm, from 1500 nm to 1800 nm, from 1800 nm to 2200 nm, from 2200 nm to 2500 nm, or from 2500 nm to 50 μm.

According to one embodiment, the light source 6111 comprises at least one light-emitting diode (LED).

According to one embodiment, the light source 6111 is a blue, green, red, or UV light source such as for example a laser, a diode, a light-emitting diode (LED), a LED chip, a LED package including at least one LED chip, a fluorescent lamp or a Xenon Arc Lamp.

According to one embodiment, the light source 6111 comprises an array of light source pixels or an array of light source sub-pixels.

According to one embodiment, each light source pixel comprises at least one light source sub-pixel which may comprise a light emitting material 7 emitting a secondary light with a wavelength ranging from 200 nm to 50 μm, from 200 nm to 800 nm, from 400 nm to 470 nm, from 400 nm to 500 nm, from 400 nm to 600 nm, from 400 nm to 700 nm, from 400 nm to 800 nm, from 800 nm to 1200 nm, from 1200 nm to 1500 nm, from 1500 nm to 1800 nm, from 1800 nm to 2200 nm, from 2200 nm to 2500 nm, or from 2500 nm to 50 μm.

According to one embodiment, the light source pixel pitch is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1 8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the light source pixel size is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the light source 6111 may further comprise inorganic phosphors as described herein.

According to one embodiment, the light source 6111 comprises at least one LED and light-emitting inorganic phosphors, all well known by the skilled artisan. Therefore, the light source 6111 can emit a combination of lights with different wavelengths, i.e. a polychromatic light, as primary light.

In one embodiment, the light source 6111 is a blue LED with a wavelength ranging from 400 nm to 470 nm such as for instance a gallium nitride based diode.

In one embodiment, the light source 6111 is a blue LED with a wavelength ranging from 400 nm to 470 nm. In one embodiment, the light source 6111 has an emission peak at about 405 nm. In one embodiment, the light source 6111 has an emission peak at about 447 nm. In one embodiment, the light source 6111 has an emission peak at about 455 nm.

In one embodiment, the light source 6111 is a UV LED with a wavelength ranging from 200 nm to 400 nm. In one embodiment, the light source 6111 has an emission peak at about 253 nm. In one embodiment, the light source 6111 has an emission peak at about 365 nm. In one embodiment, the light source 6111 has an emission peak at about 395 nm.

In one embodiment, the light source 6111 is a green LED with a wavelength ranging from 500 nm to 560 nm. In one embodiment, the light source 6111 has an emission peak at about 515 nm. In one embodiment, the light source 6111 has an emission peak at about 525 nm. In one embodiment, the light source 6111 has an emission peak at about 540 nm.

In one embodiment, the light source 6111 is a red LED with a wavelength ranging from 750 to 850 nm. In one embodiment, the light source 6111 has an emission peak at about 755 nm. In one embodiment, the light source 6111 has an emission peak at about 800 nm. In one embodiment, the light source 6111 has an emission peak at about 850 nm.

In one embodiment, the light source 6111 has a photon flux or average peak pulse power between 1 $nW\cdot cm^{-2}$ and 100 $kW\cdot cm^{-2}$ and more preferably between 1 $InW\cdot cm^{-2}$ and 100 $W\cdot cm^{-2}$, and even more preferably between 1 $InW\cdot cm^{-2}$ and 30 $W\cdot cm^{-2}$.

In one embodiment, the light source 6111 has a photon flux or average peak pulse power of at least 1 $nW\cdot cm^{-2}$, 50 $nW\cdot cm^{-2}$, 100 $nW\cdot cm^{-2}$, 200 $nW\cdot cm^{-2}$, 300 $nW\cdot cm^{-2}$, 400 $nW\cdot cm^{-2}$, 500 $nW\cdot cm^{-2}$, 600 $nW\cdot cm^{-2}$, 700 $nW\cdot cm^{-2}$, 800 $nW\cdot cm^{-2}$, 900 $nW\cdot cm^{-2}$, 1 $\mu W\cdot cm^{-2}$, 10 $\mu W\cdot cm^{-2}$, 100 $\mu W\cdot cm^{-2}$, 500 $\mu W\cdot cm^{-2}$, 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{2}$, 50 $kW\cdot cm^{-2}$, or 100 $kW\cdot cm^{-2}$.

In one embodiment, the incident light exciting the light emitting material 7 has a photon flux or average peak pulse power of at least 1 $nW\cdot cm^{2}$, 50 $nW\cdot cm^{-2}$, 100 $nW\cdot cm^{-2}$, 200 $nW\cdot cm^{-2}$, 300 $nW\cdot cm^{-2}$, 400 $nW\cdot cm^{-2}$, 500 $nW\cdot cm^{-2}$, 600 $nW\cdot cm^{-2}$, 700 $nW\cdot cm^{-2}$, 800 $nW\cdot cm^{-2}$, 900 $nW\cdot cm^{-2}$, 1 $\mu W\cdot cm^{-2}$, 10 $\mu W\cdot cm^{-2}$, 100 $\mu W\cdot cm^{-2}$, 500 $\mu W\cdot cm^{-2}$, 1 $mW\cdot cm^{-2}$, 50 $mW\cdot cm^{-2}$, 100 $mW\cdot cm^{-2}$, 500 $mW\cdot cm^{-2}$, 1 $W\cdot cm^{2}$, 5 $W\cdot cm^{-2}$, 10 $W\cdot cm^{-2}$, 20 $W\cdot cm^{2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{2}$.

In one embodiment, the light source 6111 is a GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride diode.

In one embodiment, the LED may be located on one surface of a printed circuit board. A reflector may be disposed on one surface of the printed circuit board, and the LED may be located on the reflector. The reflector reflects light which has failed to go toward the light emitting material 7, back to the light emitting material 7.

According to one embodiment, the reflector guides the wasted light from the light source 6111 back toward the light emitting material 7. Wasted light refers to the light emitted from the light source 6111 that is not directed to the light emitting material 7.

According to one embodiment, the color conversion layer 73 is an array of light emitting materials 7.

In one embodiment illustrated in FIG. 25A-B, the color conversion layer 73 comprises an array of light emitting materials 7 partially or totally surrounded and/or covered by a surrounding medium 72.

According to one embodiment, the color conversion layer 73 is a superposition of light emitting materials 7.

According to one embodiment, the light guide distributes the primary light towards the at least one light emitting material 7.

According to one embodiment, the color conversion layer 73 comprises an array of pixels.

According to one embodiment, pixels of the array of pixels comprised in the color conversion layer 73 are separated by a pixel pitch D.

According to one embodiment, the color conversion layer 73 comprises an array of pixels and each pixel comprises at least one light emitting material 7.

According to one embodiment, the color conversion layer 73 comprises an array of pixels and each pixel comprises an array of light emitting materials 7.

According to one embodiment, the pixel pitch D is as described hereabove.

According to one embodiment, the pixel size is as described hereabove.

According to one embodiment, there may be discontinuities or irregularities along the color conversion layer 73.

In one embodiment, the light emitting materials 7 may be separated by at least one surrounding medium 72.

In one embodiment, the color conversion layer 73 comprises two light emitting materials 7 emitting different colors or wavelengths.

In one embodiment, the color conversion layer 73 comprises two light emitting materials 7, a first light emitting material 7 with a maximum emission wavelength between 500 nm and 560 nm, more preferably between 515 nm and 545 nm and a second light emitting material 7 with a maximum emission wavelength between 600 nm and 2500 nm, more preferably between 610 nm and 650 nm.

In one embodiment, the color conversion layer 73 comprises three light emitting materials 7 emitting different colors or wavelengths.

In one embodiment, the color conversion layer 73 comprises three light emitting materials 7, a first light emitting material 7 with a maximum emission wavelength between 440 and 499 nm, more preferably between 450 and 495 nm, a second light emitting material 7 with a maximum emission wavelength between 500 nm and 560 nm, more preferably between 515 nm and 545 nm and a third light emitting material 7 with a maximum emission wavelength between 600 nm and 2500 nm, more preferably between 610 nm and 650 nm.

In one embodiment, the color conversion layer 73 comprises a plurality of light emitting materials 7. In this embodiment, the light emitting materials 7 may emit secondary lights of the same color or wavelength.

In one embodiment, the color conversion layer 73 comprises a plurality of light emitting material 7. In this embodiment, the light emitting materials 7 may emit secondary lights of different colors or wavelengths.

In one embodiment, the color conversion layer 73 comprises at least one light emitting material 7 comprising only one population of luminescent particles 1.

In one embodiment, the color conversion layer 73 comprises at least one light emitting material 7, each comprising only one population of luminescent particles 1, the populations comprised in each light emitting material 7 emitting different colors or wavelengths.

In one embodiment, the color conversion layer 73 comprises at least one light emitting material 7, each comprising two populations of luminescent particles 1 emitting different colors or wavelengths.

In one embodiment, the color conversion layer 73 comprises at least one light emitting material 7 comprising three populations of luminescent particles 1 emitting different colors or wavelengths.

In one embodiment, the color conversion layer 73 comprises a plurality of light emitting materials 7 each comprising only one population of luminescent particles 1, the populations comprised in each light emitting material 7 emitting different colors or wavelengths.

In one embodiment, the concentration of the plurality of light emitting material 7 comprised in the color conversion layer 73 and emitting different colors or wavelengths, is controlled to predetermine the light intensity of each secondary light emitted by said plurality of light emitting material 7, after excitation of the luminescent particles 1 by a primary light.

In one embodiment, the color conversion layer 73 comprises at least one light emitting material 7 comprising luminescent particles 1 which emit green light and red light upon downconversion of a blue light source. In this embodiment, the color conversion layer 73 is configured to transmit a predetermined intensity of the primary blue light and to emit a predetermined intensity of secondary green and red lights, allowing to emit a resulting tri-chromatic white light.

In one embodiment, the color conversion layer 73 comprises at least one light emitting material 7 comprising at least one luminescent particle 1 which emits green light, and at least one light emitting material 7 comprising at least one luminescent particle 1 which emits red light upon downconversion of a blue light source. In this embodiment, the color conversion layer 73 is configured to transmit a predetermined intensity of the primary blue light and to emit a predetermined intensity of secondary green and red lights, allowing to emit a resulting tri-chromatic white light. In one embodiment, the color conversion layer 73 comprises at least one light emitting material 7 comprising at least one luminescent particle 1 which emits green light, at least one light emitting material 7 comprising at least one luminescent particle 1 which emits red light, and at least one light emitting material 7 comprising at least one luminescent particle 1 which emits blue light upon downconversion of a UV light source. In this embodiment, the color conversion layer 73 is configured to transmit a predetermined intensity of the primary UV light and to emit a predetermined intensity of secondary green, red and blue lights, allowing to emit a resulting tri-chromatic white light.

According to one embodiment, the color conversion layer 73 may comprises at least one zone comprising at least one light emitting material 7 and/or at least one zone free of light emitting material 7 and/or at least one empty zone and/or at least one optically transparent zone.

According to one embodiment, the at least one zone free of light emitting material 7 may comprise scattering particles.

According to one embodiment, the color conversion layer 73 may comprises at least one zone comprising at least one light emitting material 7 emitting red secondary light at least one light emitting material 7 emitting green secondary light. In this embodiment, said color conversion layer 73 is equivalent to a layer comprising a yellow phosphor.

According to one embodiment, the color conversion layer 73 may comprises at least one zone comprising at least one light emitting material 7, wherein said light emitting material 7 comprises scattering particles and does not comprise luminescent particles 1; and/or at least one zone comprising at least one light emitting material 7, wherein said light emitting material 7 comprises scattering particles and luminescent particles 1.

According to one embodiment, the color conversion layer 73 may comprises at least one zone comprising at least one light emitting material 7 having an emission peak ranging from 400 nm to 470 nm, preferably at about 450 nm; at least one zone comprising at least one light emitting material 7 having an emission peak ranging from 500 nm to 560 nm, preferably at about 540 nm; and at least one zone comprising at least one light emitting material 7 having an emission peak ranging from 750 to 850 nm, preferably at about 750 nm. In this embodiment, the color conversion layer 73 can be excited with a primary light centered at 390 nm.

According to one embodiment, the color conversion layer 73 may comprises at least one zone comprising at least one light emitting material 7 having an emission peak ranging from 400 nm to 470 nm, preferably at about 450 nm; at least one zone comprising at least one light emitting material 7 having an emission peak ranging from 500 nm to 560 nm, preferably at about 540 nm; and at least one zone comprising at least one light emitting material 7 having an emission peak ranging from 750 to 850 nm, preferably at about 750 nm. In this embodiment, the color conversion layer 73 can be excited with a primary light centered at 390 nm and/or at 450 nm.

According to one embodiment, the color conversion layer 73 may comprises at least one zone comprising at least one light emitting material 7 emitting a green secondary light, at least one zone comprising at least one light emitting material 7 emitting a red secondary light, and at least one zone free of light emitting material 7 or inorganic phosphor.

According to one embodiment, the color conversion layer 73 comprises an array of pixels and each pixel comprises at least one sub-pixel.

According to one embodiment, the at least one sub-pixel comprises at least one light emitting material 7.

According to one embodiment, the at least one sub-pixel is free of light emitting material 7.

According to one embodiment, the at least one sub-pixel is free of light emitting material 7. In this embodiment, the at least one sub-pixel can comprise scattering particles.

According to one embodiment, the at least one sub-pixel comprises scattering particles.

According to one embodiment, at least one sub-pixel comprises a light emitting material 7, wherein said light emitting material 7 comprises scattering particles and does not comprise luminescent particles 1; and/or at least one sub-pixel comprises a light emitting material 7, wherein said light emitting material 7 comprises scattering particles and luminescent particles 1.

According to one embodiment illustrated in FIG. 18E, the first sub-pixel emits a green secondary light, the second sub-pixel emits a red secondary light, the third sub-pixel is free of light emitting material 7 or inorganic phosphor.

According to one embodiment, the sub-pixel pitch d is as described hereabove.

According to one embodiment, the sub-pixel size is as described hereabove.

According to one embodiment, the color conversion layer 73 and/or light emitting material 7 do not comprise pixels.

According to one embodiment, the color conversion layer 73 and/or light emitting material 7 does not comprise sub-pixels.

According to one embodiment, the pixels are configured to emit a resulting monochromatic light or a polychromatic light. For example, the pixels may emit a mixture of a blue, green and/or red lights.

According to one embodiment, the sub-pixels are configured to emit a resulting monochromatic light or a polychromatic light. For example, the sub-pixels may emit a blue light, a green light and/or a red light.

In one embodiment, the color conversion layer 73 comprises an array of pixels, each pixel comprising 3 sub-pixels. The 3 sub-pixels are: i) free of light emitting material 7, red sub-pixel and green sub-pixel both comprising at least one light emitting material 7, when the laser source emits blue light; or ii) blue sub-pixel, red sub-pixel and green sub-pixel all comprising at least one light emitting material, when the laser source emits UV light.

According to one embodiment, the color conversion layer 73 comprises an array of pixels, wherein at least one sub-pixel comprises a light emitting material 7 having an emission peak ranging from 400 nm to 470 nm, preferably at about 450 nm; at least one sub-pixel comprises a light emitting material 7 having an emission peak ranging from 500 nm to 560 nm, preferably at about 540 nm; and at least one sub-pixel comprises a light emitting material 7 having an emission peak ranging from 750 to 850 nm, preferably at about 750 nm. In this embodiment, the color conversion layer 73 can be excited with a primary light centered at 390 nm.

According to one embodiment, the color conversion layer 73 comprises an array of pixels, wherein at least one sub-pixel comprises a light emitting material 7 having an emission peak ranging from 400 nm to 470 nm, preferably at about 450 nm; at least one sub-pixel comprises a light emitting material 7 having an emission peak ranging from 500 nm to 560 nm, preferably at about 540 nm; and at least one sub-pixel comprises a light emitting material 7 having an emission peak ranging from 750 to 850 nm, preferably at about 750 nm. In this embodiment, the color conversion layer 73 can be excited with a primary light centered at 390 nm and/or at 450 nm.

According to one embodiment, the display apparatus 61 may further comprise at least one polarizer 6141 or polarizing filter to increase efficiency by repeatedly reflecting any unpolarized light back or block undesired light from the light guide to the light emitting material 7.

In one embodiment, the display apparatus 61 may further comprise at least one layer of liquid crystal material 6131 which is able to control the passage and the intensity of the light from the light source 6111 to the light emitting material 7.

In one embodiment, the display apparatus 61 may further comprise an active matrix 6132 and a layer of liquid crystal material 6131 to control the illumination of each light emitting material 7.

According to said embodiment, the display apparatus 61 further comprises a polarizer 6141 between the light emitting material 7 and the light source 6111.

According to one embodiment illustrated on FIG. 19, the display apparatus 61 comprises a color conversion layer 73 comprising an array of pixels, wherein each pixel comprises at least one of sub-pixels, wherein each sub-pixel comprises at least one light emitting material 7 or is free of light emitting material. Said display apparatus 61 comprises a light source 6111 configured to excite said light emitting material 7 comprised in said color conversion layer 73. At least one secondary light is emitted through a sub-pixel when the primary light excites the at least one light emitting material 7 comprised in said sub-pixel, while the primary light is transmitted through a sub-pixel without emission of a secondary light when said sub-pixel is free of light emitting material 7 and is illuminated by said primary light. The display apparatus 61 further comprises an active matrix 6132 and a layer of liquid crystal material 6131 to control the illumination of sub-pixel or each light emitting material 7. According to said embodiment, the display apparatus 61 further comprises at least one polarizer 6141 between the color conversion layer 73 and the light source 6111.

In another aspect, the invention relates to a display apparatus 61 comprising an array of light sources 6111 and at least one color conversion layer 73 according to the present invention. The light sources 6111 are configured to provide an excitation to the at least one light emitting material 7.

In one embodiment, each light source of the array of light sources is a light source 6111 as described hereabove.

According to one embodiment, the array of individual light sources 6111 forms an array of light source pixels or an array of light source sub-pixels.

According to one embodiment, the light source pixels and the light source sub-pixels are as described hereabove.

According to one embodiment, the light sources 6111 may be activated collectively.

According to one embodiment, the light sources 6111 may be activated independently from each other.

According to one embodiment, the light sources 6111 intensity may be controlled collectively.

According to one embodiment, the light sources 6111 intensity may be controlled independently from each other.

In one embodiment, the array of light sources 6111 is an array of LED.

In one embodiment, the array of light sources 6111 is an array of microsized LED.

In one embodiment, the array of light sources 6111 is a LED array or a microsized LED array comprising an array of GaN diodes, GaSb diodes, GaAs diodes, GaAsP diodes, GaP diodes, InP diodes, SiGe diodes, InGaN diodes, GaAlN diodes, GaAlPN diodes, MN diodes, AlGaAs diodes, AlGaP diodes, AlGaInP diodes, AlGaN diodes, AlGaInN diodes, ZnSe diodes, Si diodes, SiC diodes, diamond diodes, boron nitride diodes, organic light emitting diodes (OLED), quantum dot light emitting diodes (QLED), or a mixture thereof.

According to one embodiment, the color conversion layer 73 comprises an array of pixels.

According to one embodiment, the pixels are as described hereabove.

According to one embodiment, the color conversion layer 73 comprises an array of pixels and each pixel comprises at least one sub-pixel.

According to one embodiment, the at least one sub-pixel is as described hereabove.

According to one embodiment, the conversion layer 73 does not comprise pixels.

According to one embodiment, the conversion layer 73 does not comprise sub-pixels.

In one embodiment, each light source 6111 of the array of light sources 6111 is configured to illuminate and/or to excite at least one light emitting material 7 comprised in the at least one color conversion layer 73.

In one embodiment, each light source 6111 of the array of light sources 6111 is configured to illuminate and/or excite only one light emitting material 7 comprised in the at least one color conversion layer 73.

In one embodiment, each light source 6111 of the array of light sources 6111 is configured to illuminate and/or excite at least one pixel of the array of pixels.

In one embodiment, each light source 6111 of the array of light sources 6111 is configured to illuminate and/or excite only one pixel of the array of pixels. In this embodiment, each light source 6111 of the array of light sources 6111 is associated with only one pixel of the array of pixels.

In one embodiment, each pixel of the array of pixels is configured to be illuminated and/or excited by only one light source 6111 of the array of light sources 6111. In this embodiment, each pixel is associated with only one light source 6111 of the array of light sources 6111.

In one embodiment, each light source 6111 of the array of light sources 6111 is configured to illuminate and/or excite only one pixel of the array of pixels. In this embodiment, each light source 6111 of the array of light sources 6111 is associated with only one pixel of the array of pixels.

In one embodiment, each light source 6111 of the array of light sources 6111 is configured to illuminate and/or excite only one sub-pixel. In this embodiment, each light source 6111 of the array of light sources 6111 is associated with one sub-pixel of the array of pixels.

In one embodiment, each sub-pixel is configured to be illuminated and/or excited by only one light source 6111 of the array of light sources 6111. In this embodiment, each sub-pixel is associated with only one light source 6111 of the array of light sources 6111.

According to one embodiment, the pixels are configured to emit a resulting monochromatic light or a polychromatic light. For example, the pixels may emit a mixture of a blue, green and/or red lights.

According to one embodiment, the sub-pixels are configured to emit a resulting monochromatic light or a polychromatic light. For example, the sub-pixels may emit a blue light, a green light and/or a red light.

According to one embodiment, the active matrix 6132 is an active TFT (Thin-Film-Transistor) matrix or a CMOS (Complementary Metal-Oxide-Semiconductor) matrix. Active TFT matrix and CMOS matrix is well-known from the skilled artisan.

FIG. 22 illustrates a display apparatus 61 using such a conversion layer 73. Said display apparatus 61 comprises a bottom substrate 6122, a glass substrate 6121, a color conversion layer 73 comprising an array of pixels, wherein each pixel comprises at least one sub-pixels, wherein each sub-pixel comprises at least one light emitting material 7 or is free of light emitting material. Said display apparatus 61 comprises an array of light source 6111 for which each light source 6111 and each sub-pixel are associated two by two and, when activated, is configured to illuminate and/or excite said one sub-pixel. At least one secondary light is emitted through a sub-pixel when the primary light from the associated light source 6111 illuminates and/or excites the at least one light emitting material 7 comprised in said sub-pixel, while the primary light is transmitted through a sub-pixel without emission of a secondary light when said sub-pixel is free of light emitting material 7 and is illuminated by said primary light from the associated light source 6111. In this embodiment, the display apparatus 61 comprises an active matrix 6132 (preferably an active TFT matrix) in order to activate each light source sub-pixel. The active matrix 6132 may comprise at least one transistor and at least one capacitor per sub-pixel.

In another aspect, the invention relates to a display apparatus 61 comprising at least one laser source 6112 and at least one color conversion layer 73 according to the present invention comprising an array of light emitting material 7, wherein said at least one laser source 6112 is configured to provide an excitation for the at least one light emitting material 7, allowing said light emitting material 7 to emit at least one secondary light.

According to one embodiment, the at least one laser source 6112 is a laser diode or other type of laser device well known by the skilled artisan.

In one embodiment, the at least one laser source 6112 is a blue laser source with a wavelength ranging from 400 nm to 470 nm. In one embodiment, the laser source 6112 has an emission peak at about 405 nm. In one embodiment, the laser source 6112 has an emission peak at about 447 nm. In one embodiment, the laser source 6112 has an emission peak at about 455 nm.

In one embodiment, the at least one laser source 6112 is a UV laser source with a wavelength ranging from 200 nm to 400 nm. In one embodiment, the laser source 6112 has an emission peak at about 253 nm. In one embodiment, the laser source 6112 has an emission peak at about 365 nm. In one embodiment, the laser source 6112 has an emission peak at about 395 nm.

In one embodiment, the at least one laser source 6112 is a green laser source with a wavelength ranging from 500 nm to 560 nm. In one embodiment, the laser source 6112 has an emission peak at about 515 nm. In one embodiment, the laser source 6112 has an emission peak at about 525 nm. In one embodiment, the laser source 6112 has an emission peak at about 540 nm.

In one embodiment, the at least one laser source 6112 is a red laser source with a wavelength ranging from 600 to 850 nm. In one embodiment, the laser source 6112 has an emission peak at about 620 nm. In one embodiment, the laser source 6112 has an emission peak at about 800 nm. In one embodiment, the laser source 6112 has an emission peak at about 850 nm.

According to one embodiment, the intensity of primary light exciting the color conversion layer 73 may be controlled by the intensity of the at least one laser source 6112 or by the presence of a color filter between the laser source and the directing optical system 6143 or between the directing optical system 6143 and the color conversion layer 73 or beyond the color conversion layer 73.

According to one embodiment, the intensity of primary light exciting the color conversion layer 73 may be controlled by the intensity of the at least one laser source 6112, by the pulsation frequency of the at least one laser source 6112, or by the presence of an optical attenuator.

According to one embodiment, the color conversion layer 73 comprises an array of pixels.

According to one embodiment, the pixels are as described hereabove.

According to one embodiment, the color conversion layer 73 comprises an array of pixels and each pixel comprises at least one sub-pixel.

According to one embodiment, the sub-pixel is as described hereabove.

According to one embodiment illustrated in FIG. 23, the display apparatus 61 comprises a color conversion layer 73 comprising an array of pixels, wherein each pixel comprises at least one sub-pixels, wherein each sub-pixel comprises at least one light emitting material 7 or is free of light emitting material. The display apparatus 61 further comprises a glass substrate 6121. The display apparatus 61 further comprises a laser source 6112, which produces a laser-ray as primary light which is pointed towards a directing optical system 6143. Said system 6143 redirects the laser-ray in the direction of pixels or sub-pixels. The directing optical system 6143 is configured to allow the primary light to be directed towards or to scan pixels or sub-pixels and to provide an illumination and/or an excitation for said pixels or sub-pixels. At least one secondary light is emitted through a sub-pixel when the primary light illuminates and/or excites the at least one light emitting material 7 comprised in said sub-pixel, while the primary light is transmitted through a sub-pixel without emission of a secondary light when said sub-pixel is free of light emitting material 7 and is illuminated by said primary light. The possible laser paths 61121 are illustrated on FIG. 23.

According to one embodiment, the directing optical system 6143 is configured to allow the primary light to be directed towards or to scan all the pixels or sub-pixels, a selection of pixels or sub-pixels, or none pixel or sub-pixel of the apparatus, allowing to produce different pictures when the resulting light is projected onto a screen. In this embodiment, some of the pixels or sub-pixels may be illuminated and some of the pixels or sub-pixels may not be illuminated so that images can be created and displayed.

According to one embodiment, the primary light scans pixels or sub-pixels fast enough to produce pictures visible for the human eye when the resulting light is projected onto a screen.

According to one embodiment, the resulting light projected onto a screen may form at least one image on said screen, and/or a succession of images, and/or a video.

According to one embodiment, the change of selection of pixels or sub-pixels on which the primary light is directed or scanned is fast enough to produce a serie of pictures which could be seen like a fluid video for the human eye when the resulting light is projected onto a screen. Typically, the change frequency of selection of pixels or sub-pixels on which the primary light is directed or scanned is at least of 24 Hz multiplied by the number of pixels or sub-pixels.

In another aspect, the invention further relates to a display apparatus 61, illustrated in FIG. 13, comprising at least one color conversion layer 73 deposited onto a solid support 6123 to produce images by reflection or backscattering when excited by the laser source 6112.

In one embodiment, the color conversion layer 73 and/or the light emitting material 7 is deposited onto the solid support by drop-casting, spin coating, dip coating, inkjet printing, lithography, spray, plating, electroplating, or any other means known by the person skilled in the art.

In one embodiment, the display apparatus 61 further comprises at least one laser source 6112 as described hereabove.

In one embodiment, the at least one laser source 6112 is a blue laser source or a UV laser source as described hereabove.

In one embodiment, the at least one laser source 6112 is configured to illuminate and/or excite the light emitting material 7 allowing said light emitting material 7 to emit at least one secondary light.

In one embodiment, the solid support 6123 comprises at least one empty zone or at least one optically transparent zone, at least one zone comprising at least one light emitting material 7 configured to emit a secondary red-light and at least one zone comprising at least one color conversion layer 73 configured to emit a secondary green-light.

In one embodiment, the laser source 6112 emits a primary blue light and the solid support 6123 comprises at least one zone free of light emitting material, at least one zone comprising at least one light emitting material 7 configured to emit a secondary red-light and at least one zone comprising at least one light emitting material 7 configured to emit a secondary green-light.

In one embodiment, the laser source 6112 emits a primary UV light and the solid support 6123 comprises at least one zone comprising at least one light emitting material 7 configured to emit a secondary blue-light, at least one zone comprising at least one light emitting material 7 configured to emit a secondary red-light and at least one zone comprising at least one light emitting material 7 configured to emit a secondary green-light.

According to one embodiment, the display apparatus comprises at least one cut-on filter layer. In this embodiment, said layer is a global cut-on filter, a local cut-on filter, or a mixture thereof. This embodiment is particularly advantageous as said cut-on filter layer prevents the excitation of the particles of the invention comprised in the ink by ambient light. A local cut-on filter blocks only a particular part of the optical spectrum. A local cut-on filter which blocks only this particular part of the optical spectrum can, in conjunction with a global cut-on filter, eliminate (or significantly reduce) the excitation of the particles of the invention by ambient light.

According to one embodiment, the cut-on filter layer is a resin that can filter blue light.

According to one embodiment, the cut-on filter layer comprises at least one organic material, such as at least one organic polymer as described herein, preferably said cut-on filter layer is configured to filter blue light.

According to one embodiment, the color conversion layer 73 comprises an array of pixels.

According to one embodiment, the color conversion layer 73 comprises an array of pixels and each pixel comprises at least one light emitting material 7.

According to one embodiment, the color conversion layer 73 comprises an array of pixels and each pixel comprises an array of light emitting material 7.

According to one embodiment, the pixel pitch D is as describes hereabove.

According to one embodiment, the pixel size is as describes hereabove.

According to one embodiment, the color conversion layer 73 comprises an array of pixels and each pixel comprises at least one sub-pixel.

According to one embodiment, the at least one sub-pixel comprises at least one light emitting material 7.

According to one embodiment, the at least one sub-pixel is free of light emitting material 7.

According to one embodiment, the sub-pixel pitch d is as describes hereabove.

According to one embodiment, the sub-pixel size is as describes hereabove.

According to one embodiment, the pixels are configured to emit a resulting monochromatic light or a polychromatic light. For example, the pixels may emit a mixture of a blue, green and red lights.

According to one embodiment, the sub-pixels are configured to emit a resulting monochromatic light or a polychromatic light. For example, the sub-pixels may emit a blue light, a green light or a red light.

According to one embodiment, the display apparatus 61 further comprises a directing optical system 6143 as described hereabove.

In one embodiment, the light emitted from at least one laser source 6112 is directed to the optical system 6143 as described hereabove.

In one embodiment, the display apparatus 61 further comprises a reflecting screen.

In one embodiment, the display apparatus 61 further comprises an optically transparent screen.

In one embodiment, the solid support 6123 is a reflecting solid support, preferably the solid support 6123 is a reflecting screen.

In one embodiment, the solid support 6123 is an optically transparent material.

In one embodiment, the solid support 6123 comprises a material configured to reflect the light emitted from the laser source 6112 and/or the light emitted from the color conversion layer 73 and/or the light emitting material 7. In this embodiment, the resulting light is partially or totally reflected by said material.

In one embodiment, the solid support 6123 comprises a material configured to backscatter the light emitted from the laser source 6112 and/or the light emitted from the color conversion layer 73 and/or the light emitting material 7. In this embodiment, a portion of the resulting light may be transmitted and a portion of the resulting light is reflected, scattered or backscattered by said material. Preferably, the amount of transmitted light is lower than the amount of reflected, scattered or backscattered light.

In one embodiment, examples of material configured to backscatter light include but are not limited to: $Al_2O_3$, $SiO_2$, MgO, ZnO, $ZrO_2$, $IrO_2$, $SnO_2$, $TiO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, $Y_2O_3$ nanoparticles, or a mixture thereof.

In one embodiment, the at least one laser source 6112 is configured to scan the color conversion layer 73 and/or the solid support 6123 while selecting the sub-pixels to illuminate and/or excite, thus creating an image.

Therefore, in one embodiment, illustrated in FIG. 24A-B, the display apparatus 61 comprises a color conversion layer 73 deposited onto a solid support 6123 and comprising an array of pixels, wherein each pixel comprises at least one sub-pixels, wherein each sub-pixel comprises at least one light emitting material 7 or is free of light emitting material. The display apparatus 61 further comprises a laser source 6112 which is configured to allow the primary light to be directed towards or to scan pixels or sub-pixels and to provide an illumination and/or an excitation for said pixels or sub-pixels. At least one secondary light is emitted through a sub-pixel when the primary light illuminates and/or excites the at least one light emitting material 7 comprised in said sub-pixel, while the primary light is transmitted through a sub-pixel without emission of a secondary light when said sub-pixel is free of light emitting material 7 and is illuminated by said primary light. The resulting light is reflected or backscattered by the solid support 6123 and can produce a clear picture for a normal human eye by itself or when it is projected onto a screen. The possible laser paths 61122 and 61111 are illustrated on FIG. 24A-B.

According to one embodiment, the resulting light projected onto a screen may form at least one image on said screen, or a succession of images, or a video.

According to one embodiment, the change of selection of pixels or sub-pixels on which the primary light is directed or scanned is fast enough to produce a serie of pictures which could be seen like a fluid video for the human eye when the resulting light is projected onto a screen. Typically, the change frequency of selection of pixels or sub-pixels on which the primary light is directed or scanned is at least of 24 Hz multiplied by the number of pixels or sub-pixels.

According to one embodiment, every display apparatus 61 described in the present specification may further comprise an optical enhancement film 6142 above the light emitting material 7 as illustrated in FIG. 20 and/or comprise a glass substrate 6121 on or under the at least one color conversion layer 73 in order to protect the light emitting material 7 as illustrated on FIG. 21, and/or comprise a screen located such that the picture produced by the apparatus is clear for a normal human eye.

In one embodiment, the optical enhancement film 6142 is a reflector, a scattering element, a light guide, a polarizer or a color filter.

In one embodiment, the color filter is a color filter well known from the skilled person.

In one embodiment, the color filter comprises at least one color conversion layer 73 of the invention.

While various embodiments have been described and illustrated, the detailed description is not to be construed as being limited hereto. Various modifications can be made to the embodiments by those skilled in the art without departing from the true spirit and scope of the disclosure as defined by the claims.

In another aspect, the invention relates to an illumination source 62 comprising at least one light source 6111 and at least one color conversion layer 73 of the invention.

The illumination source may permit to emit a light in the direction of at least one color filter of a display apparatus.

According to one embodiment, the light emitted by the illumination source 62 is monochromatic.

According to one embodiment, the illumination source 62 may comprise a plurality of color conversion layers 73 in order to emit several lights or a polychromatic light. In this embodiment, the color conversion layers 73 may be stacked, i.e. each conversion layer 73 may be on top of another color conversion layer 73. One color conversion layer 73 can be identical or different from the next color conversion layer 73.

In one embodiment, the illumination source 62 produces a light with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90

W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment illustrated FIG. 26, the illumination source 62 comprises a color conversion layer 73 and a light source 6111, and the color conversion layer 73 having a shape of a film is in contact with the light source 6111. The light source 6111 excites the color conversion layer 73 which emits a light at one specific wavelength or at different wavelengths.

According to one embodiment, the at least one color conversion layer 73 may be a film deposited on the light source 6111.

In one embodiment, the color conversion layer 73 is deposited onto the light source 6111 by drop-casting, spin coating, dip coating, inkjet printing, lithography, spray, plating, electroplating, or any other means known by the person skilled in the art.

According to one embodiment, the at least one color conversion layer 73 is deposited on the light source 6111, and the at least one color conversion layer 73 is in contact with said light source 6111.

According to one embodiment, the at least one color conversion layer 73 is deposited on the light source 6111, and the at least one color conversion layer 73 is not in contact with said light source 6111.

According to one embodiment, the illumination source 62 comprises a light guide 621.

According to one embodiment, the at least one color conversion layer 73 is located between the light source 6111 and said light guide 621.

According to one embodiment, the at least one color conversion layer 73 is deposited on the light guide 621, and the at least one color conversion layer 73 is in contact with said light guide 621.

According to one embodiment, the at least one color conversion layer 73 is deposited on the light guide 621, and the at least one color conversion layer 73 is not in contact with said light guide 621.

According to one embodiment, the light guide 621 distributes the light towards the color conversion layer 73.

According to one embodiment illustrated on FIG. 27, the color conversion layer 73 comprises an array of pixels, the light source 6111 comprises an array of light source pixels, and each pixel is illuminated and/or excited by at least one light source pixel of the light source 6111.

In one embodiment, each light source 6111 of the array of light sources 6111 is configured to illuminate and/or excite at least one sub-pixel.

According to one embodiment, the color conversion layer 73 comprises an array of pixels, each pixel comprising 3 sub-pixels. The 3 sub-pixels are: i) free of light emitting material 7, red sub-pixel and green sub-pixel both comprising at least one light emitting material 7, when the light source 6111 emits blue light; or ii) blue sub-pixel, red sub-pixel and green sub-pixel all comprising at least one light emitting material, when the light source 6111 emits UV light.

According to one embodiment illustrated on FIG. 28, each pixel of the color conversion layer 73 is illuminated and/or excited by at least two light source pixels of the light source 6111, or by at least 3, 4, 5, 6, 7, 8, 9, 10, 11, 12, 13, 14, 15, 16, 17, 18, 19, 20, 21, 22, 23, 24, 25, 26, 27, 28, 29, 30, 40, 50, 60, 70, 80, 90, 100, 200, 300, 400, 500, 600, 700, 800, 900, 1000, 1500, 2000, 3500, 4000, 4500, 5000, 5500, 6000, 6500, 7000, 7500, 8000, 8500, 9000, 9500 or by at least 10000 light source pixels of the light source 6111.

According to one embodiment illustrated on FIG. 29, each light source pixel of the light source 6111 is able to illuminate and/or excite several pixels of the color conversion layer 73.

According to one embodiment, each light source pixel of the light source 6111 is able to illuminate and/or excite at least 2, 3, 4, 5, 6, 7, 8, 9, 10, 11, 12, 13, 14, 15, 16, 17, 18, 19, 20, 21, 22, 23, 24, 25, 26, 27, 28, 29, 30, 40, 50, 60, 70, 80, 90, 100, 200, 300, 400, 500, 600, 700, 800, 900, 1000, 1500, 2000, 3500, 4000, 4500, 5000, 5500, 6000, 6500, 7000, 7500, 8000, 8500, 9000, 9500 or by at least 10000 pixels of the color conversion layer 73.

As illustrated FIG. 30, FIG. 31 or FIG. 32, the illumination source 62 may be a backlight unit. In FIG. 30 and FIG. 31, the illumination source 62 comprises a space 622 between the light source 6111 and the light guide 621 that may be partially or completely void, an optically transparent substrate, or filled with gas such as for example air.

According to one embodiment, the illumination source 62 comprises a reflector 623.

According to one embodiment illustrated on FIG. 30, the light source 6111 illuminates a reflector 623 which redirects the light to the surface of the color conversion layer 73.

According to one embodiment, a light guide 621 may be added between the light source 6111 and the reflector 623 and/or between the reflector 623 and the color conversion layer 73 in order to improve the wave propagation by multiple reflections.

According to one embodiment illustrated on FIG. 31 and FIG. 32, the color conversion layer 73 is placed between the light source 6111 and the reflector 623. In said embodiment, the reflector 623 changes the direction of the light emitted by the color conversion layer 73, for example to a color display of an associated display apparatus.

According to one embodiment, the color conversion layer 73 is placed between the light source 6111 and the light guide 621.

According to one embodiment illustrated on FIG. 32, the color conversion layer 73 is deposited on the light source 6111.

In one embodiment, the color conversion layer 73 comprises a material configured to scatter the resulting light from said color conversion layer 73.

In one embodiment, examples of material configured to scatter the resulting light include but are not limited to: $Al_2O_3$, $SiO_2$, MgO, ZnO, $ZrO_2$, $IrO_2$, $SnO_2$, $TiO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, $Y_2O_3$ particles, or a mixture thereof.

In another aspect, the present invention further relates to a display apparatus comprising an illumination source 62 as described hereabove.

FIG. 33 illustrates a display apparatus 61 comprising an illumination source 62 as described hereabove comprising a light source 6111 and at least one color conversion layer 73.

According to one embodiment, the display apparatus 61 further comprises at least one color filter 625 on a substrate 624.

According to one embodiment, the display apparatus 61 further comprises a color filter layer 625 on a substrate 624.

According to one embodiment, the display apparatus 61 comprises at least one layer of activation between the illumination source 62 and the at least one color filter 625.

According to one embodiment, the at least one layer of activation comprises a layer of liquid crystal material 6131 and/or an active matrix 6132, preferably an active thin-film-transistor matrix.

According to one embodiment, the display apparatus 61 may comprise a layer of active matrix 6132 such as a layer of liquid crystal material 6131 and at least one color filter 625.

According to one embodiment, the at least one color filter 625 is preferably fixed to a substrate 624.

According to one embodiment, the illumination source 62 is configured to provide light and an excitation to the at least one color filter 625.

In one embodiment, the at least one color filter 625 is a conventional color filter which is well-known by the skilled person.

In one embodiment, the at least one color filter 625 comprises at least one color conversion layer 73 of the invention.

In one embodiment, the at least one color filter 625 comprises at least one light emitting material 7 of the invention.

According to one embodiment, the display apparatus 61 comprises a plurality of color filters 625.

According to one embodiment, the plurality of color filters 625 are comprised in a plurality of pixels or a plurality of sub-pixels.

According to one embodiment, the display apparatus 61 may also comprise at least one polarizer 6141 and an additional light guide 621 between the illumination source 62 and the at least one layer of activation.

FIG. 34A and FIG. 34B illustrate another display apparatus 61 according to one embodiment of the present invention wherein the illumination source 62 comprises a light source 6111, at least one color conversion layer 73, a light guide 621 and a reflector 623. In FIG. 34A, the illumination source 62 comprises a space 622 between the light source 6111 and the color conversion layer 73. In FIG. 34B, the illumination source 62 comprises the light source 6111 coated by the color conversion layer 73.

FIG. 35 illustrates another display apparatus 61 according to one embodiment of the present invention wherein the illumination source 62 comprises a light source 6111, a color conversion layer 73, a light guide 621 and a reflector 623 reflecting the light from the light source 6111 to the color conversion layer 73. In FIG. 35, the light guide 621 is between the light source 6111 and the color conversion layer 73.

FIG. 36 illustrates a display apparatus 61 using such a conversion layer 73. Said display apparatus 61 comprises a glass substrate 6121, a color conversion layer 73 comprising an array of pixels, wherein each pixel comprises at least one sub-pixels, wherein each sub-pixel comprises at least one light emitting material 7 or is free of light emitting material. Said display apparatus 61 comprises an array of light sources 6111 for which each light source 6111 and each sub-pixel are associated two by two and, when activated, each light source 6111 is configured to illuminate and/or excite said one sub-pixel. At least one secondary light is emitted through a sub-pixel when the primary light from the associated light source 6111 illuminates and/or excites the at least one light emitting material 7 comprised in said sub-pixel, while the primary light is transmitted through a sub-pixel without emission of a secondary light when said sub-pixel is free of light emitting material 7 and is illuminated by said primary light from the associated light source 6111. In this embodiment, the display apparatus 61 comprises an active matrix 6132 (preferably an active TFT matrix) in order to activate each light source sub-pixel. The active matrix 6132 may comprise at least one transistor and at least one capacitor per sub-pixel.

According to one embodiment, the color conversion layer 73 comprises an array of pixels. Said embodiment avoids the illumination of the entire surface of the color conversion layer 73 saving energy.

In another aspect, illustrated on FIG. 37, the present invention further relates to a display apparatus 61 comprising at least one light source 6111 and a rotating wheel 63 comprising at least one color conversion layer 73 according to the present invention, wherein said at least one light source 6111 is configured to provide an illumination and/or an excitation for the at least one color conversion layer 73. The light of the light source 631 meet the rotating wheel 63 comprising the at least one color conversion layer 73. The at least one color conversion layer 73 comprises several zones including at least one zone comprising at least one light emitting material 7 or including at least two zones each comprising at least one light emitting material 7 able to emit secondary lights at different wavelengths. At least one zone may be free of at least one light emitting material 7, empty or optically transparent in order to permit the primary light to be transmitted through the rotating wheel 63 without emission of any secondary light.

In one embodiment, the light source 6111 is a laser source.

In one embodiment, the laser source is a blue laser source with a wavelength ranging from 400 nm to 470 nm. In one embodiment, the laser source has an emission peak at about 405 nm. In one embodiment, the laser source has an emission peak at about 447 nm. In one embodiment, the laser source has an emission peak at about 455 nm.

In one embodiment, the laser source is a UV laser source with a wavelength ranging from 200 nm to 400 nm. In one embodiment, the laser source has an emission peak at about 253 nm. In one embodiment, the laser source has an emission peak at about 365 nm. In one embodiment, the laser source has an emission peak at about 395 nm.

According to one embodiment, the laser source emits a blue-light or an UV-light and the rotating wheel 63 comprises at least one zone free of light emitting material 7, empty or optically transparent, at least one zone comprising at least one light emitting material 7 configured to emit red-light and at least one zone comprising at least one light emitting material 7 configured to emit green-light.

According to one embodiment, the laser source emits an UV-light and the rotating wheel 63 comprises at least one zone free of light emitting material 7, empty or optically transparent, at least one zone comprising at least one light emitting material 7 configured to emit red-light, at least one zone comprising at least one light emitting material 7 configured to emit green-light, at least one zone comprising at least one light emitting material 7 configured to emit orange-light, at least one zone comprising at least one light emitting material 7 configured to emit yellow-light, at least one zone comprising at least one light emitting material 7 configured to emit blue-light, and at least one zone comprising at least one light emitting material 7 configured to emit purple-light.

According to one embodiment, the light emitting material 7 emits red light with a maximum emission wavelength between 610 nm and 2500 nm, more preferably between 610 nm and 660 nm.

According to one embodiment, the light emitting material 7 emits green light with a maximum emission wavelength between 500 nm and 565 nm, more preferably between 510 nm and 545 nm.

According to one embodiment, the light emitting material 7 emits orange light with a maximum emission wavelength between 586 nm and 609 nm, more preferably between 590 nm and 605 nm.

According to one embodiment, the light emitting material 7 emits yellow light with a maximum emission wavelength between 566 nm and 585 nm, more preferably between 570 nm and 585 nm.

According to one embodiment, the light emitting material 7 emits blue light with a maximum emission wavelength between 440 nm and 499 nm, more preferably between 450 nm and 490 nm.

According to one embodiment, the light emitting material 7 emits purple light with a maximum emission wavelength between 380 nm and 439 nm, more preferably between 410 nm and 439 nm.

According to one embodiment, the rotating wheel 63 has a shape of a disk, a ring, a square, a rectangle, a pentagon, a hexagon, a heptagon, a star or a triangle.

According to one embodiment, the center of mass of the rotating wheel 63 is at a distance of less than 100 cm, 90 cm, 80 cm, 70 cm, 60 cm, 50 cm, 40 cm, 30 cm, 20 cm, 10 cm, 5 cm, 1 cm, 9 mm, 8 mm, 7 mm, 6 mm, 5 mm, 4 mm, 3 mm, 2, or 1 mm to the farthest point in relation to said center of mass of the rotating wheel 63.

According to one embodiment, the rotating wheel 63 has a rough surface, for example, has a surface roughness value ranging from 10 nm to 300 nm.

According to one embodiment illustrated in FIG. 41A-B, the color conversion layer 73 forms a ring, or a ribbon centered around the center of the rotating wheel 63.

FIG. 41A-B illustrate a plane configuration of the rotating wheel 63. Said rotating wheel 63 comprises a reflective layer and a color conversion layer 73 that may be laminated in order on the surface of a thin plate having a circular planar shape.

According to one embodiment, the rotating wheel 63 comprises an opening at the center of the circular plate.

According to one embodiment, the color conversion layer 73 has a thickness ranging from 0 μm to 1 cm, from 10 μm to 1 mm or from 100 μm to 1000 μm.

According to one embodiment, the color conversion layer 73 has a rough surface, for example, has a surface roughness value ranging from 10 nm to 2000 nm, 50 nm to 1500 nm, 100 nm to 1000 nm, or 150 nm to 500 nm.

According to one embodiment, the color conversion layer 73 has a homogeneous thickness. In this embodiment, the thickness of the color conversion layer 73 does not vary and is the same all along said color conversion layer 73.

According to one embodiment, the color conversion layer 73 has a heterogeneous thickness. In this embodiment, the thickness of the color conversion layer 73 may vary and may be different in different zones of said color conversion layer 73.

According to one embodiment, the rotating wheel 63 has a thickness ranging from 100 μm and 1 cm.

According to one embodiment, the rotating wheel 63 and the color conversion layer 73 have a difference of refractive index lower than 1, lower than 0.8, lower than 0.6, lower than 0.4, lower than 0.2, lower than 0.1, lower than 0.08, lower than 0.06, lower than 0.04, lower than 0.02, lower than 0.01, lower than 0.005, lower than 0.001 or equal to 0 at 450 nm.

According to one embodiment, the rotating wheel 63 has a thermal conductivity a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1.0 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3.0 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4.0 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5.0 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6.0 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7.0 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8.0 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9.0 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10.0 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11.0 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12.0 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13.0 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14.0 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15.0 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16.0 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17.0 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18.0 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19.0 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20.0 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21.0 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22.0 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23.0 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24.0 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25.0 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110

W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K). In this embodiment, the rotating wheel 63 can evacuate the heat from the color conversion layer 73.

According to one embodiment, the rotating wheel 63 is a multi-layer material.

According to one embodiment, the multi-layer material is polymeric, as described hereabove.

According to one embodiment, the multi-layer material comprises an organic material and/or a polymer as described hereabove.

According to one embodiment, the multi-layer material is inorganic, as described hereabove.

According to one embodiment, the multi-layer material comprises an inorganic material as described hereabove.

According to another embodiment, the multi-layer material is a composite material comprising at least one inorganic material and at least one polymeric material, each being as described hereabove.

According to another embodiment, the multi-layer material is a mixture of at least one inorganic material and at least one polymeric material, each being as described hereabove.

According to one embodiment, the color conversion layer 73 is coated onto the surface of the rotating wheel 63 for example by drop-casting, spin coating, dip coating, inkjet printing, lithography, spray, plating, electroplating, or any other means known by the person skilled in the art.

According to one embodiment, the rotating wheel 63 is optically transparent. In this embodiment, the rotating wheel 63 is configured to work in a transmission mode.

According to one embodiment, the rotating wheel 63 comprises an optically transparent material allowing to transmit the light. In this embodiment, the rotating wheel 63 is configured to work in a transmission mode.

According to one embodiment, the rotating wheel 63 comprises a material allowing to reflect the light such as for example a metal like aluminium and silver, a glass, a polymer or a plastic. In this embodiment, the rotating wheel 63 is configured to work in a reflective mode.

According to one embodiment, the rotating wheel 63 is configured to work in a transmission mode. In such a mode, the rotating wheel 63 transmits at least 50%, 60%, 70%, 80%, 85%, 90%, 95%, or 100% of the primary light, of the secondary light and/or of the resulting light. In this embodiment, said transmitted light is generally directed towards other components of a device to create and display pictures.

According to one embodiment, the rotating wheel 63 is configured to work in a reflective mode. In such a mode, the rotating wheel 63 reflects at least 50%, 60%, 70%, 80%, 85%, 90%, 95%, or 100% of the primary light, of the secondary light and/or of the resulting light. In this embodiment, said reflected light is generally directed towards other components of a device to create and display pictures.

According to one embodiment, the light reflected by the rotating wheel 63 is reflected in another direction than the direction of the incident light.

According to one embodiment, the angle between the direction of the incident light and the direction of the light reflected by the rotating wheel 63 is at least 1°, 2°, 3°, 4°, 5°, 6°, 7°, 8°, 9°, 10°, 11°, 12°, 13°, 14°, 15°, 16°, 17°, 18°, 19°, 20°, 21°, 22°, 23°, 24°, 25°, 26°, 27°, 28°, 29°, 30°, 31°, 32°, 33°, 34°, 35°, 36°, 37°, 38°, 39°, 40°, 41°, 42°, 43°, 44°, 45°, 46°, 47°, 48°, 49°, 50°, 51°, 52°, 53°, 54°, 55°, 56°, 57°, 58°, 59°, 60°, 61°, 62°, 63°, 64°, 65°, 66°, 67°, 68°, 69°, 70°, 71°, 72°, 73°, 74°, 75°, 76°, 77°, 78°, 79°, 80°, 81°, 82°, 83°, 84°, 85°, 86°, 87°, 88°, 89°, 90°, 91°, 92°, 93°, 94°, 95°, 96°, 97°, 98°, 99°, 100°, 101°, 102°, 103°, 104°, 105°, 106°, 107°, 108°, 109°, 110°, 111°, 112°, 113°, 114°, 115°, 116°, 117°, 118°, 119°, 120°, 121°, 122°, 123°, 124°, 125°, 126°, 127°, 128°, 129°, 130°, 131°, 132°, 133°, 134°, 135°, 136°, 137°, 138°, 139°, 140°, 141°, 142°, 143°, 144°, 145°, 146°, 147°, 148°, 149°, 150°, 151°, 152°, 153°, 154°, 155°, 156°, 157°, 158°, 159°, 160°, 161°, 162°, 163°, 164°, 165°, 166°, 167°, 168°, 169°, 170°, 171°, 172°, 173°, 174°, 175°, 176°, 177°, 178°, 179° or 180°.

According to one embodiment, the rotation of the wheel 63 may be electronically controlled to select a zone of the rotating wheel 63 to be illuminated and/or excited by the primary light from the light source 6111.

According to one embodiment, the rotation of the wheel 63 may be electronically controlled to be a continuous rotation, such that the primary light from the light source 6111 illuminates and/or excites successively the at least one zone of said rotating wheel 63 at a constant rotation speed.

According to one embodiment, the rotating wheel 63 is connected to a motor configured to turn the wheel 63 around its center of mass at a speed ranging from 50 to 10 000 000 turns per second.

According to one embodiment, the rotating wheel 63 is connected to a motor configured to turn the wheel 63 around its center of mass at a speed ranging of at least 50, 60, 70, 80, 90, 100, 200, 300, 400, 500, 600, 700, 800, 900, 1000, 2000, 3000, 4000, 5000, 6000, 7000, 8000, 9000, 10 000, 20 000, 30 000, 40 000, 50 000, 60 000, 70 000, 80 000, 90 000, 100 000, 200 000, 300 000, 400 000, 500 000, 600 000, 700 000, 800 000, 900 000, 1 000 000, 2 000 000, 3 000 000, 4 000 000, 5 000 000, 6 000 000, 7 000 000, 8 000 000, 9 000 000, or 10 000 000 turns per second.

According to one embodiment illustrated in FIG. 37 an FIG. 42B, the rotating wheel 63 is configured to work in a transmission mode as described hereabove. If the at least one zone of the rotating wheel 63 is illuminated and/or excited by a primary light from the light source 6111 and includes at least one light emitting material 7, a secondary light is emitted and transmitted through the rotating wheel 63. If the at least one zone of the rotating wheel 63 is illuminated by a primary light from the light source 6111 and is free of light emitting material 7 or includes an optically transparent material or is empty, the primary light is transmitted through the rotating wheel 63 without any emission of secondary light. The intensity of each colored light may be controlled by the frequency or the number of the pulsation laser, leading to different pictures after each complete rotation of the rotating wheel 63. In this embodiment, the rotating wheel 63 preferably comprises a color conversion layer comprising: at least one zone comprising a light emitting material 7 emitting red secondary light; at least one zone comprising a light emitting material 7 emitting green secondary light; and at least one zone free of light emitting material 7, so that said zone transmits the primary light, preferably a blue primary light.

According to one embodiment illustrated in FIG. 39 and FIG. 42A, the rotating wheel 63 is configured to work in a reflective mode as described hereabove. If the at least one zone of the rotating wheel 63 is illuminated and/or excited by a primary light from the light source 6111 and includes at least one light emitting material 7, a secondary light is emitted and reflected by the rotating wheel 63. If the at least one zone of the rotating wheel 63 is illuminated by a primary light from the light source 6111 and is free of light emitting material 7 or includes an optically transparent material or is empty, the primary light is reflected by the rotating wheel 63. The intensity of each colored light may be controlled by the frequency or the number of the pulsation laser, leading to different pictures after each complete rotation of the rotating wheel 63.

According to one embodiment, illustrated in FIG. 38, the display apparatus 61 further comprises at least one wavelength splitter system 6391, at least one wavelength combiner system 6392 and/or at least one mirror 6384. The resulting light may be guided towards different directions depending on their color or wavelength, for example with a wavelength splitter system 6391, and then recombinate with a wavelength combiner system 6392 after being reflected by mirrors 6384 or refracted by other wavelength splitter systems 6391, allowing to control the optical path length of each colored light. The intensity of each colored light may be controlled by the frequency or the number of the pulsation laser before the recombination of said colored lights, leading to different pictures after each complete rotation of the rotating wheel 63.

According to one embodiment, the display apparatus 61 comprises color filters.

According to one embodiment, the display apparatus 61 comprises an optical component 634 which permits to focalize the light produced by the rotating wheel 63 comprising the color conversion layer 73 such as an optical lens or a succession of optical lenses.

According to one embodiment, the display apparatus 61 further comprises a modulating optical system 635 such as a digital micromirror device known by the skilled artisan to reflect the light in the direction of a screen 637.

According to one embodiment, the digital micromirror device has on its surface a few or several millions microscopic mirrors 6381 arranged in a rectangular array or a square array which corresponds to the pixels in the image to be displayed. The mirrors may be individually rotated at angles of ±10-12°, corresponding to an ON or OFF states. In the ON state, light from the digital micromirror device is reflected into the optical component 634 making the pixel appears bright on the screen. In the OFF state, the light is directed elsewhere (usually onto a heatsink), making the relative pixel appears dark. To produce greyscale, the mirrors are toggled ON and OFF very quickly, and the ratio of ON time to OFF time determines the shade produced.

According to one embodiment, the angle formed by the resulting light 632 from the rotating wheel 63 and the surface of the modulating optical system 635 is 10°, 15°, 20°, 25°, 30°, 35°, 40°, 45°, 50°, 55°, 60°, 65°, 70°, 75° or 80°.

According to one embodiment, the mirrors of the digital micromirror device may be made of aluminum or silver for example.

According to one embodiment, the display apparatus 61 further comprises at least one color filter between the rotating wheel 63 and the modulating optical system 635.

According to one embodiment, the display apparatus 61 further comprise an electronic system configured to synchronize the rotating wheel 63, the light source 6111 and the modulating optical system 635 in order to display a picture, a succession of pictures or a video on the screen 637.

According to one embodiment, the display apparatus 61 further comprise an electronic system configured to synchronize the rotating wheel 63 and the light source 6111 in order to display a picture, a succession of pictures or a video on the screen 637.

According to one embodiment, the display apparatus 61 further comprises an additional optical component 634 between the digital micromirror device and the screen 637.

Therefore, in one embodiment, the light source 6111 emits a primary light 631 which illuminate and/or excite the color conversion layer 73 of the invention on the rotating wheel 63. The at least one light emitting material 7 comprised in the color conversion layer 73 is excited and emits a secondary light at a different wavelength 632 with respect to the wavelength of the primary light. The resulting light is focalized on the optical component 634 and is reflected by the digital micromirror device. Then, the resulting light passes through a second optical component 634 and the beam of light 636 of the formed image thus illuminates the screen 637.

In another aspect, illustrated on FIG. 40A, the present invention further relates to a display apparatus 61 comprising at least one light source 6111 and a digital micromirror device 638 comprising at least one color conversion layer 73 according to the present invention, wherein said at least one light source 6111 is configured to provide an illumination and/or an excitation for the at least one color conversion layer 73. The primary light supplied by the light source 631 meet the digital micromirror device 638 comprising the at least one color conversion layer 73.

In one embodiment, the light source 6111 is as described hereabove.

In one embodiment, the at least one primary light supplied by the light source 6111 is as described hereabove.

According to one embodiment, the digital micromirror device 638 is known by the skilled artisan.

According to one embodiment, the digital micromirror device 638 has on its surface a few or several millions microscopic mirrors 6381 arranged in a rectangular array or a square array which corresponds to the sub-pixels in the image to be displayed. The mirrors may be individually rotated at angles of ±10-12°, corresponding to ON or OFF states. In the ON state, light from the digital micromirror device is reflected into the optical component 634 making the sub-pixel appear bright on the screen. In the OFF state, the light is directed elsewhere (usually onto a heatsink), making the relative sub-pixel appear dark. To produce greyscale, the mirrors are toggled ON and OFF very quickly, and the ratio of ON time to OFF time determines the shade produced.

According to one embodiment, the digital micromirror device 638 comprises a material allowing to reflect the light such as for example a metal like aluminium and silver, a glass, a polymer or a plastic.

According to one embodiment, the digital micromirror device 638 reflects at least 50%, 60%, 70%, 80%, 85%, 90%, 95%, or 100% of the primary light, the secondary light and/or the resulting light. In this embodiment, said reflected light is generally directed towards other components of a device to create and display pictures.

According to one embodiment, the light reflected by the digital micromirror device 638 is reflected in another direction than the direction of the incident light.

According to one embodiment, the digital micromirror device 638 is configured to reflect the light in the direction of a screen 637.

According to one embodiment, each microscopic mirror of the digital micromirror device 6381 corresponds to one pixel in the image to be displayed.

According to one embodiment, each microscopic mirror of the digital micromirror device 6381 corresponds to one sub-pixel in the image to be displayed.

According to one embodiment, each microscopic mirror of the digital micromirror device 6381 comprises at least one light emitting material 7, which emit a secondary light of only one color or wavelength.

According to one embodiment, each microscopic mirror of the digital micromirror device 6381 comprises at least one light emitting material 7, which emit a secondary light of different colors or wavelengths.

According to one embodiment, some microscopic mirror of the digital micromirror device 6381 comprise at least one light emitting material and some microscopic mirror 6382 are free of light emitting material 7, empty or optically transparent.

According to one embodiment, a microscopic mirror of the digital micromirror device 6382 being free of light emitting material 7, empty or optically transparent permits the primary light to be reflected by said microscopic mirrors 6381 without emission of any secondary light.

According to one embodiment illustrated in FIG. 40B, each pixel in the image to be displayed is formed by at least three sub-pixels: a first one corresponding to a microscopic mirror 6382 free of light emitting material 7, empty or optically transparent, a second one corresponding to a microscopic mirror 6381 comprising a red emitting light emitting material 7, and a third one corresponding to a microscopic mirror 6381 comprising a green emitting light emitting material 7. In this embodiment, monochromatic and polychromatic colors can be obtained for said pixel, depending on the ON and OFF states of said microscopic mirrors 6381. The digital micromirror device 638 comprises microscopic mirrors (6382, 6381) on a support 6383. The microscopic mirror of the digital micromirror device 6381 comprising at least one light emitting material 7, which emit a secondary light of only one color or wavelength, and the microscopic mirror of the digital micromirror device 6382 being free of light emitting material 7 (empty or optically transparent) permits the primary light to be reflected by said microscopic mirrors 6381 without emission of any secondary light. The possible light path from the light source and the possible light paths of secondary light or primary light are referenced as 631 and 632 respectively.

According to one embodiment, each pixel in the image to be displayed is formed by at least three sub-pixels: a first one corresponding to a microscopic mirror 6381 comprising a blue emitting light emitting material 7, empty or optically transparent, a second one corresponding to a microscopic mirror 6381 comprising a red emitting light emitting material 7, and a third one corresponding to a microscopic mirror 6381 comprising a green emitting light emitting material 7. In this embodiment, monochromatic and polychromatic colors can be obtained for said pixel, depending on the ON and OFF states of said microscopic mirrors 6381.

According to one embodiment, the light emitting material 7 has a thickness ranging from 1 μm to 1 cm, from 10 μm to 1 mm or from 100 μm to 1000 μm.

According to one embodiment, the digital micromirror device 638 and the color conversion layer 73 have a difference of refractive index lower than 1, lower than 0.8, lower than 0.6, lower than 0.4, lower than 0.2, lower than 0.1, lower than 0.08, lower than 0.06, lower than 0.04, lower than 0.02, lower than 0.01, lower than 0.005, lower than 0.001 or equal to 0 at 450 nm.

According to one embodiment, the digital micromirror device 638 is a multi-layer material as described hereabove.

According to one embodiment, the color conversion layer 73 is coated onto the surface of the digital micromirror device 638 for example by drop-casting, spin coating, dip coating, inkjet printing, lithography, spray, plating, electroplating, or any other means known by the person skilled in the art.

According to one embodiment, the display apparatus 61 comprises color filters.

According to one embodiment, the display apparatus 61 further comprise an electronic system configured to synchronize the digital micromirror device 638 and the light source 6111 in order to display a picture, a succession of pictures or a video on the screen 637.

According to one embodiment, the display apparatus 61 further comprises an additional optical component 634 between the digital micromirror device and the screen 637.

According to one embodiment, the additional optical component 634 permits to focalize the light produced by the digital micromirror device 638 comprising the color conversion layer 73 such as an optical lens or a succession of optical lenses.

According to one embodiment, the display apparatus 61 further comprises at least one color filter between the digital micromirror device 638 and the additional optical component 634.

Therefore, in one embodiment, the primary light 631 emitted by the light source 6111 through an optical component 634 may illuminate and/or excite the microscopic mirrors of the digital micromirror device 6381, where each microscopic mirror 6381 corresponds to one sub-pixel in the image to be displayed and comprises at least one light emitting material 7 of the color conversion layer 73 of the invention, or is free of light emitting material 7. At least one secondary light is emitted when the primary light excites the at least one light emitting material 7. The resulting light is then reflected onto the surface of said microscopic mirrors 6381, passes through a second optical component 634 and illuminates the screen 637 to form a clear image for a human eye.

While various embodiments have been described and illustrated, the detailed description is not to be construed as being limited hereto. Various modifications can be made to the embodiments by those skilled in the art without departing from the true spirit and scope of the disclosure as defined by the claims.

EXAMPLES

Figure 1:
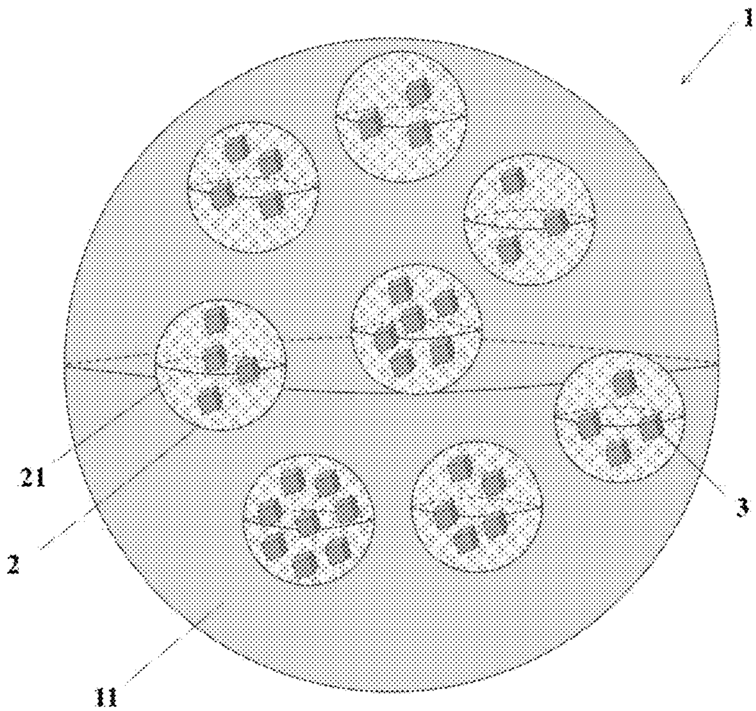
FIG. 1 illustrates a luminescent particle 1 comprising a first material 11 and particles 2; wherein each particle 2 comprises a second material 21 and at least one nanoparticle 3 dispersed in said second material 21.
Figure 2:
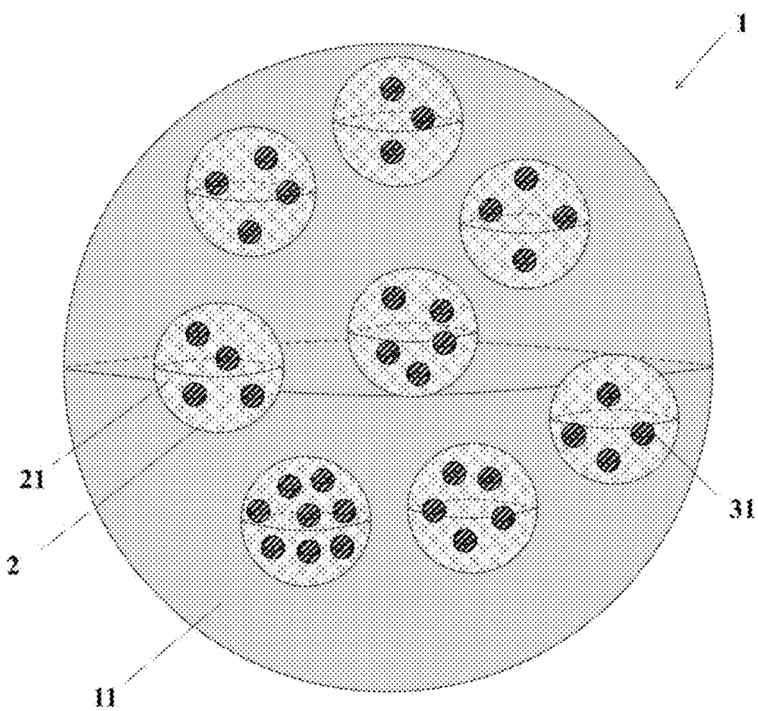
FIG. 2 illustrates a luminescent particle 1 comprising a first material 11 and particles 2; wherein each particle 2 comprises a second material 21 and at least one spherical nanoparticle 31 dispersed in said second material 21.
Figure 3:
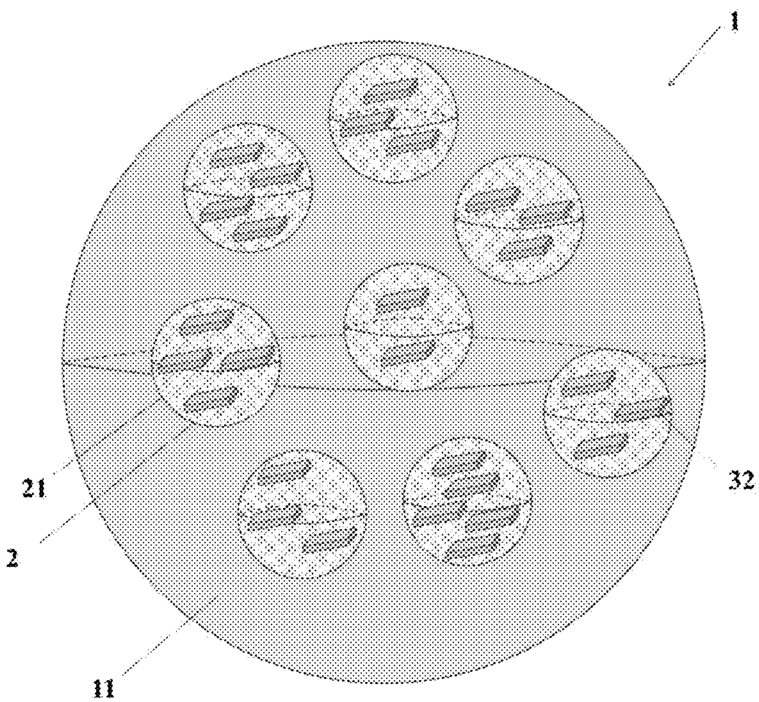
FIG. 3 illustrates a luminescent particle 1 comprising a first material 11 and particles 2; wherein each particle 2 comprises a second material 21 and at least one 2D nanoparticle 32 dispersed in said second material 21.
Figure 4:
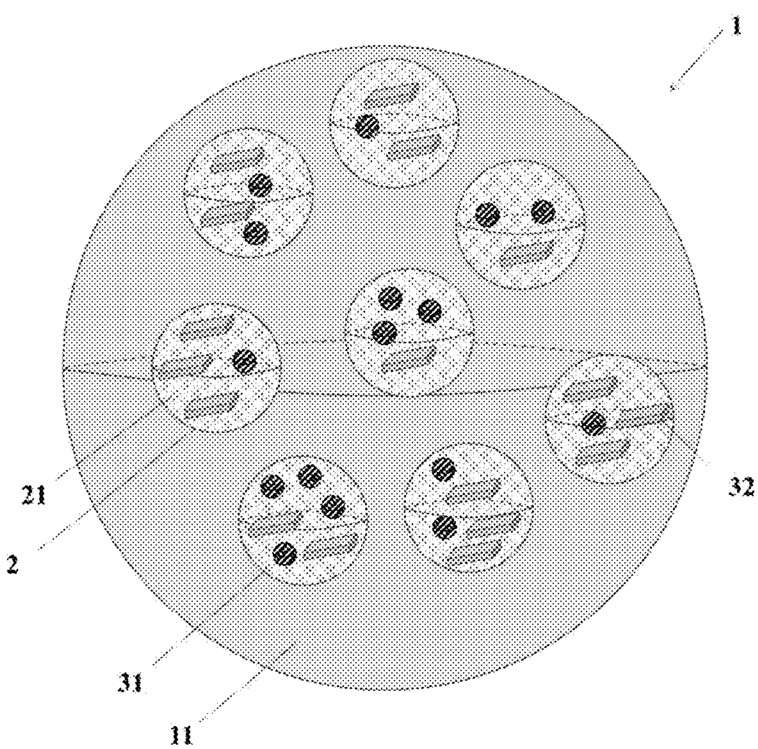
FIG. 4 illustrates a luminescent particle 1 comprising a first material 11 and particles 2; wherein each particle 2 comprises a second material 21, at least one spherical nanoparticle 31 and at least one 2D nanoparticle 32 dispersed in said second material 21.
Figure 5:
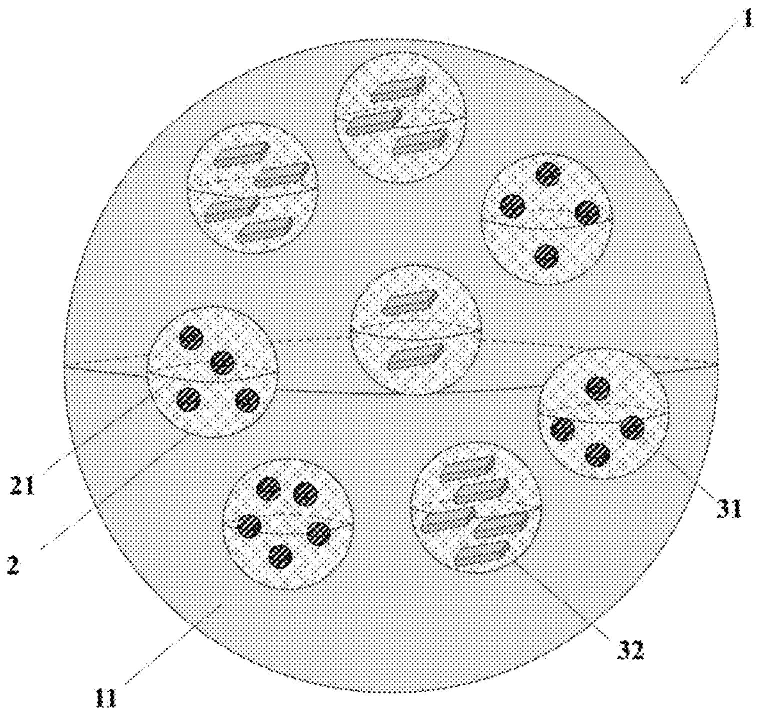
FIG. 5 illustrates a luminescent particle 1 comprising different particles 2.
Figure 6A:
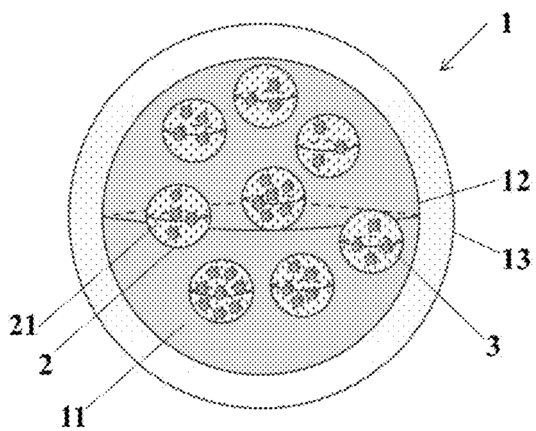
FIG. 6A illustrates a heterostructured luminescent particle 1, wherein the core 12 of the luminescent particle 1 comprises at least one particle 2 and the shell 13 of the luminescent particle 1 does not comprise particles 2.
Figure 6B:
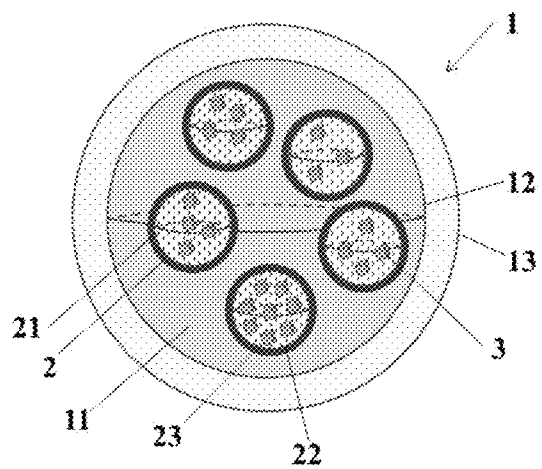
FIG. 6B illustrates a heterostructured luminescent particle 1, wherein the at least one particle 2 is a heterostructure.
Figure 6C:
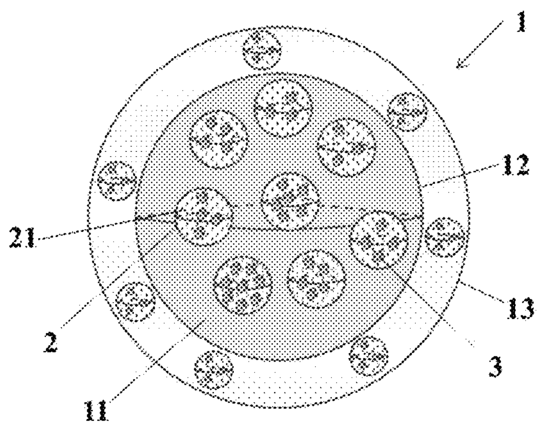
FIG. 6C illustrates a heterostructured luminescent particle 1, wherein the core 12 of the luminescent particle 1 comprises at least one particle 2 and the shell 13 of the luminescent particle 1 comprises at least one particle 2.
Figure 6D:
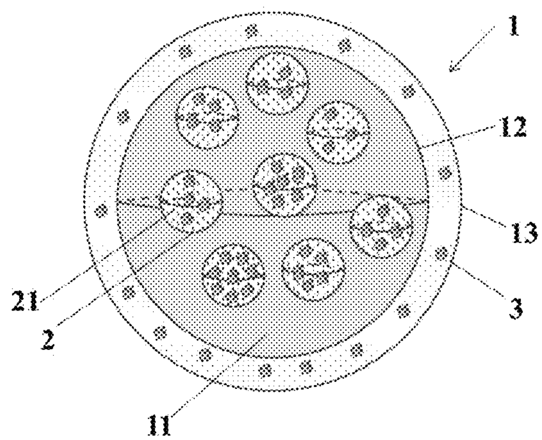
FIG. 6D illustrates a heterostructured luminescent particle 1, wherein the core 12 of the luminescent particle 1 comprises at least one particle 2 and the shell 13 of the luminescent particle 1 comprises at least one nanoparticle 3.
Figure 7A:
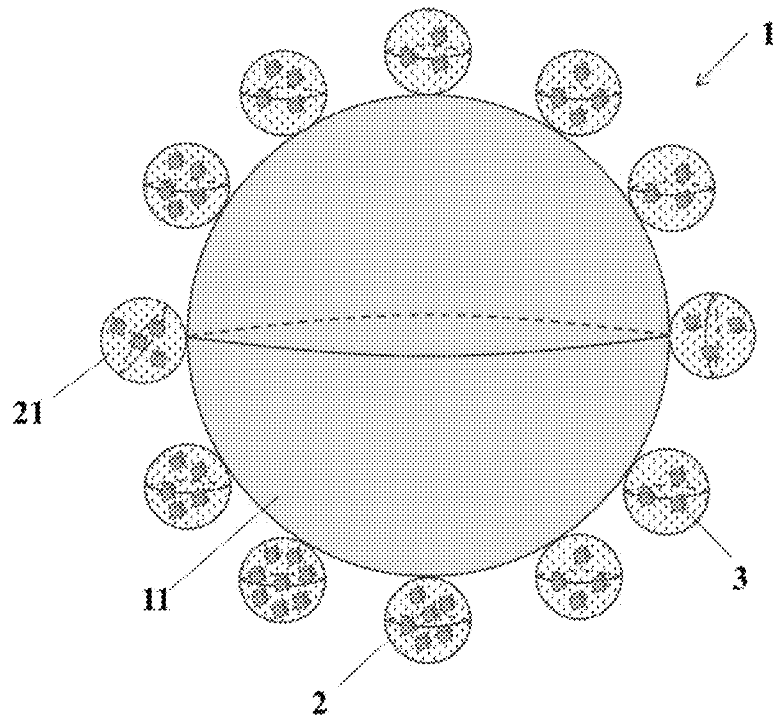
FIG. 7A illustrates a luminescent particle 1 with at least one nanoparticle 2 adsorbed with a cement on its surface.
Figure 7B:
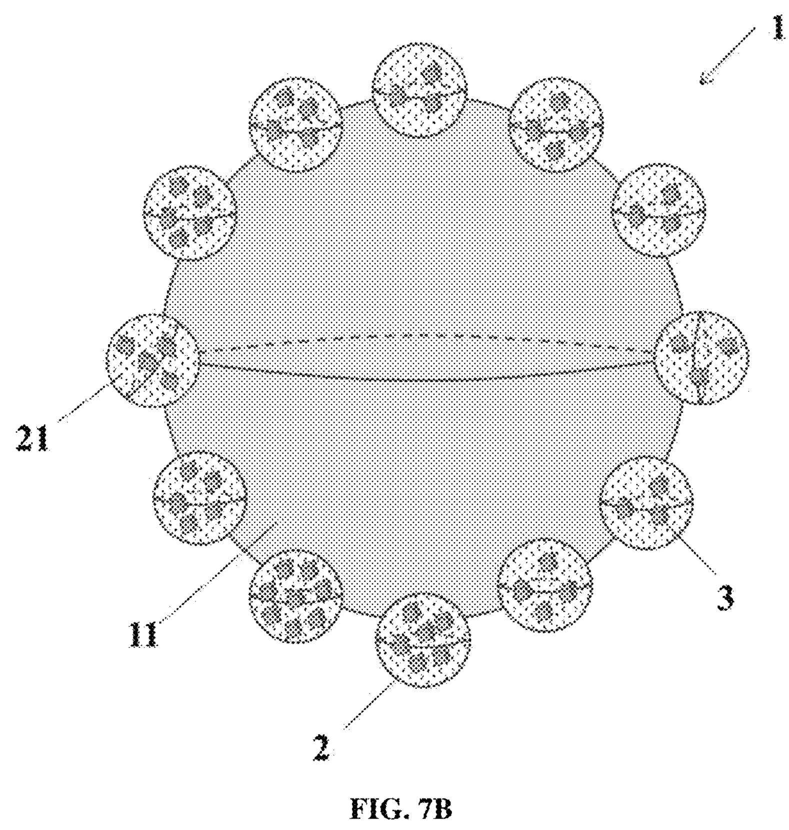
FIG. 7B illustrates a luminescent particle 1 with at least one nanoparticle 2 located on its surface, wherein the at least one particle 2 has some of its volume trapped in the first material 11.
Figure 8A:
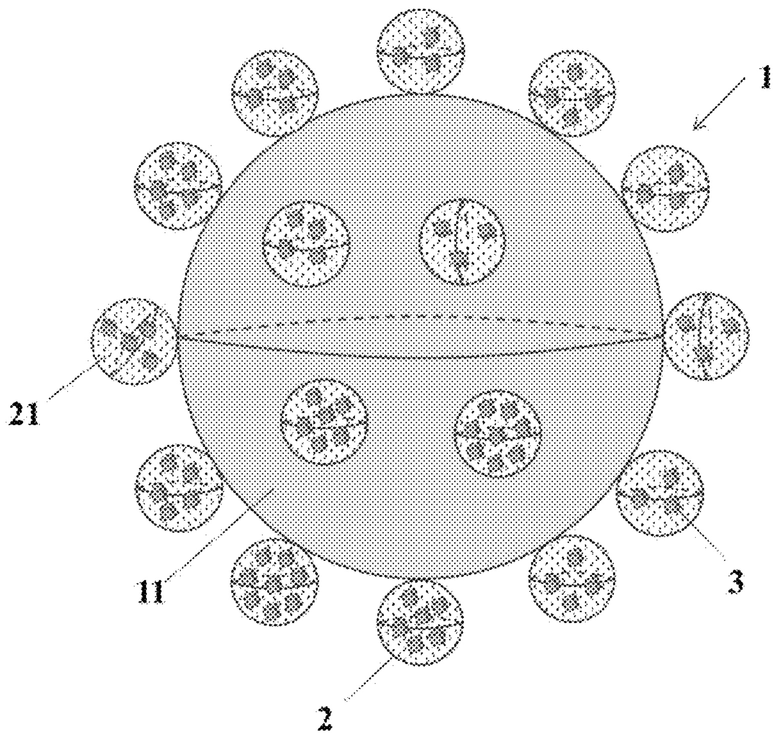
FIG. 8A illustrates a luminescent particle 1 comprising at least one particle 2 dispersed in the first material 11; and at least one particle 2 adsorbed with a cement on the surface of said luminescent particle 1.
Figure 8B:
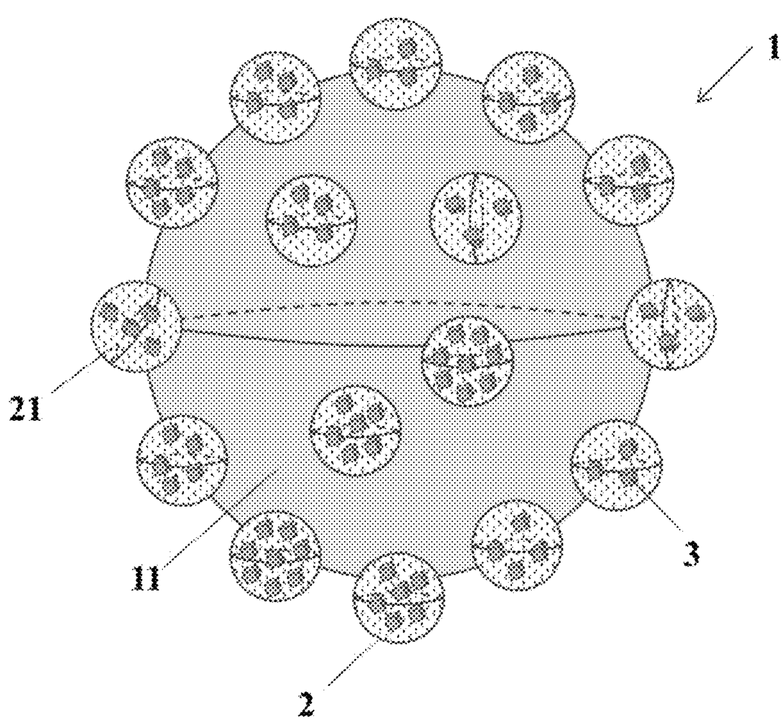
FIG. 8B illustrates a luminescent particle 1 comprising at least one particle 2 dispersed in the first material 11; and at least one particle 2 located on the surface with some of its volume trapped in the first material 11.
Figure 9:
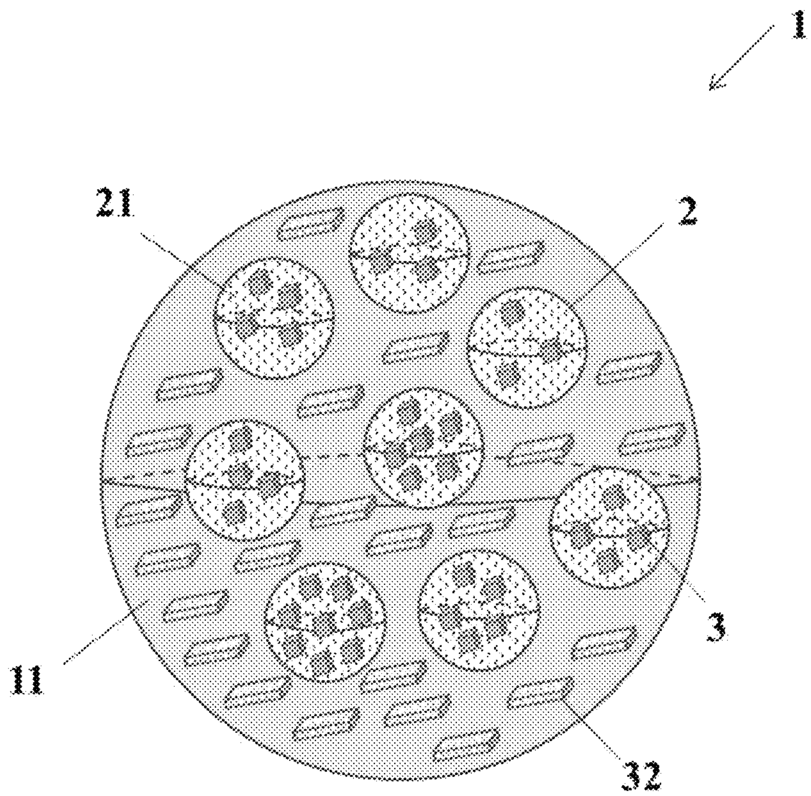
FIG. 9 illustrates a luminescent particle 1 further comprising at least one nanoparticle 3 dispersed in the first material 11.
Figure 10A:
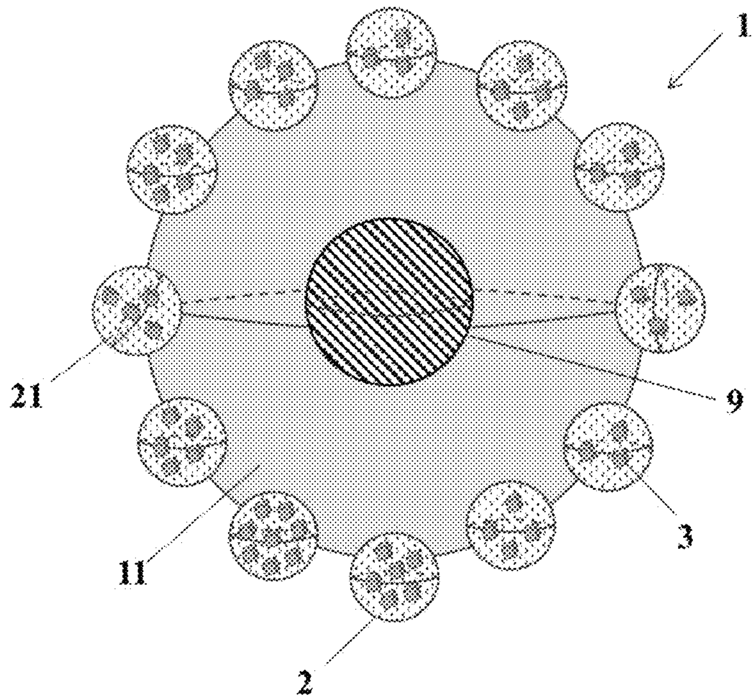
FIG. 10A illustrates a luminescent particle 1 comprising at least one nanoparticle 2 located on its surface and a dense particle 9 dispersed in the first material 11.
Figure 10B:
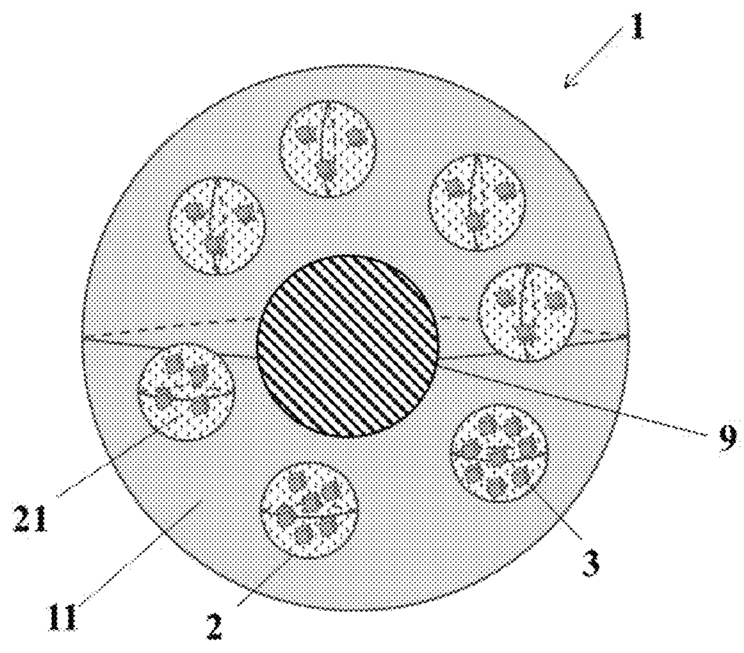
FIG. 10B illustrates a luminescent particle 1 comprising at least one nanoparticle 2 and a dense particle 9 dispersed in the first material 11.
Figure 11:
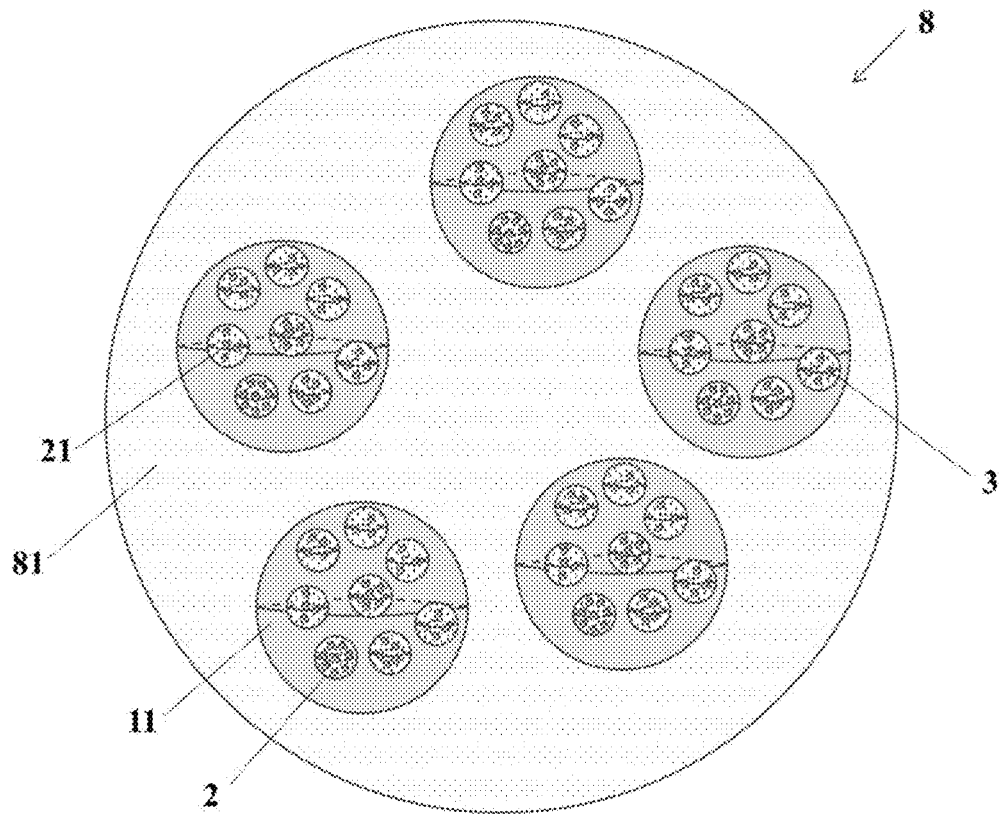
FIG. 11 illustrates a bead 8 comprising a third material 81 and the luminescent particle 1 is dispersed in said third material 81.
Figure 12A:
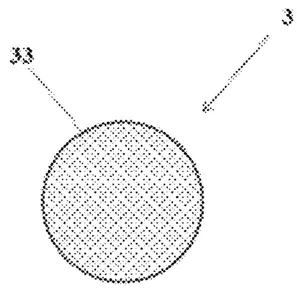
FIG. 12A illustrates a core nanoparticle 33 without a shell.
Figure 12B:
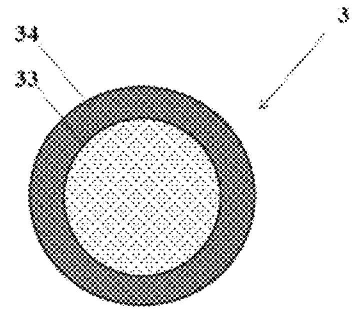
FIG. 12B illustrates a core 33/shell 34 nanoparticle 3 with one shell 34.
Figure 12C:
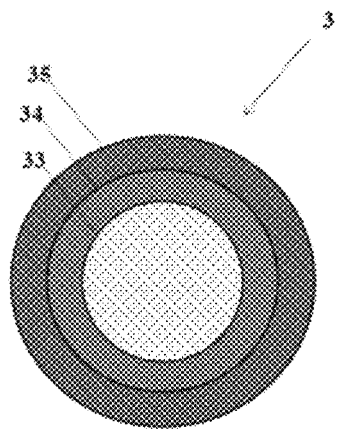
FIG. 12C illustrates a core 33/shell (34, 35) nanoparticle 3 with two different shells (34, 35).
Figure 12D:
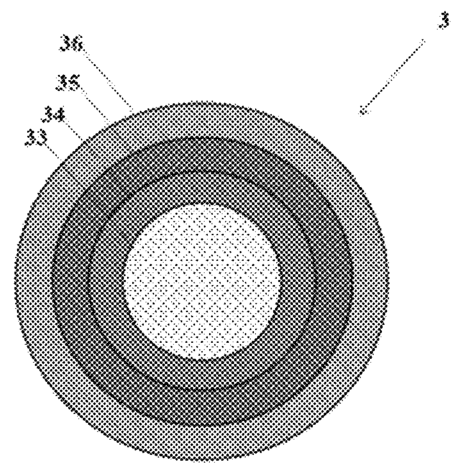
FIG. 12D illustrates a core 33/shell (34, 35, 36) nanoparticle 3 with two different shells (34, 35) surrounded by an oxide insulator shell 36.
Figure 12E:
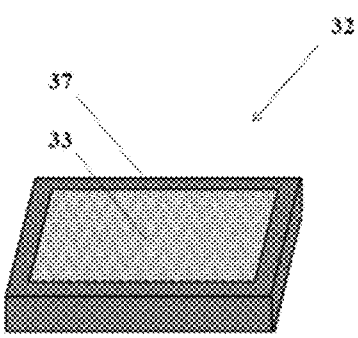
FIG. 12E illustrates a core 33/crown 37 nanoparticle 32.
Figure 12F:
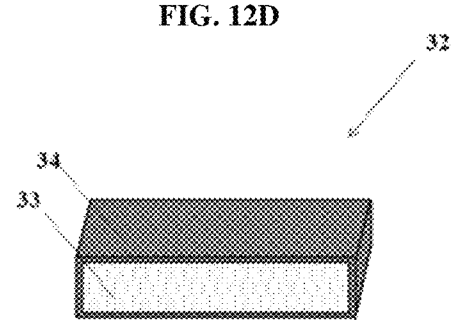
FIG. 12F illustrates a sectional view of a core 33/shell 34 nanoparticle 32 with one shell 34.
Figure 12G:
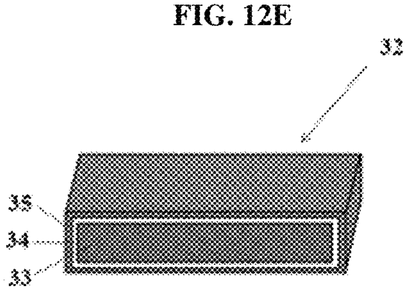
FIG. 12G illustrates a sectional view of a core 33/shell (34, 35) nanoparticle 32 with two different shells (34, 35).
Figure 12H:
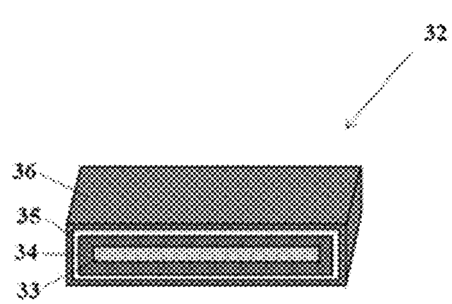
FIG. 12H illustrates a sectional view of a core 33/shell (34, 35, 36) nanoparticle 32 with two different shells (34, 35) surrounded by an oxide insulator shell 36.
Figure 13A:
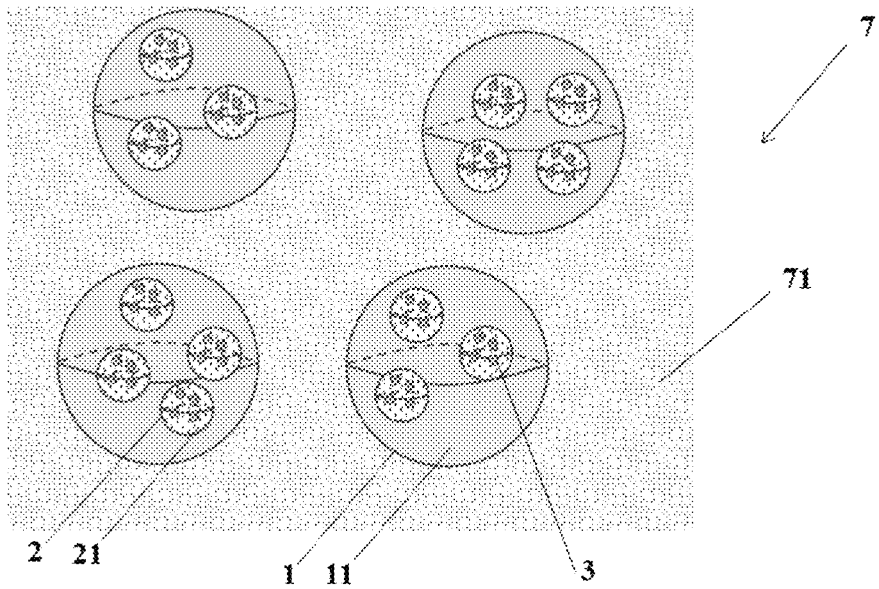
FIG. 13A illustrates a light emitting material 7 comprising a host material 71 and at least one luminescent particle 1 of the invention.
Figure 13B:
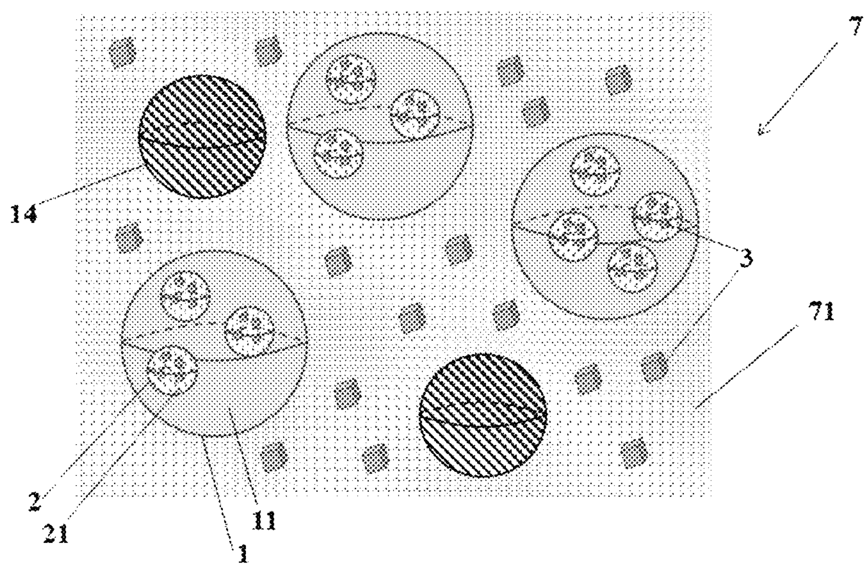
FIG. 13B illustrates a light emitting material 7 comprising a host material 71; at least one luminescent particle 1 of the invention; a plurality of particles comprising an inorganic material 14; and a plurality of 2D nanoparticles 32.
Figure 14A:
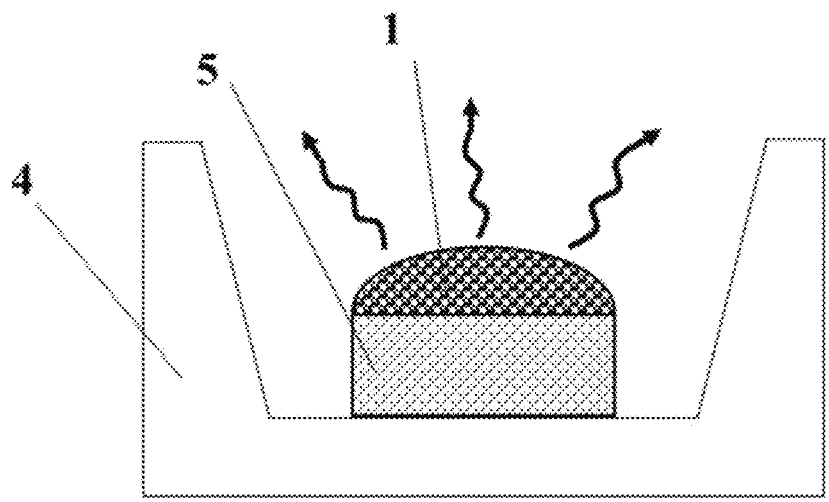
FIG. 14A illustrates an optoelectronic device comprising a LED support 4, a LED chip 5 and luminescent particles 1 deposited on said LED chip 5, wherein the luminescent particles 1 cover the LED chip 5.
Figure 14B:
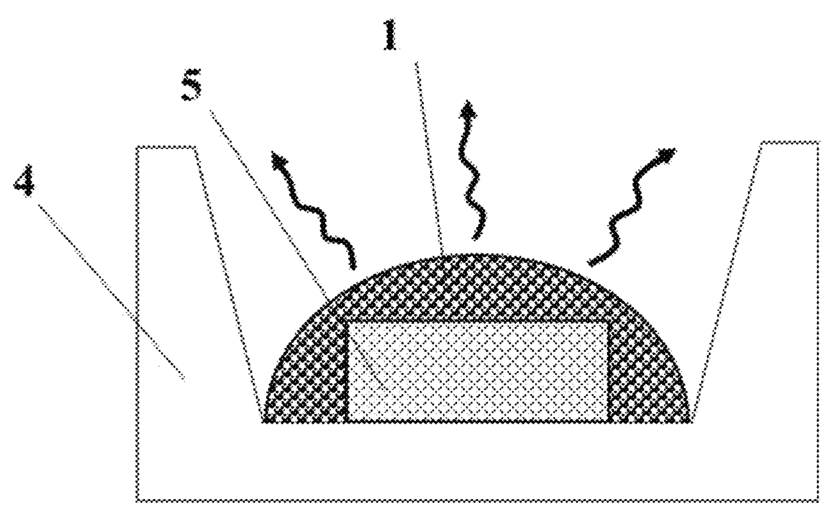
FIG. 14B illustrates an optoelectronic device comprising a LED support 4, a LED chip 5 and luminescent particles 1 deposited on said LED chip 5 wherein the luminescent particles 1 cover and surround the LED chip 5.
Figure 15:
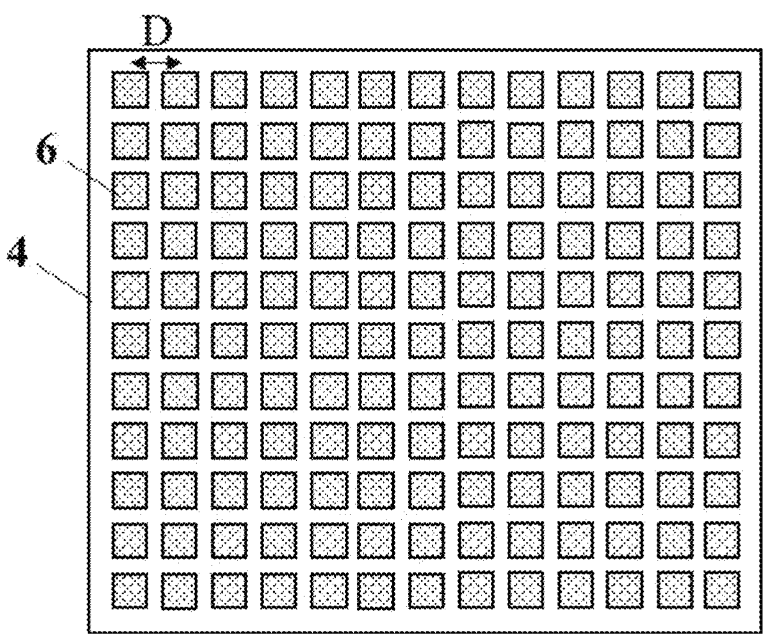
FIG. 15 illustrates a microsized LED 6 array comprising a LED support 4 and a plurality of microsized LED 6, wherein the pixel pitch D is the distance from the center of a pixel to the center of the next pixel.
Figure 16A:
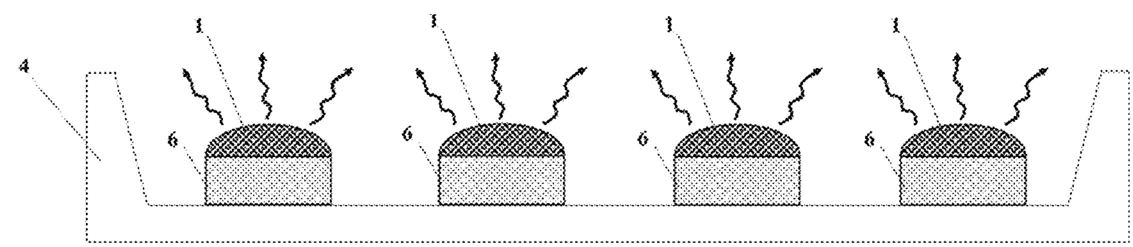
FIG. 16A illustrates an optoelectronic device comprising a LED support 4, a microsized LED 6 and luminescent particles 1 deposited on said microsized LED 6, wherein the luminescent particles 1 cover the microsized LED 6.
Figure 16B:
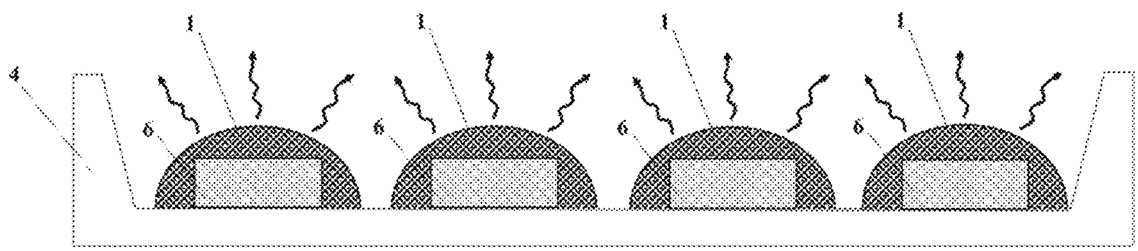
FIG. 16B illustrates an optoelectronic device comprising a LED support 4, a microsized LED 6 and luminescent particles 1 deposited on said microsized LED 6 wherein the luminescent particles 1 cover and surround the microsized LED 6.

The present invention is further illustrated by the following examples.

Example 1: Inorganic Nanoparticles Preparation

Nanoparticles used in the examples herein were prepared according to methods of the art (Lhuillier E. et al., Acc. Chem. Res., 2015, 48 (1), pp 22-30; Pedetti S. et al., J. Am. Chem. Soc., 2014, 136 (46), pp 16430-16438; Ithurria S. et al., J. Am. Chem. Soc., 2008, 130, 16504-16505; Nasilowski M. et al., Chem. Rev. 2016, 116, 10934-10982).

Nanoparticles used in the examples herein were selected in the group comprising CdSe/CdZnS, CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots.

Example 2: Exchange Ligands for Phase Transfer in Basic Aqueous Solution

100 μL of CdSe/CdZnS nanoplatelets suspended in heptane were mixed with 3-mercaptopropionic acid and heated at 60° C. for several hours. The nanoparticles were then precipitated by centrifugation and redispersed in dimethylformamide Potassium tert-butoxide were added to the solution before adding ethanol and centrifugate. The final colloidal nanoparticles were redispersed in water.

Example 3: Exchange Ligands for Phase Transfer In Acidic Aqueous Solution

100 μL of CdSe/CdZnS nanoplatelets suspended in a basic aqueous solution were mixed with ethanol and centrifugated. A PEG-based polymer was solubilized in water and added to the precipitated nanoplatelets. Acetic acid was dissolved in the colloidal suspension to control the acidic pH.

Example 4: InP/GaP/ZnSe/ZnS@$Al_2O_3$@$HfO_2$

1st Step

100 μL of InP/GaP/ZnSe/ZnS nanocrystals suspended in heptane (10 mg/mL) were mixed with aluminium tri-sec butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles InP/GaP/ZnSe/ZnS@$Al_2O_3$ were collected at the surface of a filter.

2nd Step 5 mg of InP/GaP/ZnSe/ZnS@$Al_2O_3$ particles were suspended in 5 mL of pentane and mixed with hafnium n-butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles InP/GaP/ZnSe/ZnS@$Al_2O_3$@$HfO_2$ were collected at the surface of a filter.

The same procedure was carried out by replacing InP/GaP/ZnSe/ZnS nanocrystals with CdSe/CdZnS, CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing InP/GaP/ZnSe/ZnS nanocrystals with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 5: InP/ZnS/ZnSe/ZnS@$Al_2O_3$@$HfO_2$

1st Step

100 μL of InP/ZnS/ZnSe/ZnS nanocrystals suspended in heptane (10 mg/mL) were mixed with aluminium tri-sec butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles InP/ZnS/ZnSe/ZnS@$Al_2O_3$ were collected at the surface of a filter.

2nd Step 5 mg of InP/ZnS/ZnSe/ZnS@$Al_2O_3$ particles were suspended in 5 mL of pentane and mixed with hafnium n-butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles InP/ZnS/ZnSe/ZnS@$Al_2O_3$@$HfO_2$ were collected at the surface of a filter.

The same procedure was carried out by replacing InP/ZnS/ZnSe/ZnS nanocrystals with CdSe, CdS, CdTe, CdSe/CdS, CdSe/ZnS, CdSe/CdZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing InP/ZnS/ZnSe/ZnS nanocrystals with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 6: CdSe/CdZnS@$HfO_2$@$Si_{0.8}Hf_{0.2}O_2$

1st Step

100 μL of CdSe/CdZnS nanoplatelets suspended in heptane (10 mg/mL) were mixed with hafnium n-butoxide and 5 mL of pentane, then loaded on a spray-drying set-up. On another side, an aqueous solution was prepared and loaded the same spray-drying set-up, but at a different location than the first pentane solution. The two liquids were sprayed simultaneously towards a tube furnace heated at a temperature ranging from the boiling point of the solvent to 1000° C. with a nitrogen flow. The resulting particles CdSe/CdZnS@$HfO_2$ were collected at the surface of a filter.

2nd Step 50 mg of CdSe/CdZnS@$HfO_2$ particles were suspended in 20 mL of ethanol and mixed with TEOS, hafnium oxychloride and water, then loaded on a spray-drying set-up. The liquid was sprayed towards a tube furnace heated at a temperature ranging from the boiling point of the solvent to 1000° C. with a nitrogen flow. The luminescent particles CdSe/CdZnS@$HfO_2$@$SiHfO_2$ were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiHfO_2$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $SiHfO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 7: CdSe/CdZnS@$HfO_2$@$Si_{0.8}Zr_{0.2}O_2$

1st Step

100 μL of CdSe/CdZnS nanoplatelets suspended in heptane (10 mg/mL) were mixed with hafnium n-butoxide and 5 mL of pentane, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles CdSe/CdZnS@$HfO_2$ were collected at the surface of a filter.

2nd Step 50 mg of CdSe/CdZnS@$HfO_2$ particles were suspended in 20 mL of ethanol and mixed with TEOS, zirconium oxychloride and water, then loaded on a spray-drying set-up. The liquid was sprayed towards a tube furnace heated at a temperature ranging from the boiling point of the solvent to a temperature ranging from the boiling point of the solvent to 1000° C. with a nitrogen flow. The luminescent particles CdSe/CdZnS@$HfO_2$@$SiZrO_2$ were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiZrO_2$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $SiZrO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 8: CdSe/CdZnS@$Al_2O_3$@$HfO_2$

1st Step

100 μL of CdSe/CdZnS nanoplatelets suspended in heptane (10 mg/mL) were mixed with aluminium tri-sec butoxide and 5 mL of pentane, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles CdSe/CdZnS@$Al_2O_3$ (particles 2) were collected at the surface of a filter.

2nd Step 5 mg of CdSe/CdZnS@$Al_2O_3$ particles were suspended in 5 mL of pentane and mixed with hafnium n-butoxide, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles CdSe/CdZnS@$Al_2O_3$@$HfO_2$ were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 9: CdSe/CdZnS@$Al_2O_3$ and $SnO_2$ particles encapsulated in $Al_2O_3$ 5 mg of a previously prepared CdSe/CdZnS@$Al_2O_3$ particles (size: 150 nm) were suspended in 5 mL of pentane along with larger particles ($SnO_2$, 2 μm) and mixed with aluminium tri-sec butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles, CdSe/CdZnS@$Al_2O_3$ and $SnO_2$ particles encapsulated in $Al_2O_3$, were collected at the surface of a filter.

Note: the amount of aluminium tri-sec butoxide is calculated so that the amount of $Al_2O_3$ formed would form a layer around the $SnO_2$ particle so that it is thicker than the solid diameter.

The same procedure was carried out by replacing CdSe/CdZnS nanoplatelets and/or $SnO_2$ particles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets and/or $SnO_2$ particles with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with ZnTe, $Al_2O_3$, $SiO_2$, $HfO_2$, ZnSe, ZnO, ZnS, $TiO_2$, $SiZrO_2$, $SiHfO_2$ or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 10: Phosphor Particles @$Al_2O_3$@$HfO_2$

1st Step

1 μm of phosphor particles (cf. list below) suspended in heptane (10 mg/mL) were mixed with aluminium tri-sec butoxide and 5 mL of pentane, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles phosphors particles@$Al_2O_3$ were collected at the surface of a filter.

2nd Step 5 mg of phosphors particles @$Al_2O_3$ were suspended in 5 mL of pentane and mixed with hafnium n-butoxide, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles phosphor particles@$Al_2O_3$@$HfO_2$ were collected at the surface of a filter.

Phosphor particles used for this example were: Yttrium aluminium garnet particles (YAG, $Y_3Al_5O_{12}$), (Ca,Y)-α-SiAlON:Eu particles, ($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

The same procedure was carried out by replacing $Al_2O_3$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 11: CdSe/CdZnS@$HfO_2$@$Al_2O_3$

1st Step

100 μL of CdSe/CdZnS nanoplatelets suspended in heptane (10 mg/mL) were mixed with hafnium n-butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles CdSe/CdZnS@$HfO_2$ were collected at the surface of a filter.

2nd Step 5 mg of CdSe/CdZnS@$HfO_2$ particles were suspended in 5 mL of pentane and mixed with aluminium tri-sec butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles CdSe/CdZnS@$HfO_2$@$Al_2O_3$ were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 12: CdSe/CdZnS@$HfO_2$ and $SnO_2$ particles encapsulated in $Al_2O_3$ 5 mg of a previously prepared CdSe/CdZnS@$HfO_2$ particles (size: 150 nm) were suspended in 5 mL of pentane along with larger particles ($SnO_2$, 2 μm) and mixed with aluminium tri-sec butoxide, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles, CdSe/CdZnS@$HfO_2$ and $SnO_2$ particles encapsulated in $Al_2O_3$, were collected at the surface of a filter.

Note: the amount of aluminium tri-sec butoxide is calculated so that the amount of $Al_2O_3$ formed would form a layer around the $SnO_2$ particle so that it is thicker than the solid diameter.

The same procedure was carried out by replacing CdSe/CdZnS nanoplatelets and/or $SnO_2$ particles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets and/or $SnO_2$ particles with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 13: Phosphor particles @$HfO_2$@$Al_2O_3$

1st Step

1 μm of phosphor particles (cf. list below) suspended in heptane (10 mg/mL) were mixed with hafnium n-butoxide and 5 mL of pentane, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles phosphors particles @$HfO_2$ were collected at the surface of a filter.

2nd Step 5 mg of phosphors particles@$HfO_2$ were suspended in 5 mL of pentane and mixed with aluminium tri-sec butoxide, then loaded on a spray-drying set-up. On another side, an aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles phosphor particles @$HfO_2$@$Al_2O_3$ were collected at the surface of a filter.

Phosphor particles used for this example were: Yttrium aluminium garnet particles (YAG, $Y_3Al_5O_{12}$), (Ca,Y)-α-SiAlON:Eu particles, ($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

The same procedure was carried out by replacing $Al_2O_3$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 14: Preparation of CdSe/CdZnS@$HfO_2$@$SiO_2$ Comprising $SnO_2$ Nanoparticles by Microemulsion CdSe/CdZnS@$HfO_2$ and $SnO_2$ nanoparticles (30-40 nm diameter) were coated with $SiO_2$ using reverse micelles of polyoxyethylene cetylether (Nihon surfactant, C-15) using cyclohexane (purity 99.0%) as the organic phase. The concentration of the surfactant in the organic solvent was 0.5 mol/L. The microemulsion solution was prepared by injecting an aqueous solution (4.0 mL, denoted as aq.) containing 100 mg of CdSe/CdZnS@$HfO_2$ and $SnO_2$ nanoparticles (varying proportions) into the organic surfactant solution (100 mL) at 50° C. under magnetic stirring. An oxalic acid solution ($(COOH)_2$ aq., 1 mol/L, 3.0 mL) was used to charge positively the oxides surface. Tetraethylorthosilicate (TEOS, 0.86 mol/L in the microemulsion solution) as a $SiO_2$ source and diluted $NH_4OH$ solution (2.70 mol/1, 15.0 ml) were charged into the microemulsion containing CdSe/CdZnS@$HfO_2$ and $SnO_2$ nanoparticles, and subjected to hydrolysis at 50° C. for 60 min The molar ratio of water to surfactant in the solution during TEOS hydrolysis was 23. The solid formed was centrifuged, thoroughly washed with propanol, dried at 80° C. overnight, and a thermal treatment at 130° C. for 24 h was performed in air.

The same procedure was carried out by replacing CdSe/CdZnS nanoplatelets and/or $SnO_2$ nanoparticles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets and/or $SnO_2$ nanoparticles with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $SiO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 14: bis: Preparation of CdSe/CdS/ZnS@$SiO_2$@$HfO_2$ Nanoparticles by Microemulsion The formation of a silica shell around the CdSe/CdS/ZnS nanocrystals was performed by an inverse water-in-oil microemulsion micelles method. In particular, 0.98 g of the surfactant Triton X-100 ($C_8H_{17}C_6H_4(OC_2H_4)_{9-10}OH$) and 0.75 g of 1-Hexanol as co-surfactant were mixed and dissolved in 7.5 ml of cyclohexane. Then, 0.08 nmol of CdSe/CdS/ZnS particles dispersed in hexane were injected and after 10 min of stirring with a magnetic bar, 190 μl of water and 30 μl of ammonia (29% in water) were added. After, 30 μl of TEOS were added to start the reaction of silica formation around the nanoparticles. After 6 h, another amount of 150 μl of TEOS was added to have final 100 nm diameter silica nanoparticles after 30 h of total time of growth. The CdSe/CdS/ZnS@$SiO_2$ particles show a high monodispersity (diameter 100±4 nm), only one CdSe/CdS/ZnS nanocrystal per silica particle and a few of empty silica beads. The microemulsion was broken by adding acetone and after centrifugation, CdSe/CdS/ZnS@$SiO_2$ particles were washed by centrifugation and sonication in different solvents (50% n-butanol-50% hexane, 50% isopropanol-50% hexane, 50% ethanol-50% hexane, two times in ethanol) and finally dispersed in 7.5 ml of ethanol with a final concentration of the order of 10 nM.

5 mg of CdSe/CdS/ZnS@$SiO_2$ particles were suspended in 5 mL of pentane and mixed with hafnium n-butoxide, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The luminescent particles CdSe/CdS/ZnS@$SiO_2$@$HfO_2$ were collected at the surface of a filter.

The same procedure was carried out by replacing CdSe/CdS/ZnS nanocrystals with CdSe, CdS, CdTe, CdSe/CdS, CdSe/ZnS, CdSe/CdZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/

ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdS/ZnS nanocrystals with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $SiO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 15: Semiconductor Nanoplatelets@$Al_2O_3$@$SiO_2$

The dry solid 0.05 g, i.e. semiconductor nanoplatelets @$Al_2O_3$, is weighted under dry atmosphere (glovebox) and is dispersed in 1 mL of pure/dry THF, then 0.07 mL of 2.3 $mol \cdot L^{-1}$ HCl solution is added. The solution is then heated in a closed vessel to 70° C. A solution (1 mL) containing TEOS (TétraEthylOrthoSilicate) (0.5 $mmol \cdot L^{-1}$) in clean THF is added dropwise over a period of 0.1 $\mu mol \cdot min^{-1}$ under stirring. The mixture is then refluxed for about 1 h. The product is then filtered and washed consecutively with 20/80 water/THF (3×5 mL), EtOH (3×5 mL), and $Et_2O$ (3×5 mL), and dried at 80° C. under vacuum.

The same procedure was carried out by replacing semiconductor nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $SiO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 16: Semiconductor Nanoplatelets @$HfO_2$@$SiO_2$

The dry solid 0.05 g, i.e. semiconductor nanoplatelets@$HfO_2$, is weighted under dry atmosphere (glovebox) and is dispersed in 1 mL of pure/dry THF, then 0.07 mL of 2.3 $mol \cdot L^{-1}$ HCl solution is added. The solution is then heated in a closed vessel to 70° C. A solution (1 mL) containing TEOS (TétraEthylOrthoSilicate) (0.5 $mmol \cdot L^{-1}$) in clean THF is added dropwise over a period of 0.1 $\mu mol \cdot min^{-1}$ under stirring. The mixture is then refluxed for about 1 h. The product is then filtered and washed consecutively with 20/80 water/THF (3×5 mL), EtOH (3×5 mL), and $Et_2O$ (3×5 mL), and dried at 80° C. under vacuum.

Note 1: Trialkoxy Azidoalkyl silane, Trialkoxy Aminoalkyl silane or Trialkoxy alkylThiol silane can be added to the TEOS solution to add versatile functionalities the solid for further functionalization.

The same procedure was carried out by replacing semiconductor nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $HfO_2$ and/or $SiO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $HfO_2$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 17: Semiconductor Nanoplatelets @$Al_2O_3$@$SiO_2$

Semiconductor nanoplatelets@$Al_2O_3$ particles are dispersed in 16.7 wt % $H_2O$ in an anhydrous ethanol to reach 5 wt. % solid loading and then ultrasonicated to break down agglomerates. A 20 wt. % of TEOS+silane in ethanol solution (quantity varied to tune $SiO_2$ thickness) was carefully added to the suspension step by step. The amounts of added TEOS were calculated based on the surface area of semiconductor nanoplatelets@$Al_2O_3$ particle and the desired shell thickness, assuming complete conversion of TEOS to silica. The appropriate pH value of the suspension was adjusted using ammonia to pH=11. Afterward, the suspension was stirred at 50° C. for 6 h to control the thickness of the coating layer through the hydrolysis and condensation of TEOS on the surface of semiconductor nanoplatelets@$Al_2O_3$ particle. Resulting particles were then collected by centrifuged, washed with anhydrous ethanol and dried in an oven at 80° C.

The same procedure was carried out by replacing semiconductor nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $SiO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $Al_2O_3$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 18: CdSe/CdZnS@$HfO_2$@$SiO_2$

1st Step

100 μL of CdSe/CdZnS nanoplatelets suspended in heptane (10 mg/mL) were mixed with Hafnium n-butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles CdSe/CdZnS@$HfO_2$ were collected at the surface of a filter.

2nd Step 50 mg of CdSe/CdZnS@$HfO_2$ particles were suspended in 20 mL of water and mixed with TEOS and ammonia, then loaded on a spray-drying set-up. The liquid was sprayed towards a tube furnace heated at a temperature ranging from the boiling point of the solvent to 1000° C. with a nitrogen flow. The luminescent particles CdSe/CdZnS@$HfO_2$@$SiO_2$ were collected at the surface of a filter.

Figure 17A:
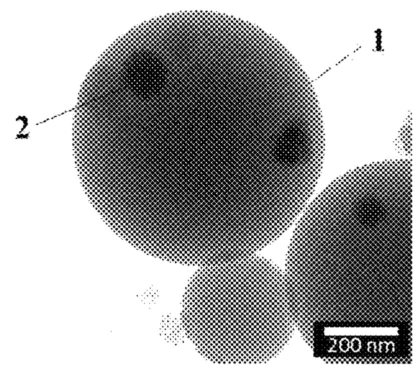
FIG. 17A is a TEM image of CdSe/CdZnS@$HfO_2$@$SiO_2$ particles
Figure 17B:
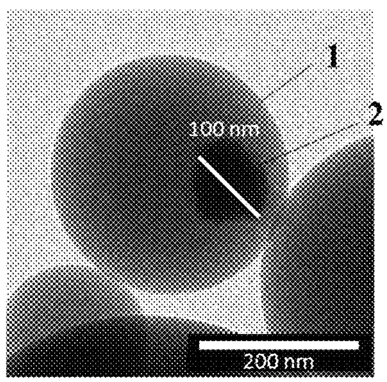
FIG. 17B is a TEM image of CdSe/CdZnS@$HfO_2$@$SiO_2$ particles

FIGS. 17A and 17B show as-synthetized CdSe/CdZnS@$HfO_2$@$SiO_2$ particles.

Figure 17C:
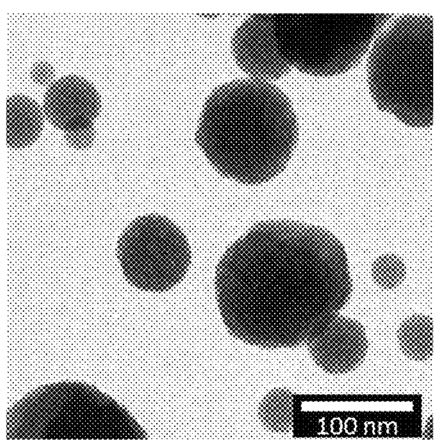
FIG. 17C is a TEM image of $HfO_2$ particles
Figure 18A:
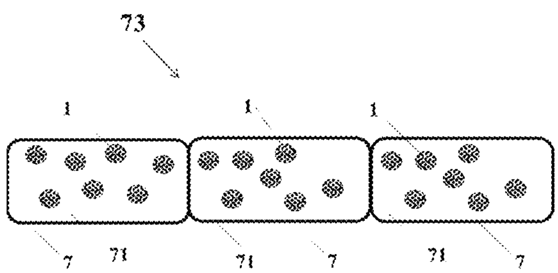
FIG. 18A illustrates a color conversion layer as described in the invention.
Figure 18C:
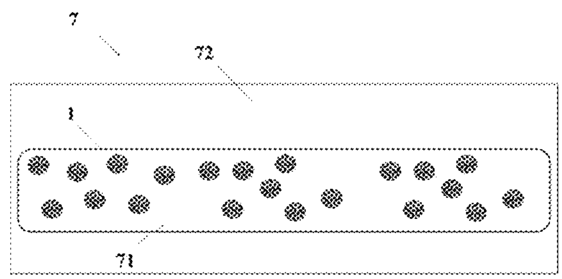
FIG. 18C illustrates a light emitting material comprising at least two host materials.
Figure 18B:
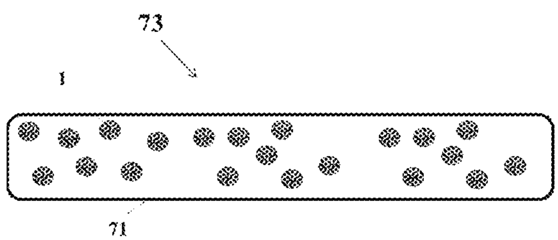
FIG. 18B illustrates a color conversion layer as described in the invention.
Figure 18D:
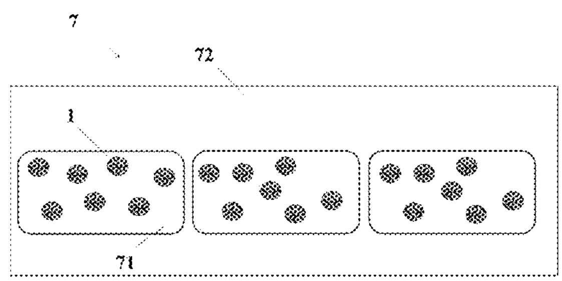
FIG. 18D illustrates a light emitting material comprising at least two host materials.
Figure 18E:
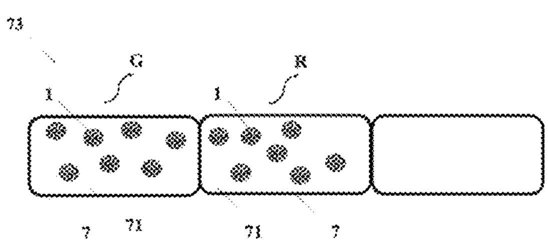
FIG. 18E illustrates a color conversion layer comprising three sub-pixels, wherein the first sub-pixel emits a green secondary light (G), the second sub-pixel emits a red secondary light (R), the third sub-pixel is free of light emitting material 7 or inorganic phosphor.
Figure 19:
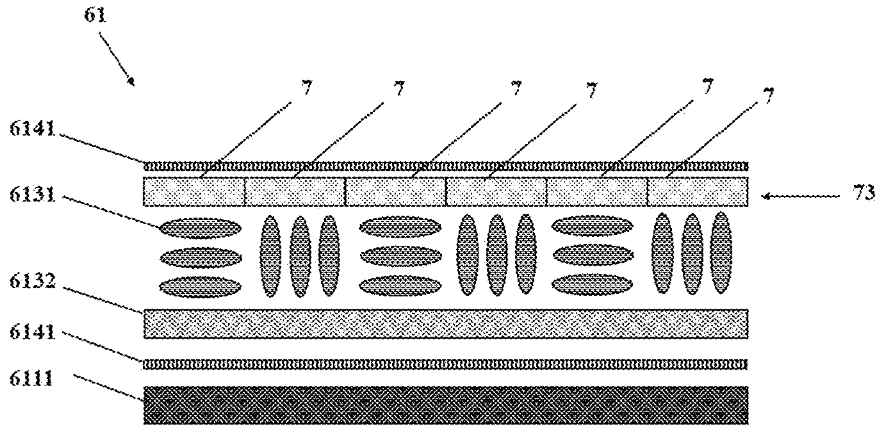
FIG. 19 illustrates a structure of a display apparatus as described in the invention comprising an active matrix to control the light intensity passing through the liquid crystal layer before said light excites a color conversion layer comprising an array of light emitting materials.
Figure 20:
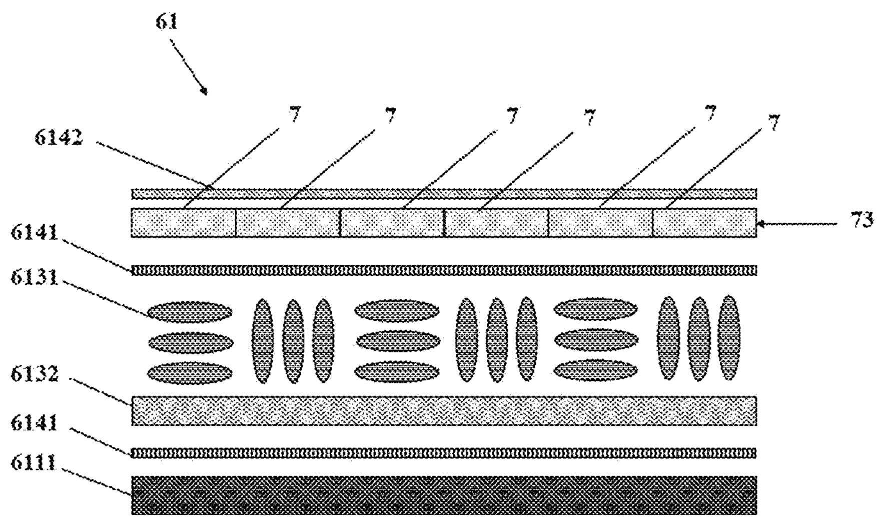
FIG. 20 illustrates a structure of a display apparatus as described in the invention comprising an optical enhancement film above the color conversion layer.
Figure 21:
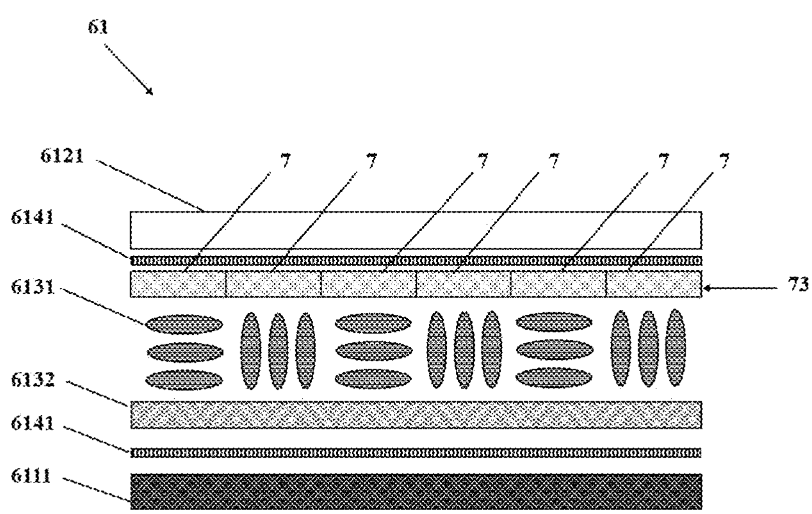
FIG. 21 illustrates a structure of a display apparatus as described in the invention comprising a glass substrate.
Figure 22:
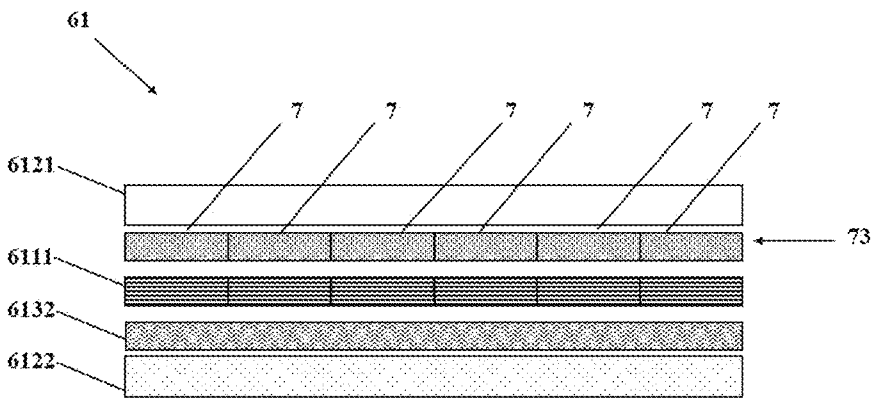
FIG. 22 illustrates a display apparatus comprising an individual light source for each light emitting material of the array of light emitting materials.
Figure 23:
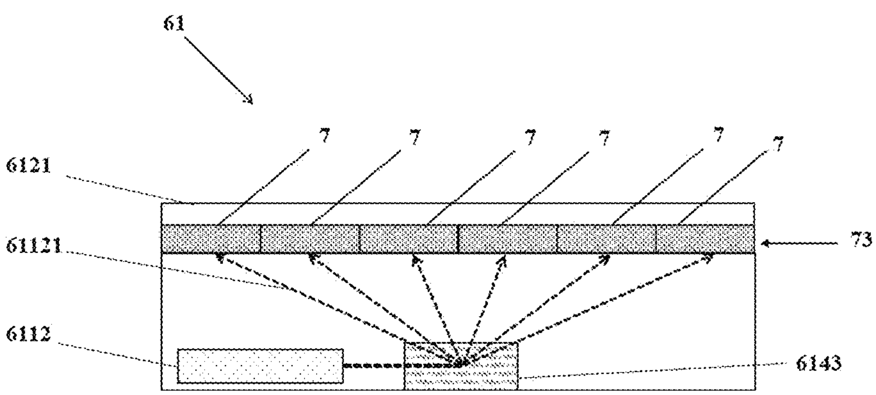
FIG. 23 illustrates a display apparatus comprising at least one laser source and an array of light emitting materials.
Figure 24A:
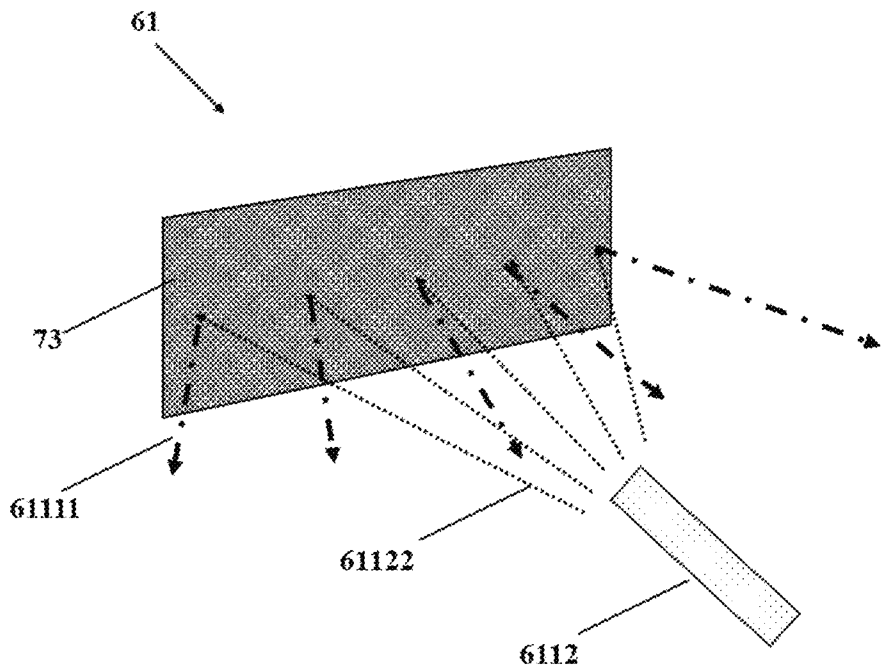
FIGS. 24A and 24B illustrate a display apparatus comprising at least one color conversion layer deposited onto a solid support.
Figure 24B:
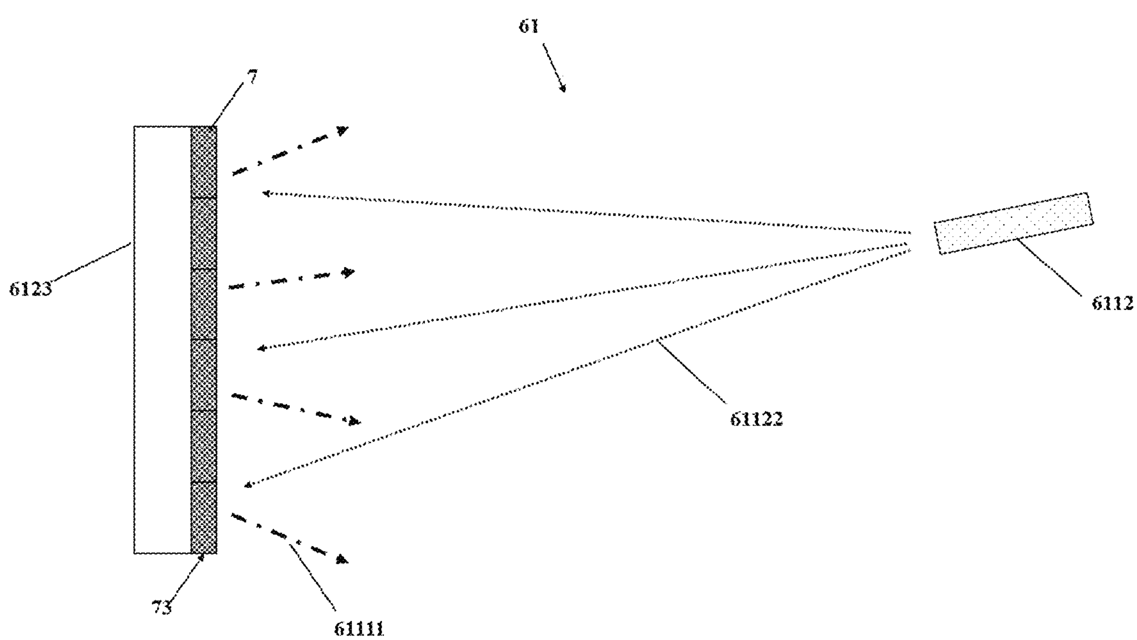
Figure 25A:
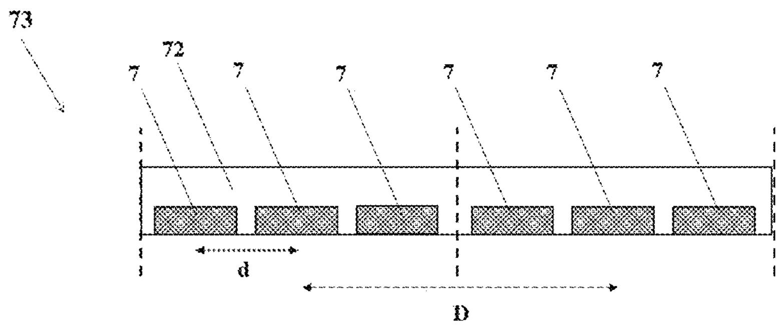
FIGS. 25A and 25B illustrate a color conversion layer comprising an array of light emitting materials surrounded by a host material.
Figure 25B:
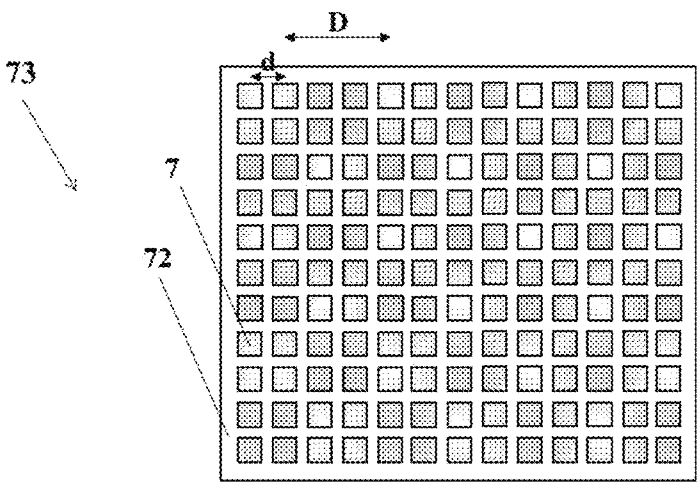
Figure 26:
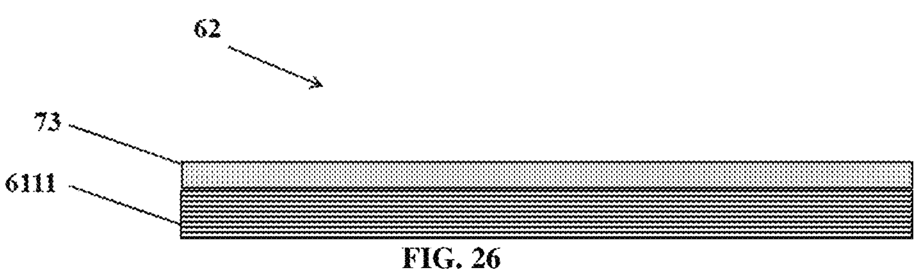
FIG. 26 illustrates an illumination source comprising a light source and a color conversion layer.
Figure 27:
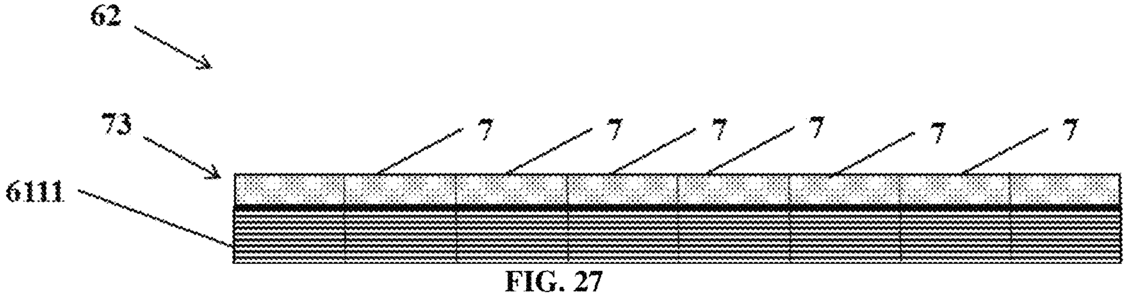
FIG. 27 illustrates an illumination source comprising an array of light source forming pixels and a color conversion layer comprising an array of light emitting materials.
Figure 28:
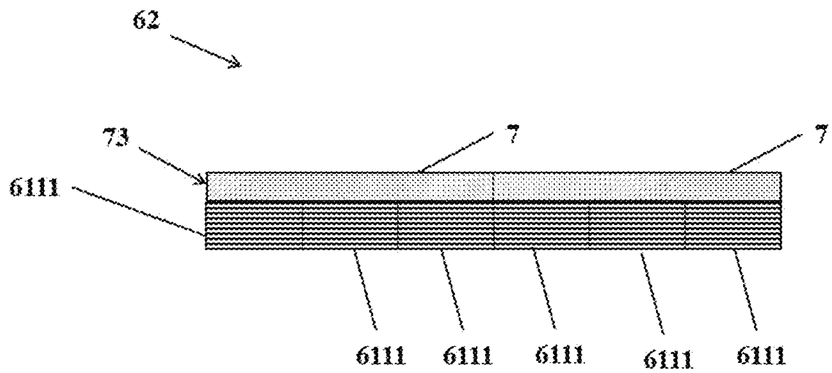
FIG. 28 illustrates an illumination source wherein each pixel of the color conversion layer is illuminated by three light sources.
Figure 29:
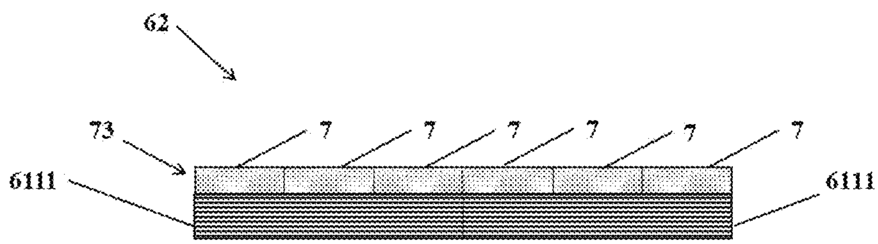
FIG. 29 illustrates an illumination source wherein each light source pixel of the light source is able to illuminate several pixels of the color conversion layer.
Figure 30:
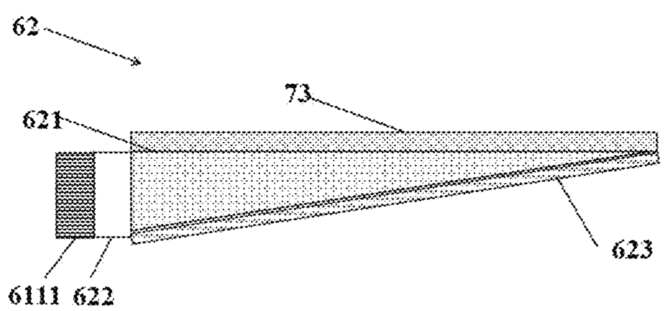
FIG. 30 illustrates an illumination source wherein the color conversion layer is upon a light guide, a reflector and a light source.
Figure 31:
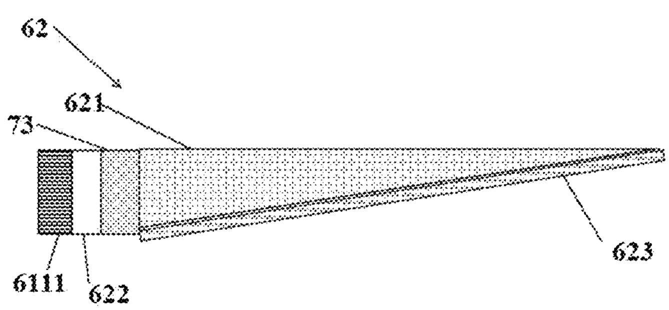
FIG. 31 illustrates an illumination source wherein the color conversion layer is between the light source and the reflector.
Figure 32:
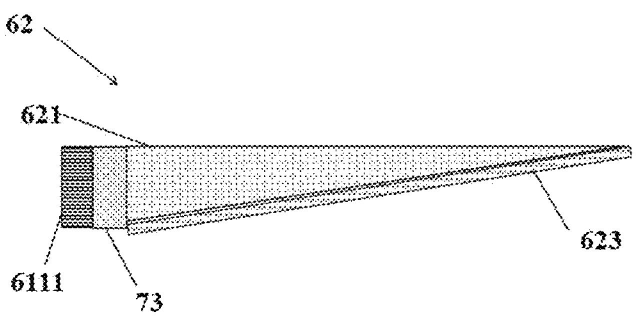
FIG. 32 illustrates an illumination source wherein the color conversion layer is deposited on the light source.
Figure 33:
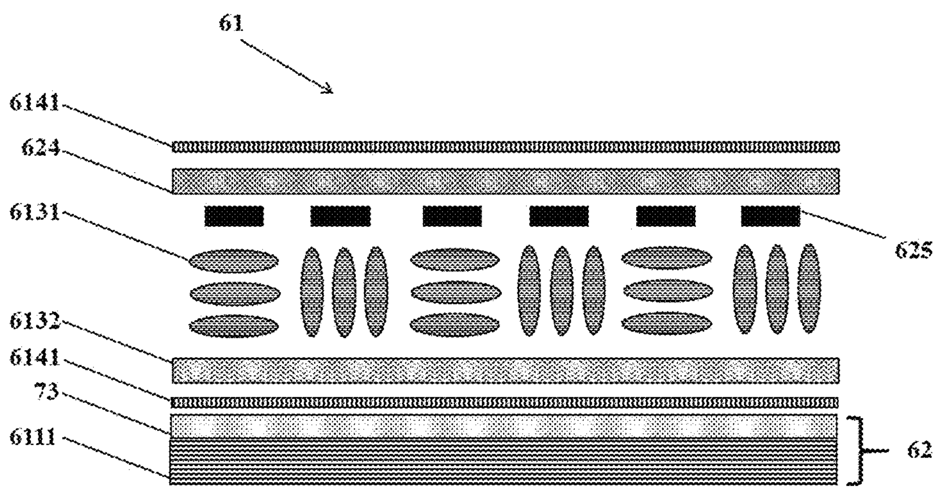
FIG. 33 illustrates a display apparatus comprising a light source, the color conversion layer, polarizers, an active matrix, a layer of liquid crystals material and a color filer layer.
Figure 34A:
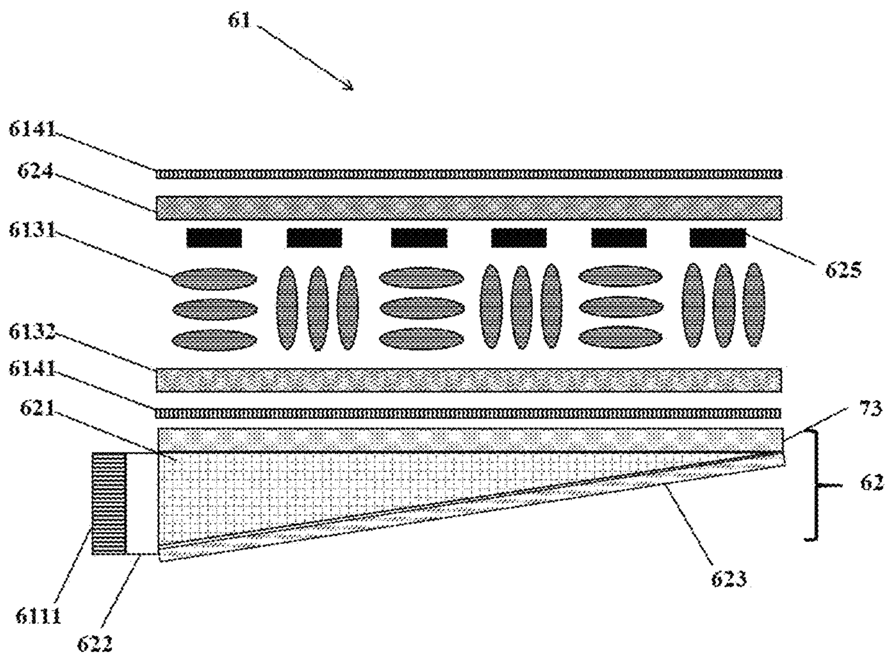
FIGS. 34A and 34B illustrate a display apparatus wherein the light source is a backlight unit comprising a color conversion layer.
Figure 34B:
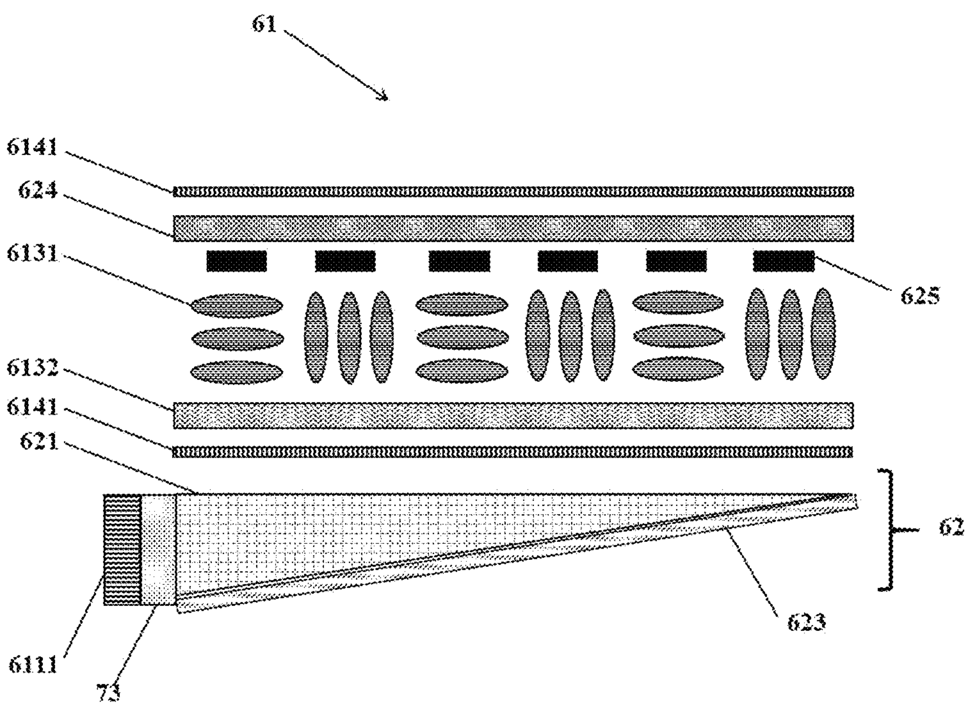
Figure 35:
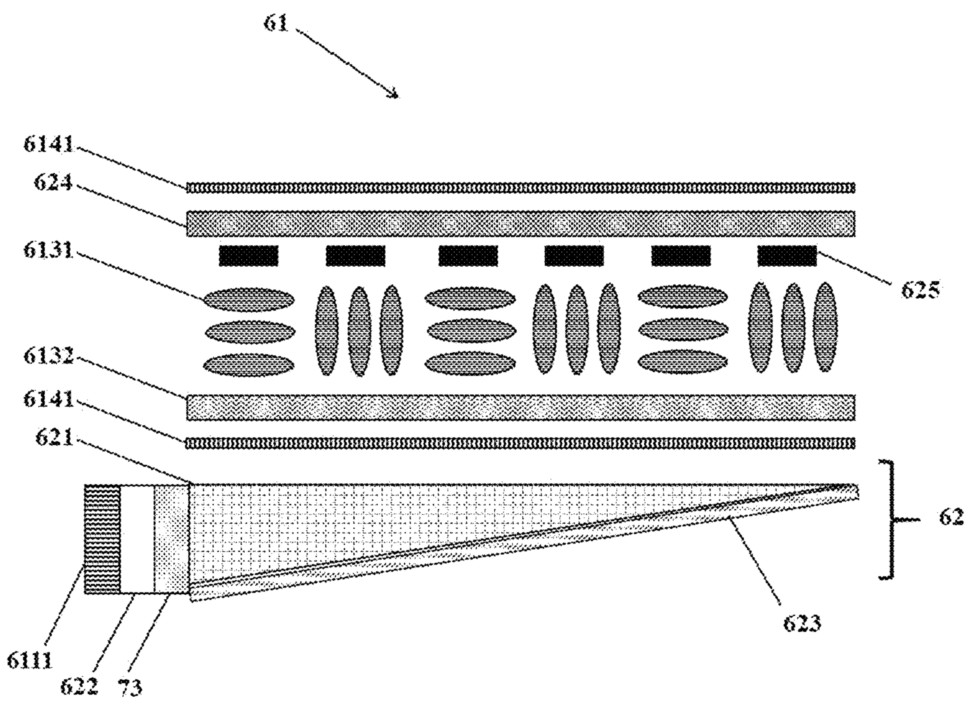
FIG. 35 illustrates a display apparatus wherein the light source is a backlight unit comprising a color conversion layer.
Figure 36:
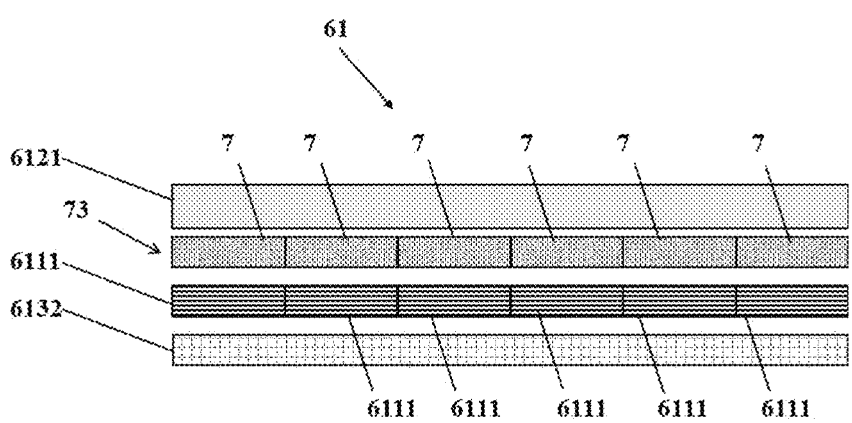
FIG. 36 illustrates a display apparatus comprising a light source and an active matrix.
Figure 37:
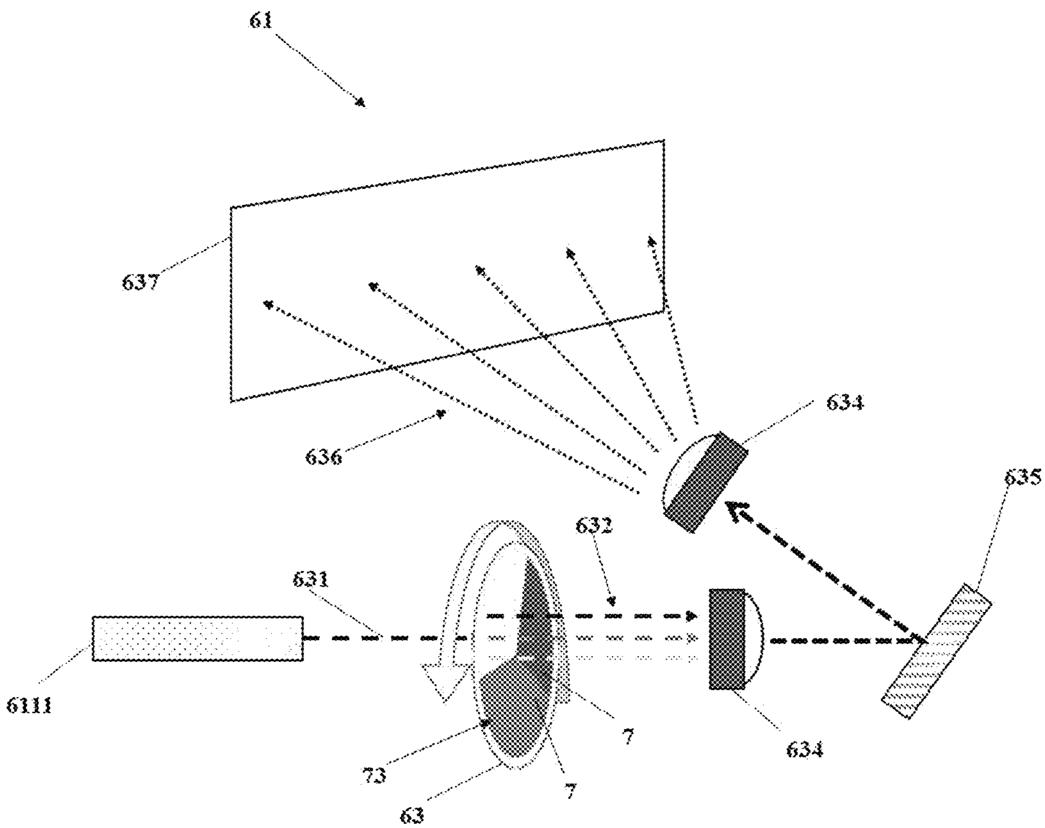
FIG. 37 illustrates a display apparatus wherein the color conversion layer is deposited onto a rotation wheel and is excited by a light source.
Figure 38:
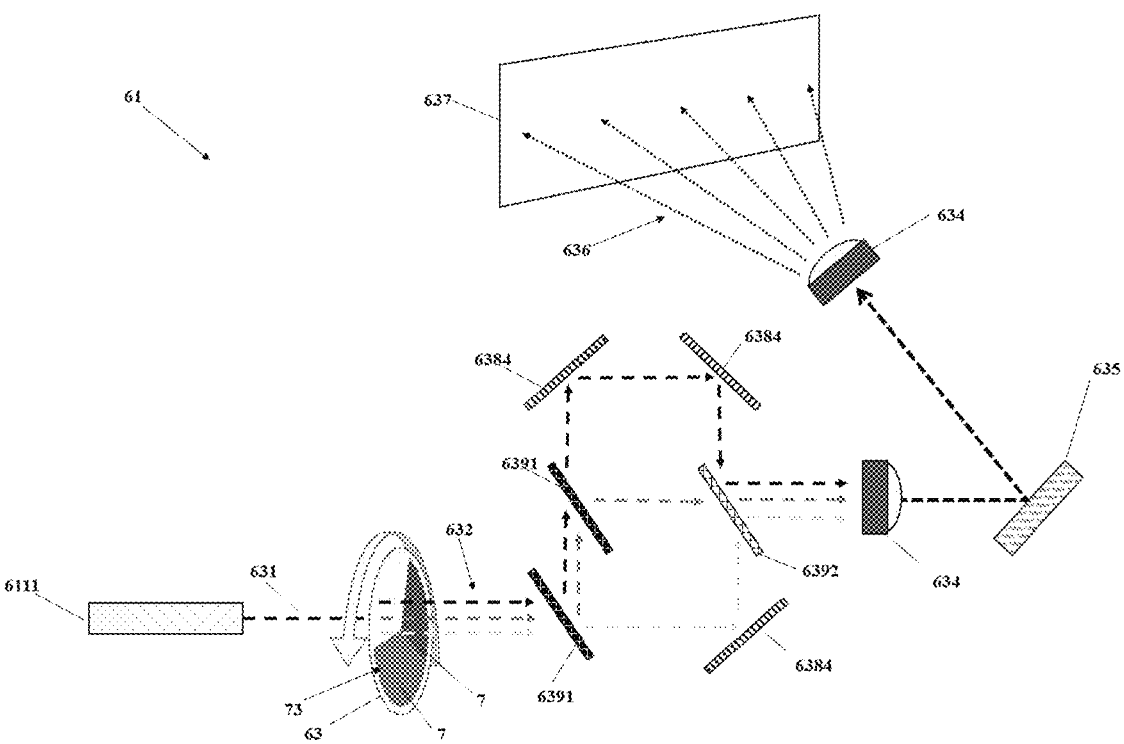
FIG. 38 illustrates a display apparatus wherein the color conversion layer is deposited onto a rotation wheel and is excited by a light source.
Figure 39:
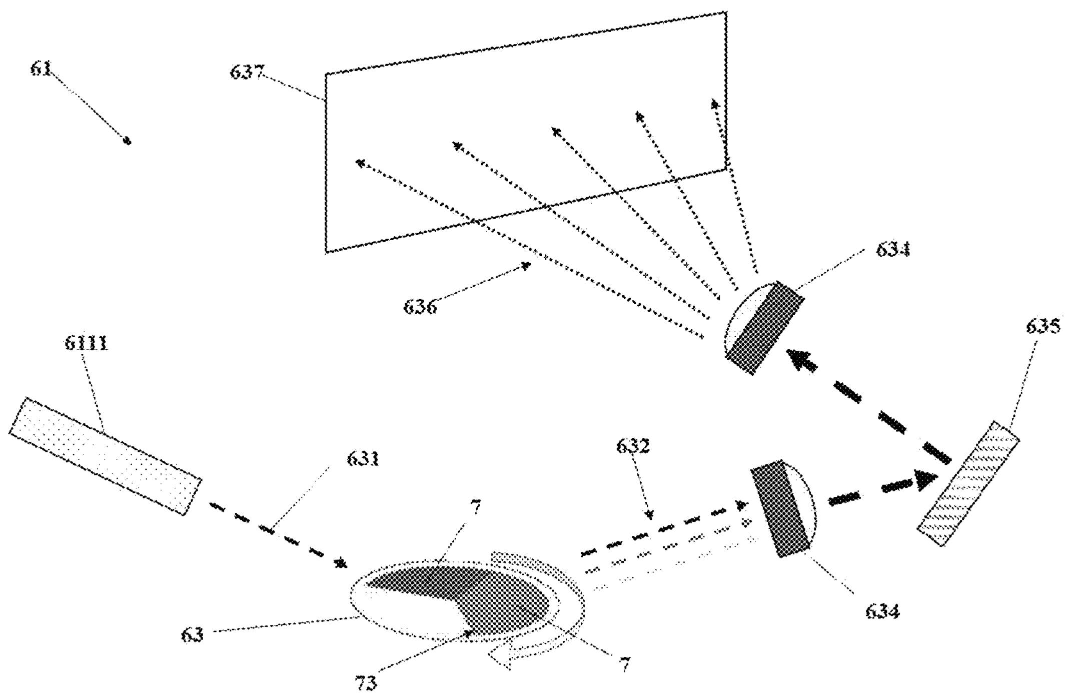
FIG. 39 illustrates a display apparatus wherein the color conversion layer is deposited onto a rotation wheel and is excited by a light source. Said rotation wheel is configured to work in a reflective mode.
Figure 40A:
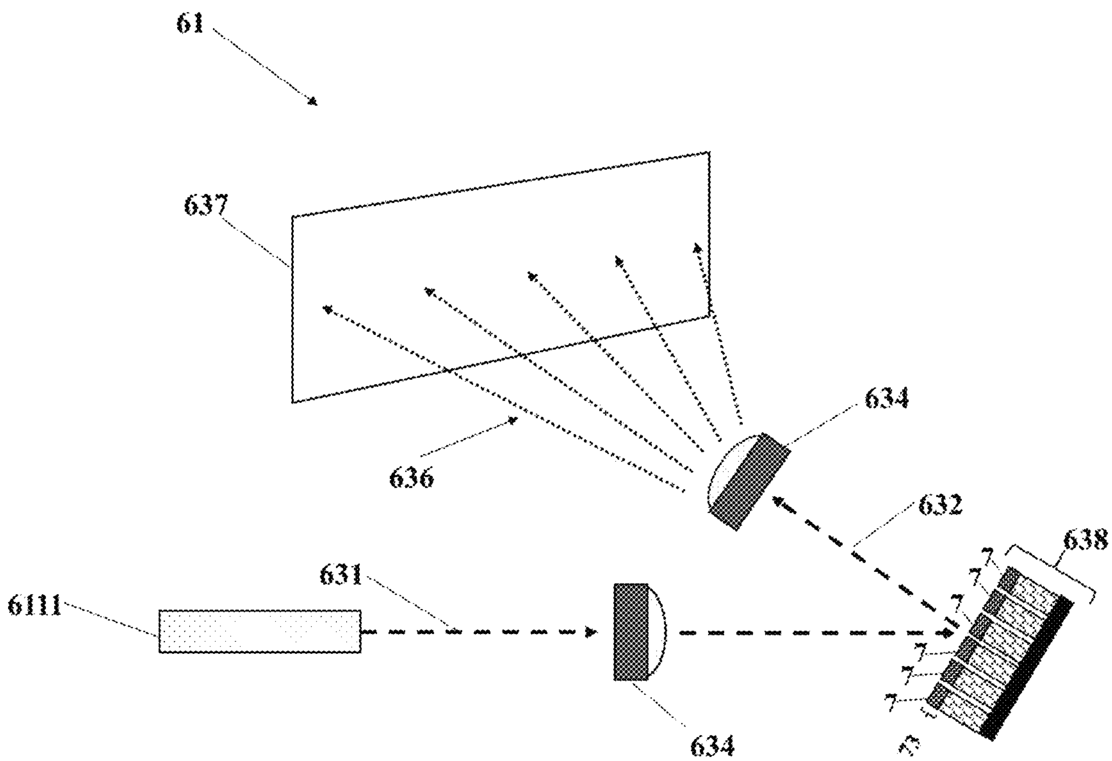
FIG. 40A illustrates a display apparatus comprising a digital micromirror device according to the invention.
Figure 40B:
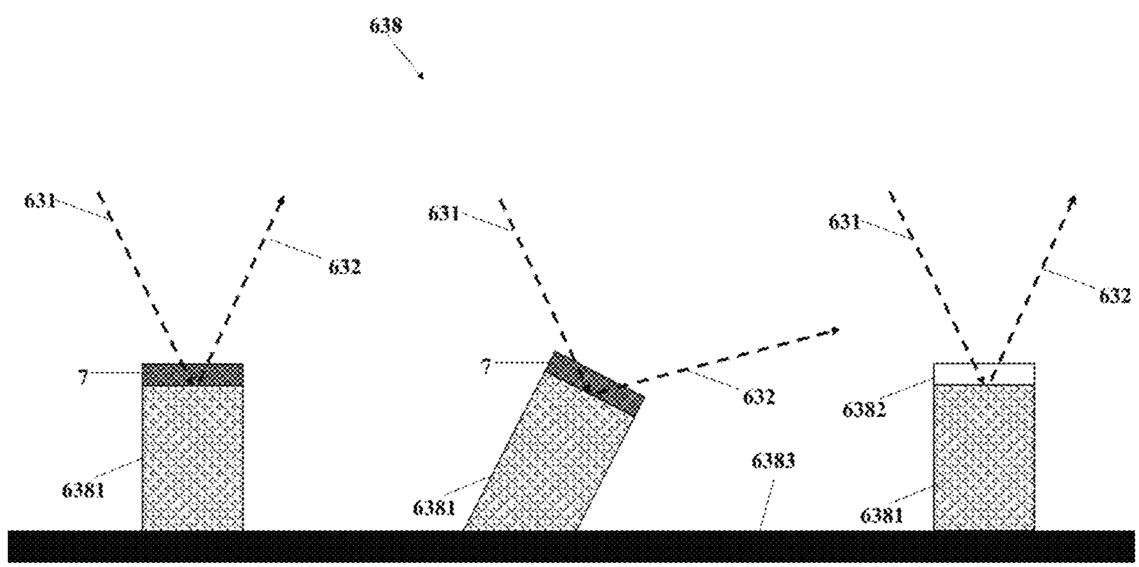
FIG. 40B illustrates a digital micromirror device according to the invention.
Figure 41:
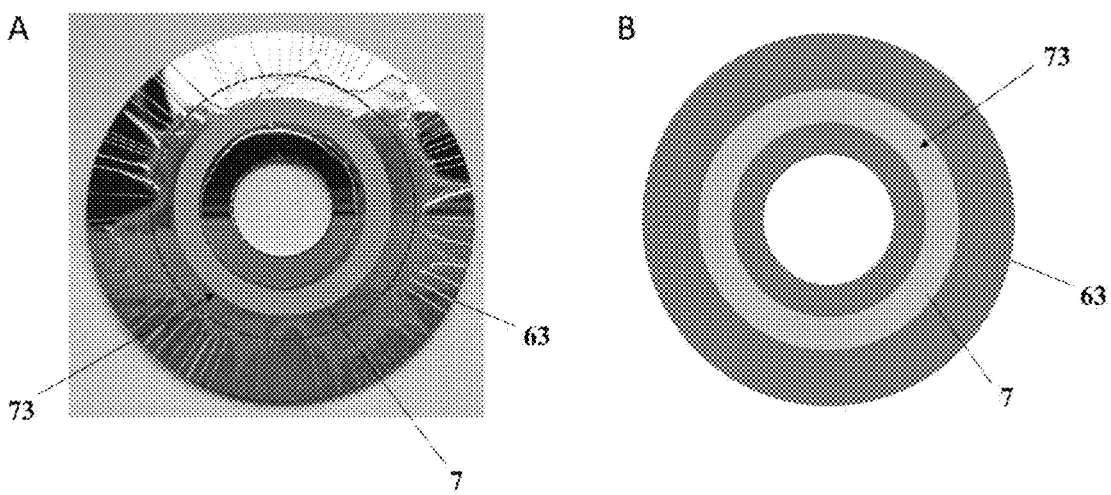
FIG. 41 illustrates a a rotation wheel, wherein the color conversion layer forms a ring on said rotation wheel.
Figure 42:
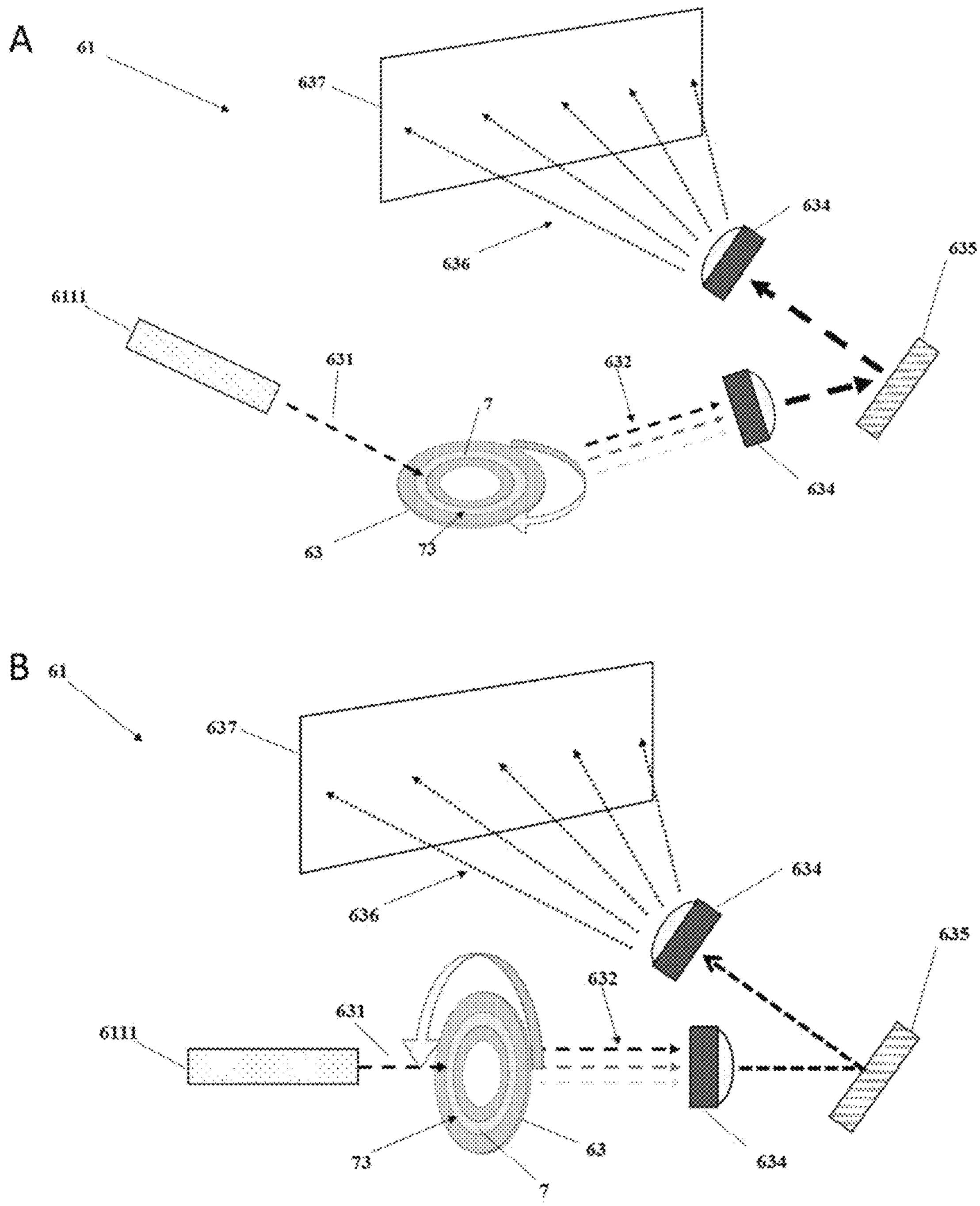
FIG. 42 illustrates a display apparatus wherein the color conversion layer is deposited onto a rotation wheel to form a ring and is excited by a light source.

FIG. 17C show a TEM image of $HfO_2$ particles, it is clear from that pictures that CdSe/CdZnS@$HfO_2$ seen in FIGS. 17A and 17B have a morphology consistent with $HfO_2$ particles.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ and/or $HfO_2$ with ZnTe, $Al_2O_3$, $SiO_2$, $TiO_2$, $HfO_2$, ZnSe, ZnO, ZnS, $SiZrO_2$, $SiHfO_2$ or MgO, or a mixture thereof. Reaction temperature of the above procedure is adapted according to the inorganic material chosen.

The same procedure was carried out by replacing $SiO_2$ and/or $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 19: Luminescent Particles Preparation from an Organometallic Precursor 100 μL of CdSe/CdZnS@$HfO_2$ particles suspended in heptane were mixed with an organometallic precursor selected in the group below in pentane under controlled atmosphere, then loaded on a spray-drying set-up. On another side, an aqueous solution was prepared and loaded on the same spray-drying set-up, but at a different location than the first heptane solution. The two liquids were sprayed simultaneously towards a tube furnace heated from room temperature to 300° C. with a nitrogen flow. The particles were collected at the surface of a filter.

The procedure was carried out with an organometallic precursor selected in the group comprising: $Al[N(SiMe_3)_2]_3$, trimethyl aluminium, triisobutylaluminum, trioctylaluminum, triphenylaluminum, dimethyl aluminium, trimethyl zinc, dimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), $Hf[(C_5H_4(CH_3)]_2(CH_3)_2$, $HfCH_3(OCH_3)[C_5H_4(CH_3)]_2$, $[[(CH_3)_3Si]_2N]_2HfCl_2$, $(C_5H_5)_2Hf(CH_3)_2$, $[CH_2CH_3)_2N]_4Hf$, $[(CH_3)_2N]_4Hf$, $[(CH_3)_2N]_4Hf$, $[(CH_3)(C_2H_5)N]_4Hf$, $[(CH_3)(C_2H_5)N]_4Hf$, 2,2',6,6'-tetramethyl-3,5-heptanedione zirconium ($Zr(THD)_4$), $C_{10}H_{12}Zr$, $Zr(CH_3C_5H_4)_2CH_3OCH_3$, $C_{22}H_{36}Zr$, $[(C_2H_5)_2N]_4Zr$, $[(CH_3)_2N]_4Zr$, $[(CH_3)_2N]_4Zr$, $Zr(NCH_3C_2H_5)_4$, $Zr(NCH_3C_2H_5)_4$, $C_{18}H_{32}O_6Zr$, $Zr(C_8H_{15}O_2)_4$, $Zr(OCC(CH_3)_3CHCOC(CH_3)_3)_4$, $Mg(C_5H_5)_2$, or $C_{20}H_{30}Mg$. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $HfO_2$ with ZnTe, $Al_2O_3$, $SiO_2$, $HfO_2$, ZnSe, $TiO_2$, ZnO, ZnS, $SiZrO_2$, $SiHfO_2$ or MgO, or a mixture thereof. The same procedure was carried out by replacing $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing the aqueous solution with another liquid or vapor source of oxidation.

Example 20: Luminescent Particles Preparation from an Organometallic Precursor—CdSe/CdZnS@$HfO_2$@ZnTe 100 μL of CdSe/CdZnS@$HfO_2$ particles suspended in heptane were mixed with two organometallic precursors selected in the group below in pentane under inert atmosphere then loaded on a spray-drying set-up. The suspension was sprayed towards a tube furnace heated from RT to 300° C. with a nitrogen flow. The particles were collected at the surface of a filter.

The procedure was carried out by with a first organometallic precursor selected in the group comprising: dimethyl telluride, diethyl telluride, diisopropyl telluride, di-t-butyl telluride, diallyl telluride, methyl allyl telluride, dimethyl selenide, or dimethyl sulfur. Reaction temperature of the above procedure is adapted according to the organometallic precursor chosen.

The procedure was carried out by with a second organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, or $Zn(TMHD)_2$ (β-diketonate). Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, CuInS2/ZnS, CuInSe2/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnTe with ZnS or ZnSe, or a mixture thereof.

The same procedure was carried out by replacing $HfO_2$ with ZnTe, $Al_2O_3$, $SiO_2$, $HfO_2$, ZnSe, $TiO_2$, ZnO, ZnS, $SiZrO_2$, $SiHfO_2$ or MgO, or a mixture thereof. The same procedure was carried out by replacing $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing the aqueous solution with another liquid or vapor source of oxidation.

Example 21: Luminescent Particles Preparation from an Organometallic Precursor—CdSe/CdZnS@$HfO_2$@ZnS 100 μL of CdSe/CdZnS@$HfO_2$ particles suspended in heptane were mixed with an organometallic precursor selected in the group below in pentane under inert atmosphere, then loaded on a spray-drying set-up. On another side, a vapor source of $H_2S$ was inserted in the same spray-drying set-up. The suspension was sprayed towards a tube furnace heated from RT to 300° C. with a nitrogen flow. The particles were collected at the surface of a filter.

The procedure was carried out with an organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate). Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnS with ZnSe or ZnTe, or a mixture thereof.

The same procedure was carried out by replacing $HfO_2$ with ZnTe, $Al_2O_3$, $HfO_2$, ZnSe, $TiO_2$, ZnO, ZnS, $SiZrO_2$, $SiHfO_2$ or MgO, or a mixture thereof. The same procedure was carried out by replacing $HfO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing the aqueous solution with another liquid or vapor source of oxidation.

The same procedure was carried out by replacing $H_2S$ with $H_2Se$, $H_2Te$ or other gas.

Example 22: Dispersion of Luminescent Particles in a Silicone and Deposition Onto a LED Luminescent particles as-prepared in the examples hereabove, and containing fluorescent nanoparticles, were dispersed in a polymer of silicone, with a mass concentration of 20%. The obtained material was deposited onto a LED of InGaN before annealing at 150° C. for 2 hours. The LED was then turned on to get a mixture of blue light and the light emitted by the fluorescent nanoparticles.

The same procedure was carried out by replacing silicone with ZnO, PMMA, Polystyrene, $Al_2O_3$, $TiO_2$, $HfO_2$ or $ZrO_2$, or a mixture thereof.

Example 23: Dispersion of Luminescent Particles in a ZnO Matrix and Deposition Onto a LED Luminescent particles as-prepared in the examples hereabove, and containing fluorescent nanoparticles, were dispersed in a ZnO matrix prepared by a sol-gel method. The material was then deposited onto a glass substrate by spin-coating and annealed at 100° C. for 24 hours. The glass substrate was then illuminated by a blue laser to get a mixture of blue light and the light emitted by the fluorescent nanoparticles.

The same procedure was carried out by replacing ZnO with a resin, silicone, PMMA, Polystyrene, $Al_2O_3$, $TiO_2$, $HfO_2$ or $ZrO_2$, or a mixture thereof.

Example 24: Color Conversion Layer Preparation

Blue emitting luminescent particles as-prepared in the examples hereabove, green emitting luminescent particles as-prepared in the examples hereabove, and red emitting luminescent particles as-prepared in the examples hereabove were dispersed separately in silicone and deposited onto a support, such that each film of luminescent particles was around 1-10 μm in thickness. The support was then annealed at 180° C. for 2 hours before it was introduced in the display apparatus described in the invention. The resulting lights were blue, green and red depending on the luminescent particles illuminated with the UV light from a light source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

The same procedure was carried out using inkjet printing; or traditional lithography.

With traditional lithography: the entire surface was coated with blue emitting luminescent particles, followed by the subtractive photolithography patterning process. The process is then repeated for the red emitting luminescent particles and for the green emitting luminescent particles.

Example 25: Color Conversion Layer Preparation

Green emitting core-shell CdSeS/CdZnS nanoplatelets and red emitting core-shell CdSe/CdZnS nanoplatelets were dispersed separately in silicone and deposited onto a support, such that each film of luminescent particles was around 1-10 μm in thickness. The support was then annealed at 180° C. for 2 hours before it was introduced in the display apparatus described in the invention. The resulting lights were green and red depending on the luminescent particles illuminated with the blue light from a light source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

The same procedure was carried out using inkjet printing; or traditional lithography.

With traditional lithography: the entire surface was coated with blue emitting luminescent particles, followed by the subtractive photolithography patterning process. The process is then repeated for the red emitting luminescent particles and for the green emitting luminescent particles.

Example 26: Color Conversion Layer Preparation

Green emitting luminescent particles as-prepared in the examples hereabove, and red emitting luminescent particles as-prepared in the examples hereabove were dispersed separately in a zinc oxide matrix and deposited onto a support, such that each film of luminescent particles was around 1-10 μm in thickness. The support was then annealed at 180° C. for 2 hours before it was introduced in the display apparatus described in the invention. The resulting lights were green and red depending on the luminescent particles illuminated with the blue light from a light source.

The same procedure was carried out by replacing ZnO with a resin, silicone, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

The same procedure was carried out using inkjet printing; or traditional lithography.

With traditional lithography: the entire surface was coated with blue emitting luminescent particles, followed by the subtractive photolithography patterning process. The process is then repeated for the red emitting luminescent particles and for the green emitting luminescent particles.

Example 27: Color Conversion Layer Preparation

Green emitting luminescent particles as-prepared in the examples hereabove, and red emitting luminescent particles as-prepared in the examples hereabove were dispersed separately in silicone and deposited onto a support, such that each film of luminescent particles was around 1-10 μm μm in thickness. The support was then annealed at 180° C. for 2 hours before it was introduced in the display apparatus described in the invention. The resulting lights were green and red depending on the luminescent particles illuminated with the blue light from a light source.

The same procedure was carried out by replacing silicone with a resin, ZnO, PMMA, MgO, Polystyrene, $Al_2O_3$, $TiO_2$, $HfO_2$ or $ZrO_2$, or a mixture thereof.

The same procedure was carried out with luminescent particles prepared in the examples hereabove.

The same procedure was carried out using inkjet printing; or traditional lithography.

With traditional lithography: the entire surface was coated with blue emitting luminescent particles, followed by the subtractive photolithography patterning process. The process is then repeated for the red emitting luminescent particles and for the green emitting luminescent particles.

Example 28: Color Conversion Layer Preparation

Green emitting luminescent particles as-prepared in the examples hereabove, and red emitting luminescent particles as-prepared in the examples hereabove were dispersed separately in silicone and deposited onto a support, such that each film of luminescent particles was around 1-10 μm in thickness. The support was then annealed at 180° C. for 2 hours before it was introduced in the display apparatus described in the invention. The resulting lights were green and red depending on the luminescent particles illuminated with the blue light from a light source.

The same procedure was carried out by replacing silicone with a resin, ZnO, PMMA, MgO, Polystyrene, $Al_2O_3$, $TiO_2$, $HfO_2$ or $ZrO_2$, or a mixture thereof.

The same procedure was carried out with luminescent particles prepared in the examples hereabove.

The same procedure was carried out using inkjet printing; or traditional lithography.

With traditional lithography: the entire surface was coated with blue emitting luminescent particles, followed by the subtractive photolithography patterning process. The process is then repeated for the red emitting luminescent particles and for the green emitting luminescent particles.

Example 29: Color Conversion Layer Preparation

Green emitting luminescent particles as-prepared in the examples hereabove, and red emitting c luminescent particles as-prepared in the examples hereabove were dispersed separately in a resin matrix and deposited onto a support, such that each film of luminescent particles was around 1-10 μm in thickness. The support was then annealed at 180° C. for 3 hours before it was introduced in the display apparatus described in the invention. The resulting lights were green and red depending on the luminescent particles illuminated with the blue light from a light source.

The same procedure was carried out by replacing the resin with silicone, ZnO, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

The same procedure was carried out using inkjet printing; or traditional lithography.

With traditional lithography: the entire surface was coated with blue emitting luminescent particles, followed by the subtractive photolithography patterning process. The process is then repeated for the red emitting luminescent particles and for the green emitting luminescent particles.

Example 30: Color Conversion Layer Preparation

Green emitting luminescent particles as-prepared in the examples hereabove and red emitting luminescent particles as-prepared in the examples hereabove were dispersed separately in silicone and deposited onto a support, such that each film of luminescent particles was around 1-10 μm in thickness. The support was then annealed at 180° C. for 2 hours before it was introduced in the display apparatus described in the invention. The resulting lights were green and red depending on the luminescent particles illuminated with the blue light from a light source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

The same procedure was carried out using inkjet printing; or traditional lithography.

With traditional lithography: the entire surface was coated with blue emitting luminescent particles, followed by the subtractive photolithography patterning process. The process is then repeated for the red emitting luminescent particles and for the green emitting luminescent particles.

Example 31: Color Conversion Layer Preparation

Green emitting luminescent particles as-prepared in the examples hereabove and red emitting luminescent particles as-prepared in the examples hereabove were dispersed separately in a MgO matrix and deposited onto a support, such that each film of luminescent particles was around 1-10 μm in thickness. The support was then annealed at 180° C. for 2 hours before it was introduced in the display apparatus described in the invention. The resulting lights were green and red depending on the luminescent particles illuminated with the blue light from a light source.

The same procedure was carried out by replacing MgO with a resin, ZnO, silicone, PMMA, Polystyrene, $Al_2O_3$, $TiO_2$, $HfO_2$ or $ZrO_2$, or a mixture thereof.

The same procedure was carried out with luminescent particles prepared in the examples hereabove.

The same procedure was carried out using inkjet printing; or traditional lithography: the entire surface was coated with blue emitting luminescent particles, followed by the subtractive photolithography patterning process. The process is then repeated for the red emitting luminescent particles and for the green emitting luminescent particles.

The same procedure was carried out using inkjet printing.

Example 32: Color Conversion Layer Preparation

Blue emitting luminescent particles as-prepared in the examples hereabove, green emitting luminescent particles as-prepared in the examples hereabove, and red emitting luminescent particles as-prepared in the examples hereabove were dispersed separately in silicone and successively deposited onto an optically transparent rotating wheel with a ring shape, such that the film of luminescent particles is around 50-150 μm in thickness and were equally distributed in three zones along the ring to obtain one zone coated with green emitting luminescent particles, one zone coated with blue emitting luminescent particles and one zone coated with red emitting luminescent particles. The rotating wheel was then annealed at 150° C. for 2 hours before it was introduced in the display apparatus described in the invention, wherein a UV laser source was used as excitation source. The resulting lights were blue, green and red depending on the zone illuminated with the UV light form the laser source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

Example 33: Color Conversion Layer Preparation

Green emitting core-shell CdSeS/CdZnS nanoplatelets and red emitting core-shell CdSe/CdZnS nanoplatelets were dispersed separately in silicone and successively deposited onto an optically transparent rotating wheel with a ring shape, such that the film of luminescent particles is around 50-150 μm in thickness and were equally distributed in three zones along the ring, to obtain one zone not coated, one zone coated with green emitting core-shell CdSe/CdZnS nanoplatelets and one zone coated with red emitting core-shell CdSe/CdZnS nanoplatelets. The rotating wheel was then annealed at 150° C. for 2 hours before it was introduced in the display apparatus described in the invention, where a blue laser source was used as excitation source. The resulting lights were blue, green and red depending on the zone illuminated with the blue light form the laser source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

Example 34: Color Conversion Layer Preparation

Green emitting luminescent particles as-prepared in the examples hereabove, and red emitting luminescent particles as-prepared in the examples hereabove were dispersed separately in a zinc oxide matrix and successively deposited onto an optically transparent rotating wheel with a ring shape, such that the film of luminescent particles is around 50-150 μm in thickness and were equally distributed in three zones along the ring, to obtain one zone not coated, one zone coated with green emitting luminescent particles and one zone coated with red emitting luminescent particles. The rotating wheel was then annealed at 150° C. for 2 hours before it was introduced in the display apparatus described in the invention, where a blue laser source was used as excitation source. The resulting lights were blue, green and red depending on the zone illuminated with the blue light form the laser source.

The same procedure was carried out by replacing ZnO with a resin, silicone, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

Example 35: Color Conversion Layer Preparation

Green emitting luminescent particles as-prepared in the examples hereabove, and red emitting luminescent particles as-prepared in the examples hereabove were dispersed separately in a resin matrix and successively deposited onto an optically transparent rotating wheel with a ring shape, such that the film of luminescent particles is around 50-150 μm in thickness and were equally distributed in three zones along the ring, to obtain one zone not coated, one zone coated with green emitting luminescent particles and one zone coated with red emitting luminescent particles. The rotating wheel was then annealed at 150° C. for 2 hours before it was introduced in the display apparatus described in the invention, where a blue laser source was used as excitation source. The resulting lights were blue, green and red depending on the zone illuminated with the blue light form the laser source.

The same procedure was carried out by replacing the resin with silicone, ZnO, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

Example 36: Color Conversion Layer Preparation

Green emitting luminescent particles as-prepared in the examples hereabove, yellow emitting luminescent particles as-prepared in the examples hereabove, orange emitting luminescent particles as-prepared in the examples hereabove, and red emitting luminescent particles as-prepared in the examples hereabove were dispersed separately in silicone and deposited onto an optically transparent rotating wheel with a ring shape, such that the film of luminescent particles is around 50-150 μm in thickness and were equally distributed in five zones along the ring, to obtain one zone not coated, one zone coated with green emitting luminescent particles, one zone coated with yellow emitting luminescent particles, one zone coated with orange emitting luminescent particles and one zone coated with red emitting luminescent particles. The rotating wheel was then annealed at 150° C. for 2 hours before it was introduced in the display apparatus described in the invention, where a blue laser source was used as excitation source. The resulting lights were blue, green, yellow, orange and red depending on the zone illuminated with the blue light form the laser source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with luminescent particles prepared in the examples hereabove.

REFERENCES

1—Luminescent particle
11—First material
12—Core of the luminescent particle
13—Shell of the luminescent particle
14—Inorganic material
2—Particle
21—Second material
22—Core of the particle 2
23—Shell of the particle 2
3—Nanoparticle
31—Spherical Nanoparticle
32—2D nanoparticle
33—Core of a nanoparticle
34—First shell of a nanoparticle
35—Second shell of a nanoparticle
36—Insulator shell of a nanoparticle
37—Crown of a nanoparticle
4—LED support
5—LED chip
6—Microsized LED
61—Display apparatus
6111—Light source
61111—Possible colored light paths
6112—Laser source
61121—Laser path
61122—Possible laser path
6121—Glass substrate
6122—Bottom substrate
6123—Solid support
6131—Layer of liquid crystal material
6132—Active matrix

6141—Polarizer
6142—Optical enhancement film
6143—Directing optical system
62—Illumination source
621—Light guide
622—Space
623—Reflector
624—Substrate
625—Color Filter
63—Rotating wheel comprising at least a zone comprising a color conversion layer
631—Possible light path of primary light from the light source
632—Possible light paths of secondary or primary light
634—Optical component
635—Modulating optical system
636—Possible path of the formed image
637—Screen
638—Digital micromirror device
6381—Microscopic mirror of the digital micromirror device
6382—Microscopic mirror of the digital micromirror device free of light emitting material, empty or optically transparent
6383—Support of a microscopic mirror
6391—Wavelength splitter system
6392—Wavelength combiner system
6384—Mirror
7—Light emitting material
71—Host material
72—Surrounding medium
73—Color conversion layer
8—Bead
81—Third material
9—Dense particle
d—Sub-pixel pitch
D—Pixel pitch
G—Green secondary light
R—Red secondary light

The invention claimed is:

1. A luminescent particle (1) comprising a first material (11),
wherein the luminescent particle (1) comprises a plurality of particles (2) comprising a second material (21) and at least one nanoparticle (3) dispersed in said second material (21); wherein the first material (11) and the second material (21) have a bandgap superior or equal to 3 eV, and wherein the plurality of particles (2) is uniformly dispersed in the first material (11).

2. The luminescent particle (1) according to claim 1, wherein the first material (11) and the second material (21) are selected from the group consisting of silicon oxide, aluminium oxide, titanium oxide, iron oxide, calcium oxide, magnesium oxide, zinc oxide, tin oxide, beryllium oxide, zirconium oxide, niobium oxide, cerium oxide, iridium oxide, scandium oxide, sodium oxide, barium oxide, potassium oxide, tellurium oxide, manganese oxide, boron oxide, germanium oxide, osmium oxide, rhenium oxide, arsenic oxide, tantalum oxide, lithium oxide, strontium oxide, yttrium oxide, hafnium oxide, molybdenum oxide, technetium oxide, rhodium oxide, cobalt oxide, gallium oxide, indium oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, silicon carbide SiC, aluminium nitride AlN, gallium nitride GaN, boron nitride BN, mixed oxides thereof, and mixtures thereof.

3. The luminescent particle (1) according to claim 1, wherein the first material (11) limits or prevents the diffusion of outer molecular species or fluids (liquid or gas) into said first material (11).

4. The luminescent particle (1) according to claim 1, wherein the first material (11) has a density ranging from 1 to 10.

5. The luminescent particle (1) according to claim 1, wherein the first material (11) has a density superior or equal to the density of the second material (21).

6. The luminescent particle (1) according to claim 1, wherein the first material (11) has a thermal conductivity at standard conditions of at least 0.1 W/(m·K).

7. The luminescent particle (1) according to claim 1, wherein the at least one nanoparticle (3) is a luminescent nanoparticle.

8. The luminescent particle (1) according to claim 1, wherein the at least one nanoparticle (3) is a semiconductor nanocrystal.

9. The luminescent particle (1) according to claim 1, wherein the at least one nanoparticle (3) is semiconductor nanocrystal comprising a core comprising a material of formula MxNyEzAw, wherein:
M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof;
N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof;
E is selected from the group consisting of O, S, Se, Te, C, N, P, As, Sb, F, Cl, Br, I, thereof; A is selected from the group consisting of O, S, Se, Te, C, N, P, As, Sb, F, Cl, Br, I, and mixtures thereof; and
x, y, z and w are independently a decimal number from 0 to 5; x, y, z and w are not simultaneously equal to 0; x and y are not simultaneously equal to 0; z and w may not be simultaneously equal to 0.

10. The luminescent particle (1) according to claim 1, wherein the at least one nanoparticle (3) is a semiconductor nanocrystal comprising at least one shell comprising a material of formula MxNyEzAw, wherein:
M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof;
N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof;
E is selected from the group consisting of O, S, Se, Te, C, N, P, As, Sb, F, Cl, Br, I, and mixtures thereof; A is selected from the group consisting of O, S, Se, Te, C, N, P, As, Sb, F, Cl, Br, I, and mixtures thereof; and
x, y, z and w are independently a decimal number from 0 to 5; x, y, z and w are not simultaneously equal to 0; x and y are not simultaneously equal to 0; z and w may not be simultaneously equal to 0.

11. The luminescent particle (1) according to claim 1, wherein the at least one nanoparticle (3) is a semiconductor nanocrystal comprising at least one crown (37) comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs and mixtures thereof; E is selected from the group consisting of O, S, Se, Te, C, N, P, As, Sb, F, Cl, Br, I, and mixtures thereof; A is selected from the group consisting of O, S, Se, Te, C, N, P, As, Sb, F, Cl, Br, I, and mixtures thereof; and x, y, z and w are independently a decimal number from 0 to 5; x, y, z and w are not simultaneously equal to 0; x and y are not simultaneously equal to 0; z and w may not be simultaneously equal to 0.

12. The luminescent particle (1) according to claim 1, wherein the at least one nanoparticle (3) is a semiconductor nanoplatelet.

13. A light emitting material comprising at least one host material and at least one luminescent particle (1) according to claim 1, wherein said at least one luminescent particle (1) is dispersed in the at least one host material.

14. The light emitting material according to claim 13, wherein the host material comprises an inorganic material, a polymer, or a silicone based polymer, a resin or a mixture thereof.

15. The light emitting material according to claim 13, wherein the host material has a thermal conductivity at standard conditions of at least 0.1 W/(m·K).

16. A support supporting at least one luminescent particle (1) according to claim 1 or a light emitting material comprising at least one host material and said at least one luminescent particle (1).

17. The support according to claim 16, wherein the support is a LED chip or microsized LED.

18. An optoelectronic device comprising at least one luminescent particle (1) according to claim 1 or a light emitting material comprising at least one host material and said at least one luminescent particle (1).

* * * * *